US012635268B2

(12) United States Patent
Lu et al.

(10) Patent No.: US 12,635,268 B2
(45) Date of Patent: May 19, 2026

(54) PHOTO-DETECTING APPARATUS WITH LOW DARK CURRENT

(71) Applicant: ARTILUX, INC., Menlo Park, CA (US)

(72) Inventors: Yen-Cheng Lu, Zhubei City (TW); Yun-Chung Na, San Jose, CA (US)

(73) Assignee: Artilux, Inc., Menlo Park, CA (US)

( * ) Notice: Subject to any disclaimer, the term of this patent is extended or adjusted under 35 U.S.C. 154(b) by 378 days.

(21) Appl. No.: 18/144,779

(22) Filed: May 8, 2023

(65) Prior Publication Data

US 2023/0275177 A1 Aug. 31, 2023

Related U.S. Application Data

(63) Continuation of application No. 17/278,645, filed as application No. PCT/US2020/048292 on Aug. 27, 2020, now Pat. No. 11,652,184.

(Continued)

(51) Int. Cl.
  H10F 30/225 (2025.01)
  H10F 39/00 (2025.01)
  (Continued)

(52) U.S. Cl.
  CPC ......... H10F 30/2255 (2025.01); H10F 39/18 (2025.01); H10F 39/8033 (2025.01); H10F 39/805 (2025.01); H10F 77/933 (2025.01)

(58) Field of Classification Search
  CPC ... H10F 30/2255; H10F 39/8033; H10F 39/18
  See application file for complete search history.

(56) References Cited

U.S. PATENT DOCUMENTS 3,621,466 A 11/1971 Toshio
4,275,404 A 6/1981 Cassiday et al.
(Continued)

FOREIGN PATENT DOCUMENTS

CN 1853276 10/2006
CN 104617119 5/2015
(Continued)

OTHER PUBLICATIONS

Office Action in Japanese Appln. No. 2023-106390, dated Sep. 25, 2023, 6 pages (with English translation).
(Continued)

*Primary Examiner* — Mounir S Amer
*Assistant Examiner* — Alexander Belousov
(74) *Attorney, Agent, or Firm* — Fish & Richardson P.C.

(57) ABSTRACT

A photo-detecting apparatus is provided. The photo-detecting apparatus includes a carrier conducting layer having a first surface; an absorption region is doped with a first dopant having a first conductivity type and a first peak doping concentration, wherein the carrier conducting layer is doped with a second dopant having a second conductivity type and a second peak doping concentration, wherein the carrier conducting layer comprises a material different from a material of the absorption region, wherein the carrier conducting layer is in contact with the absorption region to form at least one heterointerface, wherein a ratio between the first peak doping concentration of the absorption region and the second peak doping concentration of the carrier conducting layer is equal to or greater than 10; and a first electrode and a second electrode both formed over the first surface of the carrier conducting layer.

18 Claims, 102 Drawing Sheets

100b

Related U.S. Application Data

(60) Provisional application No. 63/053,723, filed on Jul. 20, 2020, provisional application No. 62/929,089, filed on Oct. 31, 2019, provisional application No. 62/899,153, filed on Sep. 12, 2019, provisional application No. 62/892,551, filed on Aug. 28, 2019.

(51) Int. Cl.
*H10F 39/18* (2025.01)
*H10F 77/00* (2025.01)

(56) References Cited

U.S. PATENT DOCUMENTS

| | | | |
|---|---|---|---|
| 4,341,918 | A | 7/1982 | Evans, Jr. et al. |
| 4,695,859 | A | 9/1987 | Guha et al. |
| 5,453,611 | A | 9/1995 | Oozu |
| 5,466,948 | A | 11/1995 | Worley |
| 5,673,284 | A | 9/1997 | Congdon et al. |
| 5,780,875 | A | 7/1998 | Tsuji |
| 5,965,875 | A | 10/1999 | Merrill |
| 6,316,286 | B1 | 11/2001 | Trezza |
| 6,509,203 | B2 | 1/2003 | Spartiotis et al. |
| 6,527,456 | B1 | 3/2003 | Trezza |
| 6,806,111 | B1 | 10/2004 | Ehrichs et al. |
| 7,090,133 | B2 | 8/2006 | Zhu |
| 7,340,709 | B1 | 3/2008 | Masini et al. |
| 7,348,608 | B2 | 3/2008 | Ko et al. |
| 7,411,265 | B2 | 8/2008 | Sekiguchi |
| 7,495,583 | B2 | 2/2009 | Tan |
| 7,629,661 | B2 | 12/2009 | Rafferty et al. |
| 7,741,657 | B2 | 6/2010 | Pauchard et al. |
| 7,750,958 | B1 | 7/2010 | Dierickx |
| 7,826,058 | B1 | 11/2010 | Ulrich et al. |
| 7,884,310 | B2 | 2/2011 | Buettgen |
| 7,888,763 | B2 | 2/2011 | Qian et al. |
| 7,961,301 | B2 | 6/2011 | Earhart et al. |
| 8,129,813 | B2 | 3/2012 | Herz |
| 8,183,510 | B2 | 5/2012 | Venezia et al. |
| 8,405,823 | B2 | 3/2013 | Pfaff |
| 8,471,895 | B2 | 6/2013 | Banks |
| 8,704,272 | B2 | 4/2014 | Huang et al. |
| 8,975,668 | B2 | 3/2015 | Costello et al. |
| 9,030,832 | B2 | 5/2015 | Kwong |
| 9,236,520 | B2 | 1/2016 | Okhonin et al. |
| 9,472,588 | B1 | 10/2016 | Li et al. |
| 9,643,181 | B1 | 5/2017 | Chang |
| 9,755,096 | B2 | 9/2017 | Novack et al. |
| 10,254,389 | B2 | 4/2019 | Na et al. |
| 10,269,855 | B2 | 4/2019 | Sallin et al. |
| 10,310,060 | B2 | 6/2019 | Na et al. |
| 10,353,056 | B2 | 7/2019 | Na et al. |
| 10,418,407 | B2 | 9/2019 | Na et al. |
| 10,613,202 | B2 | 4/2020 | Roy et al. |
| 10,690,495 | B2 | 6/2020 | Takagi et al. |
| 10,739,443 | B2 | 8/2020 | Na et al. |
| 10,741,598 | B2 | 8/2020 | Na et al. |
| 10,777,692 | B2 | 9/2020 | Cheng et al. |
| 10,795,003 | B2 | 10/2020 | Na et al. |
| 10,840,239 | B2 | 11/2020 | Or-Bach et al. |
| 10,886,309 | B2 | 1/2021 | Na et al. |
| 10,886,312 | B2 | 1/2021 | Na et al. |
| 10,896,931 | B1 | 1/2021 | Sekar et al. |
| 11,105,928 | B2 | 8/2021 | Cheng et al. |
| 11,131,757 | B2 | 9/2021 | Na et al. |
| 11,579,267 | B2 | 2/2023 | Na et al. |
| 11,637,142 | B2 | 4/2023 | Na et al. |
| 11,652,184 | B2 | 5/2023 | Lu et al. |
| 11,747,450 | B2 | 9/2023 | Na et al. |
| 11,777,049 | B2 | 10/2023 | Lu et al. |
| 12,072,448 | B2 | 8/2024 | Na et al. |
| 12,243,901 | B2 | 3/2025 | Na et al. |
| 12,278,252 | B2 | 4/2025 | Lu et al. |
| 2001/0000316 | A1 | 4/2001 | Kawai |
| 2001/0017786 | A1 | 8/2001 | Woodward |
| 2002/0070417 | A1 | 6/2002 | Kimura et al. |
| 2002/0072138 | A1 | 6/2002 | Trezza et al. |
| 2003/0042500 | A1 | 3/2003 | Rhodes et al. |
| 2003/0183893 | A1 | 10/2003 | Li |
| 2004/0208439 | A1 | 10/2004 | Bell et al. |
| 2005/0051730 | A1 | 3/2005 | Kuijk et al. |
| 2005/0167709 | A1 | 8/2005 | Augusto |
| 2006/0291362 | A1 | 12/2006 | Nakanishi |
| 2007/0114626 | A1 | 5/2007 | Kang et al. |
| 2007/0164767 | A1 | 7/2007 | Herz |
| 2008/0017883 | A1 | 1/2008 | Sarid et al. |
| 2008/0303058 | A1 | 12/2008 | Mori et al. |
| 2009/0121236 | A1 | 5/2009 | Worley |
| 2009/0166684 | A1 | 7/2009 | Yahav et al. |
| 2009/0173976 | A1 | 7/2009 | Augusto |
| 2009/0237770 | A1 | 9/2009 | Kim et al. |
| 2010/0291730 | A1 | 11/2010 | Uya et al. |
| 2011/0012221 | A1 | 1/2011 | Fujikata et al. |
| 2011/0031578 | A1 | 2/2011 | Miura et al. |
| 2011/0128430 | A1 | 6/2011 | Fossum |
| 2011/0255071 | A1 | 10/2011 | Van Der Tempel et al. |
| 2012/0001234 | A1 | 1/2012 | Lim et al. |
| 2012/0133922 | A1 | 5/2012 | Pfaff |
| 2012/0148190 | A1 | 6/2012 | Tamanuki |
| 2012/0290255 | A1 | 11/2012 | Kelkar |
| 2012/0307232 | A1 | 12/2012 | Mase |
| 2012/0326259 | A1 | 12/2012 | Huang et al. |
| 2013/0026548 | A1 | 1/2013 | McCarten |
| 2013/0119234 | A1 | 5/2013 | Lee et al. |
| 2013/0155390 | A1 | 6/2013 | Jensen |
| 2013/0202005 | A1 | 8/2013 | Dutt |
| 2013/0214161 | A1 | 8/2013 | Cazuax et al. |
| 2013/0292741 | A1 | 11/2013 | Huang et al. |
| 2014/0002700 | A1 | 1/2014 | Oishi |
| 2014/0111664 | A1 | 4/2014 | Kumano |
| 2014/0117428 | A1 | 5/2014 | Lee et al. |
| 2014/0133508 | A1 | 5/2014 | Huang et al. |
| 2014/0159129 | A1 | 6/2014 | Wang |
| 2014/0225173 | A1 | 8/2014 | Kim et al. |
| 2014/0252528 | A1 | 9/2014 | Yasuoka et al. |
| 2014/0291682 | A1 | 10/2014 | Huang et al. |
| 2014/0312206 | A1 | 10/2014 | Okhonin et al. |
| 2014/0340487 | A1 | 11/2014 | Gilliland et al. |
| 2014/0367740 | A1 | 12/2014 | Morse |
| 2015/0001664 | A1 | 1/2015 | Van Der Tempel et al. |
| 2015/0097256 | A1 | 4/2015 | Ang et al. |
| 2015/0187923 | A1 | 7/2015 | Kawahito |
| 2015/0236478 | A1 | 8/2015 | Huang et al. |
| 2015/0277043 | A1 | 10/2015 | Shimizu |
| 2016/0014352 | A1 | 1/2016 | Moriyama et al. |
| 2016/0056315 | A1 | 2/2016 | Shibata et al. |
| 2016/0064439 | A1 | 3/2016 | Or-Bach et al. |
| 2016/0103278 | A1 | 4/2016 | Cheng |
| 2016/0141329 | A1 | 5/2016 | Cheng et al. |
| 2016/0148959 | A1 | 5/2016 | Cheng et al. |
| 2016/0150174 | A1 | 5/2016 | Hynecek |
| 2016/0155883 | A1 | 6/2016 | Shi et al. |
| 2016/0161599 | A1 | 6/2016 | Seliuchenko |
| 2016/0211402 | A1 | 7/2016 | Joo et al. |
| 2016/0225922 | A1 | 8/2016 | Akkaya et al. |
| 2016/0233370 | A1 | 8/2016 | Jiang et al. |
| 2016/0284750 | A1 | 9/2016 | Ionescu et al. |
| 2016/0316159 | A1 | 10/2016 | Yoneda |
| 2017/0025454 | A1 | 1/2017 | Cheng et al. |
| 2017/0040361 | A1 | 2/2017 | Ikeda et al. |
| 2017/0040362 | A1 | 2/2017 | Na et al. |
| 2017/0062508 | A1 | 3/2017 | Na et al. |
| 2017/0074643 | A1 | 3/2017 | Chang et al. |
| 2017/0084775 | A1 | 3/2017 | Li et al. |
| 2017/0131389 | A1 | 5/2017 | Na et al. |
| 2017/0213821 | A1 | 7/2017 | Or-Bach et al. |
| 2017/0230598 | A1 | 8/2017 | Takayanagi et al. |
| 2017/0261425 | A1 | 9/2017 | Deliwala |
| 2018/0061883 | A1 | 3/2018 | Na et al. |
| 2018/0102442 | A1 | 4/2018 | Wang et al. |
| 2018/0114878 | A1 | 4/2018 | Danesh et al. |
| 2018/0175095 | A1 | 6/2018 | Sallin et al. |
| 2018/0180546 | A1 | 6/2018 | Rothberg et al. |
| 2018/0182913 | A1 | 6/2018 | Chen |

(56) References Cited

U.S. PATENT DOCUMENTS

| | | | |
|---|---|---|---|
| 2018/0188356 A1* | 7/2018 | Na | G01S 17/10 |
| 2018/0190698 A1 | 7/2018 | Na et al. | |
| 2018/0190702 A1 | 7/2018 | Na et al. | |
| 2018/0233521 A1 | 8/2018 | Na et al. | |
| 2018/0247968 A1 | 8/2018 | Na et al. | |
| 2018/0308882 A1 | 10/2018 | Cheng et al. | |
| 2018/0341020 A1 | 11/2018 | Magee et al. | |
| 2019/0006630 A1 | 1/2019 | Chen et al. | |
| 2019/0019899 A1 | 1/2019 | Wang et al. | |
| 2019/0033432 A1 | 1/2019 | Na et al. | |
| 2019/0035831 A1 | 1/2019 | Cao et al. | |
| 2019/0049564 A1 | 2/2019 | Na et al. | |
| 2019/0064372 A1 | 2/2019 | Cao et al. | |
| 2019/0113387 A1 | 4/2019 | Lee | |
| 2019/0140133 A1 | 5/2019 | Chen et al. | |
| 2019/0235677 A1 | 8/2019 | Liu et al. | |
| 2019/0267498 A1 | 8/2019 | Cheng et al. | |
| 2019/0302243 A1 | 10/2019 | Na et al. | |
| 2019/0312158 A1 | 10/2019 | Na et al. | |
| 2019/0319139 A1 | 10/2019 | Cho et al. | |
| 2019/0348463 A1 | 11/2019 | Na et al. | |
| 2020/0028000 A1 | 1/2020 | Wang et al. | |
| 2020/0035862 A1 | 1/2020 | Zhang | |
| 2020/0052016 A1 | 2/2020 | Na et al. | |
| 2020/0091217 A1 | 3/2020 | Horikoshi et al. | |
| 2020/0177829 A1 | 6/2020 | Takahashi et al. | |
| 2020/0192032 A1 | 6/2020 | Na et al. | |
| 2020/0194480 A1 | 6/2020 | Na et al. | |
| 2020/0203547 A1 | 6/2020 | Benhammou et al. | |
| 2020/0249327 A1 | 8/2020 | Na et al. | |
| 2020/0303581 A1 | 9/2020 | Immer et al. | |
| 2020/0319345 A1 | 10/2020 | Cheng et al. | |
| 2020/0356016 A1 | 11/2020 | Sampayan et al. | |
| 2020/0382736 A1 | 12/2020 | Na et al. | |
| 2020/0395393 A1 | 12/2020 | Na et al. | |
| 2021/0003448 A1 | 1/2021 | Siess | |
| 2021/0058042 A1 | 2/2021 | Na et al. | |
| 2021/0066529 A1 | 3/2021 | Lu et al. | |
| 2021/0084249 A1 | 3/2021 | Nakazawa et al. | |
| 2021/0091246 A1 | 3/2021 | Chern | |
| 2021/0126027 A1 | 4/2021 | Na et al. | |
| 2021/0272990 A1 | 9/2021 | Lo et al. | |
| 2021/0273024 A1 | 9/2021 | Wang | |
| 2021/0302549 A1 | 9/2021 | Na et al. | |
| 2021/0348967 A1 | 11/2021 | Leirer | |
| 2021/0351223 A1 | 11/2021 | Nomoto | |
| 2021/0391370 A1 | 12/2021 | Lu et al. | |
| 2022/0042877 A1 | 2/2022 | Fukuda et al. | |
| 2022/0069153 A1 | 3/2022 | Li et al. | |
| 2022/0181378 A1 | 6/2022 | Lu et al. | |
| 2022/0262835 A1 | 8/2022 | Chen et al. | |
| 2022/0262974 A1 | 8/2022 | Lu et al. | |
| 2023/0184907 A1 | 6/2023 | Na et al. | |
| 2023/0215902 A1 | 7/2023 | Na et al. | |
| 2025/0212544 A1 | 6/2025 | Lu | |

FOREIGN PATENT DOCUMENTS

| | | |
|---|---|---|
| CN | 105789347 | 7/2016 |
| EP | 0278408 | 8/1988 |
| EP | 2081004 | 7/2009 |
| EP | 2330637 | 6/2011 |
| JP | H0548139 | 2/1993 |
| JP | 2007-506269 | 3/2007 |
| JP | 2007-150261 | 6/2007 |
| JP | 2009-047658 | 3/2009 |
| JP | 2011-066097 | 3/2011 |
| JP | 2011-128024 | 6/2011 |
| JP | 2011-211019 | 10/2011 |
| JP | 2012-029130 | 2/2012 |
| JP | 2013-084786 | 5/2013 |
| JP | 2013-541860 | 11/2013 |
| JP | 2015-050463 | 3/2015 |
| JP | 2016-092738 | 5/2016 |
| JP | 2017-147352 | 8/2017 |
| JP | 2017-220581 | 12/2017 |
| JP | 2018-021764 | 2/2018 |
| JP | 2018-032810 A | 3/2018 |
| JP | 2018-082089 | 5/2018 |
| JP | 2018-124218 A | 8/2018 |
| JP | 2018-152489 A | 9/2018 |
| JP | 2019-510365 | 4/2019 |
| JP | 2020-516200 | 5/2020 |
| KR | 10-2006-0077183 | 7/2006 |
| WO | WO 2005/036647 | 4/2005 |
| WO | WO 2013/104718 | 7/2013 |
| WO | WO 2015/104307 | 7/2015 |
| WO | WO 2015/151790 | 10/2015 |
| WO | WO 2016/038416 | 3/2016 |
| WO | WO 2016/077791 | 5/2016 |
| WO | WO 2016/187566 | 11/2016 |
| WO | WO 2016/208215 | 12/2016 |
| WO | WO 2017/018477 | 2/2017 |
| WO | WO 2017/022219 | 2/2017 |
| WO | WO 2019/165220 | 8/2019 |
| WO | WO 2019/199691 | 10/2019 |

OTHER PUBLICATIONS

Bamji et al., "A 0.13 µm CMOS System-on-Chip for a 512×424 Time-of-Flight Image Sensor With Multi-Frequency Photo-Demodulation up to 130 MHz and 2 GS/s ADC," IEEE J. Solid-State Circuits, Jan. 2015, 50(1):303-319.

Bandaru et al., "Fabrication and characterization of low temperature (<450° C.) grown p-Ge/n-Si photodetectors for silicon based photonics," Materials Scoence and Engineering B, 2004, 113:79-84.

Bianco et al., "A Comparative Analysis between Active and Passive Techniques for Underwater 3D Reconstruction of Close-Range Objects," Sensors, Aug. 20, 2013, 13(8):11007-11031.

Chen et al., "Self-Aligned Microbonded Germanium Metal-Semiconductor-Metal Photodetectors Butt-Coupled to Si Waveguides," IEEE J. Sel. Top. Quant. Electron. Nov. 2014, 20(6):3800605, 5 pages.

Dalla Betta et al., "Design and Characterization of Current-Assisted Photonic Demodulators in 0.18-µm CMOS Technology," IEEE Trans. Electron. Dev., Jun. 2011, 58(6):1702-1709.

EP Extended European Search Report in European Application No. 20857170.3, dated Nov. 29, 2022, 7 pages.

Fang et al., "An Integration PIN MISS OEIC for High Current Photoreceiver Applications," IEEE Transactions on Electron Devices, Jan. 1997, 44(1):34-38.

Feng et al., "Vertical p-i-n germanium photodetector with high external responsivity integrated with large core Si waveguides," Optics Express, Jan. 4, 2010, 18(1):96-101.

Foix et al., "Lock-in Time-of-Flight (ToF) Cameras: A Survey," IEEE Sensors J., Sep. 2011, 11(9):1917-1926.

Fossum et al., "A Review of the Pinned Photodiode for CCD and CMOS Image Sensors," IEEE J. Electron Devices Soc. May 1, 2014, 2(3):33-43.

Geng, "Structured-light 3D surface imaging: a tutorial," Advances in Optics and Photonics, Jun. 30, 2011, 3(2):128-160.

Gulden et al., "Novel optical distance sensor based on MSM technology." IEEE Sensors Journal. Oct. 2004, 4(5):612-8.

Hutchinson et al., "High-Resolution Aliasing-Free Optical Beam Steering," Optica, vol. 3, No. 8, dated Aug. 5, 2016, 4 pages.

International Preliminary Report on Patentability in International Application No. PCT/US2020/048292, dated Mar. 10, 2022, 9 pages.

International Search Report and Written Opinion in International Appln. No. PCT/US2020/048292, dated Nov. 20, 2020, 9 pages.

Joo et al., "High-sensitivity 10 Gbps Ge-on-Si photoreceiver operating at λ ~1.55 µm," Optics Express, Aug. 2, 2010, 18(16):16474-16479.

Kato et al., "320×240 Back-Illuminated 10-um CAPD Pixels for High-Speed Modulation Time-of-Flight CMOS Image Sensor," IEEE J. Solid-State Circuits Apr. 2018, 53(4):1071-1078.

Kawahito et al., "A CMOS Time-of-Flight Range Image Sensor With Gates-on-Field-Oxide Structure," IEEE Sensors J. Dec. 2007, 7(12):1578-1586.

(56)          References Cited

OTHER PUBLICATIONS

Kim et al., "A Three-Dimensional Time-of-Flight CMOS Image Sensor With Pinned-Photodiode Pixel Structure," IEEE Electron. Dev. Lett., Nov. 2010, 31(11):1272-1274.

Koester et al., "Ge-on-SOI-Detector/Si-CMOS-Amplifier Receivers for High-Performance Optical-Communication Applications," J. Lightw. Technol., Jan. 2001, 25(1):46-57.

Lange et al., "Solid-State Time-of-Flight Range Camera," IEEE J. Quant. Electron. Mar. 2001, 37(3):390-397.

Li et al., "High-responsivity verticalillumination Si/Ge uni-travelingcarrier photodiodes based on silicon-on-insulator substrate," Science Reports, Jun. 9, 2016, 6(27743):1-9.

Li et al., "High-Bandwidth and High-Responsivity Top-Illuminated Germanium Photodiodes for Optical Interconnection," IEEE Trans. Electron Dev., Mar. 2013, 60(3):1183-1187.

Lischke et al., "High bandwidth, high responsivity waveguide-coupled germanium p-i-n photodiode," Optics Express, Oct. 19, 2015, 23(21):27213-27220.

Liu et al., "Backside-incidence critically coupled Ge on SOI photodetector," Proc. SPIE 10100, Optical Components and Materials, Feb. 16, 2017, XIV, 101001X, 6 pages.

Michel et al., "High-performance Ge-on-Si photodetectors," Nature Photon. Jul. 30, 2010, 4:527-534.

Morse et al., "Performance of Ge-on-Si p-i-n Photodetectors for Standard Receiver Modules," IEEE Photon. Technol. Lett., Dec. 1, 2006, 18(23):2442-2444.

Office Action in Japanese Appln. No. 2022-513328, dated Aug. 29, 2022, 6 pages (with English Translation).

Perenzoni et al., "Compact SPAD-Based Pixel Architectures for Time-Resolved Image Sensors," Sensors, May 23, 2016, 16(5):745, 12 pages.

Piels et al., "40 GHz Si/Ge Uni-Traveling Carrier Waveguide Photodiode," Journal of Lightwave Technology, Oct. 15, 2014, 32(20):3502-2508.

Place et al., "Rad tolerant CMOS image sensor based on hole collection 4T pixel pinned photodiode." IEEE Transactions on Nuclear Science. Dec. 6, 2012, 59(6):2888-93.

Rafferty et al., "Monolithic germanium SWIR imaging array," 2008 IEEE Conference on Technologies for Homeland Security, Waltham, MA, May 12, 2008, p. 577-582.

Ringbeck et al., "Multidimensional measurement by using 3-D PMD sensors," Adv. Radio Sci., Jan. 1, 2007, 5:135-146.

Tseng et al., "High-performance silicon-on-insulator grating coupler with completely vertical emission," Sep. 21, 2015, 23(19):24433-9.

Tseng et al., "A self-assembled microbonded germanium/silicon heterojunction photodiode for 25 GB/s high-speed optical interconnects," Sci. Rep. Nov. 15, 2013, 3:3225, 6 pages.

Van Der Tempel et al., "Lock-in Pixel Using a Current-Assisted Photonic Demodulator Implemented in 0.6 μm Standard Complementary Metal-Oxide-Semiconductor," Jpn. J. Appl. Phys., Apr. 24, 2017, 46(4B):2377-2380.

Van Nieuwenhove et al., "Photonic Demodulator With Sensitivity Control," IEEE Sensors J. Mar. 2007, 7(3):317-318.

Wu et al., "A critically coupled Germanium photodetector under vertical illumination," Opt. Express, Dec. 31, 2012, 20(28):29338-29346.

Yin et al., "31GHz Ge n-i-p waveguide photodetectors on Silicon-on-Insulator substrate," Optics Express Oct. 17, 2007, 15(21):13965-13971.

Yokogawa et al., "IR sensitivity enhancement of CMOS Image Sensor with diffractive light trapping pixels," Sci. Rep. Jun. 19, 2017, 7(1):3832, 9 pages.

* cited by examiner

800c

PHOTO-DETECTING APPARATUS WITH LOW DARK CURRENT

CROSS REFERENCE TO RELATED APPLICATIONS

This application is a continuation of U.S. patent application Ser. No. 17/278,645, filed Mar. 22, 2021, which is a national phase entry under 35 U.S.C. 371 of PCT Application Serial No. PCT/US2020/048292, filed on Aug. 27, 2020, which claims the benefit of U.S. Provisional Patent Application No. 62/892,551, filed Aug. 28, 2019, U.S. Provisional Patent Application No. 62/899,153, filed Sep. 12, 2019, U.S. Provisional Patent Application No. 62/929,089, filed Oct. 31, 2019, and U.S. Provisional Patent Application No. 63/053,723, filed Jul. 20, 2020. The entirety of each of the foregoing applications are incorporated by reference herein.

BACKGROUND

Photodetectors may be used to detect optical signals and convert the optical signals to electrical signals that may be further processed by another circuitry. Photodetectors may be used in consumer electronics products, image sensors, high-speed optical receiver, data communications, direct/indirect time-of-flight (TOF) ranging or imaging sensors, medical devices, and many other suitable applications.

SUMMARY

The present disclosure relates generally to a photo-detecting apparatus and an image system including the same.

According to another embodiment of the present disclosure, a photo-detecting apparatus is provided. The photo-detecting apparatus includes an absorption region including a first dopant having a first peak doping concentration; and a substrate supporting the absorption region, where the substrate includes a second dopant having a second peak doping concentration lower than the first peak doping concentration; where the absorption region includes a material different from a material of the substrate.

According to an embodiment of the present disclosure, a photo-detecting apparatus is provided. The photo-detecting apparatus, includes a photo-detecting device including: a carrier conducting layer having a first surface and a second surface; an absorption region in contact with the carrier conducting layer and configured to receive an optical signal and to generate photo-carriers in response to the optical signal, wherein the absorption region is doped with a first dopant having a first conductivity type and a first peak doping concentration, wherein the carrier conducting layer is doped with a second dopant having a second conductivity type and a second peak doping concentration, wherein the carrier conducting layer includes a material different from a material of the absorption region, wherein the carrier conducting layer is in contact with the absorption region to form at least one heterointerface, wherein a ratio between a doping concentration of the absorption region and a doping concentration of the carrier conducting region at the at least one heterointerface is equal to or greater than 10; and a first electrode and a second electrode formed over a same side of the carrier conducting layer.

According to an embodiment of the present disclosure, a photo-detecting apparatus is provided. The photo-detecting apparatus, includes a photo-detecting device including: a carrier conducting layer having a first surface and a second surface; an absorption region in contact with the carrier conducting layer and configured to receive an optical signal and to generate photo-carriers in response to the optical signal, wherein the absorption region is doped with a first dopant having a first conductivity type and a first peak doping concentration, wherein the carrier conducting layer is doped with a second dopant having a second conductivity type and a second peak doping concentration, wherein the carrier conducting layer includes a material different from a material of the absorption region, wherein the carrier conducting layer is in contact with the absorption region to form at least one heterointerface, wherein a ratio between a doping concentration of the absorption region and a doping concentration of the carrier conducting region at the at least one heterointerface is equal to or greater than 10 or a ratio between the first peak doping concentration of the absorption region and the second peak doping concentration of the carrier conducting region is equal to or greater than 10; and a second doped region in the carrier conducting layer and in contact with the absorption region, wherein the second doped region is doped with a fourth dopant having a conductivity type the same as the first conductivity type and having a fourth peak doping concentration higher than the first peak doping concentration.

According to an embodiment of the present disclosure, a photo-detecting apparatus is provided. The photo-detecting apparatus, includes a photo-detecting device including: a carrier conducting layer having a first surface and a second surface; an absorption region in contact with the carrier conducting layer and configured to receive an optical signal and to generate photo-carriers in response to the optical signal, wherein the absorption region is doped with a first dopant having a first conductivity type and a first peak doping concentration, wherein the carrier conducting layer is doped with a second dopant having a second conductivity type and a second peak doping concentration, wherein the carrier conducting layer includes a material different from a material of the absorption region, wherein the carrier conducting layer is in contact with the absorption region to form at least one heterointerface, wherein a ratio between a doping concentration of the absorption region and a doping concentration of the carrier conducting region at the at least one heterointerface is equal to or greater than 10, a ratio between the first peak doping concentration of the absorption region and the second peak doping concentration of the carrier conducting region is equal to or greater than 10 and at least 50% of the absorption region is doped with a doping concentration of the first dopant equal to or greater than $1 \times 10^{16}$ cm$^{-3}$.

According to an embodiment of the present disclosure, a photo-detecting apparatus is provided. The photo-detecting apparatus, includes a photo-detecting device including: a carrier conducting layer having a first surface and a second surface; an absorption region in contact with the carrier conducting layer and configured to receive an optical signal and to generate photo-carriers in response to the optical signal, wherein the absorption region is doped with a first dopant having a first conductivity type and a first peak doping concentration, wherein the carrier conducting layer is doped with a second dopant having a second conductivity type and a second peak doping concentration, wherein the carrier conducting layer includes a material different from a material of the absorption region, wherein the carrier conducting layer is in contact with the absorption region to form at least one heterointerface, wherein a ratio between the first peak doping concentration of the absorption region and the second peak doping concentration of the carrier conducting region is equal to or greater than 10; and a first electrode formed over the first surface of the carrier conducting layer and electrically coupled to the carrier conducting layer, wherein the first electrode is separated from the absorption region, wherein the first electrode is configured to collect a portion of the photo-carriers; and a second electrode formed over the first surface of the carrier conducting layer and electrically coupled to the absorption region.

According to another embodiment of the present disclosure, a photo-detecting apparatus is provided. The photo-detecting apparatus, includes a photo-detecting device including: a substrate having a first surface and a second surface; an absorption region over a first surface of the substrate and configured to receive an optical signal and to generate photo-carriers in response to the optical signal, wherein the absorption region is doped with a first dopant having a first conductivity type and a first peak doping concentration, wherein the substrate is doped with a second dopant having a second conductivity type and a second peak doping concentration, wherein the substrate includes a material different from a material of the absorption region, wherein the substrate is in contact with the absorption region to form at least one heterointerface, wherein a ratio between the first peak doping concentration of the absorption region and the second peak doping concentration of the substrate is equal to or greater than 10 or a ratio between a doping concentration of the absorption region and a doping concentration of the substrate at the at least one heterointerface is equal to or greater than 10; and a first electrode formed over the first surface of the substrate and electrically coupled to the substrate, wherein the first electrode is separated from the absorption region, wherein the first electrode is configured to collect a portion of the photo-carriers; and a second electrode formed over the first surface of the substrate and electrically coupled to the absorption region. According to another embodiment of the present disclosure, a photo-detecting apparatus is provided. The photo-detecting apparatus, includes a photo-detecting device including: an absorption region configured to receive an optical signal and to generate photo-carriers in response to the optical signal, wherein the absorption region is doped with a first dopant having a first conductivity type and a first peak doping concentration; a passivation layer over the absorption region and having a first surface and a second surface opposite to the first surface; wherein the passivation layer is doped with a second dopant having a second conductivity type and a second peak doping concentration, wherein the passivation layer includes a material different from a material of the absorption region, wherein the passivation layer is in contact with the absorption region to form at least one heterointerface, wherein a ratio between the first peak doping concentration of the absorption region and the second peak doping concentration of the passivation layer is equal to or greater than 10 or a ratio between a doping concentration of the absorption region and a doping concentration of the passivation layer at the at least one heterointerface is equal to or greater than 10; and a first electrode formed over the first surface of the passivation layer and electrically coupled to the passivation layer, wherein the first electrode is separated from the absorption region, wherein the first electrode is configured to collect a portion of the photo-carriers; and a second electrode formed over the first surface of the passivation layer and electrically coupled to the absorption region.

According to another embodiment of the present disclosure, a photo-detecting apparatus is provided. The photo-detecting apparatus includes a photo-detecting device

4 including: a carrier conducting layer having a first surface and a second surface; an absorption region in contact with the carrier conducting layer and configured to receive an optical signal and to generate photo-carriers in response to the optical signal, wherein the absorption region is doped with a first dopant having a first conductivity type and a first peak doping concentration, wherein the carrier conducting layer is doped with a second dopant having a second conductivity type and a second peak doping concentration, wherein the carrier conducting layer includes a material different from a material of the absorption region, wherein the carrier conducting layer is in contact with the absorption region to form at least one heterointerface, wherein a ratio between a doping concentration of the absorption region and a doping concentration of the carrier conducting layer at the at least one heterointerface is equal to or greater than 10 or a ratio between the first peak doping concentration of the absorption region and the second peak doping concentration of the carrier conducting layer is equal to or greater than 10; and one or more switches electrically coupled to the absorption region and partially formed in the carrier conducting layer, wherein each of the one or more switches includes a control electrode and a readout electrode that are formed over the first surface and are separated from the absorption region; and an electrode formed over the first surface, and the electrode electrically coupled to the absorption region.

According to another embodiment of the present disclosure, a photo-detecting apparatus is provided. The photo-detecting apparatus includes a photo-detecting device including: a carrier conducting layer having a first surface and a second surface; an absorption region in contact with the carrier conducting layer and configured to receive an optical signal and to generate photo-carriers in response to the optical signal, wherein the absorption region is doped with a first dopant having a first conductivity type and a first peak doping concentration, wherein the carrier conducting layer is doped with a second dopant having a second conductivity type and a second peak doping concentration, wherein the carrier conducting layer includes a material different from a material of the absorption region, wherein the carrier conducting layer is in contact with the absorption region to form at least one heterointerface, wherein a ratio between a doping concentration of the absorption region and a doping concentration of the carrier conducting layer at the at least one heterointerface is equal to or greater than 10 or a ratio between the first peak doping concentration of the absorption region and the second peak doping concentration of the carrier conducting layer is equal to or greater than 10; and one or more switches electrically coupled to the absorption region and partially formed in the carrier conducting layer, wherein each of the one or more switches includes a control electrode and a readout electrode that are formed a same side of the carrier conducting layer; a second doped region in the carrier conducting layer and in contact with the absorption region, wherein the second doped region is doped with a fourth dopant having a conductivity type the same as the first conductivity type and having a fourth peak doping concentration higher than the first peak doping concentration; and an electrode electrically coupled to the second doped region.

According to another embodiment of the present disclosure, a photo-detecting apparatus is provided. The photo-detecting apparatus includes a photo-detecting device including: a carrier conducting layer having a first surface and a second surface; an absorption region in contact with the carrier conducting layer and configured to receive an optical signal and to generate photo-carriers in response to the optical signal, wherein the absorption region is doped with a first dopant having a first conductivity type and a first peak doping concentration, wherein the carrier conducting layer is doped with a second dopant having a second conductivity type and a second peak doping concentration, wherein the carrier conducting layer includes a material different from a material of the absorption region, wherein the carrier conducting layer is in contact with the absorption region to form at least one heterointerface, wherein a ratio between a doping concentration of the absorption region and a doping concentration of the carrier conducting layer at the at least one heterointerface is equal to or greater than 10 or a ratio between the first peak doping concentration of the absorption region and the second peak doping concentration of the carrier conducting layer is equal to or greater than 10; and one or more switches electrically coupled to the absorption region and partially formed in the carrier conducting layer. The photo-detecting apparatus further includes one or more readout circuits electrically to the respective switch, and the one or more readout circuits includes a voltage-control transistor between a transfer transistor and a capacitor.

According to another embodiment of the present disclosure, a photo-detecting apparatus is provided. The photo-detecting apparatus includes an absorption region doped with a conductivity type and includes a first dopant having a first peak doping concentration; a carrier conducting layer in contact with the absorption region, wherein the carrier conducting layer includes a conducting region doped with a conductivity type and including a second dopant having a second peak doping concentration lower than the first peak doping concentration, wherein the carrier conducting layer includes or is composed of a material different from a material of the absorption region, and wherein the conducting region has a depth less than 5 μm.

According to another embodiment of the present disclosure, a photo-detecting apparatus is provided. The photo-detecting apparatus includes an absorption region doped with a first dopant having a first peak doping concentration; a first contact region having a conductivity type; a second contact region having a conductivity type different from the conductivity type of the first contact region; a charge region having a conductivity type the same as the conductivity type of the first contact region, where a part of the charge region is between the first contact region and the second contact region; a substrate supporting the absorption region, and the substrate includes a second dopant having a second peak doping concentration lower than the first peak doping concentration; where the absorption region includes a material different from a material of the substrate.

According to another embodiment of the present disclosure, a photo-detecting apparatus is provided. The photo-detecting apparatus includes a substrate; an absorption region supported by the substrate and doped with a first dopant having a first conductivity type; multiple first contact regions each having a conductivity type different from the first conductivity type and formed in the substrate; a second doped region formed in the absorption region and having a conductivity type the same as the first conductivity type; and multiple third contact regions each having a conductivity type the same as the first conductivity type and formed in the substrate; wherein the first contact regions are arranged along a first plane, and the third contact regions are arranged along a second plane different form the first plane. In some embodiments, multiple multiplication regions are formed between the multiple third contact regions and multiple first contact regions.

According to another embodiment of the present disclosure, a photo-detecting apparatus is provided. The photo-detecting apparatus includes an absorption region; a first contact region having a conductivity type; a second contact region in the absorption region and having a conductivity type different from the conductivity type of the first contact region; a charge region having a conductivity type the same as the conductivity type of the first contact region, where the charge region is closer to the second contact region than the first contact region is; a substrate supporting the absorption region, wherein the charge region and the first contact region are formed in the substrate. The photo-detecting apparatus further includes a modification element integrated with the substrate for modifying a position where multiplication occurs in the substrate.

According to another embodiment of the present disclosure, a photo-detecting apparatus is provided. The photo-detecting apparatus includes a substrate; an absorption region supported by the substrate; a first contact region having a conductivity type formed in the substrate; a second contact region formed in the absorption region and having a conductivity type different from the conductivity type of the first contact region; a charge region formed in the substrate and having a conductivity type the same as the conductivity type of the first contact region; wherein a depth of the charge region is less than a depth of the first contact region. In some embodiments, the depth of the charge region is between the depth of the second contact region and the depth of the first contact region.

According to another embodiment of the present disclosure, a photo-detecting apparatus is provided. The photo-detecting apparatus includes a photo-detecting device including: a substrate having a first surface and a second surface; an absorption region over a first surface of the substrate and configured to receive an optical signal and to generate photo-carriers in response to the optical signal, wherein the absorption region is doped with a first dopant having a first conductivity type and a first peak doping concentration, wherein the substrate is doped with a second dopant having a second conductivity type and a second peak doping concentration, wherein the substrate includes a material different from a material of the absorption region, wherein the substrate is in contact with the absorption region to form at least one heterointerface, wherein a ratio between a doping concentration of the absorption region and a doping concentration of the substrate at the at least one heterointerface is equal to or greater than 10 or a ratio between the first peak doping concentration of the absorption region and the second peak doping concentration of the substrate is equal to or greater than 10; wherein the substrate further includes a waveguide configured to guide and confine the optical signal propagating through a defined region of the substrate to couple the optical signal to the absorption region.

According to another embodiment of the present disclosure, a photo-detecting apparatus is provided. The photo-detecting apparatus includes a photo-detecting device including: a carrier conducting layer having a first surface and a second surface; an absorption region in contact with the carrier conducting layer and configured to receive an optical signal and to generate photo-carriers in response to the optical signal, wherein the absorption region is doped with a first dopant having a first conductivity type and a first peak doping concentration, wherein the carrier conducting layer is doped with a second dopant having a second conductivity type and a second peak doping concentration, wherein the carrier conducting layer includes a material different from a material of the absorption region, wherein the carrier conducting layer is in contact with the absorption region to form at least one heterointerface, wherein a ratio between a doping concentration of the absorption region and a doping concentration of the carrier conducting layer at the at least one heterointerface is equal to or greater than 10; and N switches electrically coupled to the absorption region and partially formed in the carrier conducting layer. The photo-detecting apparatus further includes Y control signals different from each other and electrically coupled to the photo-detecting device, wherein Y≤N and Y is a positive integer. Each of the control signal controls one or more of the switches of the photo-detecting device.

According to another embodiment of the present disclosure, a photo-detecting apparatus is provided. The photo-detecting apparatus includes an absorption region including a first dopant having a first peak doping concentration; and a substrate supporting the absorption region, where the substrate includes a second dopant having a second peak doping concentration lower than the first peak doping concentration, where the absorption region includes a material having a bandgap less than a bandgap of a material of the substrate, where a built-in electrical field region is across an interface between the substrate and the absorption region, where a first width of the built-in electrical field region in the substrate is greater than a second width of the built-in electrical field region in the absorption region so that the dark current is generated mostly from the substrate.

According to another embodiment of the present disclosure, a photo-detecting apparatus is provided. The photo-detecting apparatus includes an absorption region configured to receive an optical signal and generate photo-carriers having a first polarity and a second polarity; a lightly-doped region configured to receive a portion of the photo-carriers having the first polarity from the absorption region; and a gain component configured to receive a portion of the photo-carriers having the first polarity from the lightly-doped region and to generate an electrical signal having the second polarity, where a number of the electrical charges of the electrical signal having the second polarity generated by the gain component is greater than a number of electrical charges of the photo-carriers generated by the absorption region.

According to another embodiment of the present disclosure, a photo-detecting apparatus is provided. The photo-detecting apparatus includes an absorption region that is doped with a first dopant type having a first peak doping concentration, the absorption region configured to receive an optical signal and generate photo-carriers having a first polarity and a second polarity; a lightly-doped region that is doped with a second dopant type having a second peak doping concentration, the lightly-doped region configured to receive a portion of the photo-carriers having the first polarity from the absorption region, where the first dopant type is different from the second dopant type; and a gain component configured to receive a portion of the photo-carriers having the first polarity from the lightly-doped region and to generate an electrical signal having the second polarity, where a ratio of the first peak doping concentration of the absorption region to the second peak doping concentration of the lightly-doped region is equal to or greater than 10, and where a number of the electrical charges of the electrical signal having the second polarity generated by the gain component is greater than a number of electrical charges of the photo-carriers generated by the absorption region.

According to another embodiment of the present disclosure, a method for amplifying photo-carriers received by a photo-detecting apparatus having a gain component is provided. The method including: receiving an optical-signal in an absorption region to generate photo-carriers having a first and a second type; steering the first type of photo-carriers to a gain region; and generating an amplified electrical signal having the second type, where generating the amplified electrical signal includes: applying a first voltage to an emitter electrode of the gain component; applying a second voltage to a collector electrode of the gain component, such that a forward-bias is created across a p-n junction between an emitter region of the gain component and a lightly-doped region of the gain component, and that a reverse-bias is created across the p-n junction between a collector region of the gain component and the lightly-doped region of the gain component; receiving a first type of carriers in the lightly-doped region of the gain component to increase the forward-bias between the emitter region and the lightly-doped region; and collecting a second type of carriers emitted from the emitter region by the collector region as an amplified electrical signal.

According to another embodiment of the present disclosure, a photo-detecting apparatus is provided. The photo-detecting apparatus includes an absorption region configured to receive an optical signal and generate photo-carriers having a first polarity and a second polarity; a substrate configured to receive a portion of the photo-carriers having the first polarity from the absorption region; and one or more switches electrically coupled to the absorption region and at least partially formed in the substrate, wherein each of the switches includes a gain component configured to receive a portion of the photo-carriers having the first polarity and to generate an electrical signal having the second polarity, where a number of the electrical charges of the electrical signal having the second polarity generated by the gain component is greater than a number of electrical charges of the photo-carriers generated by the absorption region.

According to an embodiment of the present disclosure, an imaging system is provided. The imaging system includes a transmitter unit capable of emitting light, and a receiver unit including an image sensor including the photo-detecting apparatus.

These and other objectives of the present disclosure will no doubt become obvious to those of ordinary skill in the art after reading the following detailed description of the preferred embodiment that is illustrated in the various figures and drawings.

BRIEF DESCRIPTION OF THE DRAWINGS

The foregoing aspects and many of the attendant advantages of this application will become more readily appreciated as the same becomes better understood by reference to the following detailed description, when taken in conjunction with the accompanying drawings, wherein.

DETAILED DESCRIPTION

As used herein, the terms such as "first", "second", "third", "fourth" and "fifth" describe various elements, components, regions, layers and/or sections, these elements, components, regions, layers and/or sections should not be limited by these terms. These terms may be only used to distinguish one element, component, region, layer or section from another. The terms such as "first", "second", "third", "fourth" and "fifth" when used herein do not imply a sequence or order unless clearly indicated by the context. The terms "photo-detecting", "photo-sensing", "light-detecting", "light-sensing" and any other similar terms can be used interchangeably.

Spatial descriptions, such as "above", "top", and "bottom" and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the term "intrinsic" means that the semiconductor material is without intentionally adding dopants.

Figure 1A:
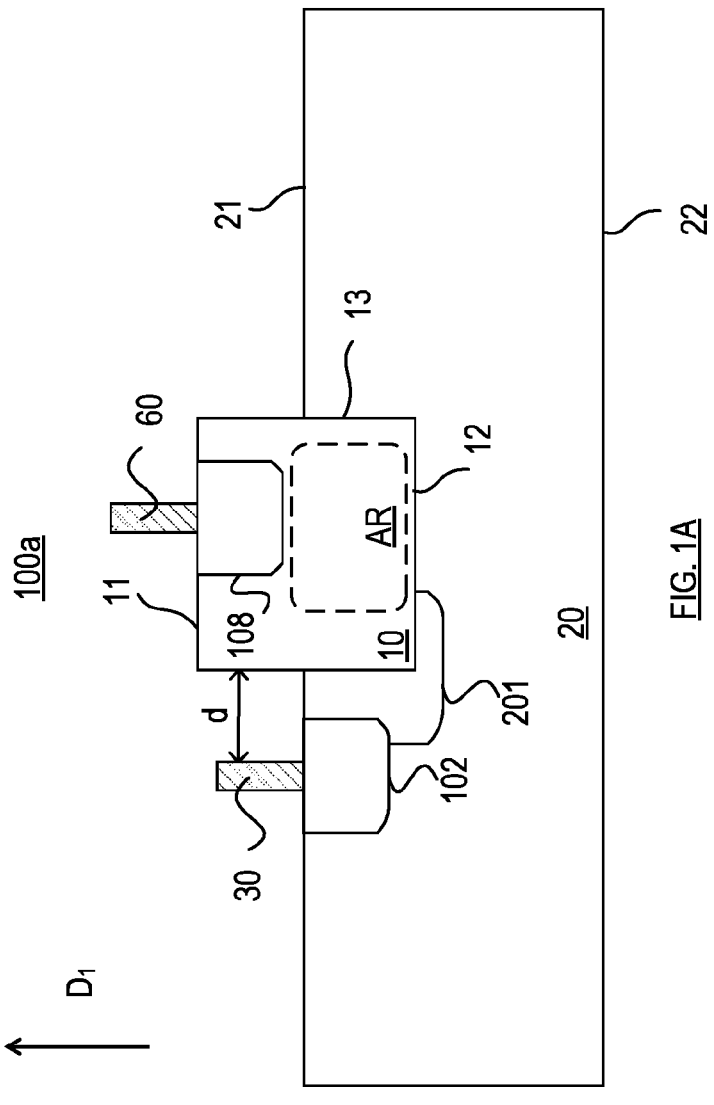
FIGS. 1A-1D illustrate cross-sectional views of a photo-detecting device, according to some embodiments.

FIG. 1A illustrates a cross-sectional view of a photo-detecting device 100a, according to some embodiments. The photo-detecting device 100a includes an absorption region 10 and a substrate 20 supporting the absorption region 10. In some embodiments, the absorption region 10 is entirely embedded in the substrate 20. In some embodiments, the absorption region 10 is partially embedded in the substrate 20. In some embodiments, the photo-detecting device 100a includes at least one heterointerface between the absorption region 10 and a carrier conducting layer including or be composed of a material different from that of the absorption region 10. In some embodiments, the carrier conducting layer is the substrate 20. For example, in some embodiments, the substrate 20 includes a first surface 21 and a second surface 22 opposite to the first surface 21. In some embodiments, the absorption region 10 includes a first surface 11, a second surface 12 and one or more side surfaces 13. The second surface 12 is between the first surface 11 of the absorption region 10 and the second surface 22 of the substrate 20. The side surfaces 13 are between the first surface 11 of the absorption region 10 and the second surface 12 of the absorption region 10. At least one of the first surface 11, second surface 12 and the side surfaces 13 of the absorption region 10 is at least partially in direct contact with the substrate 20 and thus the heterointerface is formed between the absorption region 10 and the substrate 20.

In some embodiments, the absorption region 10 is doped with a conductivity type and includes a first dopant having a first peak doping concentration. In some embodiments, the absorption region 10 is configured to convert an optical signal, for example, an incident light, to an electrical signal. In some embodiments, the optical signal enters the absorption region 10 from the first surface 21 of the substrate 20. In some embodiments, the optical signal enters the absorption region 10 from the second surface 22 of the substrate 20. In some embodiments, the absorption region 10 includes an absorbed region AR, which is defined by a light shield (not shown) including an optical window. The absorbed region AR is a virtual area receiving an optical signal incoming through the optical window.

In some embodiments, the carrier conducting layer, that is the substrate 20 in some embodiments, is doped with a conductivity type and includes a second dopant having a second peak doping concentration lower than the first peak doping concentration to reduce the dark current of the photo-detecting device 100a, which may improve the signal-to-noise ratio, sensitivity, dynamic range properties of the photo-detecting device 100a.

In some embodiments, the first peak doping concentration is equal to or greater than $1 \times 10^{16}$ cm$^{-3}$. In some embodiments, the first peak doping concentration can be between $1 \times 10^{16}$ cm$^{-3}$ and $1 \times 10^{20}$ cm$^{-3}$. In some embodiments, the first peak doping concentration can be between $1 \times 10^{17}$ cm$^{-3}$ and $1 \times 10^{20}$ cm$^{-3}$. In some embodiments, a ratio of the first peak doping concentration to the second peak doping concentration is equal to or greater than 10 such that the photo-detecting device 100a can further achieve low dark current. In some embodiments, a ratio of the first peak doping concentration to the second peak doping concentration is equal to or greater than 100 such that the photo-detecting device 100a can achieve further low dark current and high quantum efficiency at the same time. In some embodiments, the conductivity type of the substrate 20 is p-type or n-type. In some embodiments, if the conductivity type of the substrate 20 is p-type, e.g., using boron (B) and/or gallium (Ga) as dopant, the second peak doping concentration can be between $1 \times 10^{12}$ cm$^{-3}$ and $1 \times 10^{16}$ cm$^{-3}$ such that the photo-detecting device 100a is can achieve low dark current and high quantum efficiency at the same time. In some embodiments, if the conductivity type of the substrate 20 is of n-type, e.g., using phosphorus (P) and/or arsenic (As) as dopant, the second peak doping concentration can be between $1 \times 10^{14}$ cm$^{-3}$ and $1 \times 10^{18}$ cm$^{-3}$ such that the photo-detecting device 100a can achieve with low dark current and high quantum efficiency at the same time.

In some embodiments, when the conductivity type of the carrier conducting layer, that is the substrate 20 in some embodiments, is different from the conductivity type of the absorption region 10, and by having the second peak doping concentration of the substrate 20 lower than the first peak doping concentration of the absorption region 10, a depletion region is across the heterointerface between the substrate 20 and the absorption region 10. A major part of the depletion region is in the substrate 20 when the photo-detecting device is in operation. In other words, a first width of the depletion region in the substrate 20 is greater than a second width of the depletion region in the absorption region 10. In some embodiments, a ratio of the first width to the second width is greater than 10. In some embodiments, a built-in electrical field region is across an heterointerface between the substrate 20 and the absorption region 10, where a first width of the built-in electrical field region in the substrate 20 is greater than a second width of the built-in electrical field region in the absorption region 10 so that the dark current is generated mostly from the substrate 20. Therefore, the photo-detecting device can achieve lower dark current. In some embodiments, a bandgap of the carrier conducting layer, that is the substrate 20, is greater than a bandgap of the absorption region 10.

In some embodiments, when the conductivity type of the carrier conducting layer, that is the substrate 20 in some embodiments, is the same as the conductivity type of the absorption region 10, such as when the substrate 20 is of p-type and the absorption region 10 is of p-type, by having the second peak doping concentration of the substrate 20 lower than the first peak doping concentration of the absorption region 10, the electric field across the absorption region 10 can be reduced and thus the electric field across the substrate 20 is increased. That is, a difference between the electric field across the absorption region 10 and the electric field across the substrate 20 presents. As a result, the dark current of the photo-detecting device is further lower. In some embodiments, a bandgap of the carrier conducting layer, that is the substrate 20, is greater than a bandgap of the absorption region 10.

The carrier conducting layer, that is the substrate 20 in some embodiments, includes a first doped region 102 separated from the absorption region 10. The first doped region 102 is doped with a conductivity type and includes a third dopant having a third peak doping concentration. The conductivity type of the first doped region 102 is different from the conductivity type of the absorption region 10. In some embodiments, the third peak doping concentration is higher than the second peak doping concentration. In some embodiments, the third peak doping concentration of the first doped region 102 can be between $1\times10^{18}$ cm$^{-3}$ and $5\times10^{20}$ cm$^{-3}$.

In some embodiments, at least 50% of the absorption region 10 is doped with a doping concentration of the first dopant equal to or greater than $1\times10^{16}$ cm$^{-3}$. In other words, at least half of the absorption region 10 is intentionally doped with the first dopant having a doping concentration equal to or greater than $1\times10^{16}$ cm$^{-3}$. For example, a ratio of the depth of the doping region in the absorption region 10 to the thickness of the absorption region 10 is equal to or greater than ½. In some embodiments, at least 80% of the absorption region 10 is intentionally doped with the first dopant having a doping concentration equal to or greater than $1\times10^{16}$ cm$^{-3}$ for further reducing the dark current of the photo-detecting device. For example, a ratio of the depth of the doping region in the absorption region 10 to the thickness of the absorption region 10 is equal to or greater than ⅘.

In some embodiments, the carrier conducting layer, can be majorly doped with the second dopant. For example, at least 50% of the carrier conducting layer, that is the substrate 20 in some embodiments, has a doping concentration of the second dopant equal to or greater than $1\times10^{12}$ cm$^{-3}$. In other words, at least half of the carrier conducting layer is intentionally doped with the second dopant having a doping concentration equal to or greater than $1\times10^{12}$ cm$^{-3}$. For example, a ratio of the depth of the doping region in the substrate 20 to the thickness of the substrate 20 is equal to or greater than ½. In some embodiments, at least 80% of the carrier conducting layer, is intentionally doped with the second dopant having a doping concentration equal to or greater than $1\times10^{12}$ cm$^{-3}$. For example, a ratio of the depth of the doping region in the substrate 20 to the thickness of the substrate 20 is equal to or greater than ⅘.

In some embodiments, the carrier conducting layer can be regionally doped with the second dopant. For example, the carrier conducting layer, that is the substrate 20 in some embodiments, includes a conducting region 201. At least a part of the conducting region 201 is between the first doped region 102 and the absorption region 10. In some embodiments, the conducting region 201 is partially overlapped with the absorption region 10 and the first doped region 102 for confining a path of the carriers generated from the absorption region 10 moving towards the first doped region 102. In some embodiments, the conducting region 201 has a depth measured from the first surface 21 of the substrate 20 along a direction D1 substantially perpendicular to the first surface 21 of the substrate 20. The depth is to a position where the dopant profile of the second dopant reaches a certain concentration, such as a concentration between $1\times10^{14}$ cm$^{-3}$ and $1\times10^{15}$ cm$^{-3}$. In some embodiments, the depth of the conducting region 201 is less than 5 μm for better efficiently transporting the carriers. In some embodiments, the conducting region 201 may be overlapped with the entire first doped region 10. In some embodiments, the conducting region 201 has a width greater than a width of the absorption region 10.

In some embodiments, the first dopant and the second dopant are different, for example, the first dopant is boron, and the second dopant is phosphorous. In some embodiments, a doping concentration of the first dopant at the heterointerface between the absorption region 10 and the carrier conducting layer, that is the substrate 20 in some embodiment, is equal to or greater than $1\times10^{16}$ cm$^{-3}$. In some embodiments, the doping concentration of the first dopant at the heterointerface can be between $1\times10^{16}$ cm$^{-3}$ and $1\times10^{20}$ cm$^{-3}$ or between $1\times10^{17}$ cm$^{-3}$ and $1\times10^{20}$ cm$^{-3}$. In some embodiments, a doping concentration of the second dopant at the heterointerface is lower than the doping concentration of the first dopant at the heterointerface. In some embodiments, a doping concentration of the second dopant at the heterointerface between $1\times10^{12}$ cm$^{-3}$ and $1\times10^{17}$ cm$^{-3}$.

In some embodiments, since the doping concentration of the first dopant at the heterointerface is sufficiently high, it may reduce the interface dark current generation at the heterointerface. As a result, the interface combination velocity can be reduced and thus the dark current at the heterointerface can be lower. In some embodiments, since the doping concentration of the second dopant at the heterointerface is lower than the doping concentration of the first dopant at the heterointerface, the bulk dark current generation in the absorption region 10 is also reduced. In some embodiments, the photo-detecting device 100a can have an interface recombination velocity lower than $10^4$ cm/s.

In some embodiments, a ratio of the doping concentration of the first dopant to the doping concentration of the second dopant at the heterointerface is equal to or greater than 10 such that the photo-detecting device 100a can achieve low dark current at the heterointerface and high quantum efficiency at the same time. In some embodiments, a ratio of the doping concentration of the first dopant to the doping concentration of the second dopant at the heterointerface is equal to or greater than 100 such that the photo-detecting device 100a can exhibit further low dark current at the heterointerface and high quantum efficiency at the same time.

In some embodiments, the second dopant may be in the absorption region 10, but also may present outside the absorption region 10 due to thermal diffusion or implant residual etc. In some embodiments, the first dopant may be in the carrier conducting layer, that is the substrate 20 in some embodiments, but also may present outside the substrate region 20 due to thermal diffusion or implant residual etc.

In some embodiments, the first dopant may be introduced in the absorption region 10 by any suitable process, such as in-situ growth, ion implantation, and/or thermal diffusion etc.

In some embodiments, the second dopant may be introduced in the substrate 20 by any suitable process, such as in-situ growth, ion implantation, and/or thermal diffusion etc.

In some embodiments, the absorption region 10 is made by a first material or a first material-composite. The carrier conducting layer, that is the substrate 20 in some embodiments, is made by a second material or a second material-composite. The second material or a second material-composite is different from the first material or a first material-composite. For example, in some embodiments, the combinations of elements of second material or a second material-composite is different from the combinations of elements in the first material or a first material-composite.

In some embodiments, a bandgap of the carrier conducting layer, that is the substrate 20 in some embodiments, is greater than a bandgap of the absorption region 10. In some embodiments, the absorption region 10 includes or is composed of a semiconductor material. In some embodiments, the substrate 20 includes or is composed of a semiconductor material. In some embodiments, the absorption region 10 includes or is composed of a Group III-V semiconductor material. In some embodiments, the substrate 20 includes or is composed of a Group III-V semiconductor material. The Group III-V semiconductor material may include, but is not limited to, GaAs/AlAs, InP/InGaAs, GaSb/InAs, or InSb. For example, in some embodiments, the absorption region 10 includes or is composed of InGaAs, and the substrate 20 include or is composed of InP. In some embodiments, the absorption region 10 includes or is composed of a semiconductor material including a Group IV element. For example, Ge, Si or Sn. In some embodiments, the absorption region 10 includes or is composed of the $Si_xGe_ySn_{1-x-y}$, where $0 \leq x \leq 1$, $0 \leq y \leq 1$, $0 \leq x+y \leq 1$. In some embodiments, the absorption region 10 includes or is composed of $Ge_{1-a}Sn_a$, where $0 \leq a \leq 0.1$. In some embodiments, the absorption region 10 includes or is composed of $Ge_xSi_{1-x}$, where $0 \leq x \leq 1$. In some embodiments, the absorption region 10 composed of intrinsic germanium is of p-type due to material defects formed during formation of the absorption region, where the defect density is from $1 \times 10^{14}$ cm$^{-3}$ to $1 \times 10^{16}$ cm$^{-3}$. In some embodiments, the carrier conducting layer, that is the substrate 20 in some embodiments, includes or is composed of a semiconductor material including a Group IV element. For example, Ge, Si or Sn. In some embodiments, the substrate 20 includes or is composed of the $Si_xGe_ySn_{1-x-y}$, where $0 \leq x \leq 1$, $0 \leq y \leq 1$, $0 \leq x+y \leq 1$. In some embodiments, the substrate 20 includes or is composed of $Ge_{1-a}Sn_a$, where $0 \leq a \leq 0.1$. In some embodiments, the substrate 20 includes or is composed of $Ge_xSi_{1-x}$, where $0 \leq x \leq 1$. In some embodiments, the substrate 20 composed of intrinsic germanium is of p-type due to material defects formed during formation of the absorption region, where the defect density is from $1 \times 10^{14}$ cm$^{-3}$ to $1 \times 10^{16}$ cm$^{-3}$. For example, in some embodiments, the absorption region 10 includes or is composed of Ge, and the substrate 20 include or is composed of Si.

In some embodiments, the conductivity type of the absorption region 10 is p-type. In some embodiments, the first dopant is a Group III element. In some embodiments, the conductivity type of the substrate 20 is n-type. the second dopant is a Group V element.

In some embodiments, the photo-detecting device includes a first electrode 30 electrically coupled to the first doped region 102. The first electrode 30 is separated from the absorption region 10. An ohmic contact may be formed between the first electrode 30 and the first doped region 102 depending on the material of the first electrode 30 and the third peak doping concentration of the first doped region 102. In some embodiments, a nearest distance d between the first electrode 30 and one of the side surfaces 13 of the absorption region can be between 0.1 μm and 20 μm. In some embodiments, a nearest distance d between the first electrode 30 and one of the side surfaces 13 of the absorption region can be between 0.1 μm and 5 μm. In some embodiments, the distance can be between 0.5 μm and 3 μm. If the distance d between the first electrode 30 and the side surfaces 13 is greater than 20 μm, the speed of the photo-detecting device 100a is lower. If the distance d between the first electrode 30 and the side surfaces 13 is less than 0.1 μm, the dark current of the photo-detecting device may be increased.

In some embodiments, the photo-detecting device 100a includes a second doped region 108 in the absorption region 10 and near the first surface 11 of the absorption region 10. The second doped region 108 is doped with a conductivity type the same as the conductivity type of the absorption region 10. In some embodiments, the second doped region 108 includes a fourth dopant having a fourth peak doping concentration higher than the first peak doping concentration. For example, the fourth peak doping concentration of the second doped region 108 can be between $1 \times 10^{18}$ cm$^{-3}$ and $5 \times 10^{20}$ cm$^{-3}$. In some embodiments, the second doped region 108 is not arranged over the first doped region 102 along the direction D1.

In some embodiments, the photo-detecting device 100a further includes a second electrode 60 electrically coupled to the second doped region 108. An ohmic contact may be formed between the second electrode 60 and the second doped region 108 depending on the material of the second electrode 60 and the fourth peak doping concentration of the second doped region 108. The second electrode 60 is over the first surface 11 of the absorption region 10.

In some embodiments, the carrier conducting layer includes a first surface and a second surface opposite to the first surface 21. The first electrode 30 and second electrode 60 are both disposed over the of the first surface of the carrier conducting layer. That is, the first electrode 30 and second electrode 60 are disposed over a same side of the carrier conducting layer, that is the substrate 20 in some embodiment, which is benefit for the backend fabrication process afterwards.

The first doped region 102 and the second doped region 108 can be semiconductor contact regions. In some embodiments, depending on the circuits electrically coupled to the first doped region 102 and the second doped region 108, the carriers with a first type collected by one of the first doped region 102 and the second doped region 108 can be further processed, and the carriers with second type collected by the other doped region can be evacuated. Therefore, the photo-detecting device can have improved reliability and quantum efficiency.

In some embodiments, the absorption region 10 is doped with a graded doping profile. In some embodiments, the largest concentration of the graded doping profile is higher than the second peak doping concentration of the second dopant. In some embodiments, the smallest concentration of the graded doping profile is higher than the second peak doping concentration of the second dopant. In some embodiments, the graded doping profile can be graded from the first surface 11 of the absorption region 10 or from the second doped region 108 to the second surface 12 of the absorption region 10. In some embodiments, the graded doping profile can be a gradual decrease/increase or a step like decrease/increase depending on the moving direction of the carriers. In some embodiments, the concentration of the graded doping profile is gradually deceased/increased from the first surface 11 or the second doped region 108 of the absorption region 10 to the second surface 12 of the absorption region 10 depending on the moving direction of the carriers. In some embodiments, the concentration of the graded doping profile is gradually and radially deceased/increased from a center of the first surface 11 or the second doped region 108 of the absorption region 10 to the second surface 12 and to the side surfaces 13 of the absorption region 10 depending on the moving direction of the carriers. For example, if the absorption region 10 is entirely over the substrate 20, the carriers with the first type, such as electrons when the first doped region 102 is of n-type, move in the absorption region 10 substantially along a direction from the first surface 11 to the second surface 12, the concentration of the graded doping profile of the first dopant, for example, boron, is gradually deceased from the first surface 11 or from the second doped region 108 of the absorption region 10 to the second surface 12 of the absorption region 10. In some embodiments, the concentration of the graded doping profile is gradually and laterally decreased/increased from an edge of the first surface 11 or the second doped region 108 of the absorption region 10 to the side surfaces 13 of the absorption region 10 depending on the moving direction of the carriers.

In some embodiments, the dark current of the photo-detecting device is about several pA or lower, for example, lower than $1\times10^{-12}$ A.

Figure 1B:
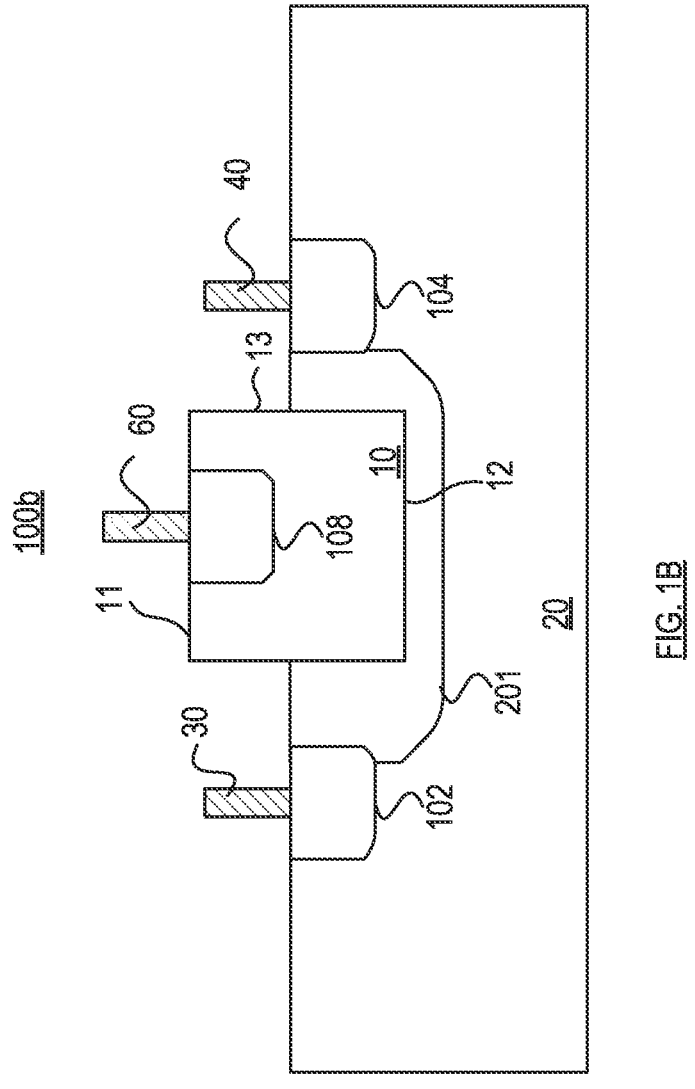

FIG. 1B illustrates a cross-sectional view of a photo-detecting device, according to some embodiments. The photo-detecting device 100b in FIG. 1B is similar to the photo-detecting device 100a in FIG. 1A. The difference is described below.

The photo-detecting device 100b further includes another first doped region 104 in the substrate 20. The first doped region 104 is similar to the first doped region 102 as described in FIG. 1A. The first doped region 104 is separated from the absorption region 10. At least a part of the conducting region 201 is also between the first doped region 104 and the absorption region 10. In some embodiments, the conducting region 201 is partially overlapped with the absorption region and the first doped region 104 for confining a path of the carriers with a first type generated from the absorption region 10 moving towards the first doped region 104.

In some embodiments, the two first doped regions 104, 102 are separated from each other. In some embodiments, the two first doped regions 104, 102 may be a continuous region, for example, a ring. The photo-detecting device 100b further includes a third electrode 40 electrically coupled to the first doped region 104. In some embodiment, the first electrode 30 and the third electrode may be electrically coupled to the same circuit.

In some embodiments, the dark current of the photo-detecting device 100b is about several pA or lower, for example, lower than $1\times10^{-12}$ A.

A photo-detecting device in accordance to a comparative example includes structures substantially the same as the structures of a photo-detecting device 100b in FIG. 1B. The difference is that in the photo-detecting device of the comparative example, the doping concentration of the absorption region 10 is not higher than the second peak doping concentration of the substrate 20, and the doping concentration of the second dopant at the heterointerface is not lower than the doping concentration of the first dopant at the heterointerface The details of the photo-detecting device in accordance to a comparative example and the photo-detecting device 100b are listed in Table 1 and Table 2.

TABLE 1

| Details of the photo-detecting device in accordance to a comparative example | |
| --- | --- |
| Conductivity type of the absorption region | p-type, |
| First peak doping concentration | $1 \times 10^{15}$ cm−3 |
| Conductivity type of the substrate | n-type |
| Second peak doping concentration | $1 \times 10^{15}$ cm−3 |
| Reference dark current | 100% |

TABLE 2

| Details of the photo-detecting device 100b | |
| --- | --- |
| Conductivity type of the absorption region | p-type, |
| First peak doping concentration | Referring to Table 3 |
| Conductivity type of the substrate | n-type |
| Second peak doping concentration | $1 \times 10^{15}$ cm−3 |
| Dark current | Referring to Table 3 |

Referring to Table 3, compared to the comparative example, since the first peak doping concentration of the absorption region 10 in the photo-detecting device 100b is higher than the second peak doping concentration of the substrate 20, the photo-detecting device 100b can have lower dark current, for example, at least two times lower.

TABLE 3

| Dark current vs. First peak doping concentration of photo-detecting device 100b in accordance to different embodiments | |
| --- | --- |
| first peak doping concentration | Dark current (compared to the reference dark current in comparative example) |
| 1.00E+16 | 42% |
| 1.00E+17 | 0.29% |
| 1.00E+18 | 0.0052% |
| 1.00E+19 | 0.001% |

Another photo-detecting device in accordance to a comparative example includes structures substantially the same as the structures of a photo-detecting device 100b in FIG. 1B. The difference is that the in the other photo-detecting device of the comparative example, the doping concentration of the absorption region 10 is not higher than the second peak doping concentration of the substrate 20, and the doping concentration of the second dopant at the heterointerface is not lower than the doping concentration of the first dopant at the heterointerface. The details of the other photo-detecting device in accordance to a comparative example and the photo-detecting device 100b are listed in Table 4 and Table 5.

TABLE 4

| Details of the other photo-detecting device in accordance to a comparative example | |
| --- | --- |
| Conductivity type of the absorption region | p-type, |
| First peak doping concentration | $1 \times 10^{15}$ cm−3 |
| Conductivity type of the substrate | p-type |
| Second peak doping concentration | $1 \times 10^{15}$ cm−3 |
| Reference dark current | 100% |

TABLE 5

| Details of the photo-detecting device 100b | |
| --- | --- |
| Conductivity type of the absorption region | p-type |
| First peak doping concentration | Referring to Table 6 |
| Conductivity type of the substrate | p-type |
| Second peak doping concentration | $1 \times 10^{15}$ cm−3 |
| Dark current | Referring to Table 6 |

Referring to Table 6, compared to the other comparative example, since the first peak doping concentration of the absorption region 10 in the photo-detecting device 100b is higher than the second peak doping concentration of the substrate 20, the photo-detecting device 100b can have lower dark current for example at least 20 times lower

TABLE 6

| Dark current vs. First peak doping concentration of photo-detecting device 100b in accordance to different embodiments | |
| --- | --- |
| first peak doping concentration | Dark current (compared to the Reference dark current in comparative example) |
| 1.00E+16 | 4.6% |
| 1.00E+17 | 0.1% |
| 1.00E+18 | 0.01% |
| 1.00E+19 | 0.0017% |

Figure 1C:
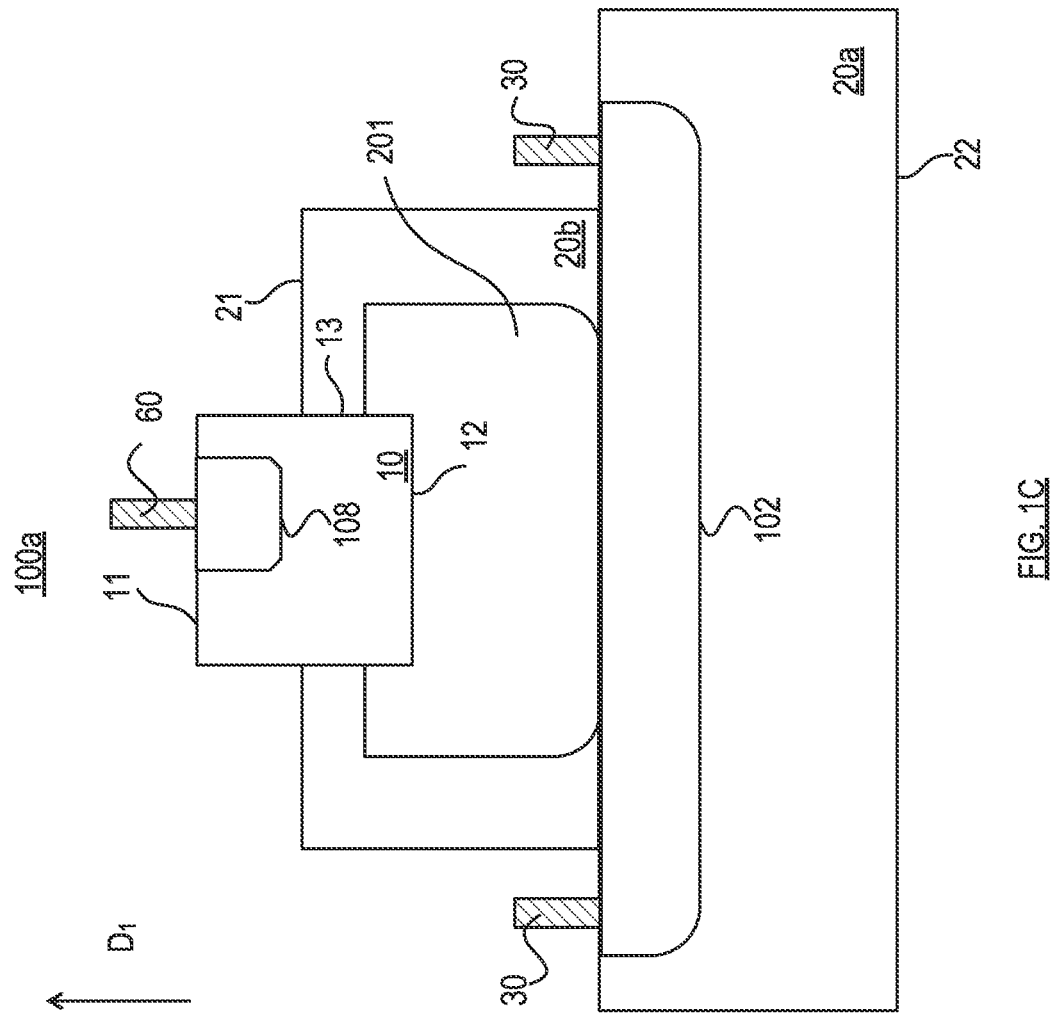

FIG. 1C illustrates a cross-sectional view of a photo-detecting device, according to some embodiments. The photo-detecting device 100c in FIG. 1C is similar to the photo-detecting device 100a in FIG. 1A. The difference is described below.

The substrate 20 includes a base portion 20a and an upper portion 20b supporting by the base portion 20a. The upper portion 20b has a width less than a width of the base portion 20a. The absorption region 10 is supported by the upper portion 20b of the substrate 20. The conducting region 201 is in the upper portion 20b. The first doped region 102 is in the base portion 20a. The first doped region 102 has a width greater than the width of the upper portion 20b of the substrate 20 and thus a part of the first doped region 102 is not covered by the upper portion 20b. The second doped region 108 is arranged over the first doped region 102 along the direction D1, and the conducting region 201 is between the first doped region 102 and the second doped region 108. The carriers with a first type generated from the absorption region 10, for example, electrons, will move towards first doped region 102 through the conducting region 201 along the direction D1.

In some embodiments, the first electrode 30 may be in any suitable shape, such as a ring from a top view of the photo-detecting device. In some embodiments, the photo-detecting device 100c includes two first electrodes 30 electrically coupled to the first doped region 102 and separated from each other. In some embodiments, the first electrodes 30 are disposed at opposite sides of the absorption region 10.

In some embodiments, based on the reverse bias voltage applied to the second doped region 108 and the first doped region 102, if an impact ionization occurs, the photo-detecting device 100c can be an avalanche photodiode operated in linear mode (reverse bias voltage<breakdown voltage) or Geiger mode (reverse bias voltage>breakdown voltage), and the portion of the conducting region 201 in between the absorption region 10 and the first doping region 102 can be a multiplication region. The multiplication region is then capable of generating one or more additional charge carriers in response to receiving the one or more carriers generated from the absorption region 10.

Figure 1D:
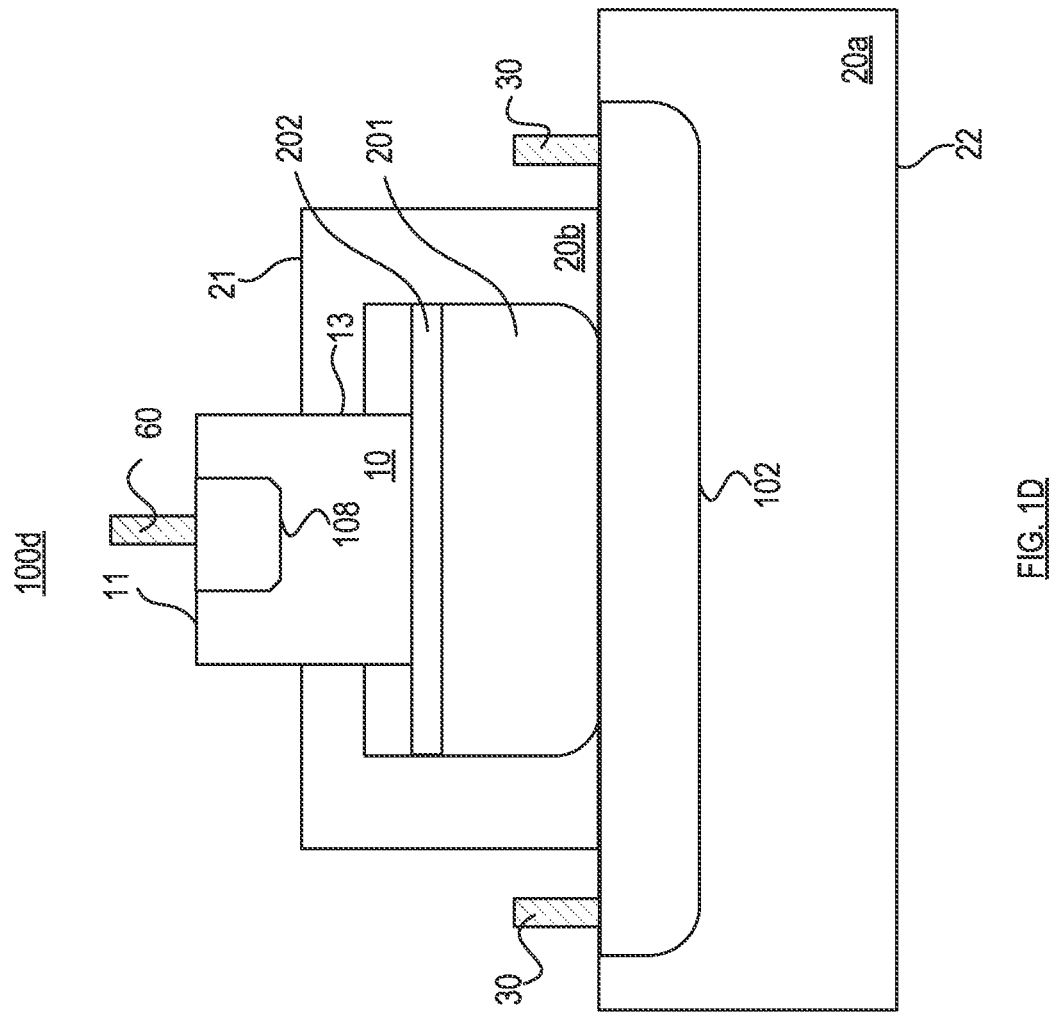

FIG. 1D illustrates a cross-sectional view of a photo-detecting device, according to some embodiments. The photo-detecting device 100d in FIG. 1D is similar to the photo-detecting device 100c in FIG. 1C. The difference is described below.

The photo-detecting device 100d further includes a charge layer 202 in the upper portion 20b of the substrate 20. The charge layer 202 is in direct contact with the absorption region 10 or overlapped with a portion of the absorption region 10. The charge layer 202 is of a conductivity type the same as the conductivity type of the absorption region 10. For example, if the conductivity type of the absorption region 10 is p, the conductivity type of the charge layer 202 is p. The charge layer 202 is with a peak doping concentration higher than the second peak doping concentration of the conducting region 201 and lower than the first peak doping concentration of the absorption region 10. In some embodiments, the charge layer 202 is with a thickness between 10 nm and 500 nm. The charge layer can reduce the electric field across the absorption region 10 and thus increase the electric field across the conducting region 201. That is, a difference between the electric field across the absorption region 10 and the electric field across the conducting region 201 presents. As a result, the speed and the responsivity of the photo-detecting device 100d is also higher, and the dark current of the photo-detecting device 100d is also lower.

Figure 2A:
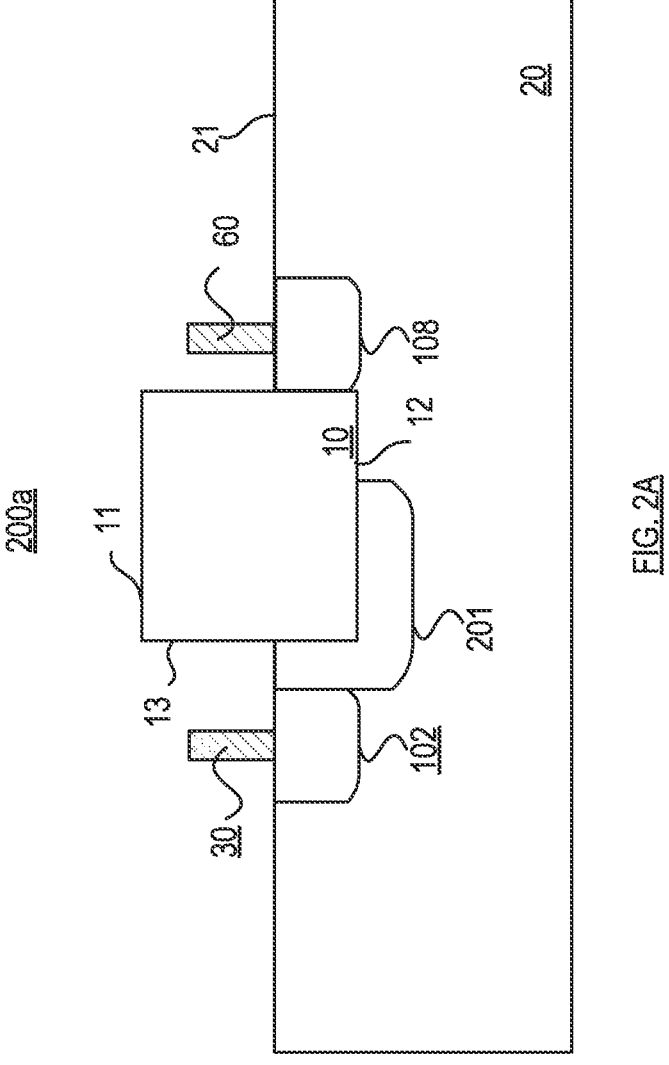
FIGS. 2A-2D illustrate cross-sectional views of a photo-detecting device, according to some embodiments.

FIG. 2A illustrates a cross-sectional view of a photo-detecting device, according to some embodiments. The photo-detecting device 200a in FIG. 2A is similar to the photo-detecting device 100a in FIG. 1A. The difference is described below. The second doped region 108 is in the substrate 20. In other words, the fourth peak doping concentration of the second doped region 108 lies in the substrate 20. In some embodiment, the second doped region 108 is below the first surface 21 of the substrate 20 and is in direct contact with the absorption region 10, for example, the second doped region 108 may be in contact with or overlapped with one of the side surfaces 13 of the absorption region 10. As a result, the carriers generated from the absorption region 10 can move from the absorption region 10 towards the second doped region 108 through the heterointerface between the absorption region 10 and the substrate 20. The second electrode 60 is over the first surface 21 of the substrate 20.

By having the second doped region 108 in the substrate 20 instead of in the absorption region 10, the second electrode 60 and the first electrode 30 can both be formed above the first surface 21 of the substrate 20. Therefore, a height difference between the second electrode 60 and the first electrode 30 can be reduced and thus the fabrication process afterwards will be benefit from this design. Besides, the area of the absorption region 10 absorbing the optical signal can be larger.

Figure 2B:
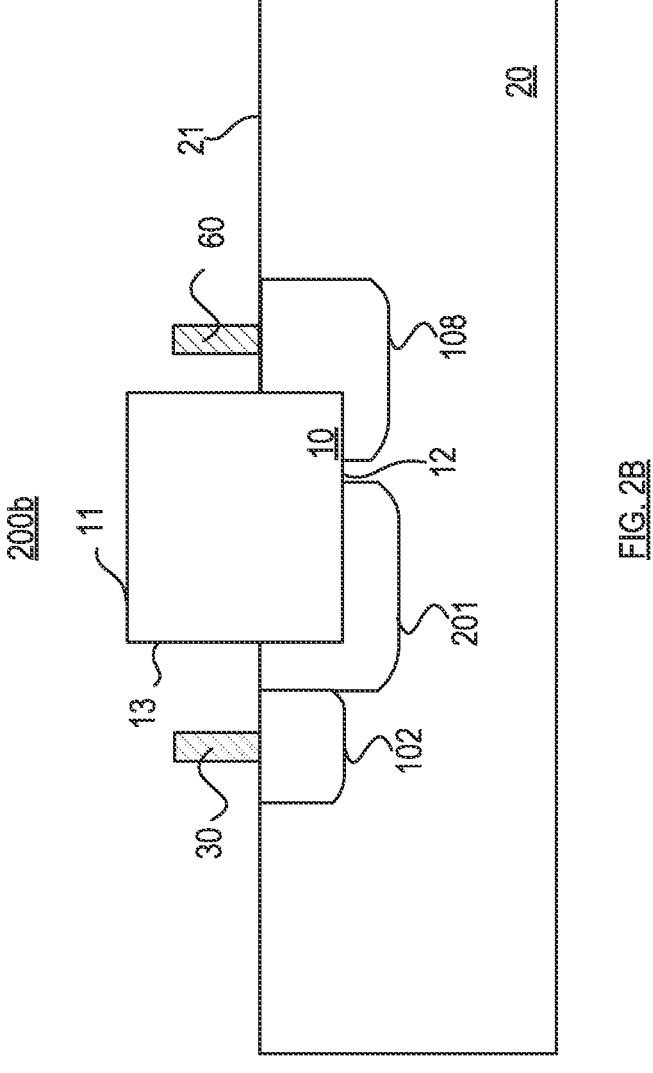

FIG. 2B illustrates a cross-sectional view of a photo-detecting device, according to some embodiments. The photo-detecting device 200b in FIG. 2B is similar to the photo-detecting device 200a in FIG. 2A. The difference is described below. The second doped region 108 can be also in contact with or overlapped with the second surface 12 of the absorption region 10.

Figure 2C:
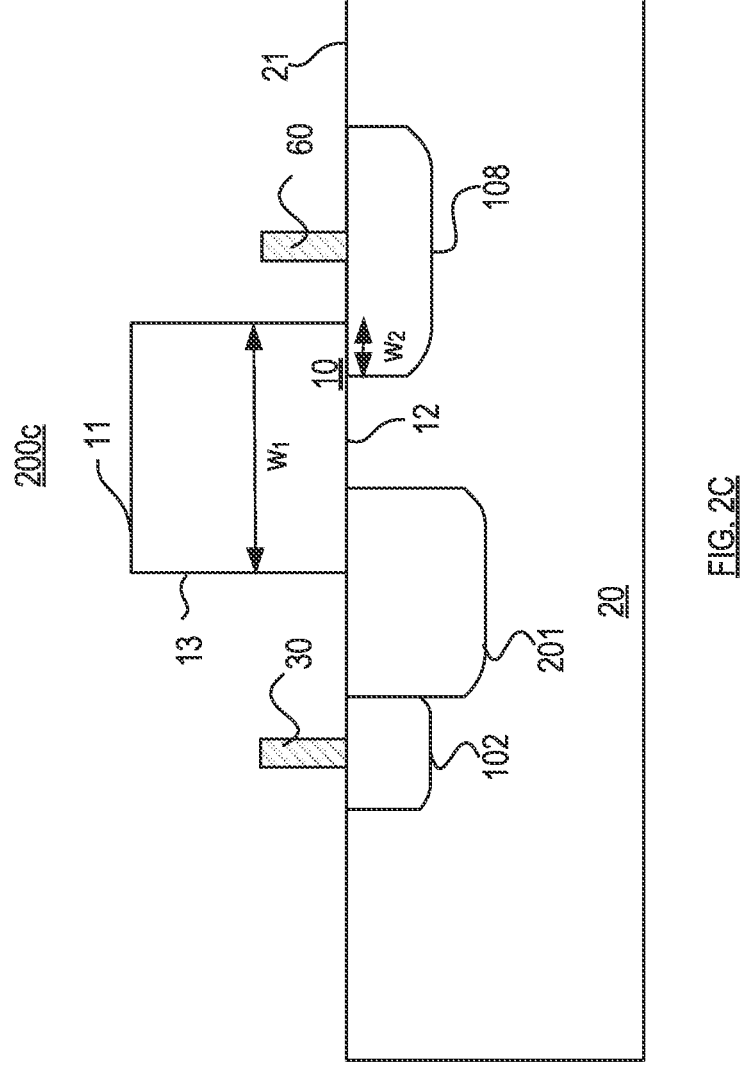

FIG. 2C illustrates a cross-sectional view of a photo-detecting device, according to some embodiments. The photo-detecting device 200c in FIG. 2C is similar to the photo-detecting device 200b in FIG. 2B. The difference is described below. The absorption region 10 is entirely over the substrate 20. A part of the second doped region 108 is covered by the absorption region 10. In some embodiments, a width w2 of the second doped region 108 covered by the absorption region may be greater than 0.2 μm. In some embodiments, the absorption region 10 has a width w1. The width $w_2$ is not greater than 0.5 $w_1$. By this design, two different types of the carriers can move from the absorption region 10 to the first doped region 102 and from the absorption region 10 to the second doped region 108 respectively without obstruction.

Figure 2D:
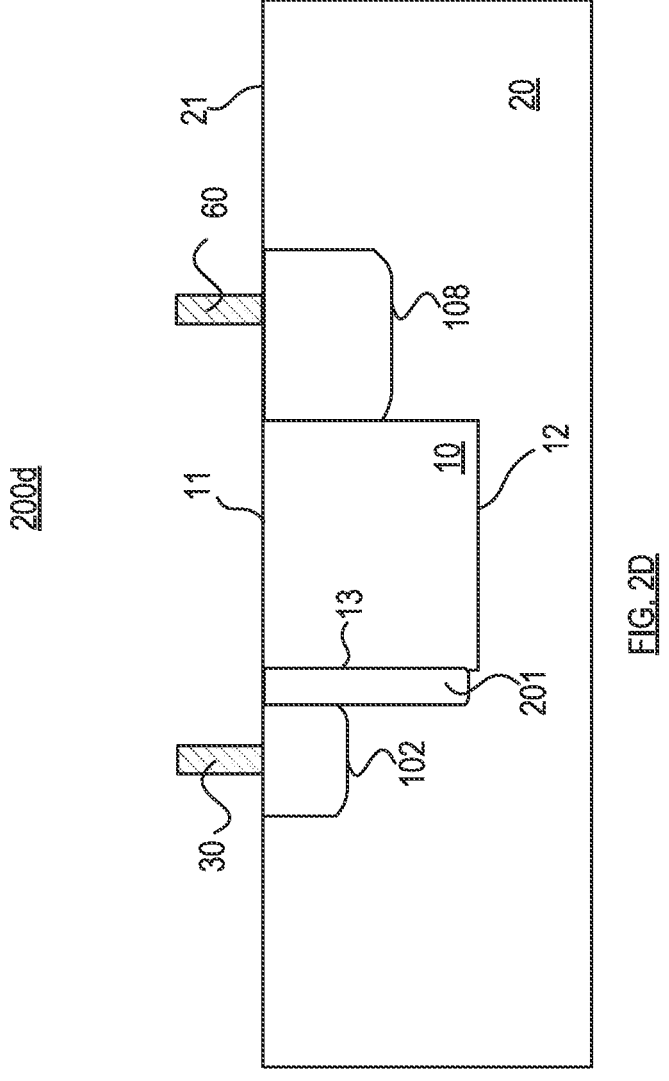
Figure 2E:
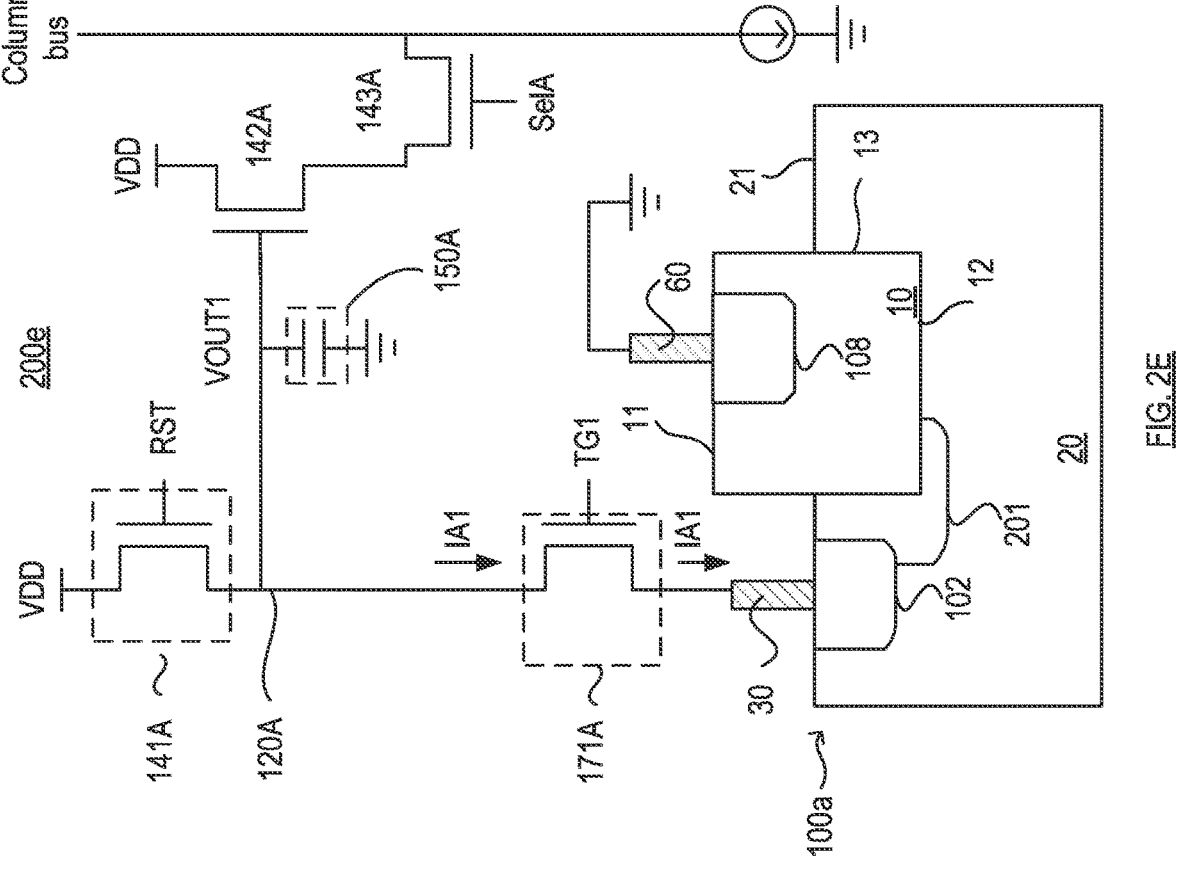
FIGS. 2E-2F show schematic diagrams of circuits of a photo-detecting apparatus, according to some embodiments.

FIG. 2D illustrates a cross-sectional view of a photo-detecting device, according to some embodiments. The photo-detecting device 200*d* in FIG. 2D is similar to the photo-detecting device 200*a* in FIG. 2A. The difference is described below. The absorption region 10 is entirely embedded in the substrate 20. In some embodiments, the graded doping profile of the first dopant is gradually and laterally decreased from the side surface 13 near the second doped region 108 to the side surface 13 near the conducting region 201. FIG. 2E shows a schematic diagram of a photo-detecting apparatus, according to some embodiments. The photo-detecting apparatus 200*e* includes a pixel (not labeled) and a column bus electrically coupled to the pixel. The pixel includes a photo-detecting device and a readout circuit (not labeled) electrically coupled to the photo-detecting device and the column bus. The photo-detecting device can be any photo-detecting device in FIG. 1A through FIG. 1D and FIG. 2A through FIG. 2D, for example, the photo-detecting device 100*a* in FIG. 1A. In some embodiments, the readout circuit (not labeled) and the column bus may be fabricated on another substrate and integrated/co-packaged with the photo-detecting device via die/wafer bonding or stacking. In some embodiments, the photo-detecting apparatus 200*e* includes a bonding layer (not shown) between the readout circuit and the photo-detecting device. The bonding layer may include any suitable material such as oxide or semiconductor or metal or alloy.

In some embodiments, the readout circuit can be electrically coupled to the first doped region 102 or the second doped region 108 to process the collected carriers with a first type, and a supply voltage or a ground voltage can be applied to the other doped region to evacuate other carriers with a second type opposite to the first type.

For example, if the first doped region 102 is of n-type and the second doped region 108 is of p-type, the readout circuit can be electrically coupled to the first doped region 102 for processing the collected electrons for further application, and a ground voltage can be applied to the second doped region 108 to evacuate holes. For another example, the readout circuit can also be electrically coupled to the second doped region 108 for processing the collected holes for further application, and a supply voltage can be applied to the first doped region 102 to evacuate electrons.

In some embodiments, the readout circuit may be in a three-transistor configuration consisting of a reset gate, a source-follower, and a selection gate, or in a four-transistor configuration including an additional transfer gate, or any suitable circuitry for processing collected charges. For example, the readout circuit includes a transfer transistor 171A, a reset transistor 141A, a capacitor 150A coupled to the reset transistor 141A, a source follower 142A, and a row selection transistor 143A. Examples of the capacitor 150A include, but not limited to, floating-diffusion capacitors, metal-oxide-metal (MOM) capacitors, metal-insulator-metal (MIM) capacitors, and metal-oxide-semiconductor (MOS) capacitors.

The transfer transistor 171A transfers carriers from the photo-detecting device 100*a* to the capacitor 150A. In other words, the transfer transistor 171A is configured to output the photo-current IA1 according to a switch signal TG1. When the switch signal TG1 turns on the transfer transistor 171A, the photo-current IA1 will be generated.

At the beginning, the reset signal RST resets the output voltage VOUT1 to VDD. Then, when the switch signal TG1 turns on the transfer transistor 171A, the photo-current IA1 is generated, the output voltage VOUT1 on the capacitor 150A will drop until the switch signal TG1 turns off the transistor 171A.

In some other embodiments, the readout circuit may be fabricated on another substrate and integrated/co-packaged with the photo-detecting device 100*a* via die/wafer bonding or stacking.

In some embodiments, the photo-detecting apparatus is an CMOS image sensor is operated at a frame rate not more than 1000 frames per second fps.

Figure 2F:
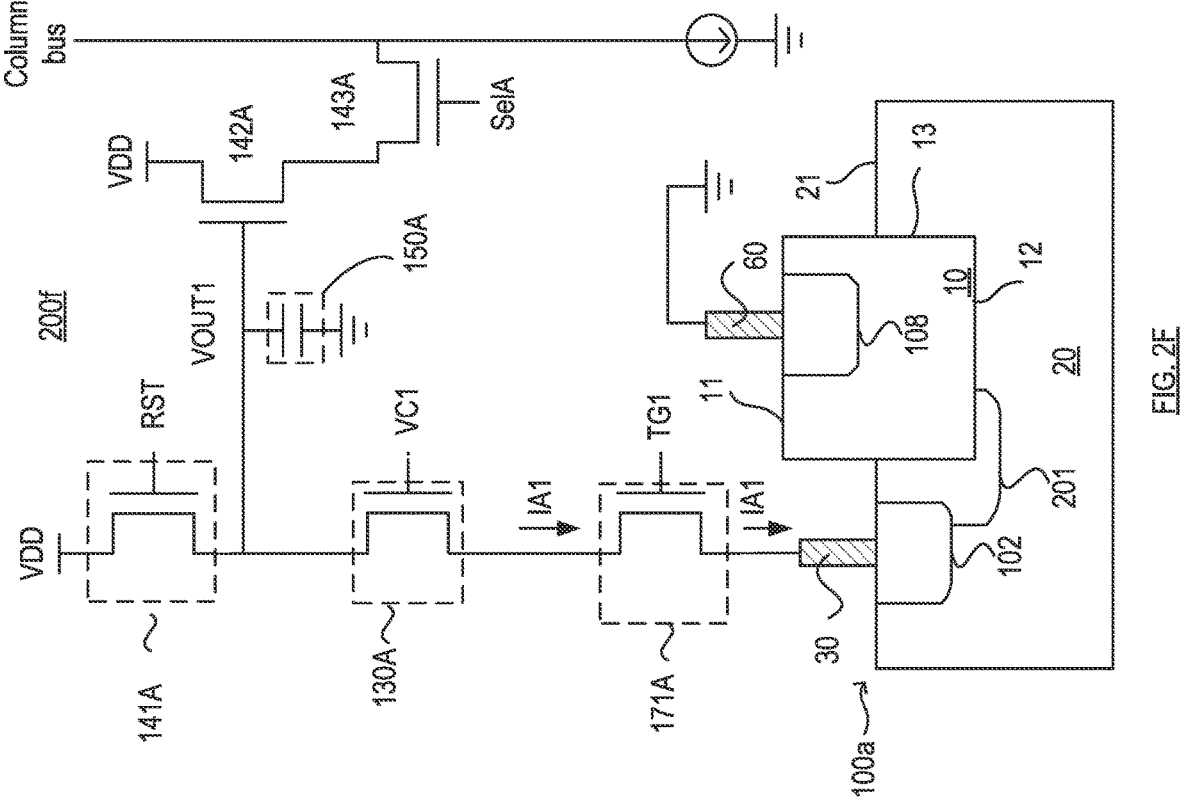

FIG. 2F shows a schematic diagram of circuits of a photo-detecting apparatus, according to some embodiments. The photo-detecting apparatus 200*f* is similar to the photo-detecting apparatus 200*e* in FIG. 2E. The difference is described below.

The readout circuit of the photo-detecting apparatus 200*f* further includes a voltage-control transistor 130A between the transfer transistor 171A and the capacitor 150A. The voltage-control transistor 130A is configured as a current buffer. Specifically, an output terminal of the voltage-control transistor 130A is coupled to the input terminal of the capacitor 150A, and the input terminal of the voltage-control transistor 130A is coupled to the output terminal of the transistor 171A. The control terminal of the voltage-control transistor 130A is coupled to a control voltage VC1.

Since the voltage-control transistor 130A is coupled between the transfer transistor 171A and the capacitor 150A, the output terminal of the transfer transistor 171A and the input terminal of capacitor 150A are separated. When the voltage-control transistor 130A is operated in a subthreshold or saturation region, the output terminal of the transfer transistor 171A can be controlled or biased at a constant voltage VA1 to reduce the dark current generated by the photo-detecting device 100*a*.

Figure 3A:
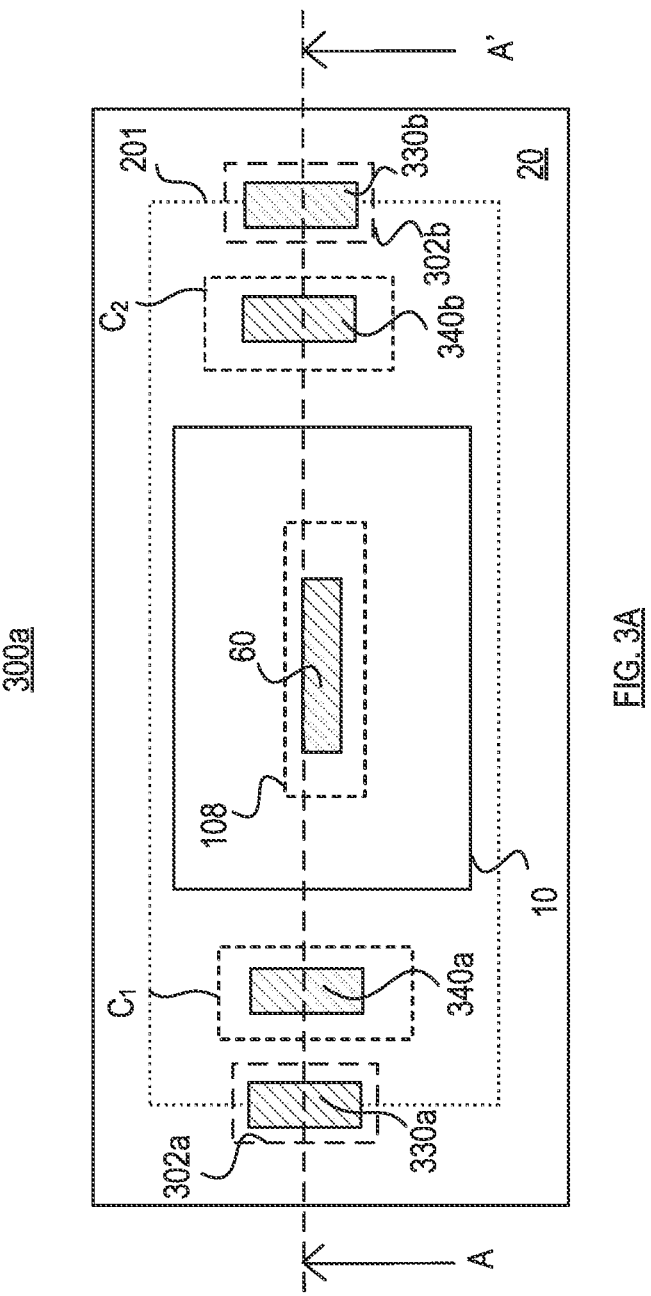
FIG. 3A illustrates a top view of a photo-detecting device, according to some embodiments.
Figure 3B:
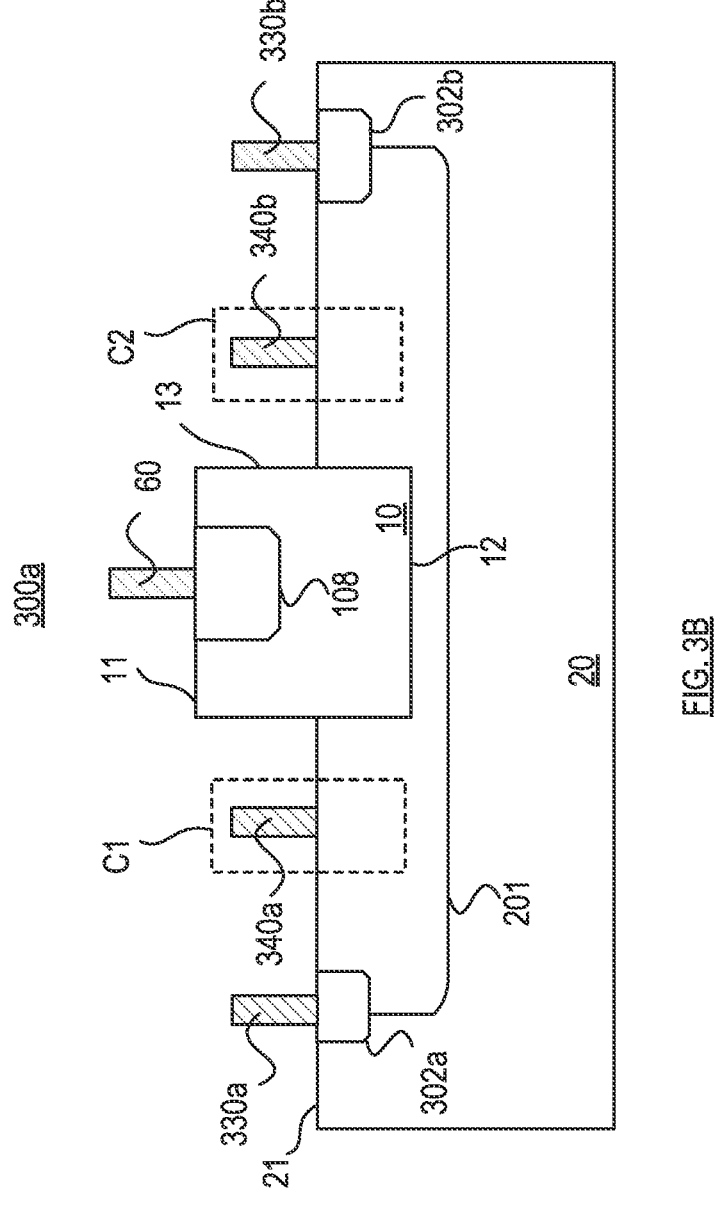
FIG. 3B illustrates a cross-sectional view along an A-A' line in FIG. 3A, according to some embodiments.

FIG. 3A illustrates a top view of a photo-detecting device, according to some embodiments. FIG. 3B illustrates a cross-sectional view along an A-A' line in FIG. 3A, according to some embodiments. The photo-detecting device includes an absorption region 10 and a substrate 20 supporting the absorption region 10. The absorption region 10 is similar to the absorption region as described in FIG. 1A. The substrate 20 is similar to the substrate 20 as described in FIG. 1A. The difference between the photo-detecting device 300*a* in FIG. 3A and the photo-detecting device 100*a* in FIG. 1A is described below. The photo-detecting device 300*a* includes a first switch (not labeled) and a second switch (not labeled) electrically coupled to the absorption region 10 and partially formed in the carrier conducting layer, that is the substrate 20 in some embodiments. The first switch includes a control region C1 including a control electrode 340*a*. The first switch further includes a readout electrode 330*a* separated from the control electrode 340*a*. The second switch includes a control region C2 including a control electrode 340*b*. The second switch further includes a readout electrode 330*b* separated from the control electrode 340*b*. In some embodiments, the readout electrodes 330*a*, 330*b*, and the control electrodes 340*a*, 340*b* are formed over a first surface 21 of the substrate 20 and are separated from the absorption region 10. In some embodiments, the readout electrode 330a and the readout electrode 330b are disposed at opposite sides of the absorption region 10. In some embodiments, a nearest distance between one of the control electrodes and the one or more side surfaces of the absorption region is between 0.1 μm and 20 μm.

In some embodiments, a photo-detecting apparatus includes a pixel including the photo-detecting device 300a as mentioned above, and the pixel further includes two control signals, for example, a first control signal and a second control signal, controlling the control regions C1, C2 respectively for controlling the moving direction of the electrons or holes generated by the absorbed photons in the absorption region 10. In some embodiments, the first control signal is different from the second control signal. For example, when voltages are used, if one of the control signals is biased against the other control signal, an electric field is created between the two portions right under the control electrodes 340a, 340b as well as in the absorption region 10, and free carriers in the absorption region 10 drift towards one of the portions right under the readout electrodes 330b 330a depending on the direction of the electric field. In some embodiments the first control signal includes a first phase, and the second control signal includes second phase, where the first control phase is not overlapped with the second control phase. In some embodiments, the first control signal is fixed at a voltage value V, and the second control signal is alternate between voltage values V±ᐃV. In some embodiments, ᐃV is generated by a varying voltage signal, e.g., sinusoid signal, clock signal or pulse signal operated between 0V and 3V. The direction of the bias value determines the drift direction of the carriers generated from the absorption region 10. The control signals are modulated signals.

In some embodiments, the first switch includes a first doped region 302a under the readout electrodes 330a. The second switch includes a first doped region 302b under the readout electrodes 330b. In some embodiments, the first doped regions 302a, 302b are of a conductivity type different from conductivity type of the absorption region 10. In some embodiments, the first doped regions 302a, 302b include a dopant and a dopant profile with a peak dopant concentration. In some embodiments, the peak doping concentrations of the first doped regions 302a, 302b are higher than the second peak doping concentration. In some embodiments, the peak dopant concentrations of the first doped regions 302a, 302b depend on the material of the readout electrodes 330a, 330b and the material of the substrate 20, for example, can be between $5 \times 10^{18}$ cm$^{-3}$ to $5 \times 10^{20}$ cm$^{-3}$. The first doped regions 302a, 302b are carrier collection regions for collecting the carriers with the first type generated from the absorption region 10 based on the control of the two control signals.

In some embodiments, the absorption function and the carrier control function such as demodulation of the carriers and collection of the carriers operate in the absorption region 10 and the carrier conducting layer, that is, the substrate 20 in some embodiments, respectively.

In some embodiments, the photo-detecting device 300a may include a second doped region 108 and a second electrode 60 similar to the second doped region 108 and the second electrode 60 respectively in FIG. 1A. The second doped region 108 is for evacuating the carriers of the second type opposite to the first type, which are not collected by the first doped regions 302a, 302b, during the operation of the photo-detecting device. In some embodiments, the control electrodes 340a is symmetric to the control electrode 340b with respect to an axis passing through the second electrode 60. In some embodiments, the readout electrode 330a is symmetric to the readout electrodes 330b with respect to an axis passing through the second electrode 60. The control electrodes 340a, 340b, the readout electrodes 330a, 330b and the second electrode 60 are all disposed over the of the first surface of the carrier conducting layer. That is, the control electrodes 340a, 340b, the readout electrodes 330a, 330b and the second electrode 60 are over a same side of the carrier conducting layer, that is the substrate 20 in some embodiment.

In some embodiments, the substrate 20 of the photo-detecting device 300a includes a conducting region 201 similar to the conducting region 201 as described in FIG. 1A. The difference is described below. In some embodiments, from a cross-sectional view of the photo-detecting device 300a, a width of the conducting region 201 can be greater than a distance between the two readout electrodes 330a, 330b. In some embodiments, the conducting region 201 is overlapped with the entire first doped regions 302a, 302b. In some embodiments, a width of the conducting region 201 can be less than a distance between the two readout electrodes 330a, 330b and greater than a distance between the two control electrodes 340a, 340b. In some embodiments, the conducting region 201 is overlapped with a portion of first doped region 302a and a portion of the first doped region 302b. Since the conducting region 201 is overlapped with at least a portion of first doped region 302a and at least a portion of the first doped region 302b, the carriers with a first type that are generated from the absorption region 10 can be confined in the conducting region 201 and move towards one of the first doped regions 302a, 302b based on the control of the two control signals. For example, if the first doped regions 302a, 302b are of n-type, the conducting region 201 is of n-type, the second doped region 108 is p-type, the electrons generated from the absorption region 10 can be confined in the conducting region 201 and move towards one of the first doped regions 302a, 302b based on the control of the two control signals, and the holes can move towards the second doped region 108 and can be further evacuated by a circuit.

In some embodiments, the photo-detecting apparatus includes a pixel array including multiple repeating pixels. In some embodiments, the pixel array may be a one-dimensional or a two-dimensional array of pixels.

A photo-detecting device in accordance to a comparative example includes structures substantially the same as the structures of a photo-detecting device 300a in FIG. 3A, the difference is that in the photo-detecting device of the comparative example, the doping concentration of the absorption region 10 is not higher than the second peak doping concentration of the substrate 20 and the doping concentration of the second dopant at the heterointerface is not lower than the doping concentration of the first dopant at the heterointerface.

The details of the photo-detecting device in accordance to a comparative example and the photo-detecting device 300a are listed in Table 7 and Table 8.

TABLE 7

Details of the photo-detecting device
in accordance to a comparative example

| | |
|---|---|
| Conductivity type of the absorption region | p-type, |
| First peak doping concentration | $1 \times 10^{15}$ cm-3 |
| Conductivity type of the substrate | n-type |

TABLE 7-continued

| Details of the photo-detecting device in accordance to a comparative example | |
| --- | --- |
| Second peak doping concentration | $1 \times 10^{15}$ cm-3 |
| Reference photocurrent | $1 \times 10^{-6}$ A |

TABLE 8

| Details of the photo-detecting device 300a | |
| --- | --- |
| Conductivity type of the absorption region | p-type, |
| First peak doping concentration | $1 \times 10^{17}$ cm$^{-3}$ |
| Conductivity type of the substrate | n-type |
| Second peak doping concentration | $1 \times 10^{15}$ cm-3 |
| Photocurrent | Referring to Table 10 |

Referring to Table 9 and Table 10, compared to the comparative example, since the first peak doping concentration of the absorption region 10 in the photo-detecting device 300a is higher than the second peak doping concentration of the substrate 20, the photo-detecting device 300a can have lower dark current, for example, at least 100 times lower.

TABLE 9

| Results of the comparative example | | | |
| --- | --- | --- | --- |
| Current measured at: | second electrode 60 @ 0 V | control electrode 330b @ 3.2 V | readout electrode 340b @3.3 V |
| Without incident light | ~L | ~L | ~D |
| With incident light | ~L | ~L | ~P |

Unit: Arbitrary Unit

TABLE 10

| Results of the photo-detecting device 300a | | | |
| --- | --- | --- | --- |
| Current measured at: | second electrode 60 @ 0 V | control electrode 330b @ 3.2 V | readout electrode 340b @ 3.3 V |
| Without incident light | ~10L | ~10L | ~0.01D |
| With incident light | ~10L | ~10L | ~0.9P |

Unit: Arbitrary Unit

In some embodiments, a voltage can be applied to the second electrode 60. In some embodiments, the voltage applied to the second electrode 60 can reduce a leakage current between the second doped region 108 and the control regions C1, C2. In some embodiment, the voltage is between the voltage applied to the control electrode 340a and the voltage applied to the control electrode 340b when operating the photo-detecting device 300a.

Figure 4A:
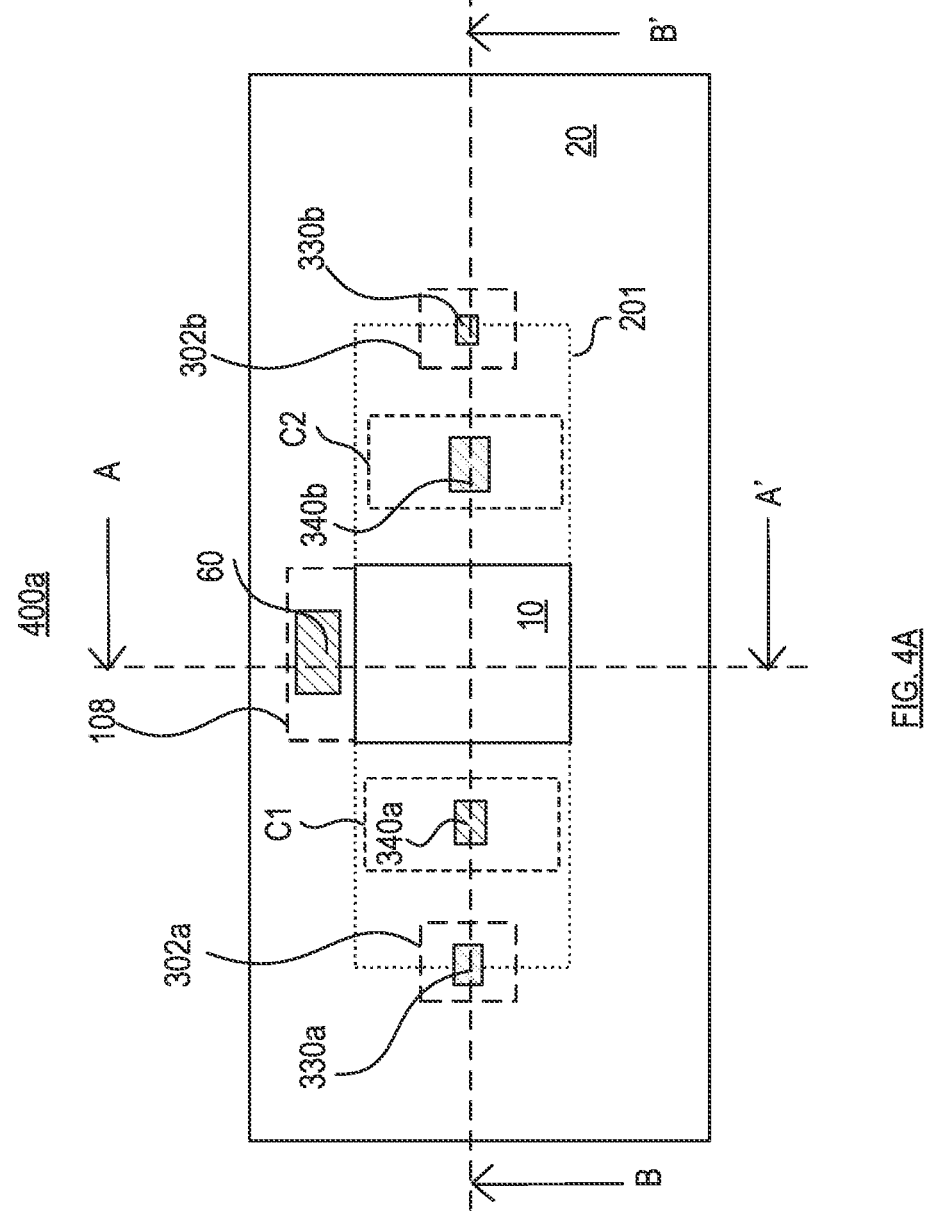
FIG. 4A illustrates a top view of a photo-detecting device, according to some embodiments.
Figure 4B:
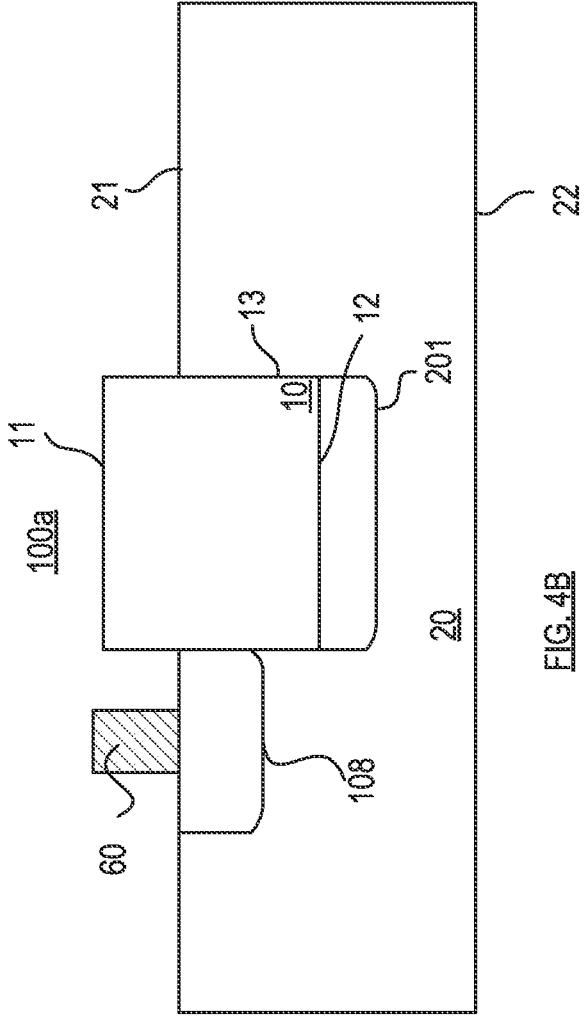
FIG. 4B illustrates a cross-sectional view along an A-A' line in FIG. 4A, according to some embodiments.
Figure 4C:
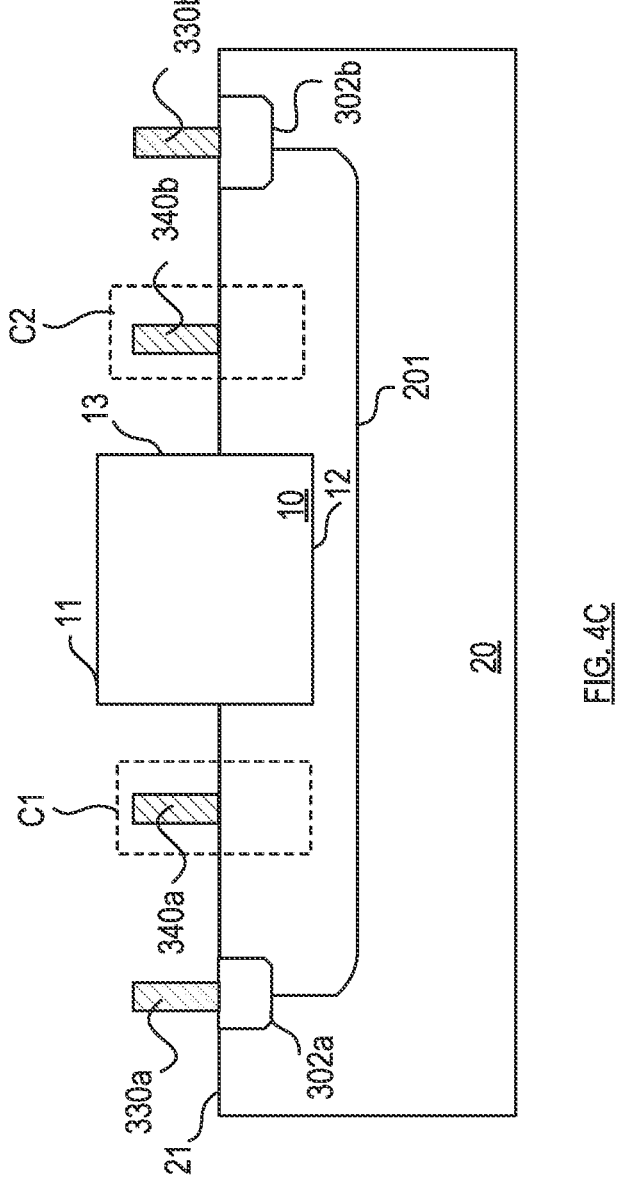
FIG. 4C illustrates a cross-sectional view along a B-B' line in FIG. 4A, according to some embodiments.

FIG. 4A illustrates a top view of a photo-detecting device, according to some embodiments. FIG. 4B illustrates a cross-sectional view along an A-A' line in FIG. 4A, according to some embodiments. FIG. 4C illustrates a cross-sectional view along a B-B' line in FIG. 4A, according to some embodiments. The photo-detecting device 400a in FIG. 4A is similar to the photo-detecting device 300a in FIG. 3A. The difference is described below.

Referring to FIG. 4A and FIG. 4B, the second doped region 108 is in the substrate 20. In other words, the fourth peak doping concentration of the second doped region 108 lies in the substrate 20. The second doped region 108 is below the first surface 21 of the substrate 20 and is in direct contact with the absorption region 10, for example, the second doped region 108 may be in contact with or over-lapped with one of the side surfaces 13 of the absorption region 10. As a result, the carriers with the second type, which are not collected by the first doped regions 302a, 302b, can move from the absorption region 10 towards the second doped region 108 through the heterointerface between the absorption region 10 and the substrate 20.

For example, if the first doped regions 302a, 302b are of n-type, the conducting region 201 is of n-type, the second doped region 108 is p-type, the electrons generated from the absorption region 10 can be confined in the conducting region 201 and move towards one of the first doped regions 302a, 302b based on the control of the two control signals, and the holes can move towards the second doped region 108 through the heterointerface between the absorption region 10 and the substrate 20 and can be further evacuated by a circuit.

The second electrode 60 is over the first surface 21 of the substrate 20. By having the second doped region 108 in the substrate 20 instead of in the absorption region 10, the second electrode 60, the readout electrodes 330a, 330b, and the control electrodes 340a, 340b can all be coplanarly formed above the first surface 21 of the substrate 20. Therefore, a height difference between any two of the second electrode 60 and the four electrodes 330a, 330b, 340a, 340b can be reduced and thus the fabrication process afterwards will be benefit from this design. Besides, the area of the absorption region 10 absorbing the optical signal can be larger.

Figure 5A:
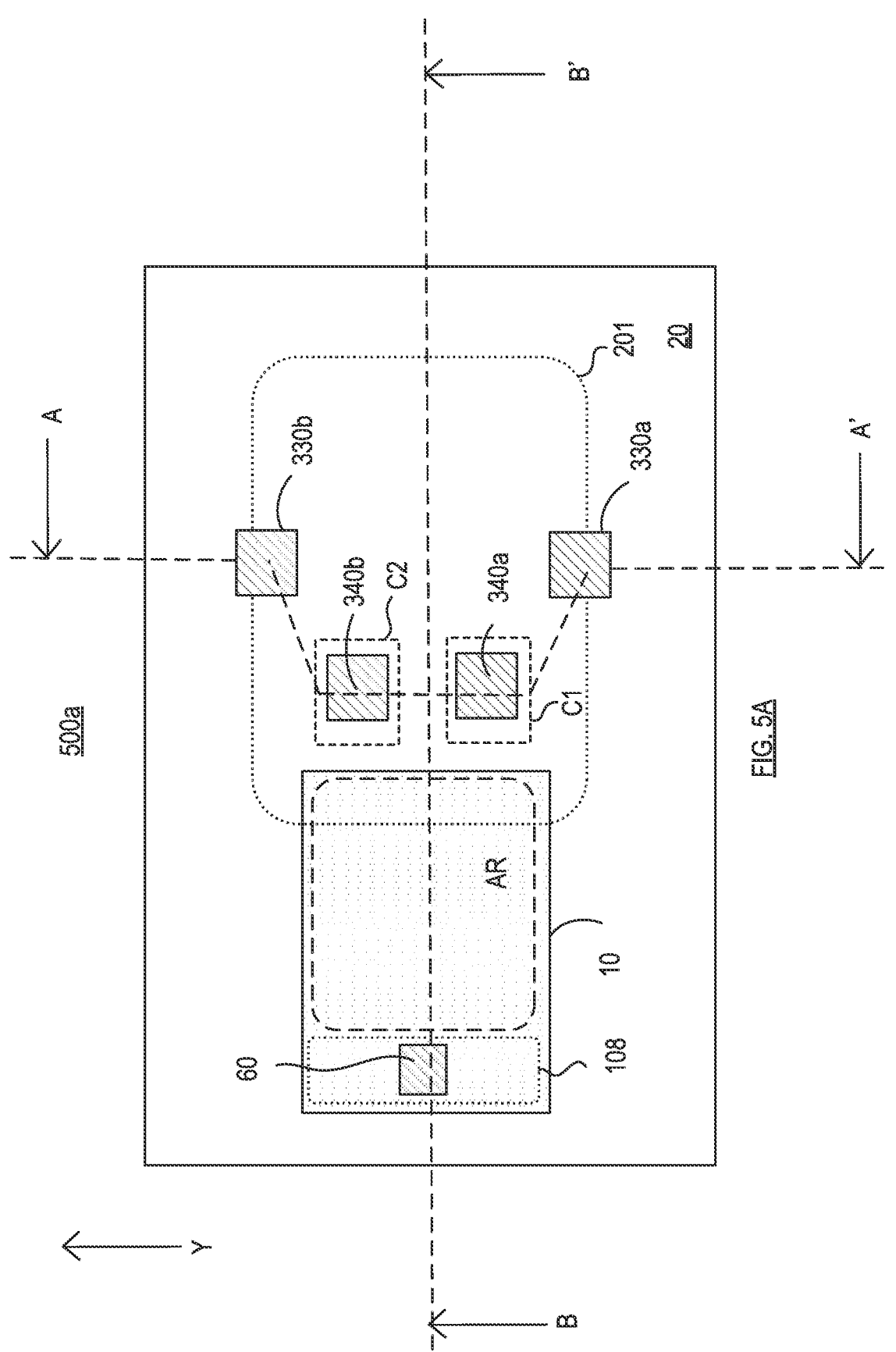
FIG. 5A illustrates a top view of a photo-detecting device, according to some embodiments.
Figure 5B:
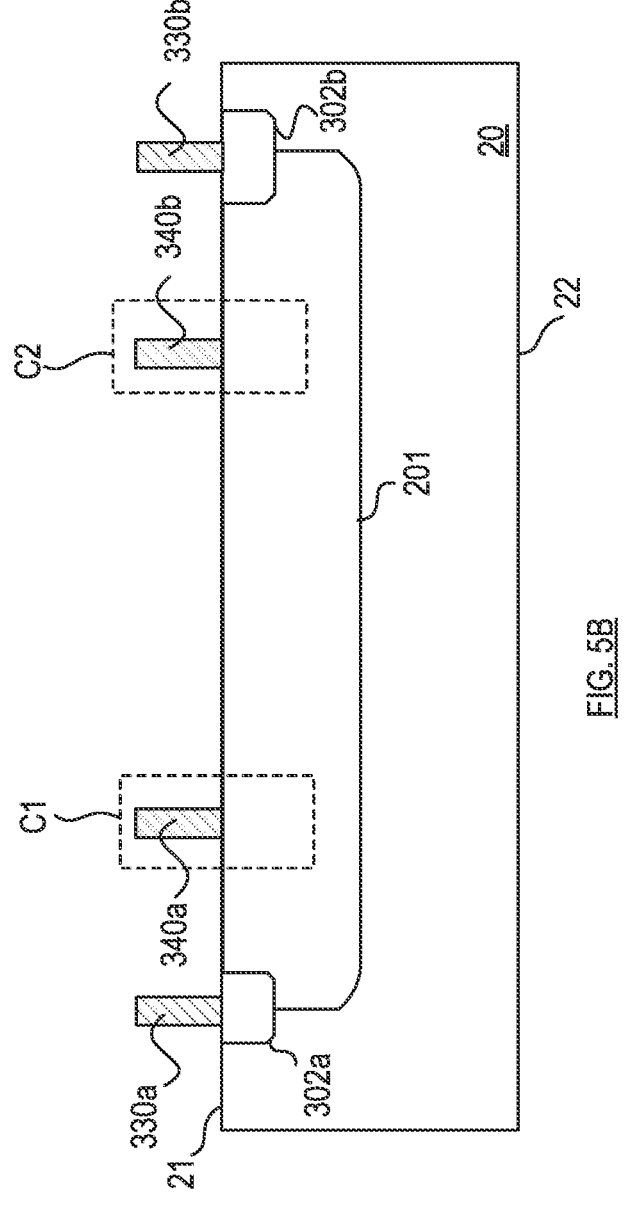
FIG. 5B illustrates a cross-sectional view along an A-A' line in FIG. 5A, according to some embodiments.
Figure 5C:
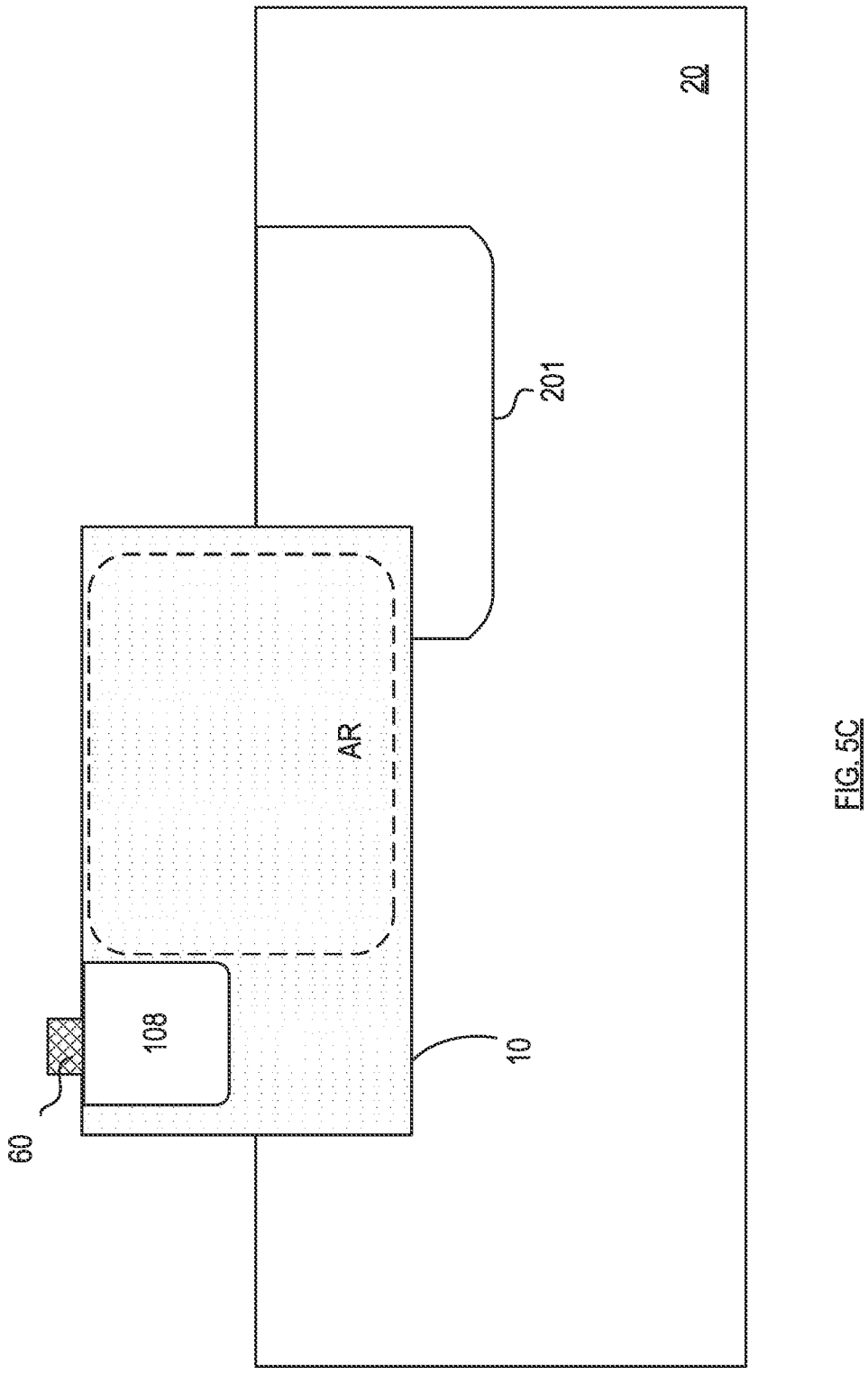
FIG. 5C illustrates a cross-sectional view along a B-B' line in FIG. 4A, according to some embodiments.

FIG. 5A illustrates a top view of a photo-detecting device, according to some embodiments. FIG. 5B illustrates a cross-sectional view along an A-A' line in FIG. 5A, according to some embodiments. FIG. 5C illustrates a cross-sectional view along a B-B' line in FIG. 5A, according to some embodiments. The photo-detecting device 500a in FIG. 5A is similar to the photo-detecting device 400a in FIG. 4A. The difference is described below. The readout electrodes 330a, 330b and the control electrodes 340a, 340b are disposed at the same side of the absorption region 10, which improves the contrast ratio of the photo-detecting device 400a since the carriers are forced to move out from the absorption region 10 through one of the side surfaces 13. In some embodiments, the distance between the readout electrodes 330a, 330b along a direction Y can be greater than the distance between the control electrodes 340a, 340b along the direction Y. In some embodiments, the distance between the readout electrodes 330a, 330b along a direction Y can be substantially the same as the distance between the control electrodes 340a, 340b along the direction Y.

Figure 6A:
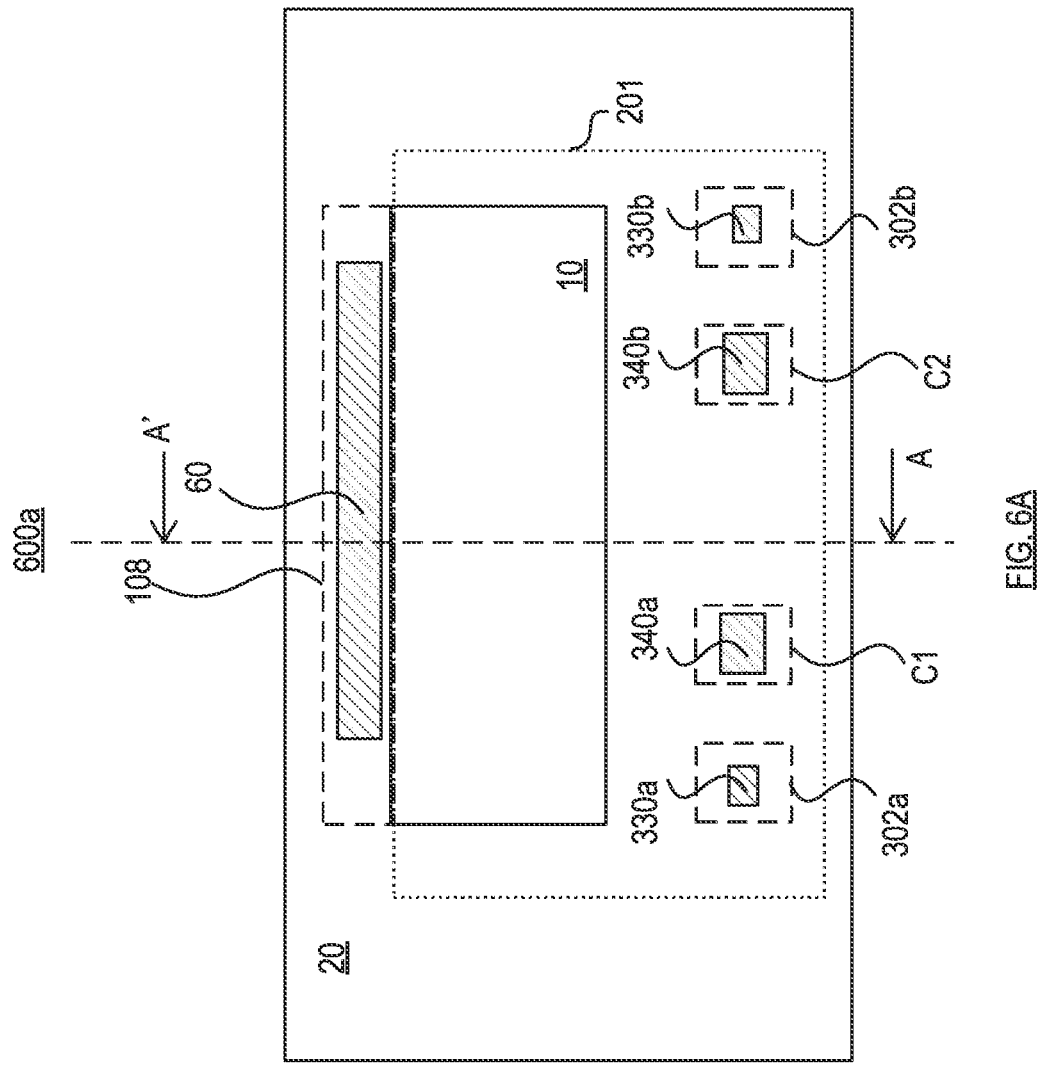
FIG. 6A illustrates a top view of a photo-detecting device, according to some embodiments.
Figure 6B:
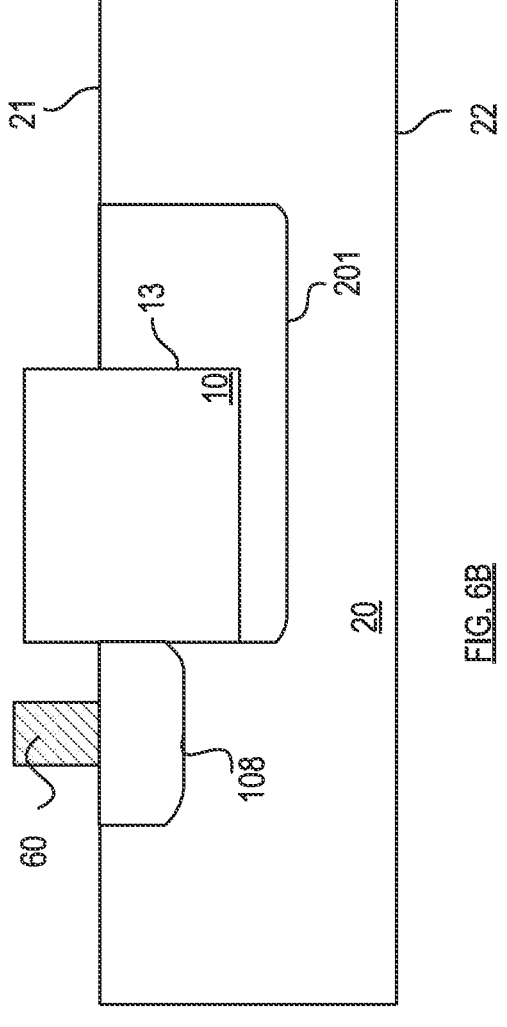
FIG. 6B illustrates a cross-sectional view along an A-A' line in FIG. 6A, according to some embodiments.

FIG. 6A illustrates a top view of a photo-detecting device, according to some embodiments. FIG. 6B illustrates a cross-sectional view along an A-A' line in FIG. 6A, according to some embodiments. The photo-detecting device 600a in FIG. 6A is similar to the photo-detecting device 500a in FIG. 5A, for example, the readout electrodes 330a, 330b and the control electrodes 340a, 340b are disposed at the same side of the absorption region 10. The difference is described below.

Referring to FIG. 6A and FIG. 6B, the second doped region 108 is in the substrate 20. In other words, the fourth peak doping concentration of the second doped region 108 lies in the substrate 20. The second doped region 108 is below the first surface 21 of the substrate 20 and is in direct contact with the absorption region 10, for example, the second doped region 108 may be in contact with or overlapped with one of the side surfaces 13 of the absorption region 10. As a result, the carriers with the second type, which are not collected by the first doped regions 302a, 302b, can move from the absorption region 10 towards the second doped region 108 through the heterointerface between the absorption region 10 and the substrate 20. The second electrode 60 is over the first surface 21 of the substrate 20. The absorption region 10 is between the second electrode 60 and the four electrodes 330a, 330b, 340a, 340b.

By having the second doped region 108 in the substrate 20 instead of in the absorption region 10, the second electrode 60 and the four electrodes 330a, 330b, 340a, 340b can both be coplanarly formed above the first surface 21 of the substrate 20. Therefore, a height difference between any two of the second electrode 60 and the four electrodes 330a, 330b, 340a, 340b can be reduced and thus the fabrication process afterwards will be benefit from this design. Besides, the area of the absorption region 10 absorbing the optical signal can be larger.

In some embodiments, the conducting region 201 can be overlapped with the entire first doped regions 302a, 302b.

Figure 6C:
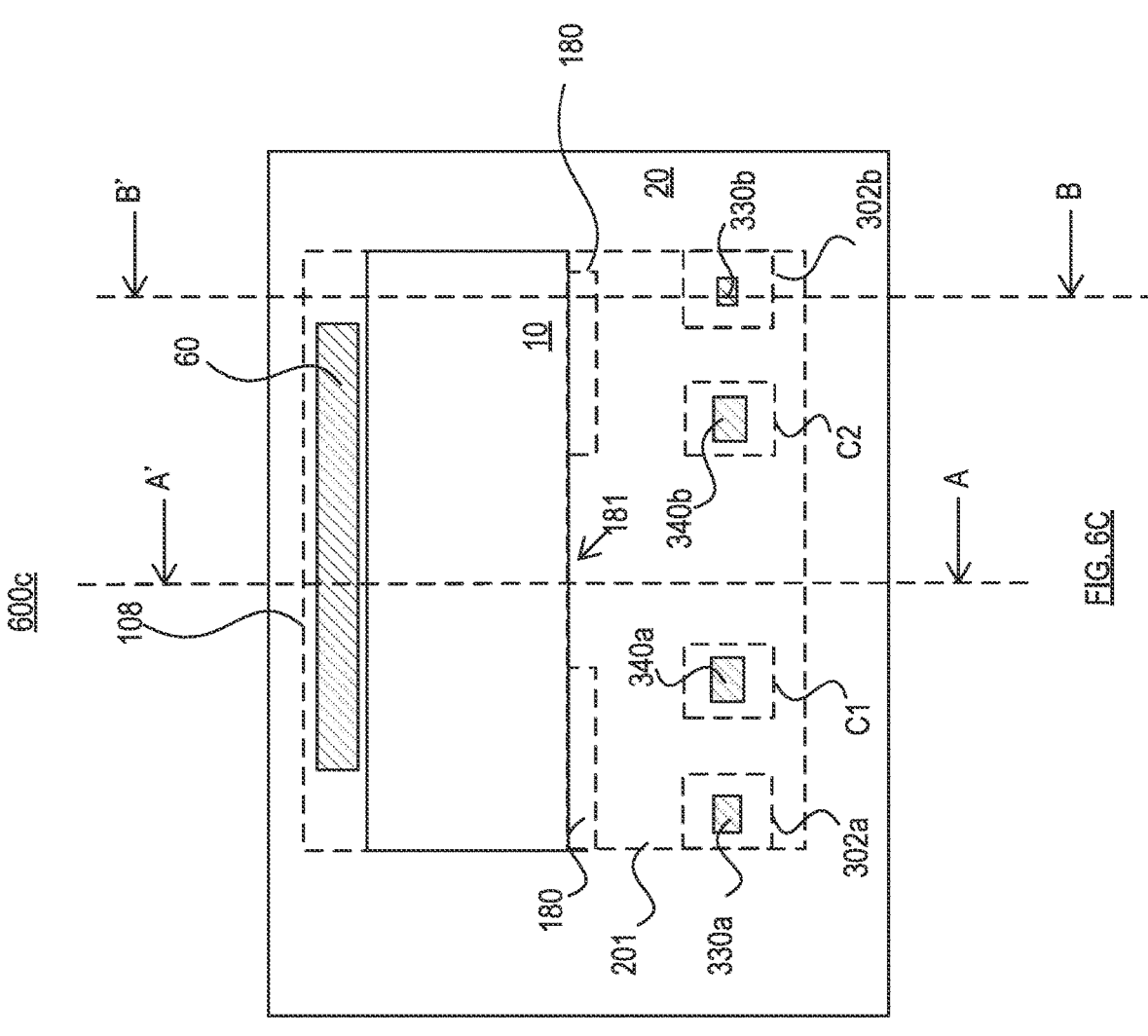
FIG. 6C illustrates a top view of a photo-detecting device, according to some embodiments.
Figure 6D:
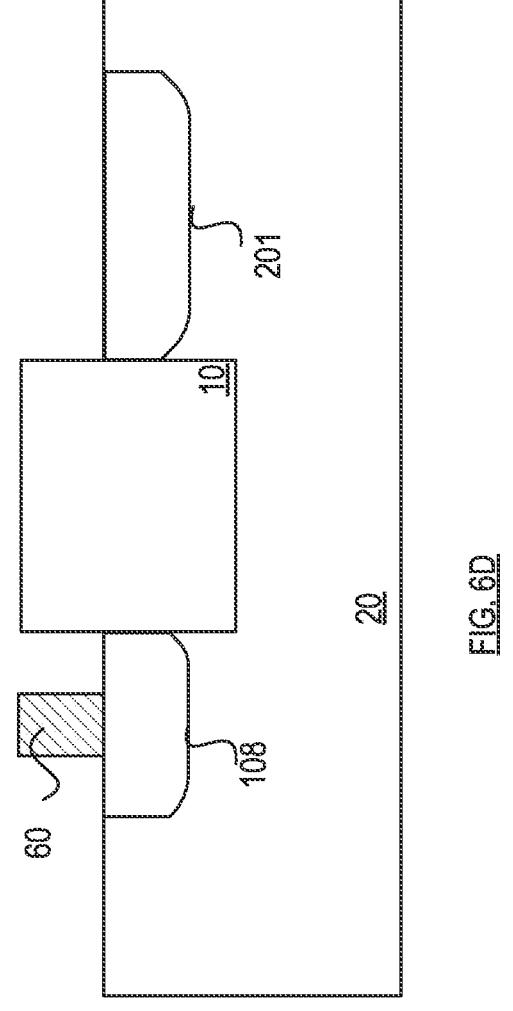
FIG. 6D illustrates a cross-sectional view along an A-A' line in FIG. 6C, according to some embodiments.
Figure 6E:
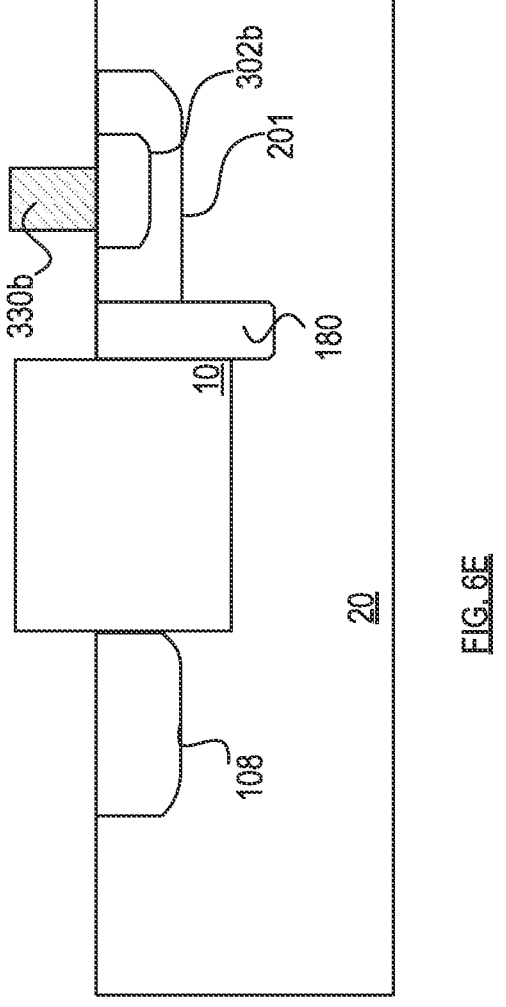
FIG. 6E illustrates a cross-sectional view along a B-B' line in FIG. 6C, according to some embodiments.

FIG. 6C illustrates a top view of a photo-detecting device, according to some embodiments. FIG. 6D illustrates a cross-sectional view along an A-A' line in FIG. 6C, according to some embodiments. FIG. 6E illustrates a cross-sectional view along a B-B' line in FIG. 6C, according to some embodiments. The photo-detecting device 600c in FIG. 6C is similar to the photo-detecting device 600a in FIG. 6A, the difference is described below. The photo-detecting device 600c further includes a confined region 180 between the absorption region 10 and the first doped regions 302a, 302b to cover at least a part of the heterointerface between the absorption region 10 and the substrate 20. The confined region 180 has a conductivity type different from the conductivity type of the first doped regions 302a, 302b. In some embodiments, the confined region 180 includes a dopant having a peak doping concentration. The peak doping concentration is equal to or greater than $1 \times 10^{16}$ cm$^{-3}$. The conducting region 201 has a channel 181 formed through the confined region 180, so as to keep a part of the conducting region 201 in direct contact with the absorption region 10 for allowing photo-carriers to move from the absorption region 10 towards the first doped regions 302a, 302b. That is, the channel 181 is not covered by the confined region 180. In some embodiments, the peak doping concentration of the confined region 180 is lower than the second peak doping concentration of the conducting region 201. In some embodiments, the peak doping concentration of the confined region 180 is higher than the second peak doping concentration of the conducting region 201. For example, when the photo-detecting device is configured to collect electrons, the confined region 180 is of p-type, and the first doped regions 302a, 302b. are of n-type. After the photo-carriers are generated from the absorption region 10, the holes will be evacuated through the second doped region 108 and the second electrode 60, and the electrons will be confined by the confined region 180 and move from the absorption region 10 towards one of the first doped regions 302a, 302b through the channel 181 instead of moving out from the whole heterointerface between the absorption region 10 and the substrate 20. Accordingly, the photo-detecting device 600c can have improved demodulation contrast by including the confined region 180 between the absorption region 10 and the first doped regions 302a, 302b.

Figure 6F:
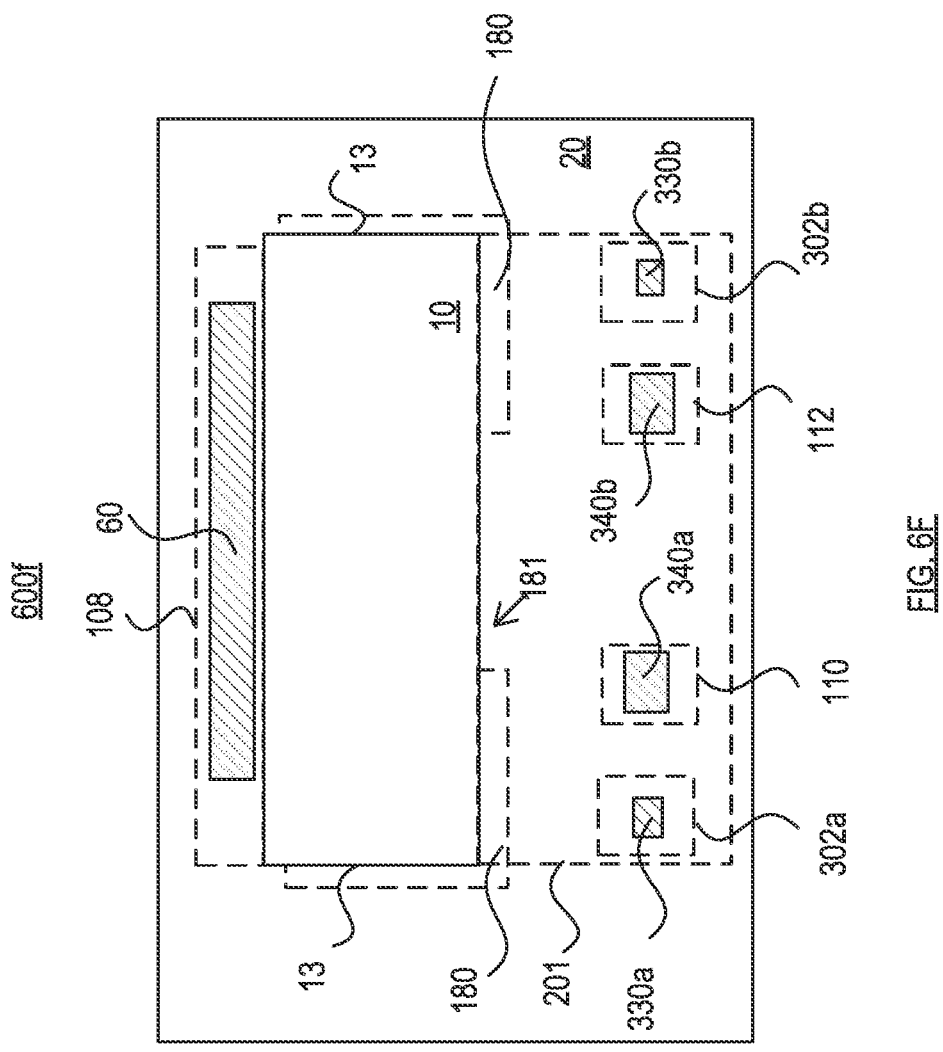
FIG. 6F illustrates a top view of a photo-detecting device, according to some embodiments.

FIG. 6F illustrates a top view of a photo-detecting device, according to some embodiments. The photo-detecting device 600f in FIG. 6F is similar to the photo-detecting device 600c in FIG. 6C. The difference is that the confined region 180 is extended to cover two other side surfaces 13 of the absorption region 10 to further confine the carriers to pass through the channel 181 at one of the side surfaces 13 of the absorption region 10 instead of moving out from other side surfaces 13 of the absorption region 10. In some embodiments, the peak doping concentration of the confined region 180 is lower than the peak doping concentration of the second doped region 108. In some embodiments, the confined region 180 and the second doped region 108 are formed by two different fabrication process steps, such as using different masks.

Figure 6G:
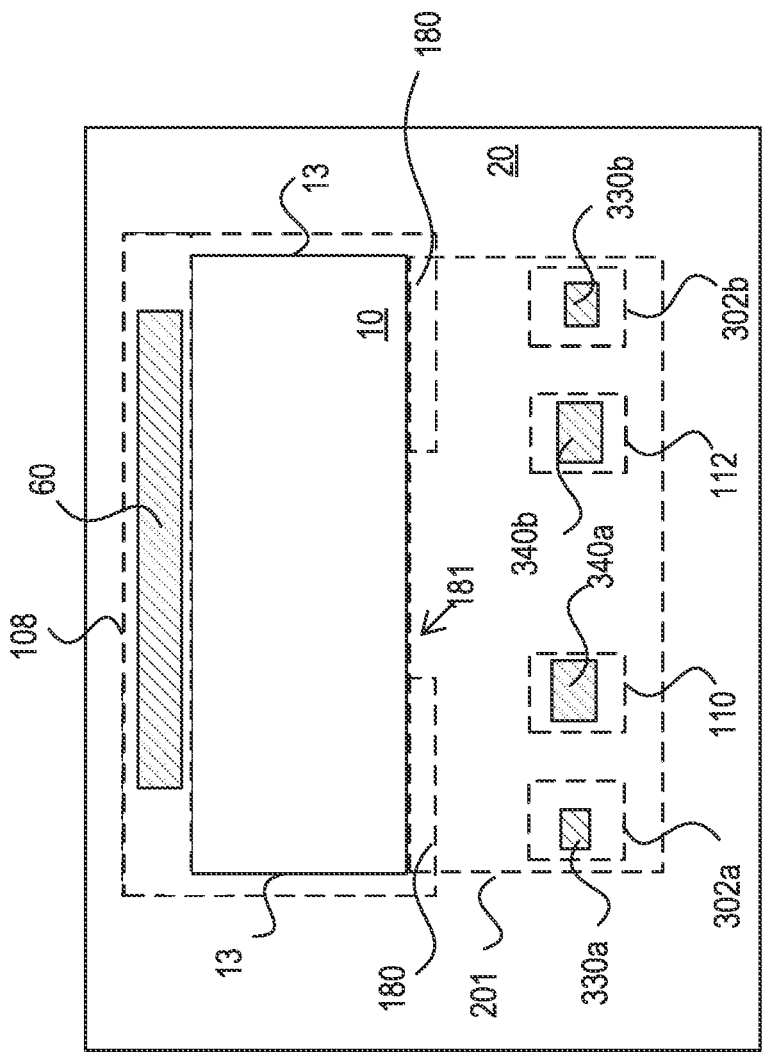
FIG. 6G illustrates a top view of a photo-detecting device, according to some embodiments.

FIG. 6G illustrates a top view of a photo-detecting device, according to some embodiments. The photo-detecting device 600g in FIG. 6G is similar to the photo-detecting device 600f in FIG. 6F. The difference is the second doped region 108 may function as the confined region 180 described in FIG. 6F. In other words, the second doped region 108 can both evacuate the carriers not collected by the first doped regions 302a, 302b and confine the carriers to be collected from the absorption region 10 towards one of the first doped regions 302a, 302b through the channel 181 at one of the side surfaces 13 instead of moving out from other side surfaces 13 of the absorption region 10.

Figure 7A:
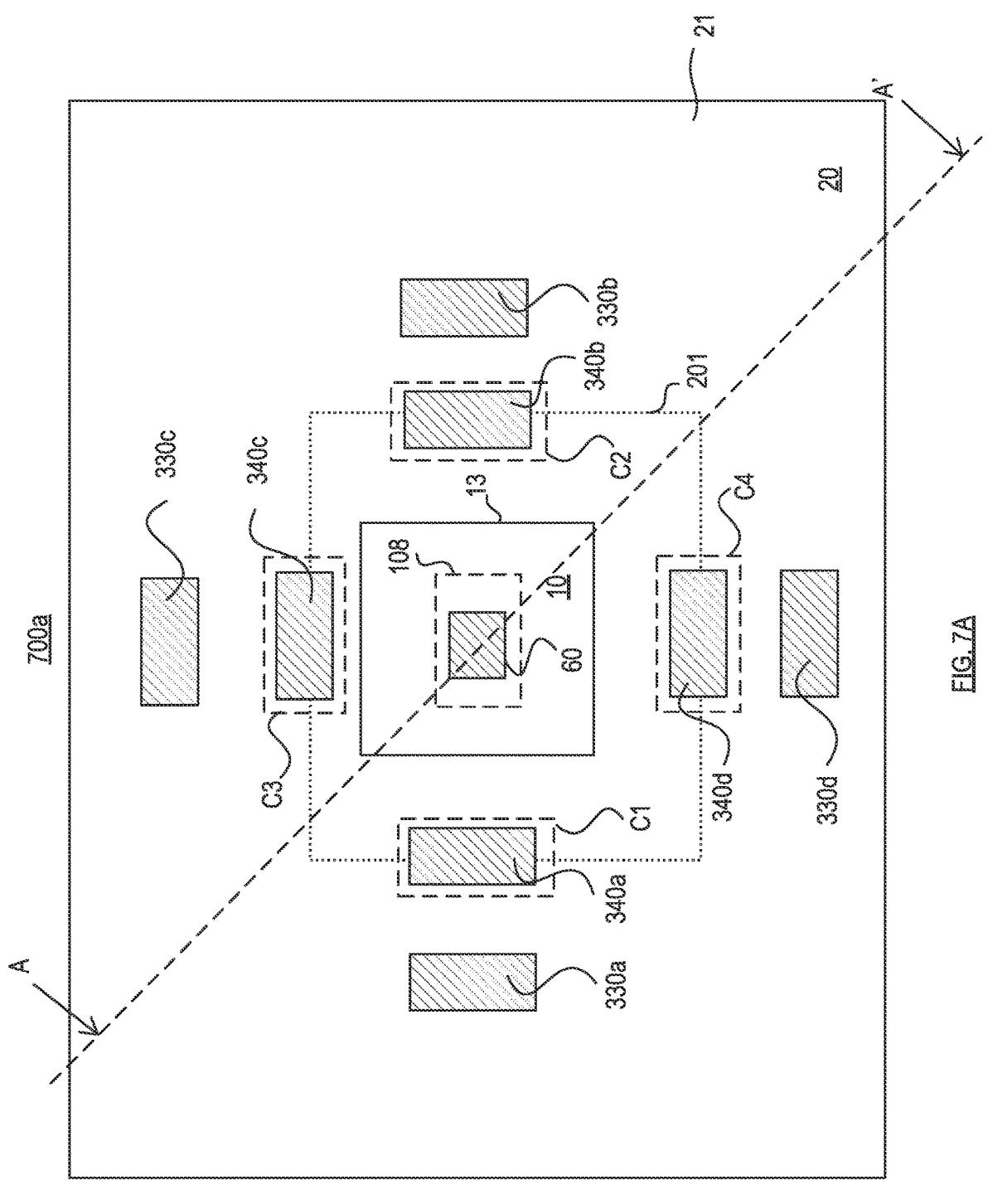
FIG. 7A illustrates a top view of a photo-detecting device, according to some embodiments.
Figure 7B:
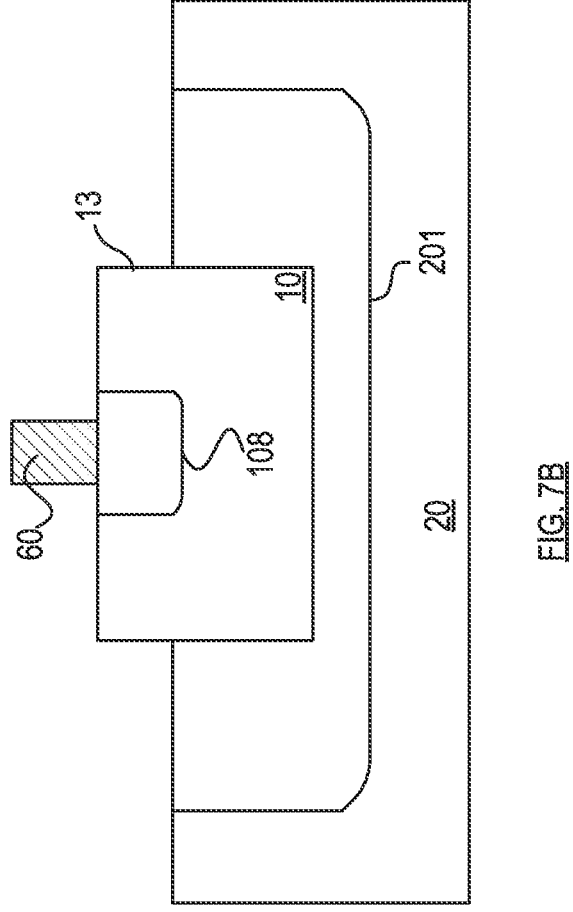
FIG. 7B illustrates a cross-sectional view along an A-A' line in FIG. 7A, according to some embodiments.

FIG. 7A illustrates a top view of a photo-detecting device, according to some embodiments. FIG. 7B illustrates a cross-sectional view along an A-A' line in FIG. 7A, according to some embodiments. The photo-detecting device 700a is similar to the photo-detecting device 300a in FIG. 3A. The difference is described below. In some embodiments, the photo-detecting device includes N switches electrically coupled to the absorption region 10 and partially formed in the substrate 20, where N is a positive integer and is >3. For example, N may be 3, 4, 5, etc. In some embodiments, the pixel of the photo-detecting apparatus further includes Y control signals different from each other, wherein $3 \le Y \le N$ and Y is a positive integer, each of the control signal controls one or more of the control regions of the photo-detecting device 700a. In some embodiments, each of the control signals includes a phase, where the phase of one of the control signals is not overlapped with the phase of another control signal of the control signals. Referring to FIGS. 7A and 7B, in some embodiments, the photo-detecting device 700a includes four switches (not labeled) electrically coupled to the absorption region 10 and partially formed in the substrate 20. Each of the switches includes a control region C1, C2, C3, C4 including a control electrode 340a, 340b, 340c, 340d. Each of the switches further includes a readout electrode 330a, 330b, 330c, 330d separated from the control electrode 340a, 340b, 340c, 340d. In some embodiments, the readout electrodes 330a, 330b, 330c, 330d and the control electrodes 340a, 340b, 340c, 340d are formed over a first surface 21 of the substrate 20 and are separated from the absorption region 10.

In some embodiments, the four switches are disposed at four side surfaces 13 respectively.

In some embodiments, each of the switched includes a first doped region (not shown) under the readout electrodes 330a, 330b, 330c, 330d, the first doped regions are similar to the first doped region 302a, 302b as described in FIG. 3A.

In some embodiments, the pixel of the photo-detecting apparatus includes four control signals for controlling the control regions C1, C2, C3, C4 respectively so as to control the moving direction of the electrons or holes generated by the absorption region 10. For example, when voltages are used, if the control signal controlling the control region C1 is biased against other control signals, an electric field is created between the four portions right under the control electrodes 340a, 340b, 340c, 340d as well as in the absorption region 10, and free carriers in the absorption region 10 drift towards one of the first doped regions under the readout electrodes 330a, 330b, 330c, 330d depending on the direction of the electric field. In some embodiments, each of the control signals has a phase not overlapped by the phase of one another.

In some embodiments, the conducting region 201 can be in any suitable shape, such as rectangle or square.

Figure 7C:
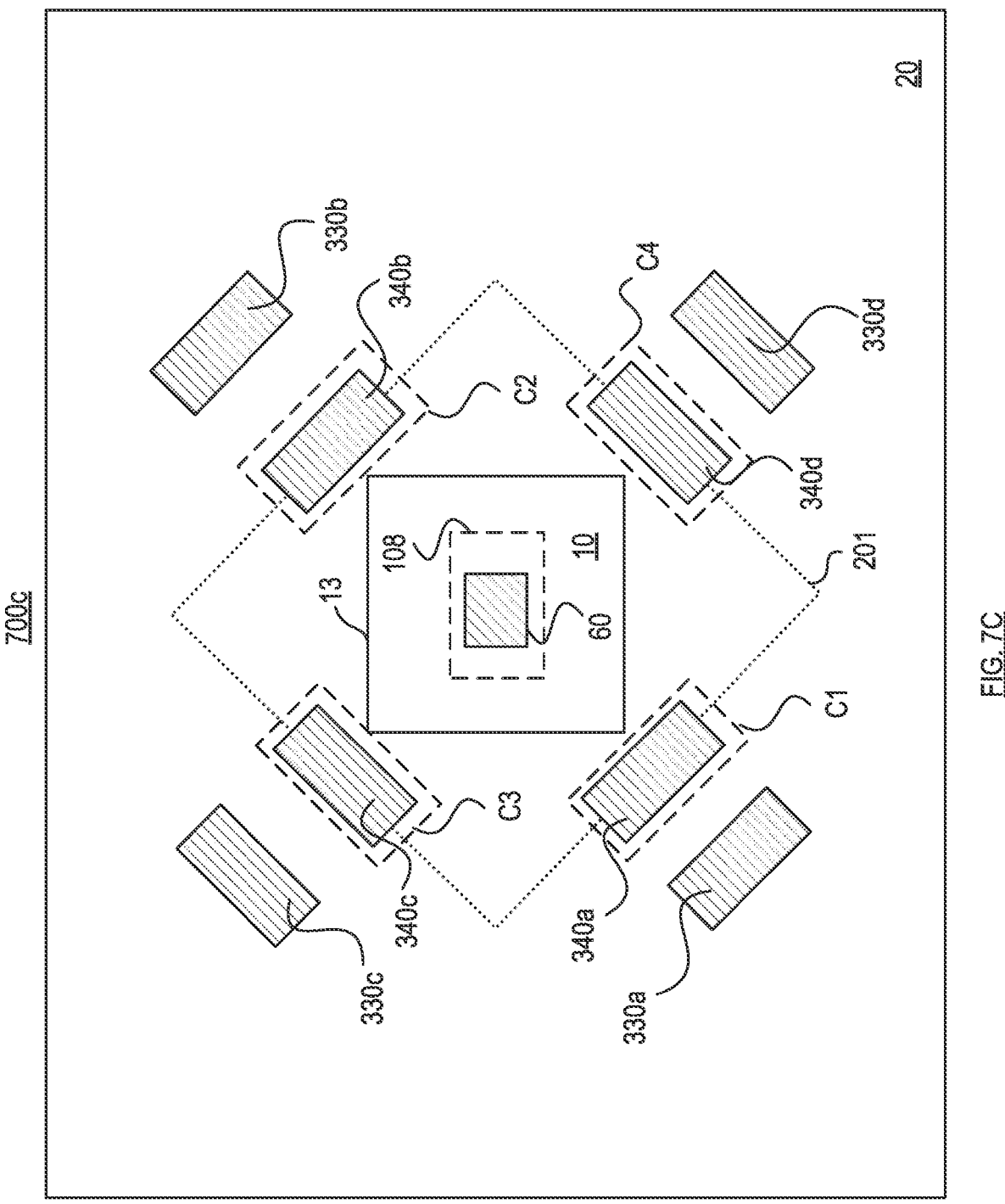
FIGS. 7C-7E illustrate top views of a photo-detecting device, according to some embodiments.

FIG. 7C illustrates a top view of a photo-detecting device, according to some embodiments. The photo-detecting device 700c is similar to the photo-detecting device 700a in FIG. 7A. The difference is described below. The arrangements of the readout electrodes 330a, 330b, 330c, 330d and the control electrodes 340a, 340b, 340c, 340d are different. For example, the four switches are disposed at the four corners of the absorption region 10 respectively.

Figure 7D:
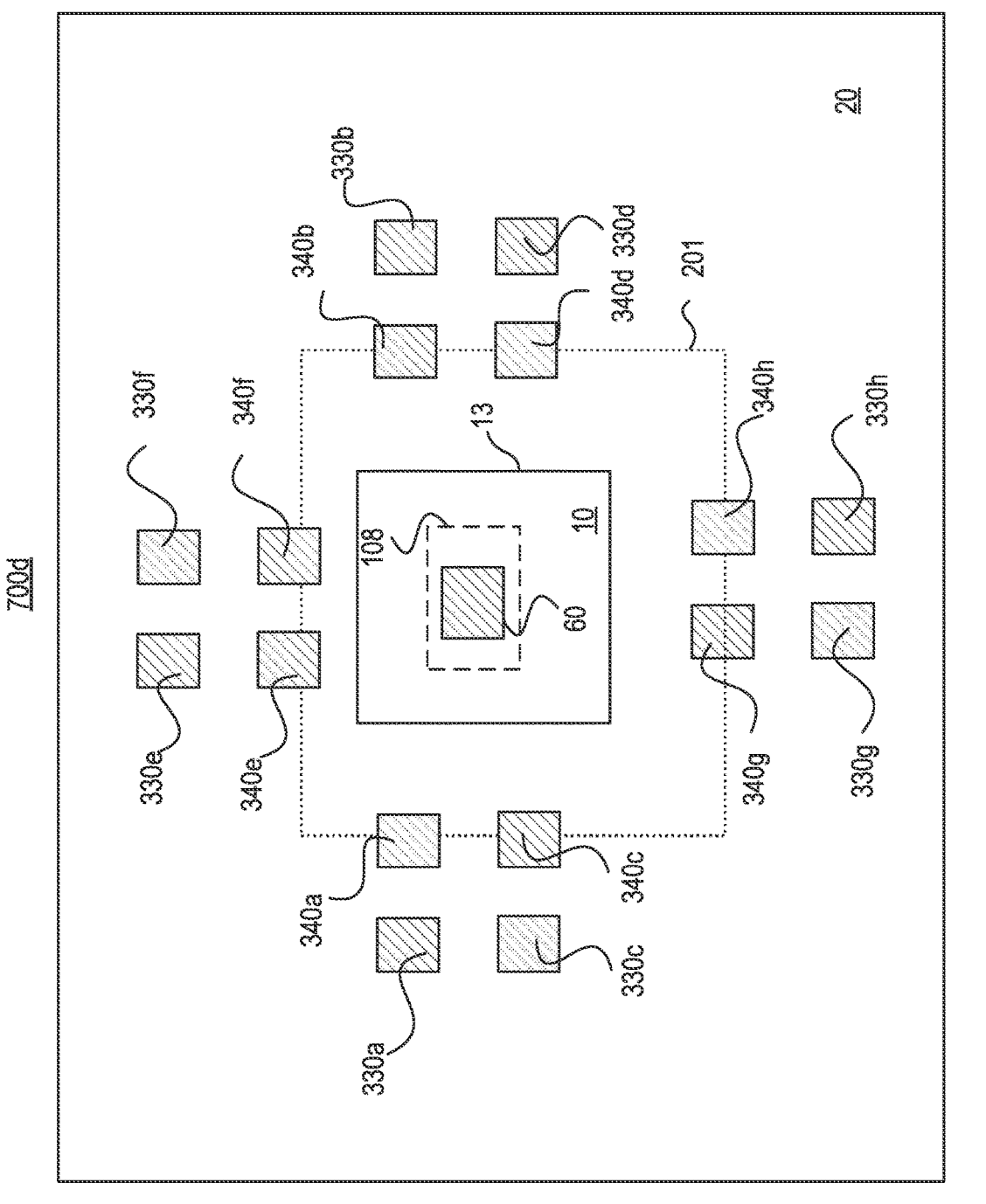

FIG. 7D illustrates a top view of a photo-detecting device, according to some embodiments. The photo-detecting device 700d is similar to the photo-detecting device 700a in FIG. 7A. The difference is described below. The photo-detecting device 700d includes eight switches (not labeled) electrically coupled to the absorption region 10 and partially formed in the substrate 20. Similarly, each of the switches includes a control region (not labeled) including a control electrode 340a, 340b, 340c, 340d, 340e, 340f, 340g, 340h and includes a readout electrode 330a, 330b, 330c, 330d, 330e, 330f, 330g, 330h separated from the control electrode 340a, 340b, 340c, 340d, 340e, 340f, 340g, 340h.

In some embodiments, a photo-detecting apparatus includes a pixel including the photo-detecting device 700d as mentioned above, and the pixel includes multiple control signals different from each other and controlling multiple switches of the photo-detecting device 700d. That is, in a same pixel, a number of the control signals is less than a number of the switches. For example, the pixel may include two control signals different from each other and each of the control signal controls two of the switches. For example, the control electrode 340a and the control electrode 340c may be electrically coupled to and controlled by the same control signal. In some embodiments, the pixel may include multiple control signals controlling respective switch. That is, in a same pixel, a number of the control signals is equal to a number of the switches. For example, the pixel of the photo-detecting apparatus includes eight control signals different from each other and controlling respective switches of the photo-detecting device 700d.

Figure 7E:
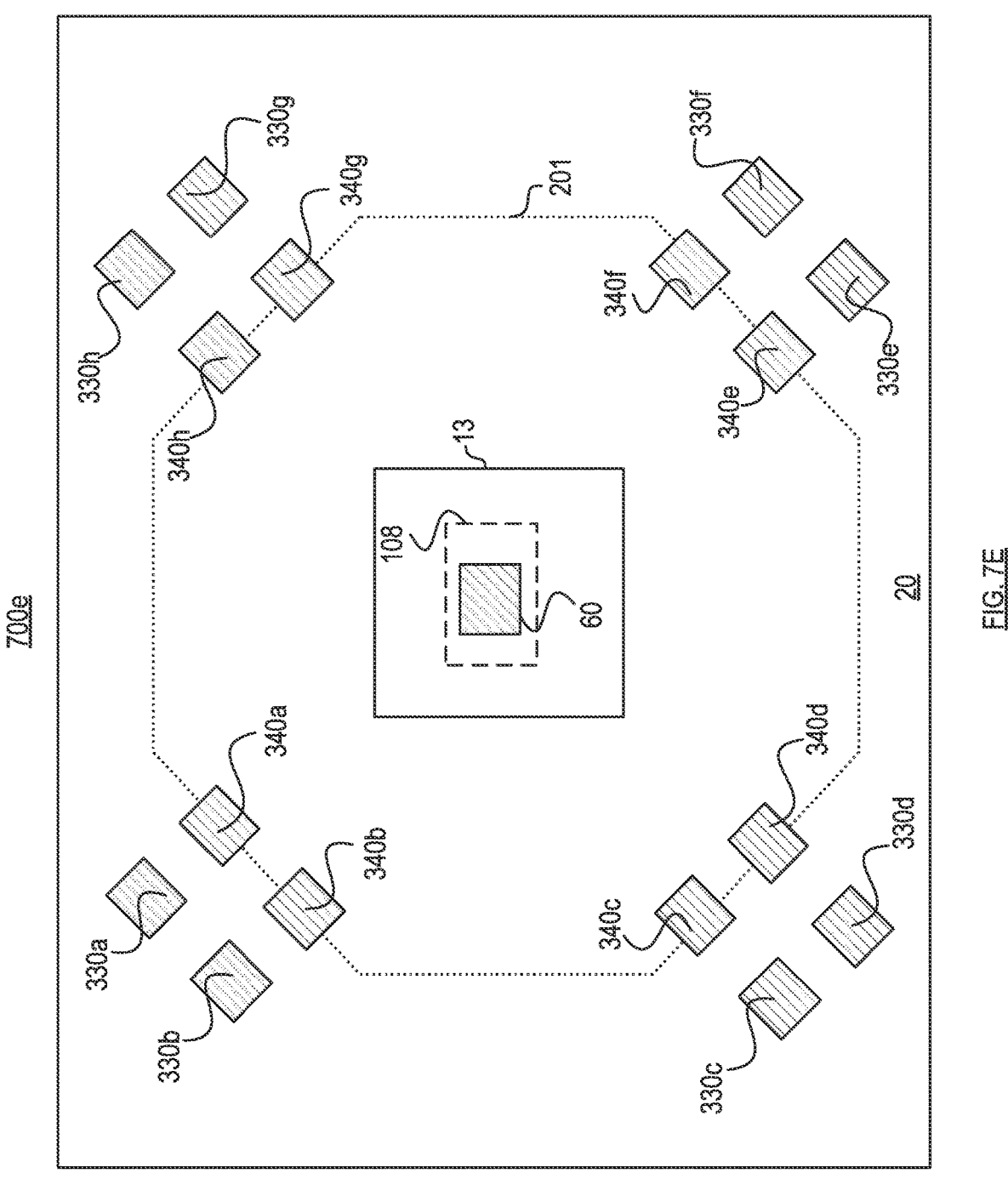

FIG. 7E illustrates a top view of a photo-detecting device, according to some embodiments. The photo-detecting device 700e is similar to the photo-detecting device 700d in FIG. 7D. The difference is described below. The arrangements of the readout electrodes 330a, 330b, 330c, 330d, 330e, 330f, 330g, 330h and the control electrodes 340a, 340b, 340c, 340d, 340e, 340f, 340g, 340h are different. For example, every two switches of the eight switches are disposed at the four corners of the absorption region 10 respectively. The conducting region 201 can be, but not limited to octagon.

Figure 8A:
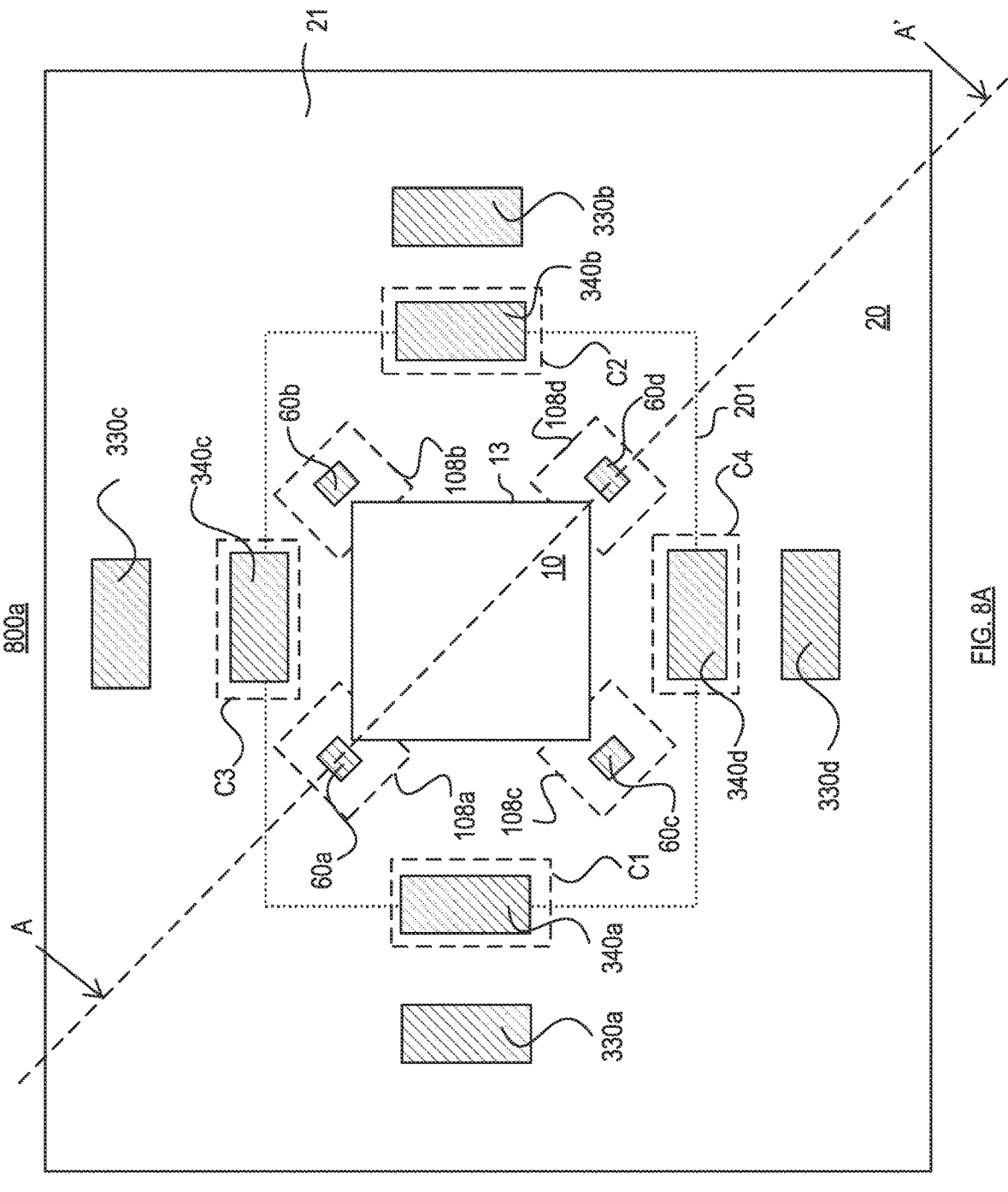
FIG. 8A illustrates a top view of a photo-detecting device, according to some embodiments.
Figure 8B:
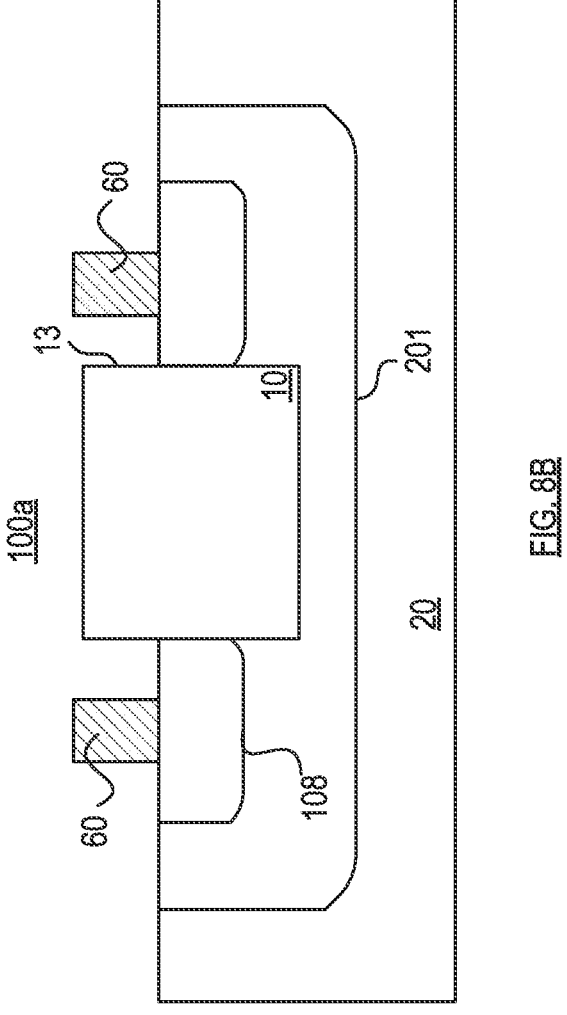
FIG. 8B illustrates a cross-sectional view along an A-A' line in FIG. 8A, according to some embodiments.

FIG. 8A illustrates a top view of a photo-detecting device, according to some embodiments. FIG. 8B illustrates a cross-sectional view along an A-A' line in FIG. 8A, according to some embodiments. The photo-detecting device 800a in FIG. 8A is similar to the photo-detecting device 700a in FIG. 7A. The difference is described below. The second doped region 108 is in the substrate 20. In other words, the fourth peak doping concentration of the second doped region 108 lies in the substrate 20. In some embodiments, the second doped region 108 includes multiple subregions 108a, 108b, 108c, 108d separated from one another and are in direct contact with the absorption region 10, for example, the subregions 108a, 108b, 108c, 108d may be in contact with or overlapped with at least a part of the side surfaces 13 of the absorption region 10. As a result, the carriers generated from the absorption region 10 and are not collected by the first doped regions can move from the absorption region 10 towards one or more of the subregions 108a, 108b, 108c, 108d through the heterointerface between the absorption region 10 and the substrate 20. In some embodiments, the subregions 108a, 108b, 108c, 108d are not between the absorption region 10 and the first doped region of any switches to avoid blocking the path of the carriers to be collected from moving from the absorption region 10 towards one of the first doped regions. For example, in some embodiments, the subregions 108a, 108b, 108c, 108d are disposed at the four corners of the absorption region 10 respectively, and the four switches are disposed at the four side surfaces 13 respectively, such that the path of the holes moving from the absorption region 10 towards one or more of the subregions 108a, 108b, 108c, 108d and the path of the electrons moving from the absorption region 10 towards one of the first doped regions are different.

In some embodiment, the second electrode 60 includes sub-electrodes 60a, 60b, 60c, 60d electrically coupled to the subregions 108a, 108b, 108c, 108d respectively. The sub-electrodes 60a, 60b, 60c, 60d are disposed over the first surface 21 of the substrate 20.

By having the second doped region 108 in the substrate 20 instead of in the absorption region 10, the sub-electrodes 60a, 60b, 60c, 60d, the readout electrodes 330a, 330b, 330c, 330d, and the control electrodes 340a, 340b, 340c, 340d, can all be coplanarly formed above the first surface 21 of the substrate 20. Therefore, a height difference between any two of the sub-electrodes 60a, 60b, 60c, 60d, the readout electrodes 330a, 330b, 330c, 330d, and the control electrodes 340a, 340b, 340c, 340d can be reduced and thus the fabrication process afterwards will be benefit from this design. Besides, the area of the absorption region 10 absorbing the optical signal can be larger.

Figure 8C:
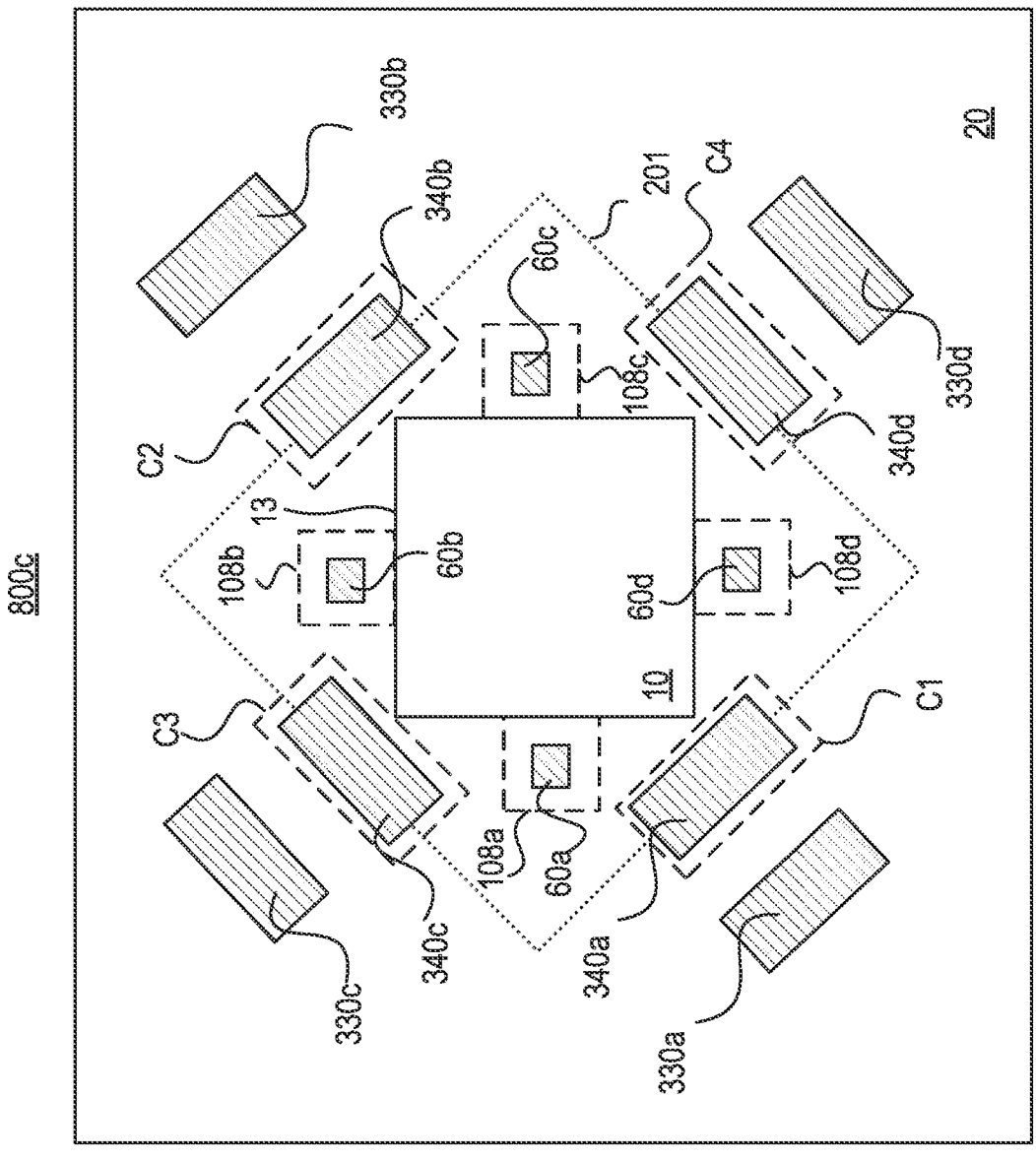
FIGS. 8C-8E illustrate top views of a photo-detecting device, according to some embodiments.

FIG. 8C illustrates a top view of a photo-detecting device, according to some embodiments. The photo-detecting device 800c in FIG. 8C is similar to the photo-detecting device 800a in FIG. 8A. The difference is described below. The arrangements of the readout electrodes 330a, 330b, 330c, 330d and the control electrodes 340a, 340b, 340c, 340d are different, the arrangement of the sub-electrodes 60a, 60b, 60c, 60d is different, and the arrangement of the subregions 108a, 108b, 108c, 108d is different. For example, the four switches are disposed at the four corners of the absorption region 10 respectively, and the subregions 108a, 108b, 108c, 108d and the sub-electrodes 60a, 60b, 60c, 60d are disposed at respective side surfaces 13 of the absorption region 10.

Figure 8D:
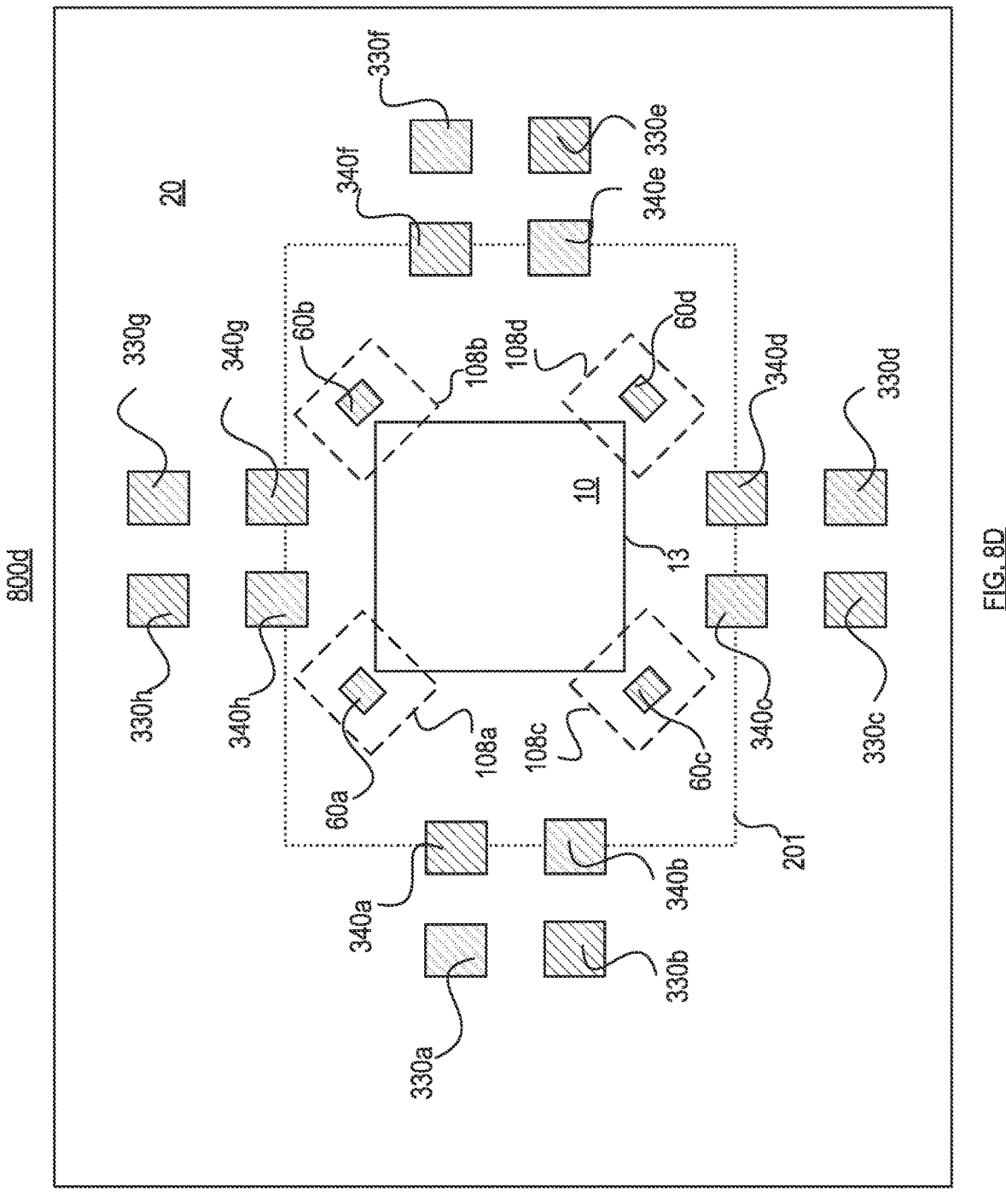

FIG. 8D illustrates a top view of a photo-detecting device, according to some embodiments. The photo-detecting device 800d is similar to the photo-detecting device 800a in FIG. 8A. The difference is described below. The photo-detecting device 800d includes eight switches (not labeled) electrically coupled to the absorption region 10 and partially formed in the substrate 20, which are similar to the photo-detecting device 700d in FIG. 7D. The pixel of the photo-detecting apparatus also includes multiple control signals as described in FIG. 7D.

Figure 8E:
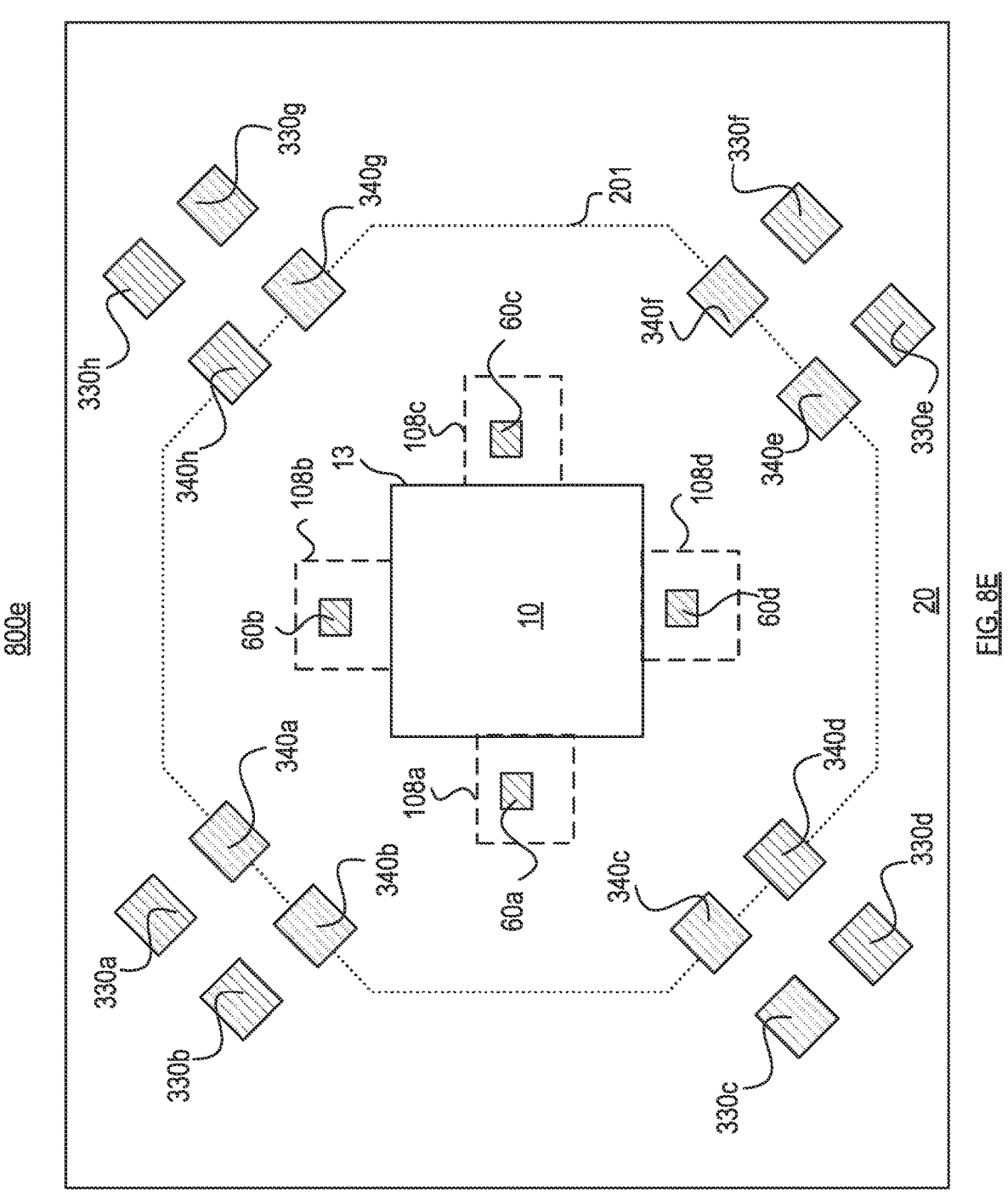

FIG. 8E illustrates a top view of a photo-detecting device, according to some embodiments. The photo-detecting device 800e is similar to the photo-detecting device 800d in FIG. 8D. The difference is described below. The arrangements of the readout electrodes 330a, 330b, 330c, 330d 330e, 330f, 330g, 330h and the control electrodes 340a, 340b, 340c, 340d, 340e, 340f, 340g, 340h are different, the arrangement of the sub-electrodes 60a, 60b, 60c, 60d is different, and the arrangement of the subregions 108a, 108b, 108c, 108d is different. For example, every two switches of the eight switches are disposed at the four corners of the absorption region 10 respectively, and the subregions 108a, 108b, 108c, 108d and the sub-electrodes 60a, 60b, 60c, 60d are disposed at respective side surfaces 13 of the absorption region 10.

Figure 9A:
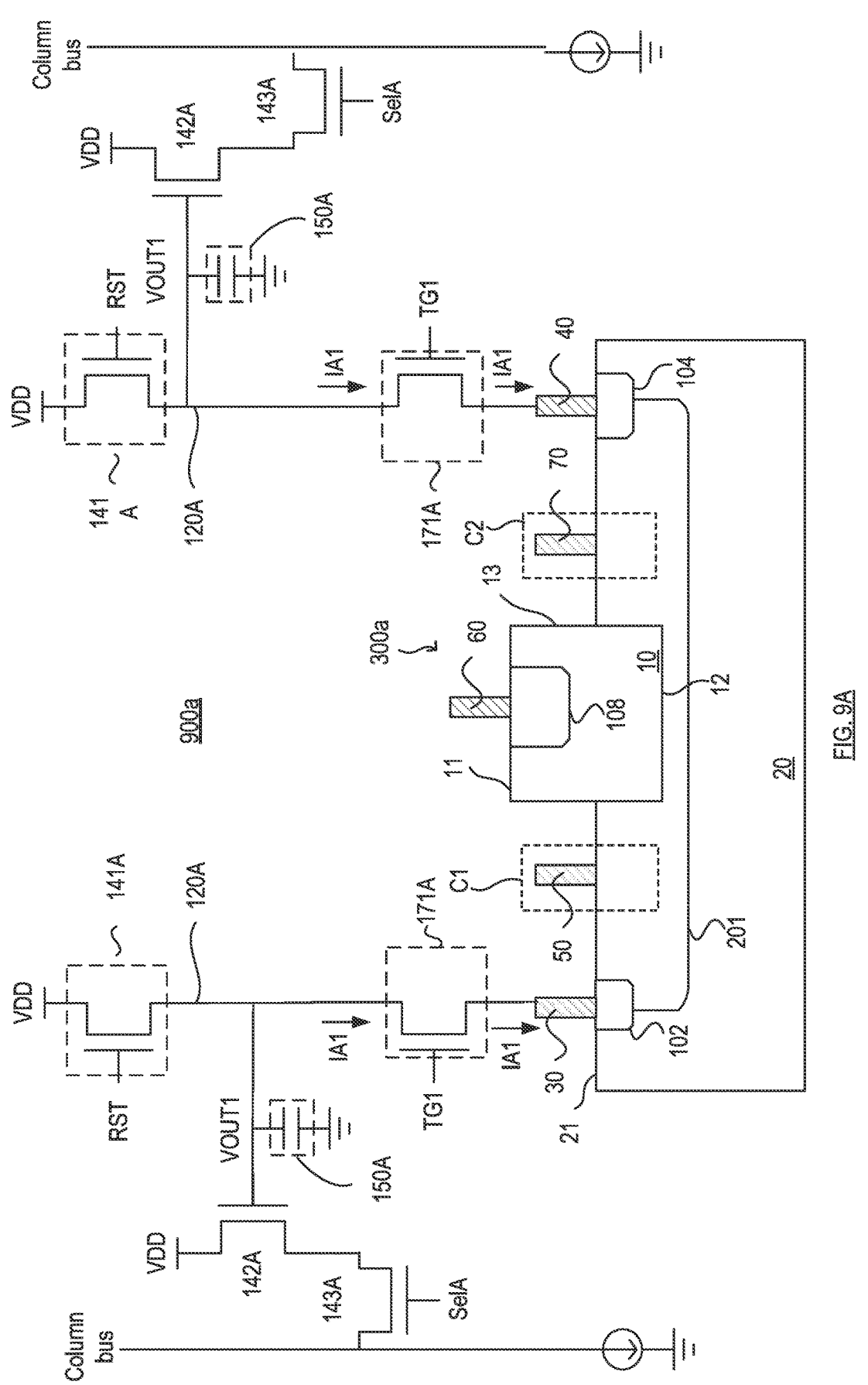
FIGS. 9A-9B show schematic diagrams of circuits of a photo-detecting apparatus, according to some embodiments.

FIG. 9A shows a schematic diagram of a photo-detecting apparatus, according to some embodiments. The photo-detecting apparatus 900a includes a pixel (not labeled) and a column bus electrically coupled to the pixel. The pixel includes a photo-detecting device and multiple readout circuits (not labeled) electrically coupled to the photo-detecting device and the column bus. The photo-detecting device can be any photo-detecting device as described in FIG. 0.3A through FIG. 3B, FIG. 4A through FIG. 4C, FIG. 5A through FIG. 5C, FIG. 0.6A through FIG. 6G, FIG. 7A through FIG. 7E, and FIG. 8A through FIG. 8E. For example, the photo-detecting device 300a in FIG. 3B is illustrated in FIG. 9A. Each of the readout circuits is similar to the readout circuit as described in FIG. 2E. The difference is described below. Each of the readout circuits is electrically coupled to the respective first doped region of the switches of the photo-detecting device for processing the carriers of the first type. For example, if the first doped region is of n-type, the readout circuits process the electrons collected from respective first doped region for further application.

The number of the readout circuits is the same as the number of switches. That is, the photo-detecting device includes N switches electrically coupled to the absorption region 10 and partially formed in the substrate 20, and the pixel of the photo-detecting apparatus further includes Z readout circuits electrically coupled to the photo-detecting device, where Z=N. For example, the number of the switches of the photo-detecting device in FIG. 3A through FIG. 3B, FIG. 4A through FIG. 4C, FIG. 5A through FIG. 5C, FIG. 6A through FIG. 6G is two, and the number of the readout circuits is two. For another example, the number of the switches of the photo-detecting device in FIG. 7A through FIG. 7C, and FIG. 8A through FIG. 8C is four, and the number of the readout circuits is four. For another example, the number of the switches of the photo-detecting device in FIG. 7D through FIG. 7E, and FIG. 8D through FIG. 8E is eight, and the number of the readout circuits is eight.

Figure 9B:
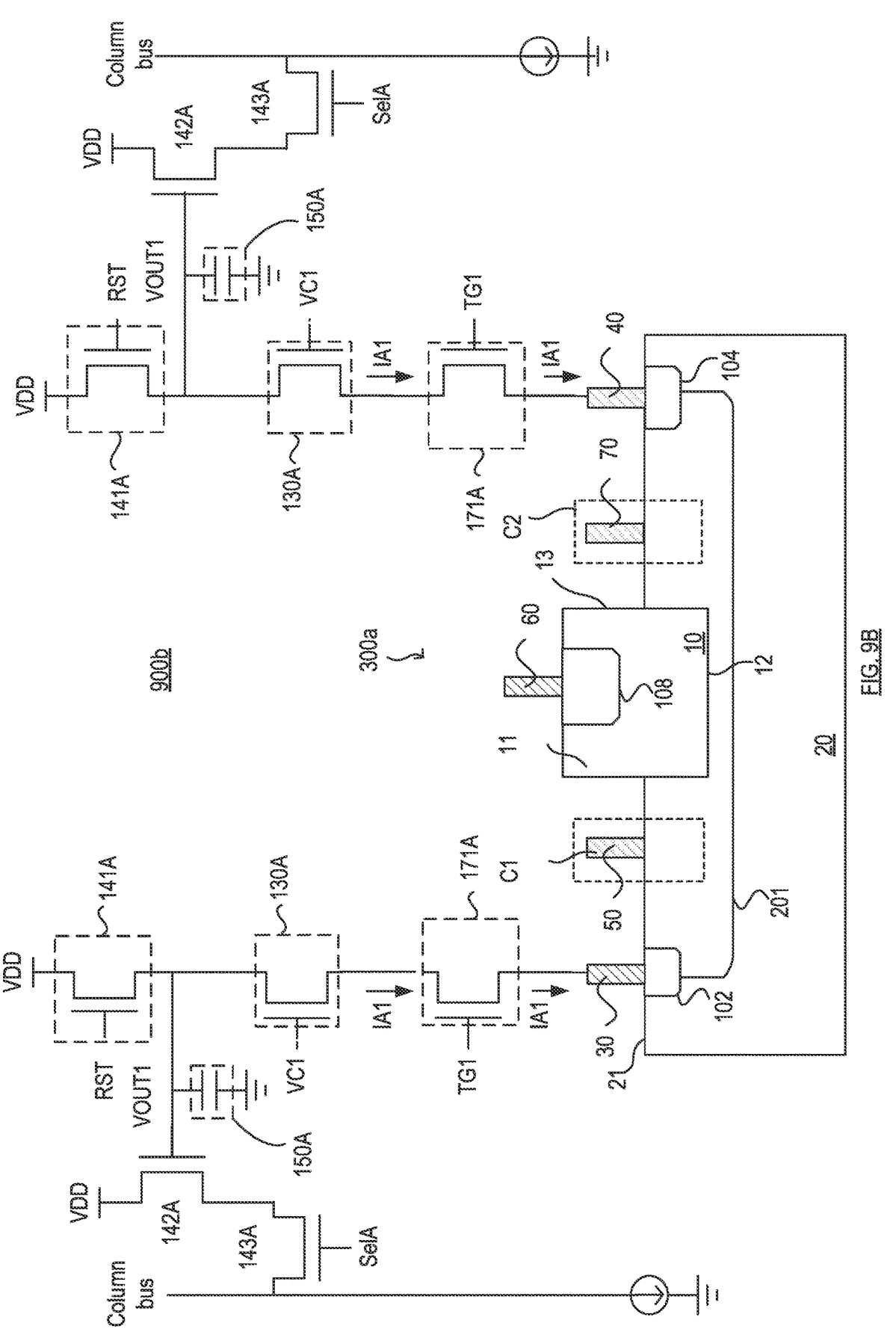

FIG. 9B shows a schematic diagram of a photo-detecting apparatus, according to some embodiments. The photo-detecting apparatus 900b is similar to the photo-detecting apparatus 900a in FIG. 9A. The difference is described below. Similar to the readout circuit as described in FIG. 2F, the readout circuit of the photo-detecting apparatus 900b further includes a voltage-control transistor 130A between the first/second switch of the photo-detecting device 300a and the capacitor 150A.

Figure 10A:
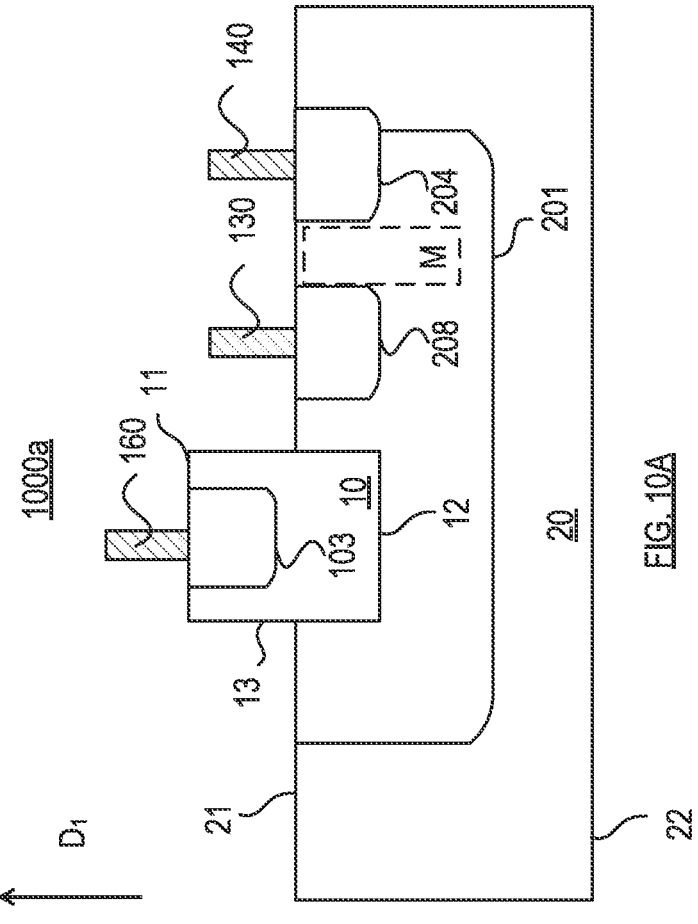
FIG. 10A illustrates a cross-sectional view of a photo-detecting device, according to some embodiments.

FIG. 10A illustrates a cross-sectional view of a photo-detecting device, according to some embodiments. The photo-detecting device includes an absorption region 10 and a substrate 20 supporting the absorption region 10. The absorption region 10 is similar to the absorption region as described in FIG. 1A. The substrate 20 is similar to the substrate 20 as described in FIG. 1A. The difference between the photo-detecting device 1000a in FIG. 10A and the photo-detecting device 100a in FIG. 1A is described below. In some embodiments, the photo-detecting device 1000a further includes a first contact region 204 separated from the absorption region 10 and in the substrate 20. The photo-detecting device 1000a further includes a second contact region 103 in the absorption region 10.

In some embodiments, the second contact region 103 is of a conductivity type. The first contact region 204 is of a conductivity type different from the conductivity type of the second contact region 103. In some embodiments, the second contact region 103 includes a dopant having a peak doping concentration higher than the first peak doping concentration of the absorption region 10, for example, can be ranging from $1 \times 10^{18}$ cm$^{-3}$ and $5 \times 10^{20}$ cm$^{-3}$. In some embodiments, the first contact region 204 includes a dopant having a peak doping concentration higher than the second peak doping concentration of the second dopant of the substrate 20, for example, can be ranging from $1 \times 10^{18}$ cm$^{-3}$ and $5 \times 10^{20}$ cm$^{-3}$. In some embodiments, the second contact region 103 is not arranged over the first contact region 204 along the direction D1 substantially vertical to the first surface 21 of the substrate 20.

The photo-detecting device includes a first electrode 140 coupled to the first contact region 204 and a second electrode 160 coupled to the second contact region 103. The second electrode 160 is over the first surface 11 of the absorption region 10. The first electrode 140 is over the first surface 21 of the substrate 20. In some embodiments, the substrate 20 of the photo-detecting device 1000a includes a conducting region 201 similar to the conducting region 201 as described in FIG. 1A.

In some embodiments, the photo-detecting device 1000a further includes a third contact region 208 in the substrate 20. In some embodiments, the third contact region 208 is between the second contact region 103 and the first contact region 204. The third contact region 208 is of a conductivity type the same as the conductivity type of the second contact region 103. The third contact region 208 includes a conductivity type different from the conductivity type of the first contact region 204. In some embodiments, the third contact region 208 includes a dopant having a peak doping concentration higher than the second peak doping concentration of the conducting region 201, for example, can be between $1 \times 10^{18}$ cm$^{-3}$ and $5 \times 10^{20}$ cm$^{-3}$.

In some embodiments a distance between the first surface 21 of the substrate 20 and a location of the first contact region 204 having the peak dopant concentration is less than 30 nm. In some embodiments a distance between the first surface 21 of the substrate 20 and a location of the third contact region 208 having the peak dopant concentration is less than 30 nm.

In some embodiments, the third contact region 208 may be entirely overlapped with the conducting region 201. The third contact region 208 and the first contact region 204 are both beneath the first surface 21 of the substrate 20.

In some embodiments, the photo-detecting device further includes a third electrode 130 electrically coupled to the third contact region 208. The third electrode 130 and the first electrode 140 are coplanarly formed on the first surface 21 of the substrate 20, and thus a height difference between the third electrode 130 and the first electrode 140 can be reduced, which benefits the fabrication process afterwards The photo-detecting device 1000a can be a lock-in pixel or an avalanche phototransistor depending on the circuits electrically coupled to the photo-detecting device 1000a and/or the operating method of the photo-detecting device 1000a.

For example, if the photo-detecting device 1000a serves as a lock-in pixel, the third contact region 208 and the first contact region 204 can be regarded as a switch. A readout circuit is electrically coupled to the first contact region 204 through the first electrode 140, a control signal, which is a modulated signal, is electrically coupled to the third contact region 208 through the third electrode 130 for controlling the on and off state of the switch, and a voltage or ground may be applied to the second contact region 103 for evacuating the carriers not collected by the first contact region 204. The lock-in pixel can be included in an indirect TOF system.

In some embodiments, if the photo-detecting device 1000a serves as an avalanche phototransistor, the part of the substrate 20 or the part of the conducting region 201 between the third contact region 208 and the first contact region 204, where the carriers pass through, serves as a multiplication region M during the operation of the photo-detecting device 1000a. In the multiplication region, photo-carriers generate additional electrons and holes through impact ionization, which starts the chain reaction of avalanche multiplication. As a result, the photo-detecting device 1000a has a gain. In some embodiments, the substrate 20 supports the absorption region 10 and is capable of amplifying the carriers by avalanche multiplication at the same time. In some embodiments, the third contact region 208 may be a charge region. The avalanche phototransistor can be included in a direct TOF system.

A method for operating the photo-detecting device 1000a capable of collecting electrons in FIG. 10A, includes steps of, applying a first voltage to a first electrode 140, applying a second voltage to the second electrode 160, and applying a third voltage to a third electrode 130 to generate a first total current and form a reverse-biased p-n junction between the first electrode 140 and the third electrode 130; and receiving an incident light in the absorption region 10 to generate a second total current, where the second total current is larger than the first total current.

In some embodiments, the first voltage is greater than the second voltage. In some embodiments, the third voltage is between the first voltage and the second voltage.

In some embodiments, the first total current includes a first current and a second current. The first current flows from the first electrode 140 to the third electrode 130. The second current flows from the first electrode 140 to the second electrode 160.

In some embodiments, the second total current includes a third current. The third current flows from the first electrode 140 to the second electrode 160.

In some embodiments, the second total current includes the third current and a fourth current. The fourth current flows from the first electrode 140 to the third electrode 130.

In some embodiments, the second voltage applied to the first electrode is, for example, 0 Volts.

In some embodiments, the third voltage can be selected to sweep the photo-carriers from the absorption region 10 to the multiplication region, that is, the part of the substrate 20 or the part of the conducting region 201 between the third contact region 208 and the first contact region 204. In some embodiments, a voltage difference between the second voltage and third voltage is less than a voltage difference between the first voltage and the third voltage to facilitate the movement of photo-carriers from absorption region 10 to the multiplication region in the substrate 20 so as to multiply the photo-carriers. For example, when the second voltage applied to the second electrode 160 is 0 Volts, a third voltage applied to the third electrode 130 is 1V, and the first voltage applied to the first electrode 140 can be 7V.

In some embodiments, a voltage difference between the first voltage and the third voltage is less than an avalanche breakdown voltage of the photo-detecting device 1000a, at which the photo-detecting device 1000a initiates the chain reaction of avalanche multiplication, to operate the multiplication region in a linear mode.

In some embodiments, a voltage difference between the first voltage and the third voltage is higher than an avalanche breakdown voltage of the photo-detecting device 1000a, at which the photo-detecting device 1000a initiates the chain reaction of avalanche multiplication, to operate the multiplication region in a Geiger mode.

In some embodiments, the carriers collected by the first contact region 204 can be further processed by a circuit electrically coupled to the photo-detecting device 1000a.

In some embodiments, the carriers not collected by the first contact region 204 can move towards the second contact region 103 and can be further evacuated by a circuit electrically coupled to the photo-detecting device 1000a.

Similarly, by the design of the concentration and the material of the absorption region 10 and the carrier conducting layer, that is the substrate 20 in some embodiments, the photo-detecting device 1000a can have lower dark current.

Figure 10B:
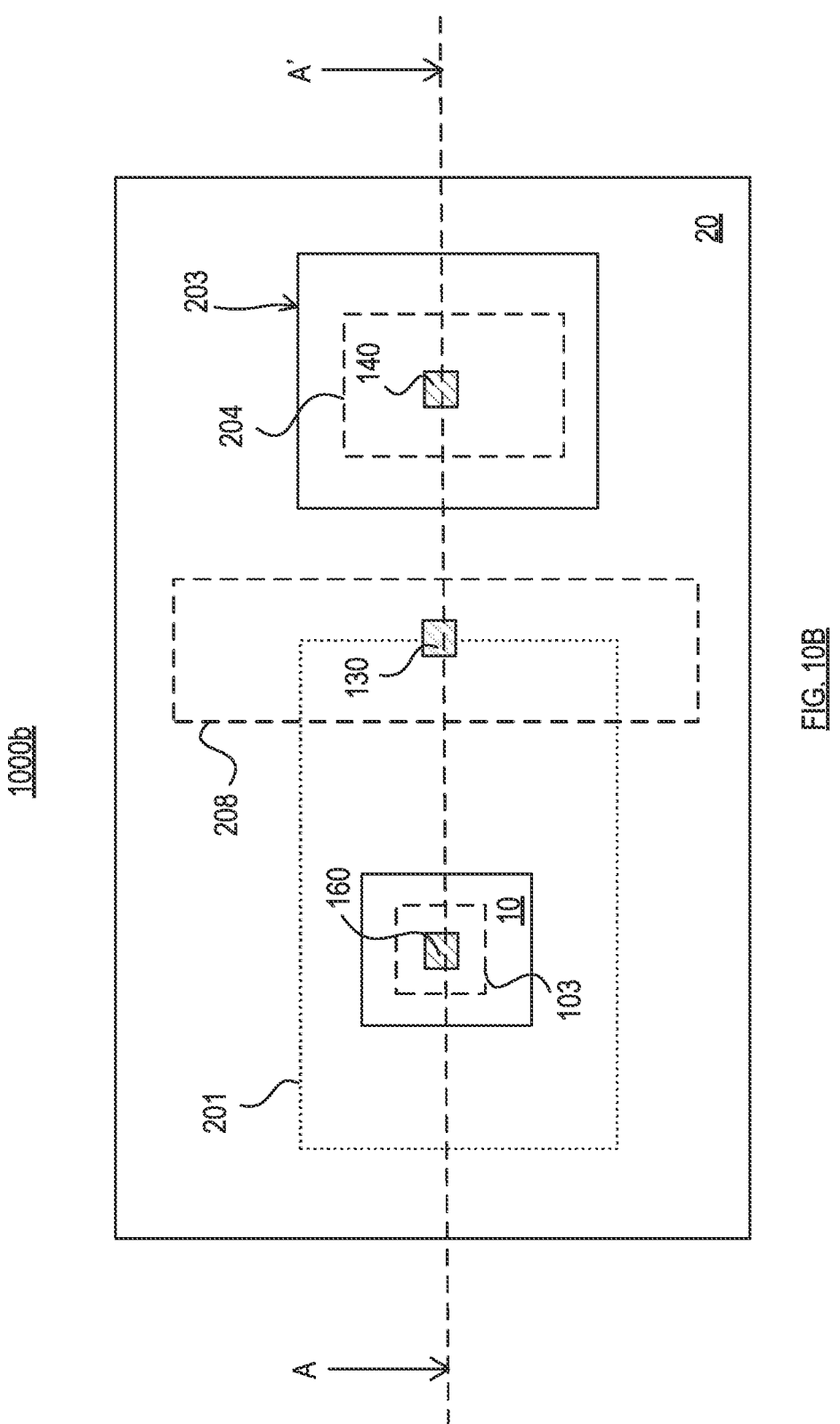
FIG. 10B illustrates a top view of a photo-detecting device, according to some embodiments.
Figure 10C:
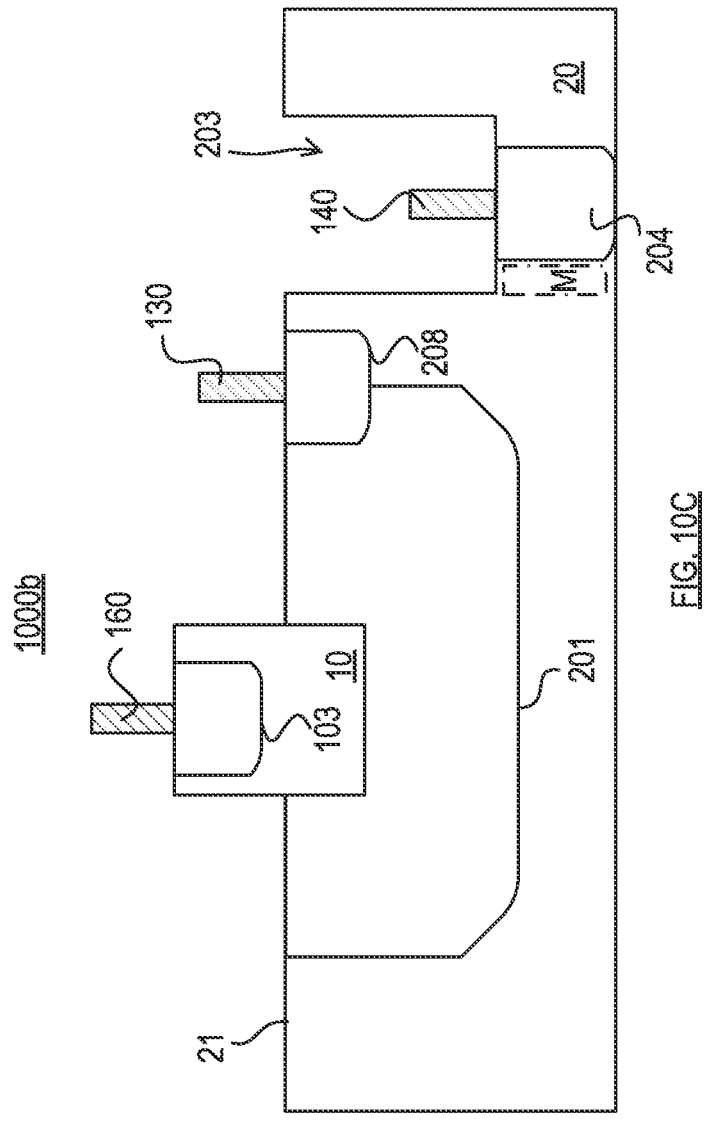
FIG. 10C illustrates a cross-sectional view along an A-A' line in FIG. 10B, according to some embodiments.

FIG. 10B illustrates a top view of a photo-detecting device, according to some embodiments. FIG. 10C illustrates a cross-sectional view along an A-A' line in FIG. 10B, according to some embodiments. The photo-detecting device 1000b in FIG. 10B is similar to the photo-detecting device 1000a in FIG. 10A. The difference is described below. Preferably, the photo-detecting device 1000b serves as an avalanche phototransistor. The photo-detecting device 1000b further includes a modification element 203 integrated with the substrate 20. The modification element 203 is for modifying the position where the multiplication occurs in the substrate 20. In some embodiments, the resistivity of the modification element 203 is higher than the resistivity of the substrate 20 so as to modify the position where the multiplication occurs in the substrate 20. Accordingly, more carriers can pass through the place where the strongest electric field locates, which increases the avalanche multiplication gain.

For example, the modification element 203 is a trench formed in the first surface 21 of the substrate 20. The trench can block the carriers from passing through a defined region of the substrate 20, and thus reduces the area in the substrate 20 where the carriers pass through. The trench has a depth, and a ratio of the depth to the thickness of the substrate 20 can be between 10% and 90%. The first contact region 204 is exposed in the trench to be electrically coupled to the first electrode 140. In some embodiments, a width of the trench can be greater than, substantially equal or less than a width of the first contact region 204. In some embodiments, a width of the trench can be greater than a width of the first contact region 204 so as to enforce carriers passing through the high-field region next to the first contact region 204.

By the modification element 203, the carriers, for example, electrons, are forced to pass through the multiplication region, where the strongest electric field locates, such as the region next to the first contact region 204, which increases the avalanche multiplication gain.

In some embodiments, the first electrode 140 is formed in the trench. A height difference is between the third electrode 130 and the first electrode 140.

In some embodiments, the conducting region 201 may be separated from the third contact region 208, overlapped with a part of the third contact region 208, overlapped with the entire third contact region 208, touches the corner of the trench, or partially overlapped with the first contact region 204.

In some embodiment, an insulating material may be filled in the trench.

Figure 10D:
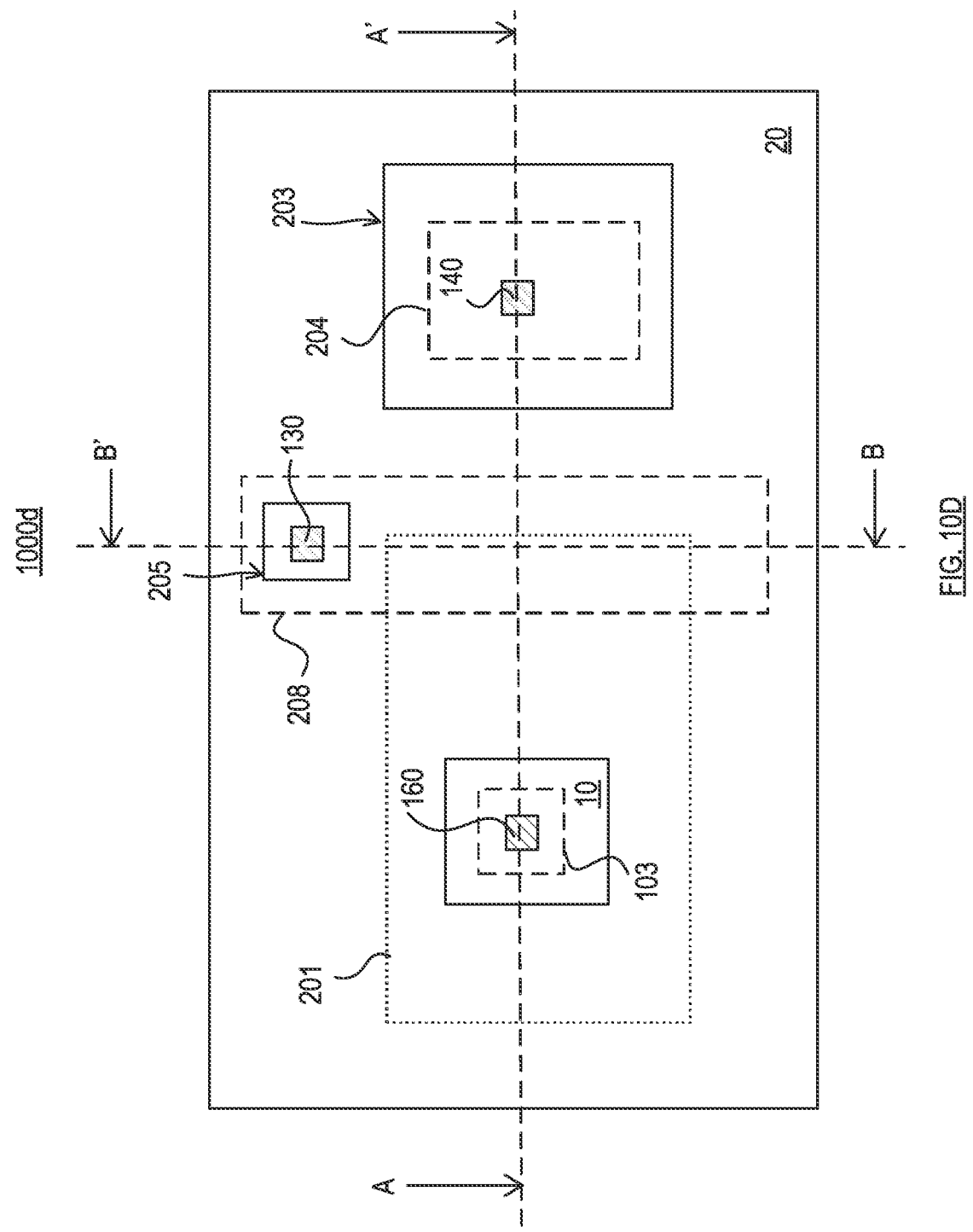
FIG. 10D illustrates a top view of a photo-detecting device, according to some embodiments.
Figure 10E:
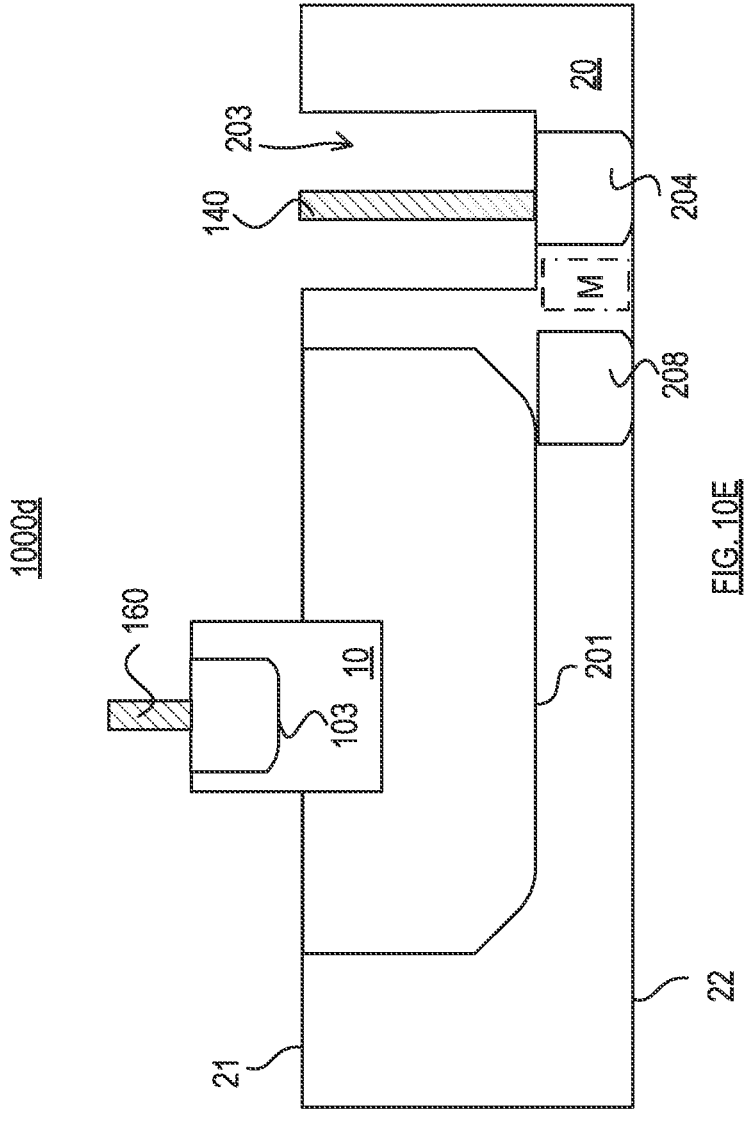
FIG. 10E illustrates a cross-sectional view along an A-A' line in FIG. 10D, according to some embodiments.
Figure 10F:
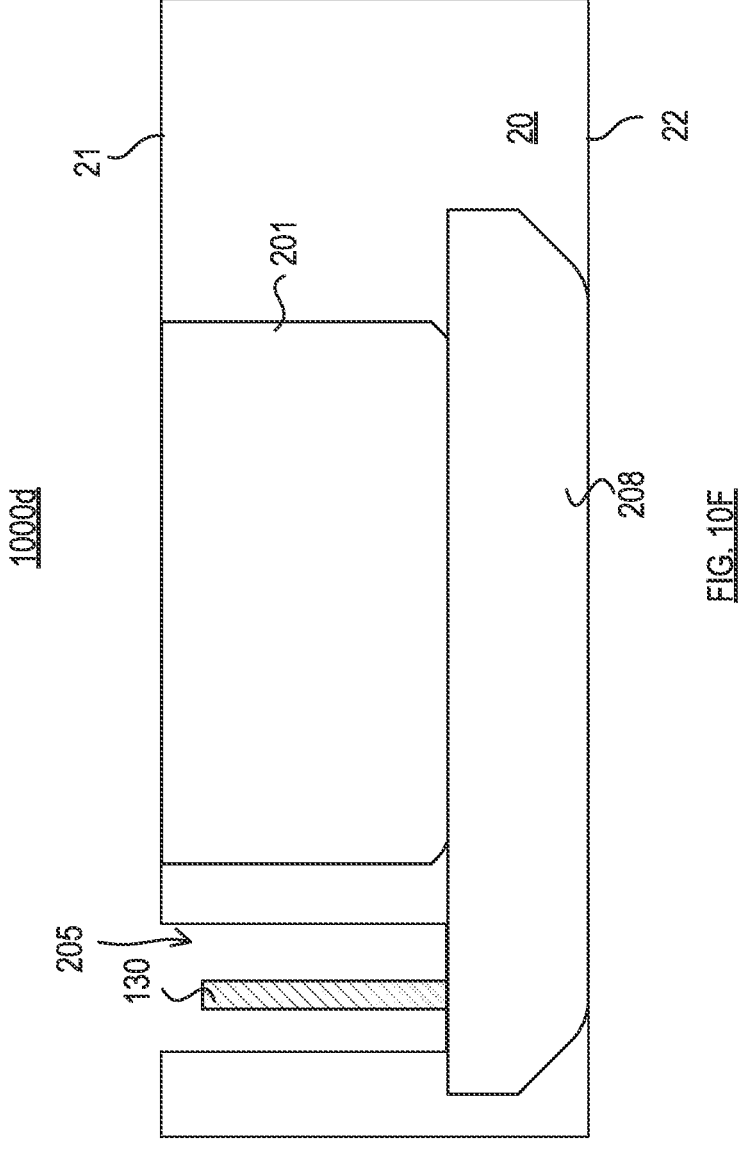
FIG. 10F illustrates a cross-sectional view along a B-B' line in FIG. 10D, according to some embodiments.

FIG. 10D illustrates a top view of a photo-detecting device, according to some embodiments. FIG. 10E illustrates a cross-sectional view along an A-A' line in FIG. 10D, according to some embodiments. FIG. 10F illustrates a cross-sectional view along a B-B' line in FIG. 10D, according to some embodiments. The photo-detecting device 1000d in FIG. 10D is similar to the photo-detecting device 1000b in FIG. 10B. The difference is described below. In some embodiments a distance between the first surface 21 of the substrate 20 and a location of the third contact region 208 having the peak dopant concentration is greater than 30 nm. In some embodiments, the photo-detecting device 1000d further includes a recess 205 formed in the first surface 21 of the substrate and exposing the third contact region 208. The third electrode 130 is formed in the recess 205 to be electrically coupled to the third contact region 208. Since the distance between the first surface 21 of the substrate 20 and a location of the third contact region 208 having the peak dopant concentration is greater than 30 nm, a distance between the third contact region 208 and the first contact region 204 is shorter, which further confines the traveling path of the carriers so as to force more carriers passing through the place where the strongest electric field locates. Accordingly, the avalanche multiplication gain is further improved. In some embodiments, an insulating material may be filled in the recess 205. The first electrode may include interconnects or plugs.

Figure 10G:
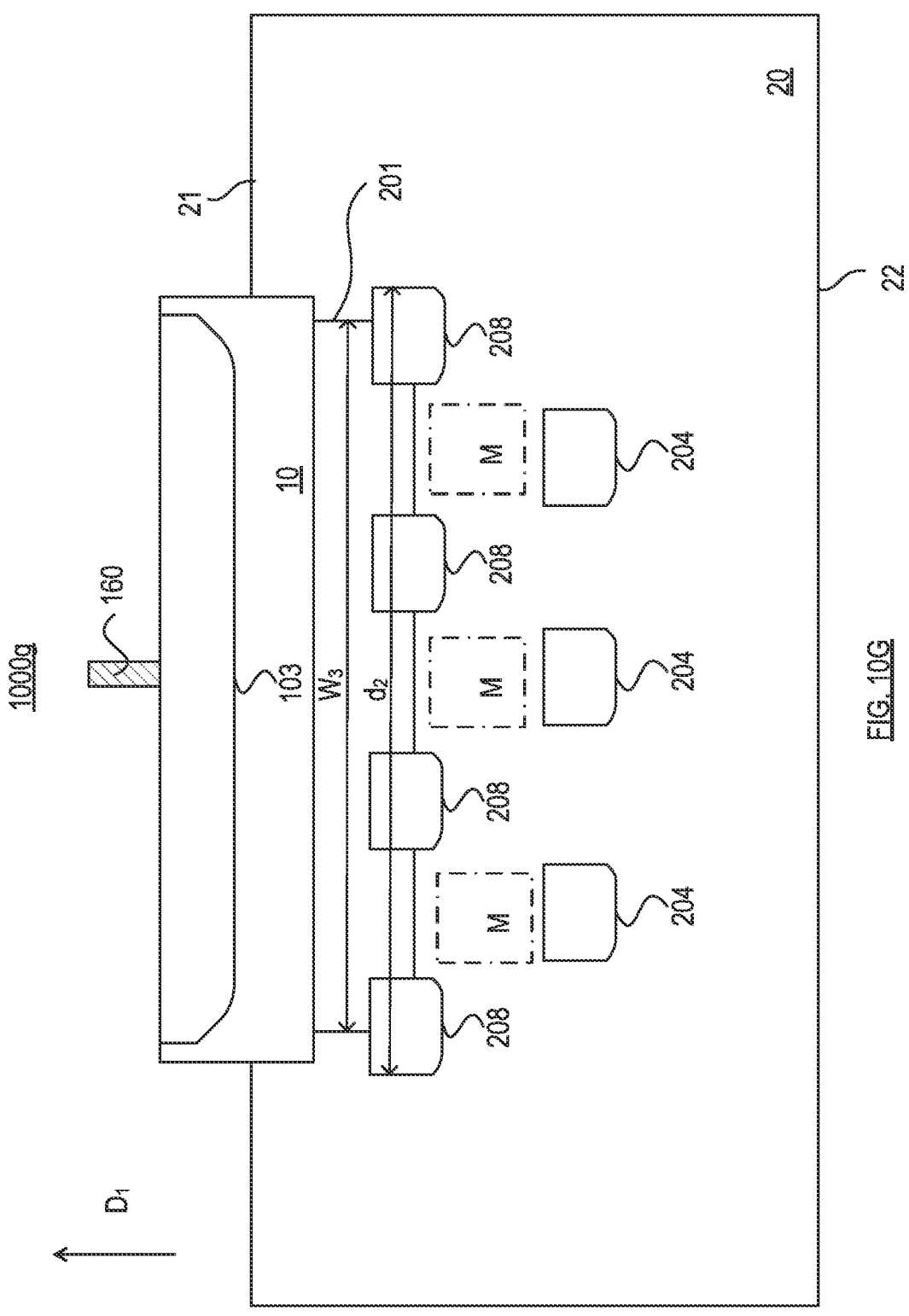
FIG. 10G illustrates a cross-sectional view of a photo-detecting device, according to some embodiments.

FIG. 10G illustrates a cross-sectional view of a photo-detecting device, according to some embodiments. The photo-detecting device 1000g in FIG. 10G is similar to the photo-detecting device 1000d in FIG. 10D. The difference is described below. In some embodiments, the photo-detecting device 1000g includes multiple third contact regions 208 and multiple first contact regions 204. The third contact regions 208 and multiple first contact regions 204 are in a staggered arrangement. By this design, multiple multiplication regions can be formed between the multiple third contact regions 208 and multiple first contact regions 204, providing a more uniform electric field profile compared to the photo-detecting device 1000d. In addition, the carriers mainly drift along the direction D1 substantially vertical to the first surface 21 of the substrate 20, which increases the speed of the photo-detecting device 1000g because the vertical transit distance is usually shorter.

In some embodiments, the second contact region 103 is arranged over the first contact regions 204 along the direction D1 substantially vertical to the first surface 21 of the substrate 20. In some embodiments, a maximum distance d2 between two outermost third contact regions 208 is greater than a width w3 of the conducting region 201, which forces carriers generated from the absorption region 10 passing through the multiple multiplication regions between the multiple third contact regions 208 and multiple first contact regions 204 instead of moving into other undesired region in the substrate 20.

In some embodiments, the multiple third contact regions 208 may be separated from one another. In some embodiments, the multiple first contact regions 204 may be separated from one another. In some embodiments, the multiple third contact regions 208 may be a continuous region. In some embodiments, the multiple first contact regions 204 may be a continuous region.

In some embodiments, the first contact regions 204 may be in an interdigitated arrangement from a top view of a first plane (not shown). In some embodiments, the third contact regions 208 may be in an interdigitated arrangement from a top view of a second plane (not shown) different form the first plane.

In some embodiments, one or more third electrodes 130 can be electrically coupled to the third contact regions 208 through any suitable structures, such as vias, from another cross-sectional view of the photo-detecting device 1000g taken along from another plane. In some embodiments, one or more first electrodes 140 can be electrically coupled to the first contact regions 204 through any suitable structures, such as vias, from another cross-sectional view of the photo-detecting device 1000g taken along from another plane.

Figure 10H:
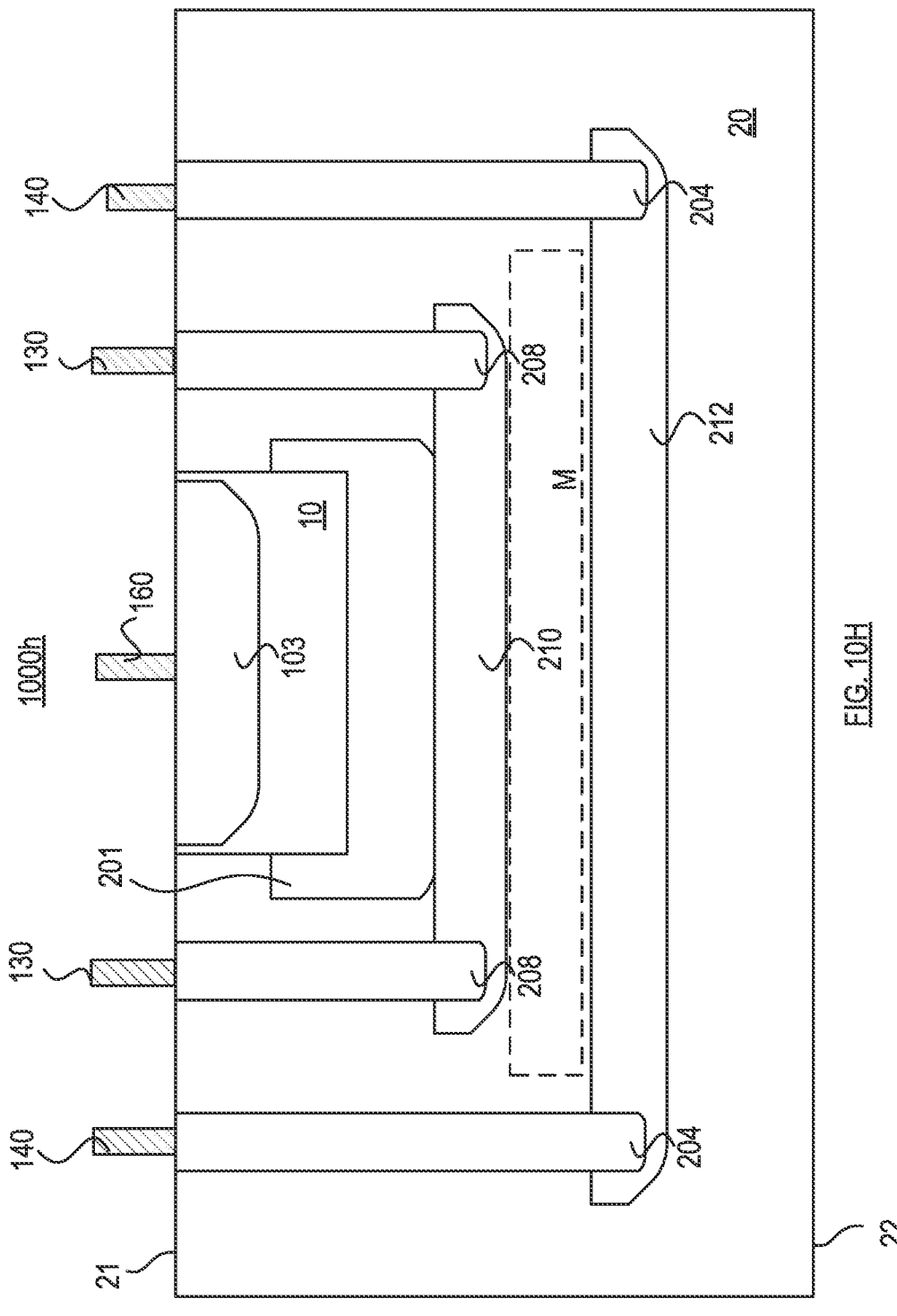
FIG. 10H illustrates a cross-sectional view of a photo-detecting device, according to some embodiments.

FIG. 10H illustrates a cross-sectional view of a photo-detecting device, according to some embodiments. The photo-detecting device 1000h in FIG. 10H is similar to the photo-detecting device 1000a in FIG. 10A. The difference is described below.

The photo-detecting device 1000h further includes a middle-doped region 210 in the substrate and may partially overlapped with the conducting region 201. The middle-doped region 210 is of a conductivity type the same as the conductivity type of the third contact region 208. The middle-doped region 210 includes a dopant having a peak doping concentration lower than peak doping concentration of the third contact region 208, for example, can be between $1\times10^{16}$ cm$^{-3}$ and $1\times10^{18}$ cm$^{-3}$.

The photo-detecting device 1000h further includes a lower-doped region 212 in the substrate 20. The lower-doped region 212 is of a conductivity type the same as the conductivity type of the first contact region 204. The lower-doped region 212 includes a dopant having a peak doping concentration lower than peak doping concentration of the first contact region 204, for example, can be between $1\times10^{18}$ cm$^{-3}$ and $1\times10^{20}$ cm$^{-3}$.

The middle-doped region 210 is between the lower-doped region 212 and the second contact region 103 along a direction substantially vertical to the first surface 21 of the substrate 20. In some embodiments, a position where the peak doping concentration of the lower-doped region 212 locates is deeper than the position where the peak doping concentration of the middle-doped region 210 locates.

In some embodiments, the depth of the third contact region 208 is less than the depth of the first contact region 204. The depth is measured from the first surface 21 of the substrate 20 along a direction substantially perpendicular to the first surface 21 of the substrate 20. The depth is to a position where the dopant profile of the dopant reaches a certain concentration, such as $1\times10^{15}$ cm$^{-3}$.

A multiplication region M can be formed between the lower-doped region 212 and the middle-doped region 210 during the operation of the photo-detecting device 1000h. The multiplication region M is configured to receive the one or more charge carriers from the middle-doped region 210 and generate one or more additional charge carriers. The multiplication region M has a thickness that is normal to the first surface 21 and that is sufficient for the generation of one or more additional charge carriers from the one or more carriers that are generated in the absorption region 10. The thickness of the multiplication region M can range, for example, between 100-500 nanometers (nm). The thickness may determine the voltage drop of the multiplication region M to reach avalanche breakdown. For example, a thickness of 100 nm corresponds to about 5-6 Volts voltage drop required to achieve avalanche breakdown in the multiplication region M. In another example, a thickness of 300 nm corresponds to about 13-14 Volts voltage drop required to achieve avalanche breakdown in the multiplication region M.

In some embodiments, the shape of the third contact region 208, the shape of the first contact region 204, the shape of the third electrode 130, and the shape of the first electrode 140 may be but not limited to a ring.

Compared to the photo-detecting device 1000c in FIG. 10C, the multiplication region M in the photo-detecting device 1000h can be formed in the bulk area of the substrate 20, which avoids defects that may present at the trench surface described in FIG. 10C. As a result, the dark current is further reduced. Furthermore, a height difference between the third electrode 130 and the first electrode 140 can be reduced and thus the fabrication process afterwards will be benefit from this design.

Figure 10I:
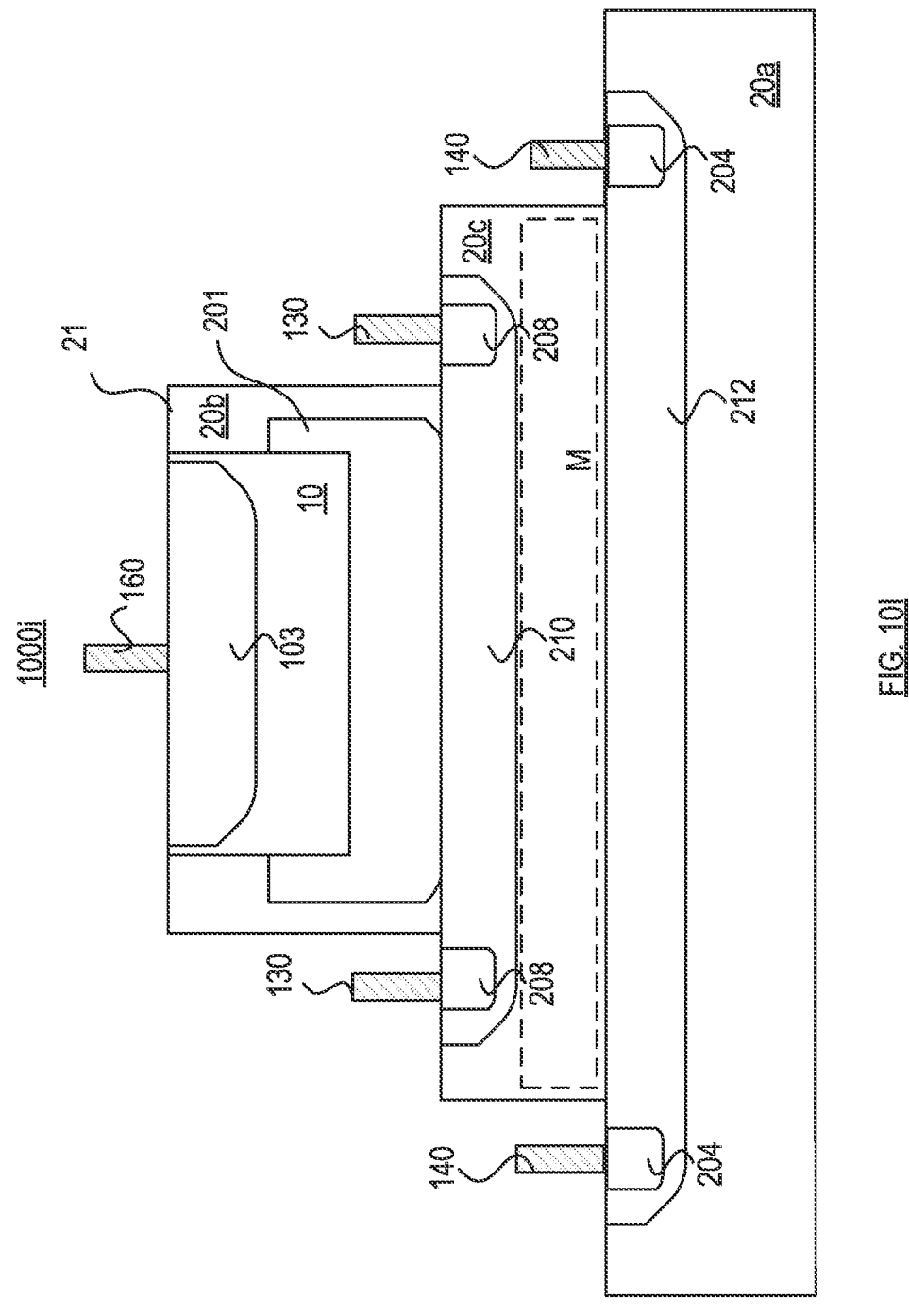
FIG. 10I illustrates a cross-sectional view of a photo-detecting device, according to some embodiments.

FIG. 10I illustrates a cross-sectional view of a photo-detecting device, according to some embodiments. The photo-detecting device 1000i in FIG. 10I is similar to the photo-detecting device 1000h in FIG. 10H. The difference is described below. The substrate 20 includes a base portion 20a, an upper portion 20b and a middle portion 20c. The middle portion 20c is between the base portion 20a and the upper portion 20b. The absorption region 10, the second contact region 103 and the conducting region 201 are in the upper portion 20b. The third contact region 208 is in the middle portion 20c. The first contact region 204 is in the base portion 20a. The upper portion 20b has a width less than a width of the middle portion 20c, and the third contact region 208 is exposed to be electrically coupled to the third electrode 130. The middle portion 20c has a width less than a width of the base portion 20a, and the first contact region 204 is exposed to be electrically coupled to the first electrode 140.

The middle-doped region 210 is in the middle portion 20c. The lower-doped region 212 is in the base portion 20a. Compared to the photo-detecting device 1000c in FIG. 10C, the multiplication region M in the photo-detecting device 1000h can be formed in the bulk area of the middle portion 20c, which avoids defects that may present at the trench surface described in FIG. 10C. As a result, the dark current is further reduced.

Figure 11A:
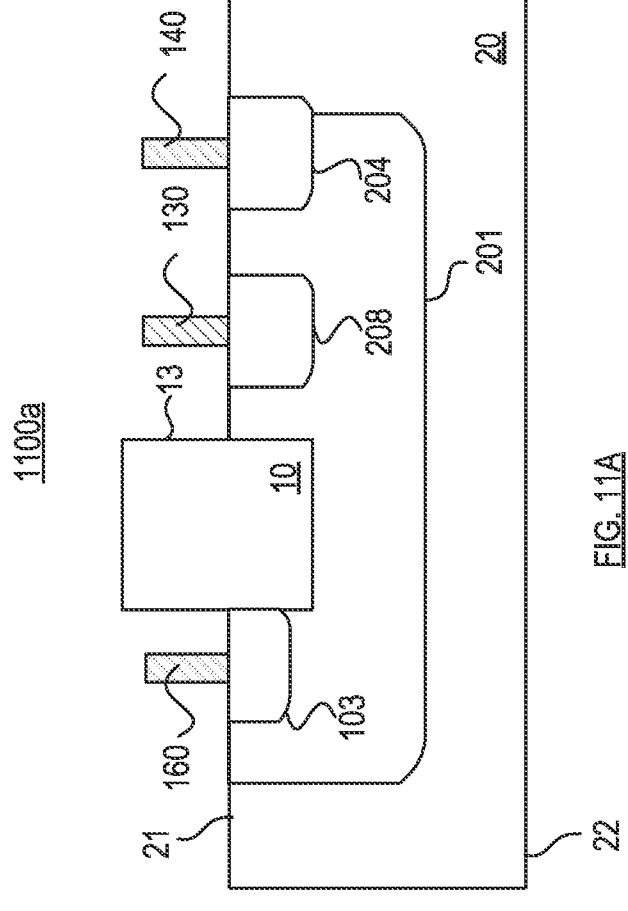
FIG. 11A illustrates a cross-sectional view of a photo-detecting device, according to some embodiments.

FIG. 11A illustrates a cross-sectional view of a photo-detecting device, according to some embodiments. The photo-detecting device 1100a in FIG. 11A is similar to the photo-detecting device 1000a in FIG. 10A. The difference is described below.

The second contact region 103 is in the substrate 20. In other words, the peak doping concentration of the second contact region 103 lies in the substrate 20. In some embodiment, the second contact region 103 is below the first surface 21 of the substrate 20 and is in direct contact with the absorption region 10, for example, the second contact region 103 may be in contact with or overlapped with one of the side surfaces 13 of the absorption region 10 that is opposite to the third contact region 208 and/or the first contact region 204. As a result, the carriers generated from the absorption region 10 can move from the absorption region 10 towards the second contact region 103 through the heterointerface between the absorption region 10 and the substrate 20. The second electrode 160 is over the first surface 21 of the substrate 20.

By having the second contact region 103 in the substrate 20 instead of in the absorption region 10, the second electrode 160, the first electrode 140 and the third electrode 130 can all be coplanarly formed above the first surface 21 of the substrate 20. Therefore, a height difference between the any two of the second electrode 160, the third electrode 130 and the first electrode 140 can be reduced and thus the fabrication process afterwards will be benefit from this design. Besides, the area of the absorption region 10 absorbing the optical signal can be larger.

Figure 11B:
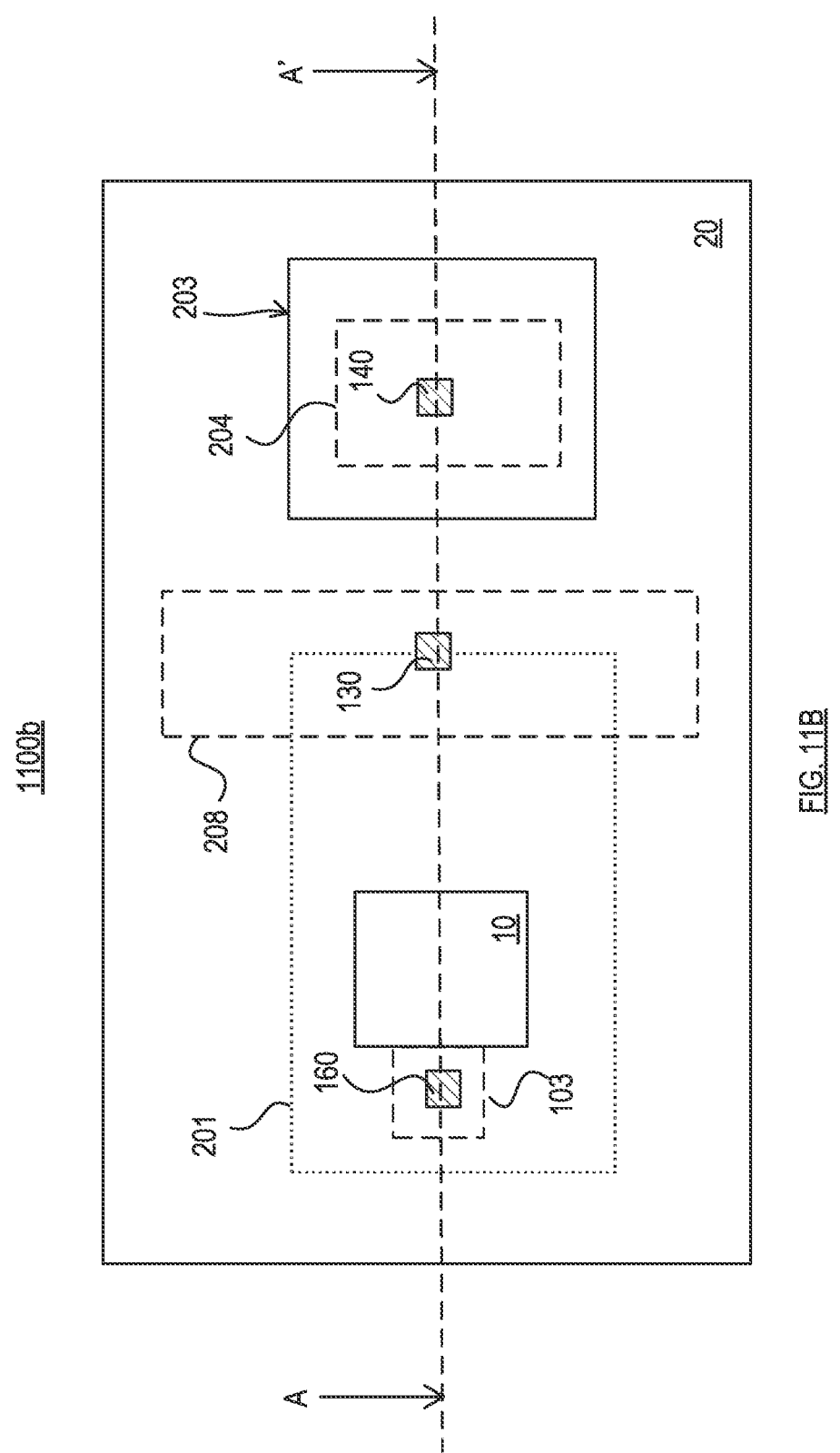
FIG. 11B illustrates a top view of a photo-detecting device, according to some embodiments.
Figure 11C:
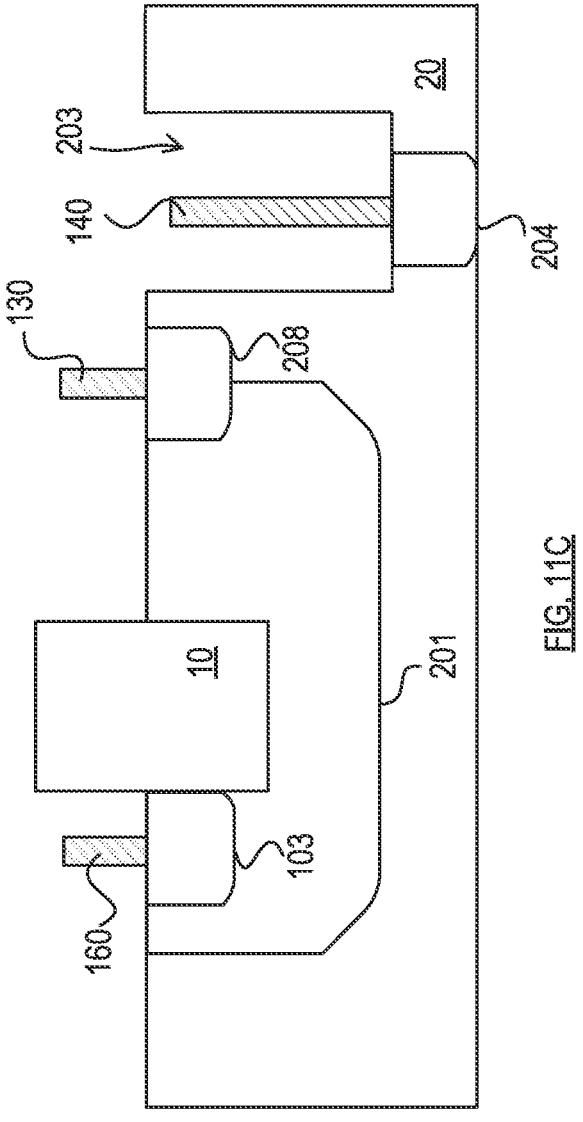
FIG. 11C illustrates a cross-sectional view along an A-A' line in FIG. 11B, according to some embodiments.

FIG. 11B illustrates a top view of a photo-detecting device, according to some embodiments. FIG. 11C illustrates a cross-sectional view along an A-A' line in FIG. 11B, according to some embodiments. The photo-detecting device 1100b in FIG. 11B is similar to the photo-detecting device 1100a in FIG. 11A. The difference is described below. The photo-detecting device 1100b further includes a modification element 203 integrated with the substrate 20. The modification element 203 is similar to the modification element 203 as described in FIGS. 10 B and 10C.

Figure 11D:
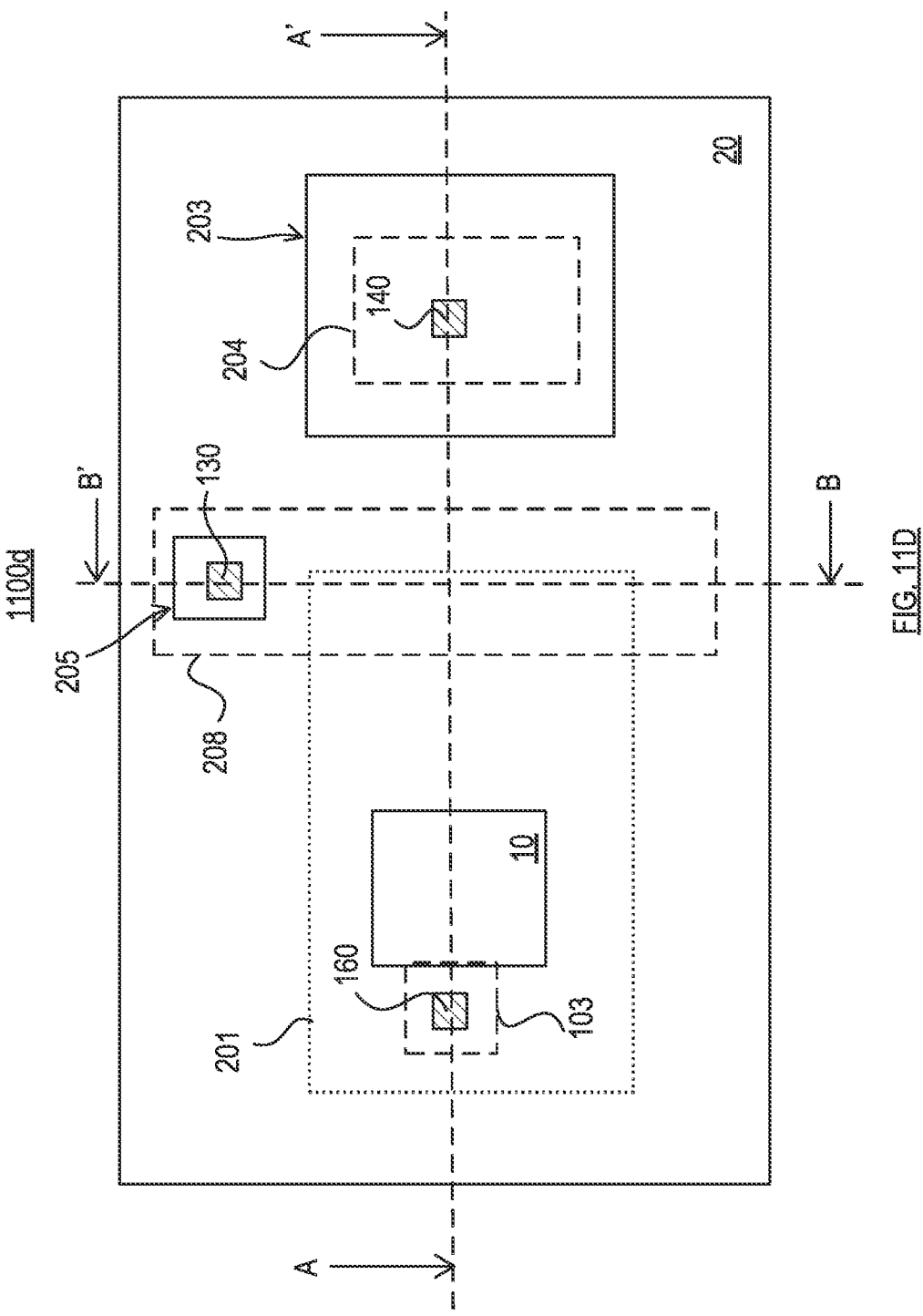
FIG. 11D illustrates a top view of a photo-detecting device, according to some embodiments.
Figure 11E:
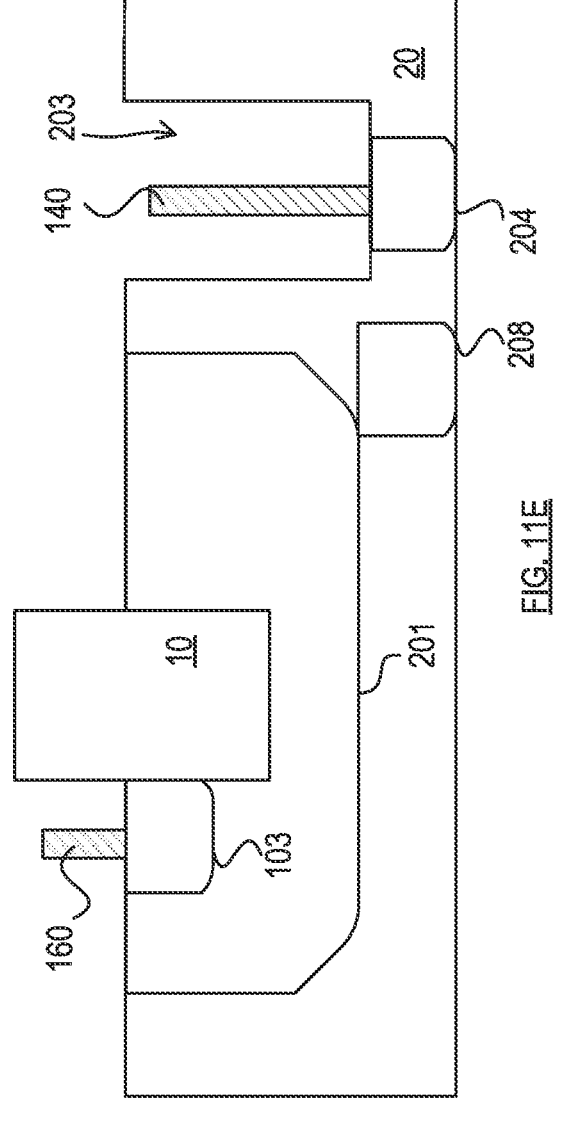
FIG. 11E illustrates a cross-sectional view along an A-A' line in FIG. 11D, according to some embodiments.

FIG. 11D illustrates a top view of a photo-detecting device, according to some embodiments. FIG. 11E illustrates a cross-sectional view along an A-A' line in FIG. 11D, according to some embodiments. A cross-sectional view along a B-B' line in FIG. 11D is the same as FIG. 10F. The photo-detecting device 1100d in FIG. 11D is similar to the photo-detecting device 1100b in FIG. 11B. The difference is described below. The third contact region 208 is similar to the third contact region 208 in FIG. 10D and FIG. 10E. Besides, the photo-detecting device 1100d further includes a recess 205 similar to the recess 205 as described in FIG. 10D and FIG. 10F, and the third electrode 130 is formed in the recess 205 to be electrically coupled to the third contact region 208.

Figure 12A:
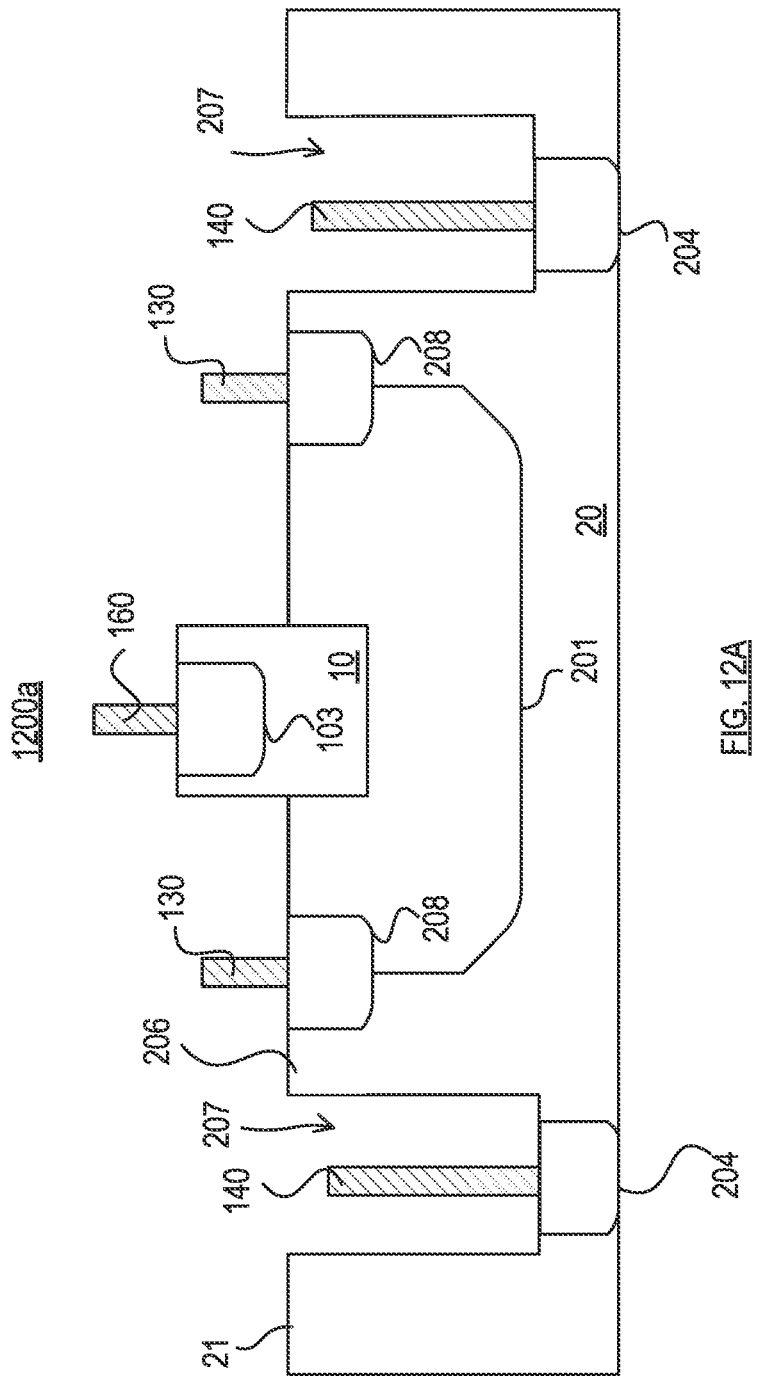
FIGS. 12A-12C illustrate cross-sectional views of the absorption region of a photo-detecting device, according to some embodiments.

FIG. 12A illustrates a cross-sectional view of a photo-detecting device, according to some embodiments. The photo-detecting device 1200a in FIG. 12A is similar to the photo-detecting device 1000c in FIG. 10C. The difference is described below. From the cross-sectional view of a photo-detecting device, the photo-detecting device 1200a includes two third contact regions 208, two first contact regions 204, two third electrodes 130 and two first electrodes 140. The third contact regions 208 are disposed at two opposite sides of the absorption region 10, and the two third electrodes 130 are electrically coupled to the respective third contact region 208. The first contact regions 204 are disposed at two opposite sides of the absorption region 10, and the first electrodes 140 are electrically coupled to the respective first contact region 204. A distance between the third contact regions 208 is less than a distance between the first contact regions 204. The substrate 20 further includes a waveguide 206 associated with the absorption region 10 for guiding and/or confining the incident optical signal passing through a defined region of the substrate 20. For example, the waveguide 206 may be a ridge defined by two trenches 207. The ridge is with a width greater than a width of the absorption region 10. An incident optical signal can be confined and propagate along the ridge 206. The trench may be similar to the trench mentioned in FIG. 10B and FIG. 10C, and may also be a modification element 203 as mentioned in FIG. 10B and FIG. 10C. For example, carriers are forced to pass through the multiplication region where the strongest electric field locates, such as the region near the corner of each of the trenches, which increases the avalanche multiplication gain. Similar to FIG. 10B and FIG. 10C, each of the first contact regions 204 is exposed in the respective trench 206 for electrically coupled to the respective first electrode 140.

Figure 12B:
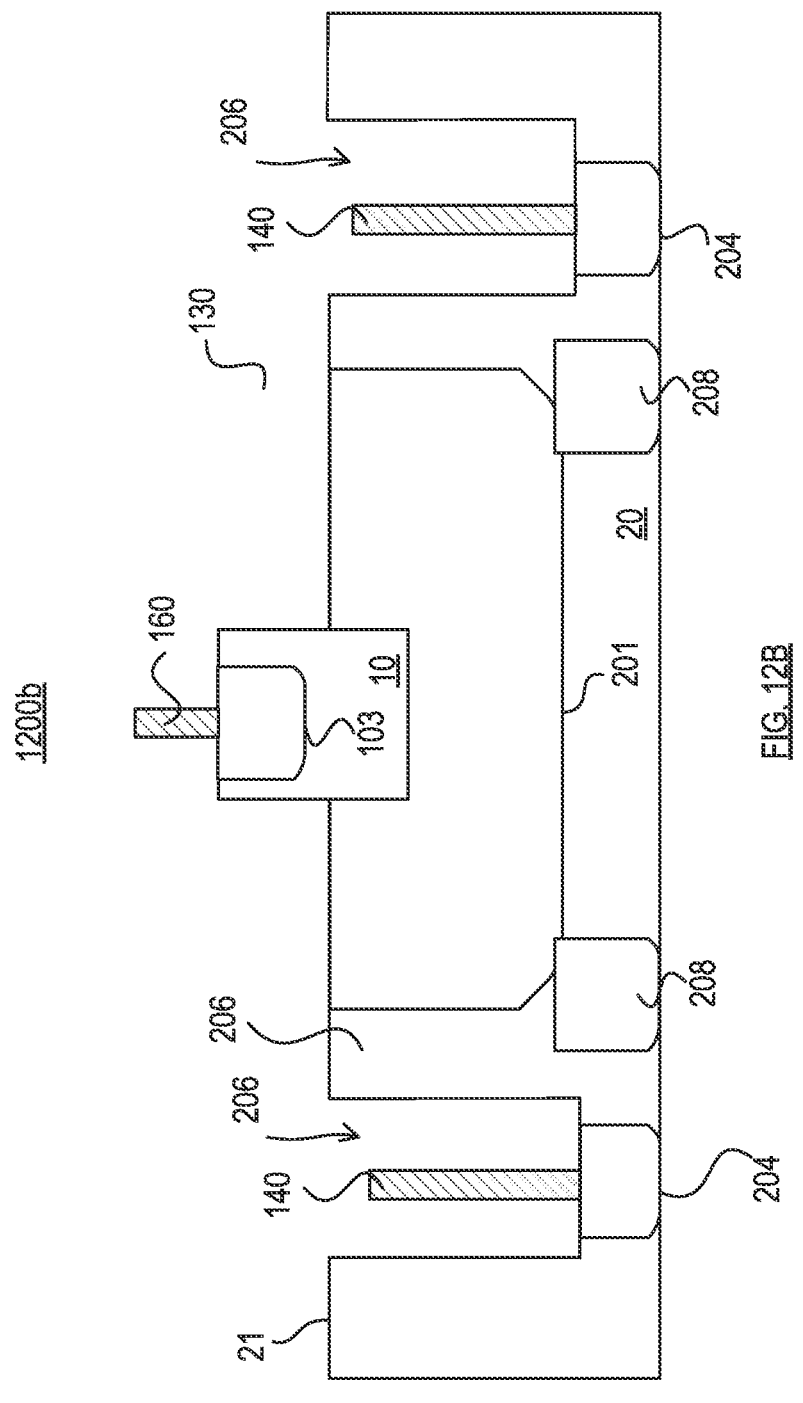

FIG. 12B illustrates a cross-sectional view of a photo-detecting device, according to some embodiments. The photo-detecting device 1200b in FIG. 12B is similar to the photo-detecting device 1100a in FIG. 12A. The difference is described below. The third contact regions 208 are similar to the third contact region 208 in FIG. 10 D and FIG. 10E. For example, a distance between the first surface 21 of the substrate 20 and a location of each of the third contact regions 208 having the peak dopant concentration is greater than 30 nm.

Figure 12C:
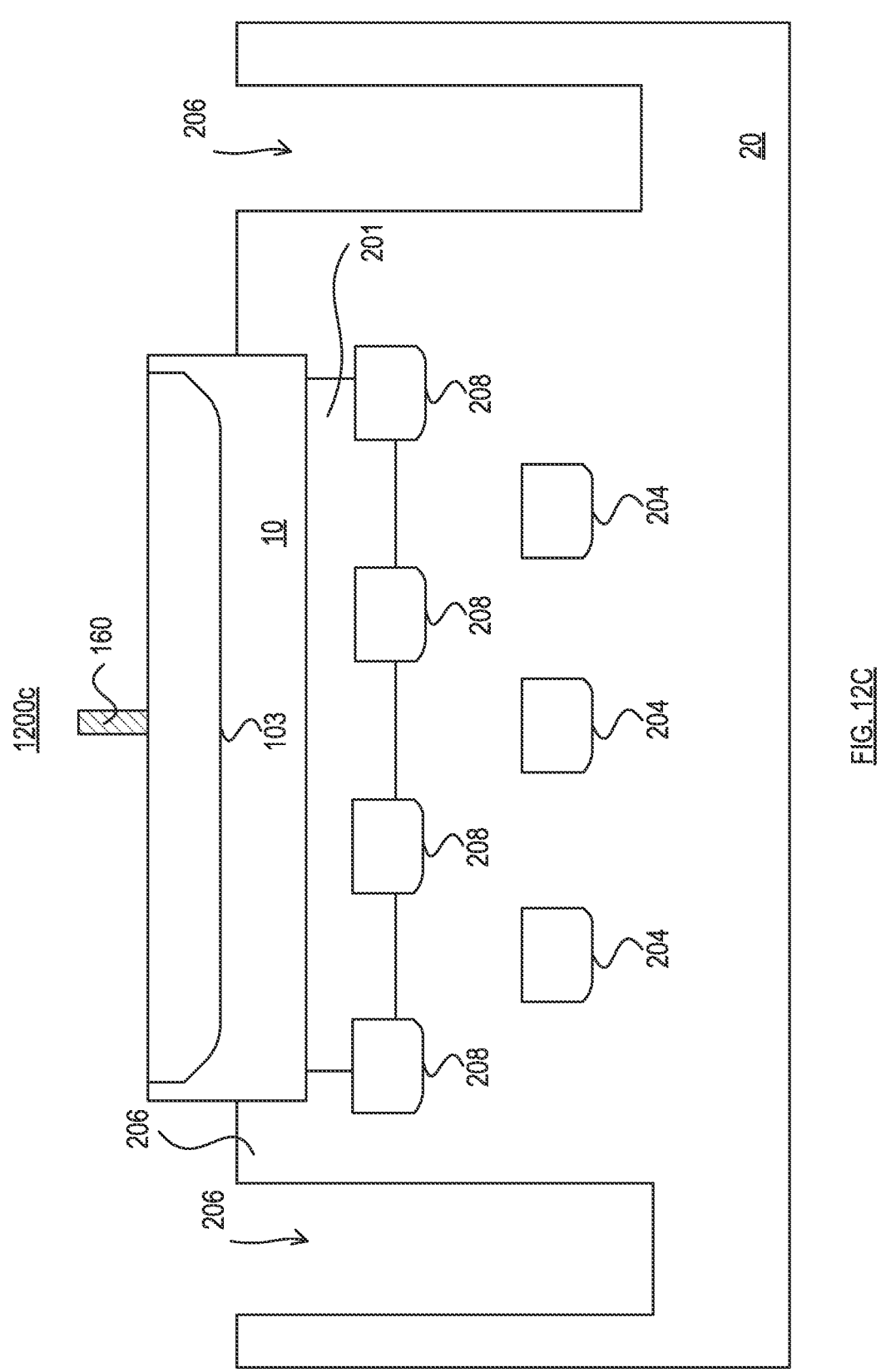

FIG. 12C illustrates a cross-sectional view of a photo-detecting device, according to some embodiments. The photo-detecting device 1200c in FIG. 12C is similar to the photo-detecting device 1000g in FIG. 10G. The difference is described below. The photo-detecting device 1200c further includes a waveguide 206 integrated with the substrate 20, where the waveguide 206 is similar to the waveguide 206 described in FIG. 12A.

Figure 13A:
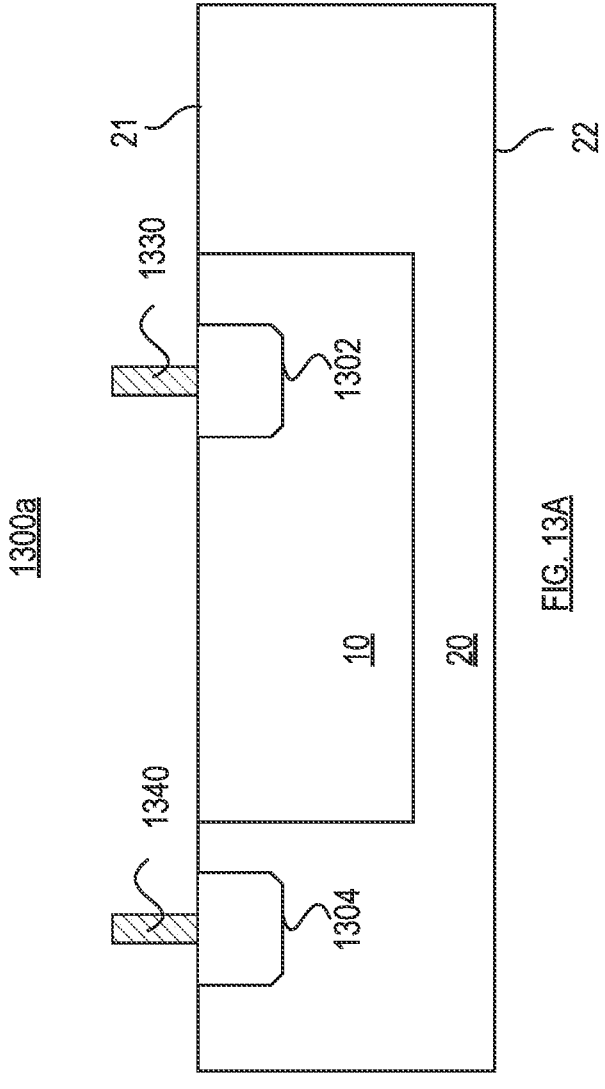
FIG. 13A illustrates a top view of a photo-detecting device, according to some embodiments.

FIG. 13A illustrates a cross-sectional view of a photo-detecting device, according to some embodiments. The photo-detecting device includes an absorption region 10 and a substrate 20 supporting the absorption region 10. The absorption region 10 is similar to the absorption region as described in FIG. 1A. The substrate 20 is similar to the substrate 20 as described in FIG. 1A. The difference between the photo-detecting device 1300a in FIG. 13A and the photo-detecting device 100a in FIG. 1A is described below.

The photo-detecting device 1300a includes a collector region 1302 and an emitter region 1304 separated from the collector region 1302. In some embodiments, the collector region 1302 is in the absorption region 10. The emitter region 1304 is outside of the absorption region 10 and is in the substrate 20. The collector region 1302 is for collecting amplified photo-carriers generated from the absorption region 10. The collector region 1302 is of a conductivity type. The emitter region 1304 is of a conductivity type the same as the conductivity type of the collector region 1302. The conductivity type of the absorption region 10 is the same as the conductivity type of the collector region 1302. For example, the conductivity type of the absorption region 10 is p-type, and the conductivity type of the collector region 1302 and the conductivity type of the emitter region 1304 are p-type. In some embodiments, the collector region 1302 includes a dopant and has a dopant profile with a peak dopant concentration higher than the first peak doping concentration of the absorption region 10, for example, may be ranging from $5 \times 10^{18}$ cm$^{-3}$ to $5 \times 10^{20}$ cm$^{-3}$.

In some embodiments, the emitter region 1304 includes a dopant and has a dopant profile with a peak dopant concentration higher than the second peak doping concentration of the second dopant of the substrate 20, for example, can be ranging from, $1 \times 10^{17}$ cm$^{-3}$ to $5 \times 10^{18}$ cm$^{-3}$.

The photo-detecting device 1300a includes a first electrode 1330 electrically coupled to the collector region 1302 and includes a second electrode 1340 electrically coupled to the emitter region 1304. The first electrode 1330 serves as a collector electrode. The second electrode 1340 serves as an emitter electrode.

In some embodiments, similar to the conducting area described in FIG. 1A, a conducting area (not shown) can be formed in the carrier conducting layer, that is the substrate 20 in some embodiments. The conducting region 201 is between the emitter region 1304 and the absorption region 10. In some embodiments, the conducting region 201 is partially overlapped with the absorption region 10 and the emitter region 1304 for confining a path of the carriers generated from the absorption region 10 moving towards the emitter region 1304. In some embodiments, the conducting region 201 has a depth measured from the first surface 21 of the substrate 20 along a direction substantially perpendicular to the first surface 21 of the substrate 20. The depth is to a position where the dopant profile of the second dopant reaches a certain concentration, such as $1 \times 10^{15}$ cm$^{-3}$.

Similarly, by the design of the concentration and the material of the absorption region 10 and the carrier conducting layer, that is the substrate 20 in some embodiments, the photo-detecting device 1300a can have lower dark current.

In some embodiments, a method for operating the photo-detecting device 1300a includes the steps of: generating a reversed-biased PN junction between the absorption region 10 and the substrate 20 and generating a forward-biased PN junction between the substrate 20 and the emitter region 1304; and receiving an incident light in the absorption region 10 to generate an amplified photocurrent.

For example, the photo-detecting device 1300a may include a p-doped emitter region 1304, a n-doped substrate 20, a p-doped absorption region 10, and an p-doped collector region 1302. The PN junction between the p-doped emitter region 1304 and the n-doped substrate 20 is forward-biased such that a hole-current is emitted into the n-doped substrate 20. The PN junction between the p-doped absorption region 10 and the n-doped substrate 20 is reverse-biased such that the emitted hole-current is collected by the first electrode 1330. When light (e.g., a light at 940 nm, 1310 nm, or any suitable wavelength) is incident on the photo-detecting device 1300a, photo-carriers including electrons and holes are generated in the absorption region 10. The photo-generated holes are collected by the first electrode 1330. The photo-generated electrons are directed towards the n-doped substrate 20, which causes the forward-bias to increase due to charge neutrality. The increased forward-bias further increases the hole-current being collected by the first electrode 1330, resulting in an amplified hole-current generated by the photo-detecting device 1300a.

Accordingly, a second electrical signal collected by the collector region 1302 is greater than the first electrical signal generated by the absorption region 10, and thus the photo-detecting device 1300a is with gain and thus is with improved signal to noise ratio.

In some embodiments, a method for operating the photo-detecting device 1300a capable of collecting holes includes the steps of: applying a first voltage V1 to the first electrode 1330 and applying a second voltage V2 to the second electrode 1340 to generate a first current flowing from the second electrode 1340 to the first electrode 1330, where the second voltage V2 is higher than the first voltage V1; and receiving an incident light in the absorption region 10 to generate a second current flowing from the second electrode 1340 to the first electrode 1330 after the absorption region 10 generates photo-carriers from the incident light, where the second current is larger than the first current.

In some embodiments, a method for operating the photo-detecting device 1300a capable of collecting holes includes the steps of: applying a second voltage V2 to the second electrode 1340 to form a forward-bias between the emitter region 1304 and the substrate 20 to form a first hole current, and applying a first voltage to the first electrode 1330 to form a reverse-bias between the substrate 20 and an absorption region 10 to collect a portion of the first hole current, where the second voltage V2 is higher than the first voltage V1; receiving an incident light in the absorption region 10 to generate photo-carriers including electrons and holes; and amplifying a portion of the holes of the photo-carriers to generate a second hole current; and collecting a portion of the second hole current by the collector region 1302, where the second hole current is larger than the first hole current.

Figure 13B:
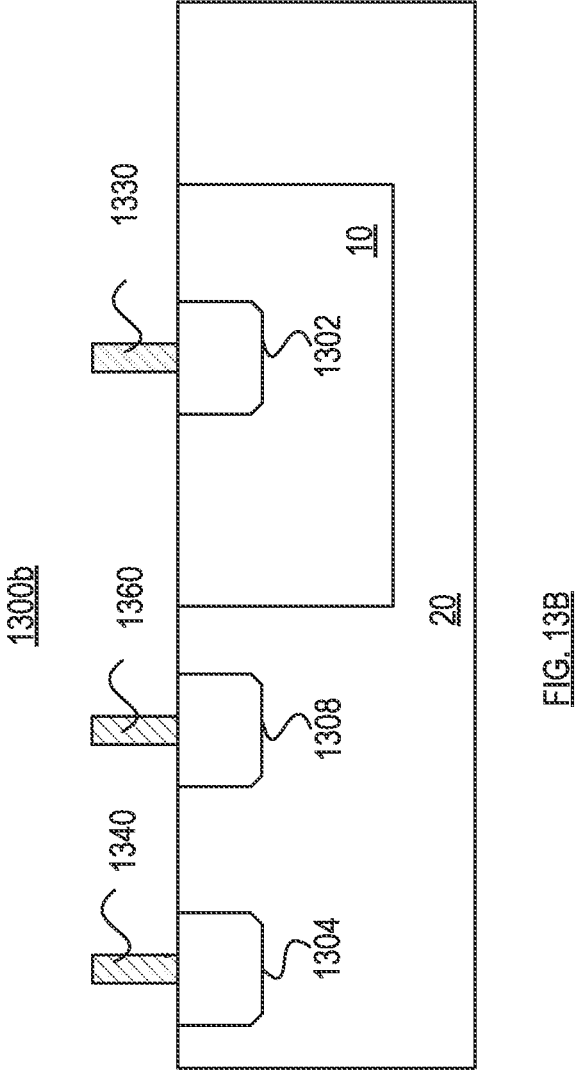
FIG. 13B illustrates a top view of a photo-detecting device, according to some embodiments.

FIG. 13B illustrates a cross-sectional view of a photo-detecting device, according to some embodiments. The photo-detecting device 1300b in FIG. 13B is similar to the photo-detecting device 1300a in FIG. 13A. The difference is described below. The photo-detecting device further includes a base region 1308 and a third electrode 1360 electrically coupled to the base region 1308. The third electrode 1360 serves as a base electrode. In some embodiments, the base region 1308 is between the collector region 1302 and the emitter region 1304. The base region 1308 is of a conductivity type different from the conductivity type of the collector region 1302. In some embodiments, base region 1308 is in the substrate 20.

In some embodiments, the base region 1308 includes a dopant and has a dopant profile with a peak dopant concentration higher than the second peak doping concentration of the second dopant of the substrate 20, for example, can be ranging from $1 \times 10^{17}$ cm$^{-3}$ to $5 \times 10^{18}$ cm$^{-3}$.

The third electrode 1360 is for biasing the base contact region 1308. In some embodiments, the third electrode 1360 is for evacuating the photo-carriers with opposite type and not collected by the first electrode 1330 during the operation of the photo-detecting device 1300b. For example, if the photo-detecting device 1300b is configured to collect holes, which are further processed by such as circuitry, the third electrode 1360 is for evacuating electrons. Therefore, the photo-detecting device 1300b can have improved reliability.

In some embodiments, a method for operating the photo-detecting device 1300b capable of collecting holes includes the steps of: applying a second voltage V2 to the second electrode 1340 to form a forward-bias between the emitter region 1304 and the substrate 20 to form a first hole current, and applying a first voltage to the first electrode 1330 to form a reverse-bias between the substrate 20 and an absorption region 10 to collect a portion of the first hole current, where the second voltage V2 is higher than the first voltage V1; applying a third voltage to a third electrode 60 electrically coupled to a base contact region 1308 of the photo-detecting device; receiving an incident light in the absorption region 10 to generate photo-carriers including electrons and holes; and amplifying a portion of the holes of the photo-carriers to generate a second hole current; and collecting a portion of the second hole current by the collector region 1302, and where the third voltage V3 is between the first voltage V1 and the second voltage V2.

A reverse-biased is formed across the p-n junction between the collector region 1302 and the base region 1308, and a forward-biased is formed across the p-n junction between the emitter region 1304 and the base region 1308. In some embodiments, where the step of the applying the third voltage V3 to the third electrode 1360 and the step of applying the first voltage V1 to the first electrode 30 and applying the second voltage V2 to the second electrode 1340 are operated at the same time.

In some embodiments, the arrangement of the third electrode 1360, first electrode 1330 and the second electrode 1340 and the arrangement of the base region 1308, collector region 1302 and the emitter region 1304 can be different. For example, in some embodiments, the second electrode 1340 is between the first electrode 1330 and the third electrode 1360. The emitter region 1304 is between the collector region 1302 and the base region 1308.

Figure 14A:
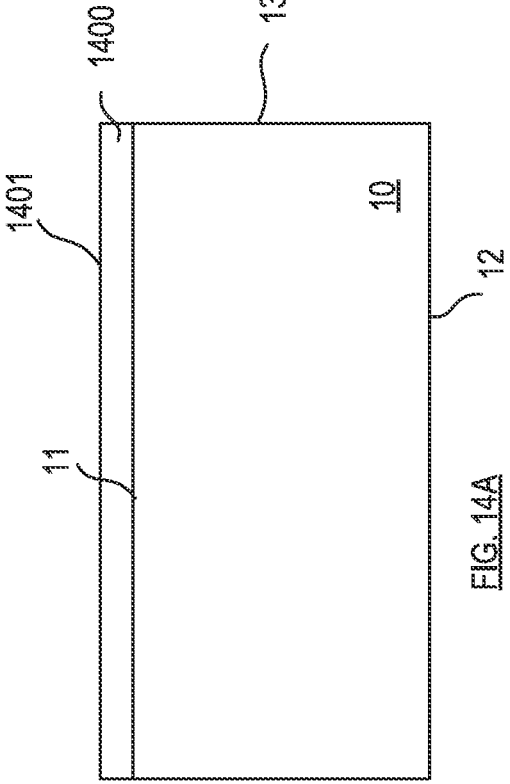
FIG. 14A illustrates a cross-sectional view of a portion of the photo-detecting device, according to some embodiments.
Figure 14B:
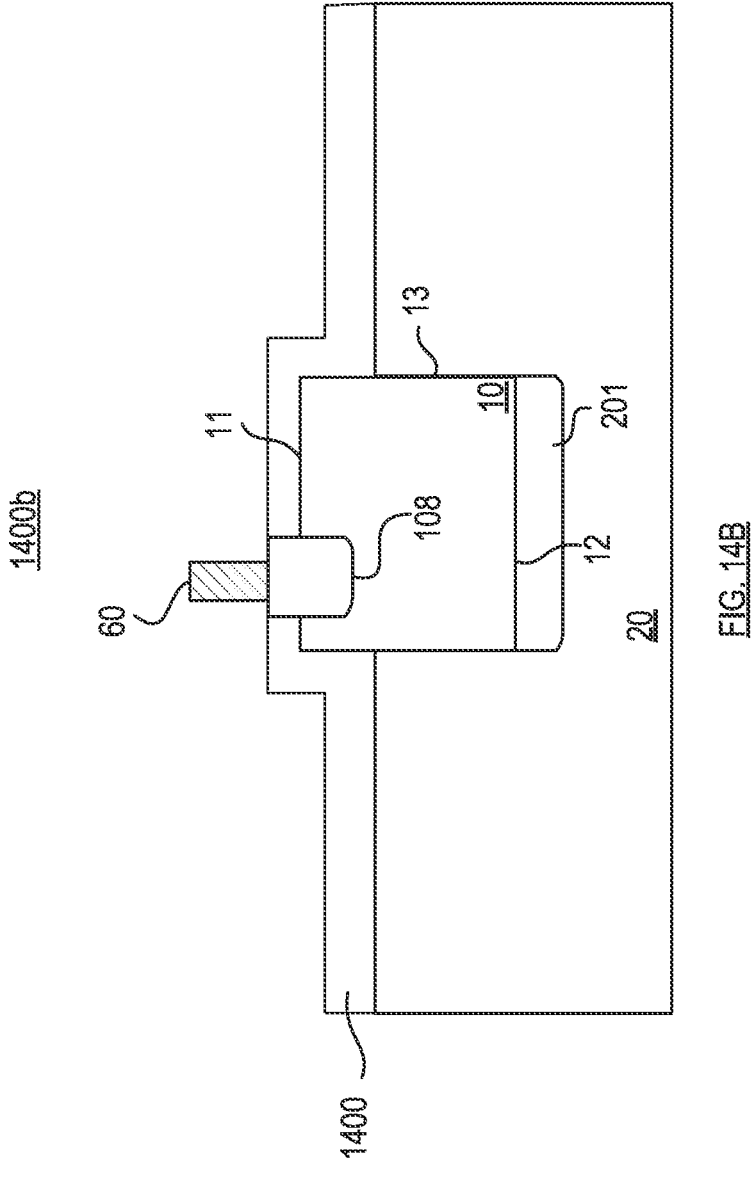
FIG. 14B illustrates a cross-sectional view along a line passing second doped region 108 of the photo-detecting device, according to some embodiments.

FIG. 14A illustrates a cross-sectional view of a portion of a photo-detecting device, according to some embodiments. The photo-detecting device can be any photo-detecting device described before. The photo-detecting device further includes a passivation layer 1400 over a first surface 11 of the absorption region 10. In some embodiments, the passivation layer 1400 further covers a portion of the first surface 21 of the substrate 20, and the readout electrodes 330a, 330b and the control electrodes 340a, 340b may be or may not be over a first surface 1401 of the passivation layer 1400. In some embodiments, the absorption region 10 is protruded from the first surface 21 of the substrate 20, and the passivation layer 1400 further covers side surfaces 13 of the absorption region 10 exposed from the substrate 20. That is, the passivation layer 1400 may be conformally formed on the absorption region 10 and the substrate 20 as shown in FIG. 14B. In some embodiments, the second electrode 60 is formed on a surface of the passivation layer 1400 higher than a surface of the passivation layer 1400 where the readout electrodes 330a, 330b and the control electrodes 340a, 340b may be formed. In some embodiments, the control electrodes 340a, 340b, the readout electrodes 330a, 330b and the second electrode 60 are all disposed over the of the first surface of the carrier conducting layer. That is, the control electrodes 340a, 340b, the readout electrodes 330a, 330b and the second electrode 60 are over a same side of the carrier conducting layer, that is the passivation layer 1400 in some embodiments, which is benefit for the backend fabrication process afterwards.

The passivation layer 1400 may include amorphous silicon, poly silicon, epitaxial silicon, aluminum oxide (e.g., $Al_xO_y$), silicon oxide (e.g., $Si_xO_y$), Ge oxide (e.g., $Ge_xO_y$), germanium-silicon (e.g., GeSi), silicon nitride family (e.g., $Si_xN_y$), high-k materials (e.g. $HfO_x$, $ZnO_x$, $LaO_x$, $LaSiO_x$), and any combination thereof. The presence of the passivation layer 1400 may have various effects. For example, the passivation layer 1400 may act as a surface passivation layer to the absorption region 10, which may reduce dark current or leakage current generated by defects occurred at the exposed surface of the absorption region 10. In some embodiments, the passivation layer 1400 may have a thickness between 20 nm and 100 nm. FIG. 14B illustrates a cross-sectional view along a line passing through second doped region 108 of the photo-detecting device, according to some embodiments. In some embodiments, a part of the doped region in the absorption region 10, such as second doped region 108 or the second contact region 103 may be formed in the corresponding portions of the passivation layer 1400. That is, the dopant of the doped region, such as the second doped region 108 or the second contact region 103, may be in the corresponding portions of the passivation layer 1400 between the absorption region 10 and the respective electrode.

Figure 14C:
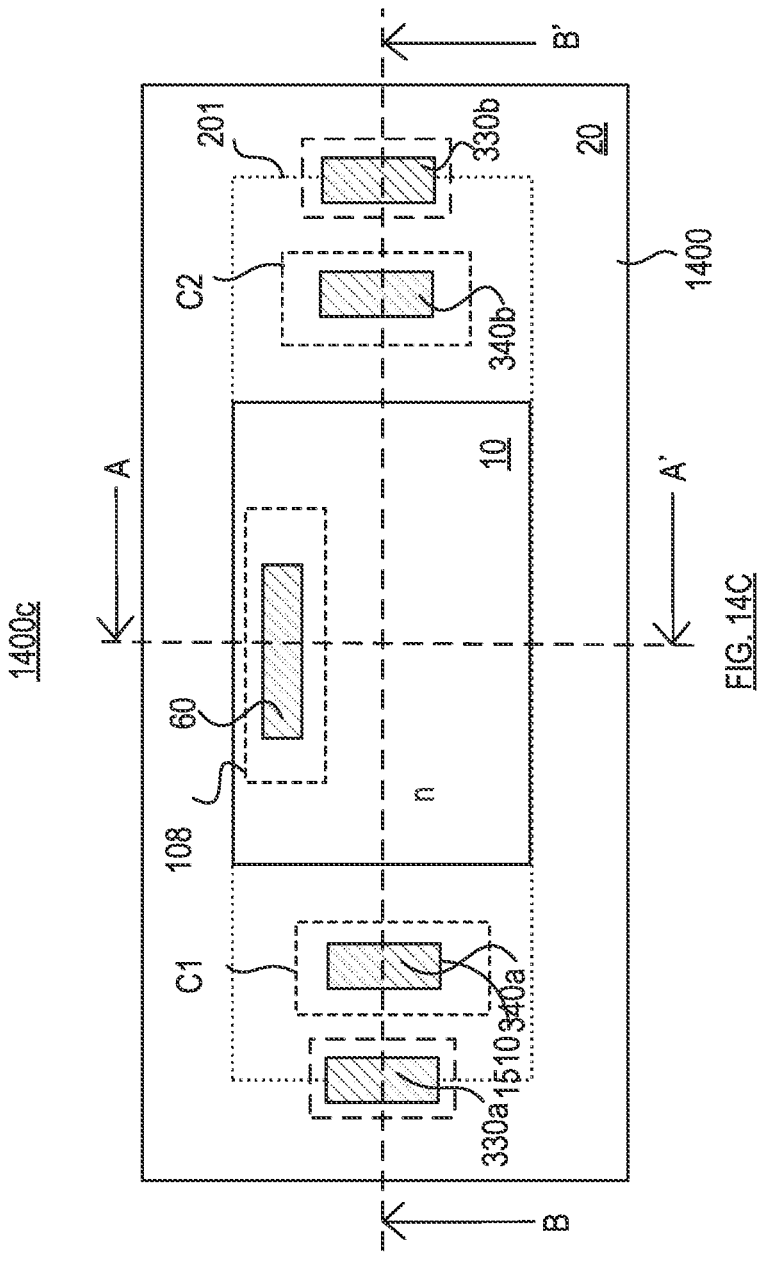
FIG. 14C illustrates a top view of a photo-detecting device, according to some embodiments.
Figure 14D:
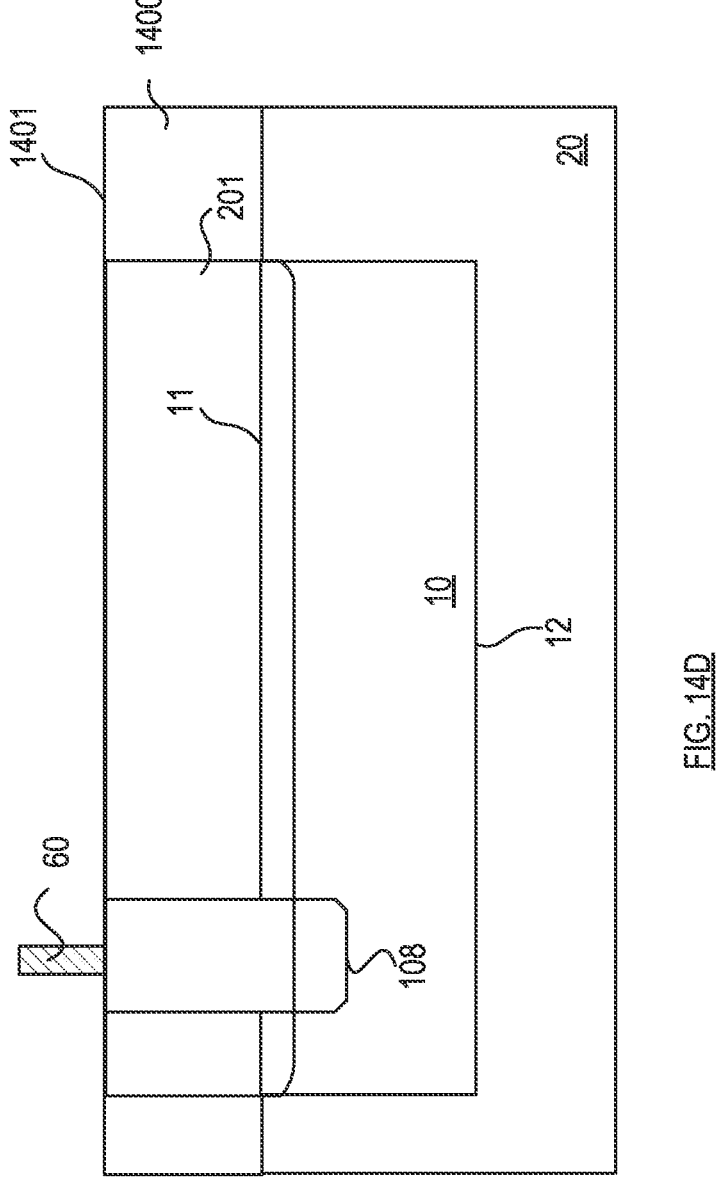
FIG. 14D illustrates a cross-sectional view along an A-A' line in FIG. 14B, according to some embodiments.
Figure 14E:
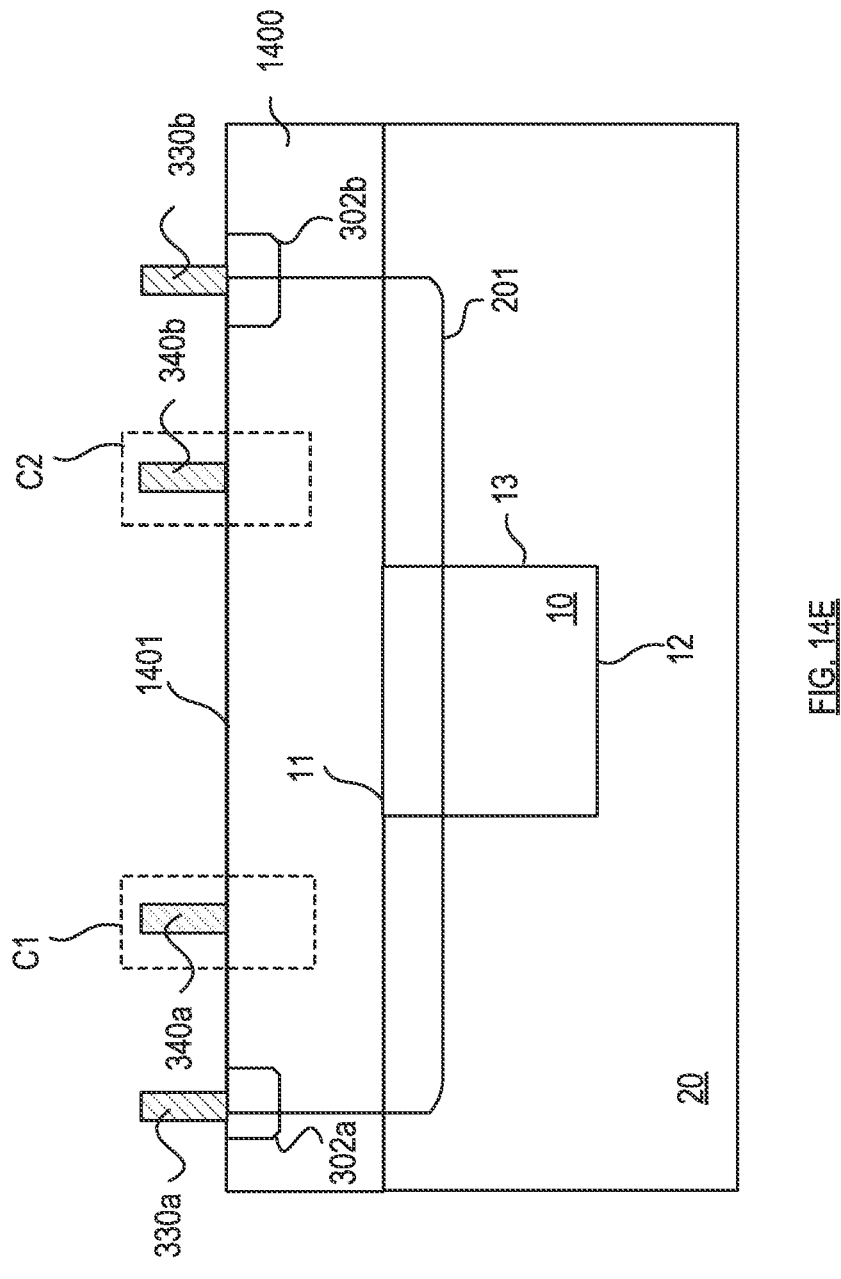
FIG. 14E illustrates a cross-sectional view along a B-B' line in FIG. 14B, according to some embodiments.

FIG. 14C illustrates a top view of a photo-detecting device, according to some embodiments. FIG. 14D illustrates a cross-sectional view along an A-A' line in FIG. 14C, according to some embodiments. FIG. 14E illustrates a cross-sectional view along a B-B' line in FIG. 14C, according to some embodiments. The photo-detecting device 1400c in FIG. 14C is similar to the photo-detecting device 300a in FIG. 3A. The difference is described below. The absorption region 10 is fully embedded in the substrate 20. The photo-detecting device 1400c includes a passivation layer 1400 on the absorption region 10 and the substrate 20, where the passivation layer 1400 is similar to the passivation layer 1400 described in FIG. 14A. In some embodiments, the thickness of the passivation layer 1400 can be between 100 nm and 500 nm. The readout electrodes 330a, 330b and the control electrodes 340a, 340b are over the first surface 1401 of the passivation layer 1400 and are separated from the absorption region 10. In some embodiments, the readout electrodes 330a, 330b, the control electrodes 340a, 340b and the second electrode 60 are coplanarly formed on the passivation layer 1400, and thus a height difference between the electrodes can be reduced. The carrier conducting layer is in the passivation layer 1400 instead of the substrate 20. That is, the heterointerface is between the passivation layer 1400 and the absorption region 10. In some embodiments, the first surface 11 of the absorption region 10 is at least partially in direct contact with the passivation layer 1400 and thus the heterointerface is formed between the absorption region 10 and the passivation layer 1400. The substrate 20 may be intrinsic and may not be limited to the description in FIG. 1A.

In some embodiments, the second doped region 108 is similar to the second doped region 108 describe in FIG. 3A. The difference is described below. The second doped region 108 is in passivation layer 1400 and in the absorption region 10. In some embodiments, the second doped region 108 has a depth equal to or greater than a thickness of the passivation layer 1400, so as to guide the carriers with the second type to move towards the second electrode 60 and to be further evacuated by a circuit. The depth is measured from the first surface 1401 of the passivation layer 1400, along a direction substantially perpendicular to the first surface 1401 of the passivation layer 1400. The depth is to a position where the dopant profile of the fourth dopant reaches a certain concentration, such as $1 \times 10^{15}$ cm$^{-3}$.

Similar to the photo-detecting device 100a in FIG. 1A, in some embodiments, a doping concentration of the first dopant at the heterointerface between the absorption region 10 and the carrier conducting layer, that is the passivation layer 1400 in some embodiment, is equal to or greater than $1 \times 10^{16}$ cm$^{-3}$. In some embodiments, the doping concentration of the first dopant at the heterointerface can be between $1 \times 10^{16}$ cm$^{-3}$ and $1 \times 10^{20}$ cm$^{-3}$ or between $1 \times 10^{17}$ cm$^{-3}$ and $1 \times 10^{20}$ cm$^{-3}$. In some embodiments, a doping concentration of the second dopant at the heterointerface is lower than the doping concentration of the first dopant at the heterointerface. In some embodiments, a doping concentration of the second dopant at the heterointerface between $1 \times 10^{12}$ cm$^{-3}$ and $1 \times 10^{17}$ cm$^{-3}$.

In some embodiment, the concentration of the graded doping profile of the first dopant is gradually deceased from the second surface 12 to the first surface 11 of the absorption region 10 so as to facilitate the moving of the carriers, such as the electrons if the first doped regions 302a, 302b are of n-type.

In some embodiments, the first switch (not labeled) and the second switch (not labeled) are partially formed in the carrier conducting layer, that is the passivation layer 1400 in some embodiments. In some embodiments, the first doped regions 302a, 302b are in the passivation layer 1400. In some embodiments, the third peak doping concentrations of the first doped regions 302a, 302b lie in the passivation layer 1400.

In some embodiments, the depth of each of the first doped regions 302a, 302b is less than a thickness of the passivation layer 1400. The depth is measured from the first surface 1401 of the passivation layer 1400 to a position where the dopant profile reaches a certain concentration, such as $1 \times 10^{15}$ cm$^{-3}$.

In some embodiments, the absorption function and the carrier control function such as demodulation of the carriers and collection of the carriers operate in the absorption region 10 and the carrier conducting layer, that is, the passivation layer 1400 in some embodiments, respectively.

In some embodiments, a conducting region 201 can be formed in the carrier conducting layer, that is the passivation layer 1400 in some embodiments. The conducting region 201 can be similar to the conducting region 201 described in FIG. 3A, such as the conducting region 201 is overlapped with a portion of the first doped regions 302a, 302b in the passivation layer 1400. The difference is described below. In some embodiments, the conducting region 201 has a depth equal to or greater than a thickness of the passivation layer 1400, so as to confine and guide the carriers with the first type to move towards one of the first doped regions 302a, 302b. The depth is measured from the first surface 1401 of the passivation layer 1400, along a direction substantially perpendicular to the first surface 1401 of the passivation layer 1400. The depth is to a position where the dopant profile of the second dopant reaches a certain concentration, such as $1 \times 10^{15}$ cm$^{-3}$.

Figure 14F:
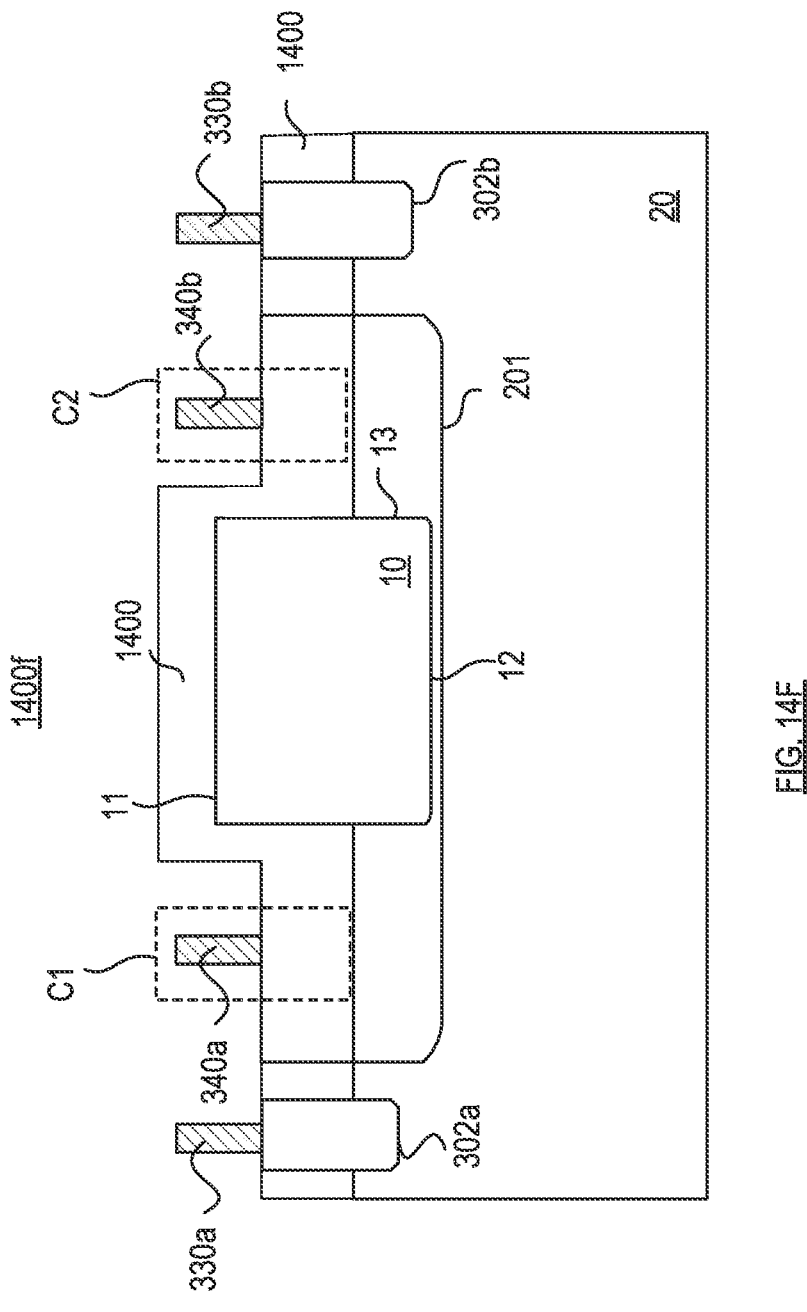
FIG. 14F illustrates a cross-sectional view of a photo-detecting device, according to some embodiments.

In some embodiments, a width of the absorption region 10 is less than a distance between the distance between the two control electrodes 340a, 340b, which can reduce the leakage current between the two control electrodes 340a, 340b. FIG. 14F illustrates a cross-sectional view of a photo-detecting device, according to some embodiments. The photo-detecting device 1400f in FIG. 14F is similar to the photo-detecting device 1400e in FIG. 14E. The difference is described below. The absorption region 10 is partially embedded in the substrate 20. The passivation layer 1400 is conformally formed on the absorption region 10 and substrate 20 to cover the exposed side surfaces 13 of the absorption region 10. The conducting region 201 can surround the absorption region 10 or overlapped with all of the surfaces of the absorption region 10, that is, overlapped with the first surface 11, the second surface 12, and all of the side surfaces 13 of the absorption region 10.

In some embodiments, the depth of each of the first doped regions 302a,302b is greater than a thickness of the passivation layer 1400. The depth is measured from the first surface 1401 of the passivation layer 1400 to a position where the dopant profile reaches a certain concentration, such as $1 \times 10^{15}$ cm$^{-3}$. In some embodiments, the depth of each of the first doped regions 302a,302b is less than a thickness of the passivation layer 1400. The depth is measured from the first surface 1401 of the passivation layer 1400 to a position where the dopant profile reaches a certain concentration, such as $1 \times 10^{15}$ cm$^{-3}$.

Figure 14G:
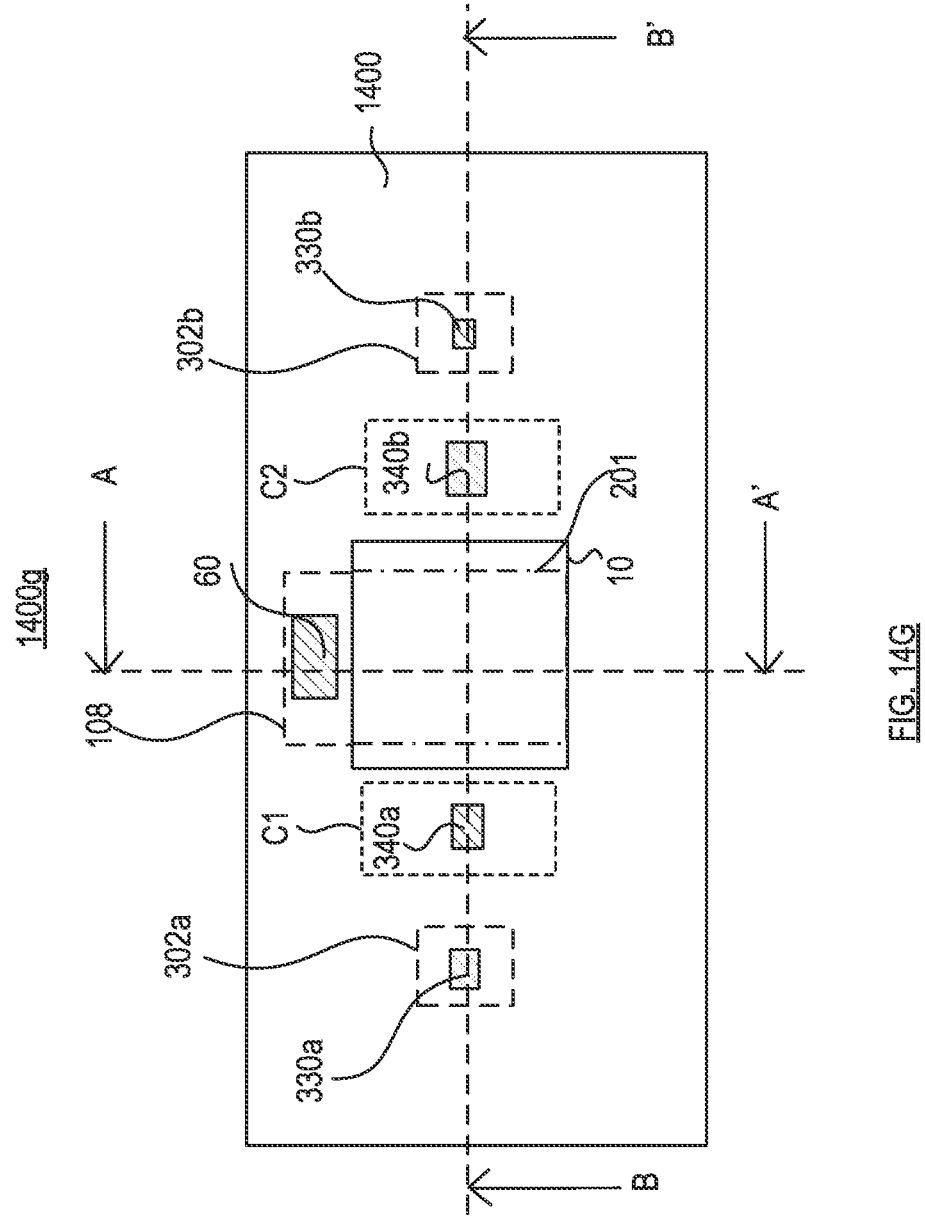
FIG. 14G illustrates a top view of a photo-detecting device, according to some embodiments.
Figure 14H:
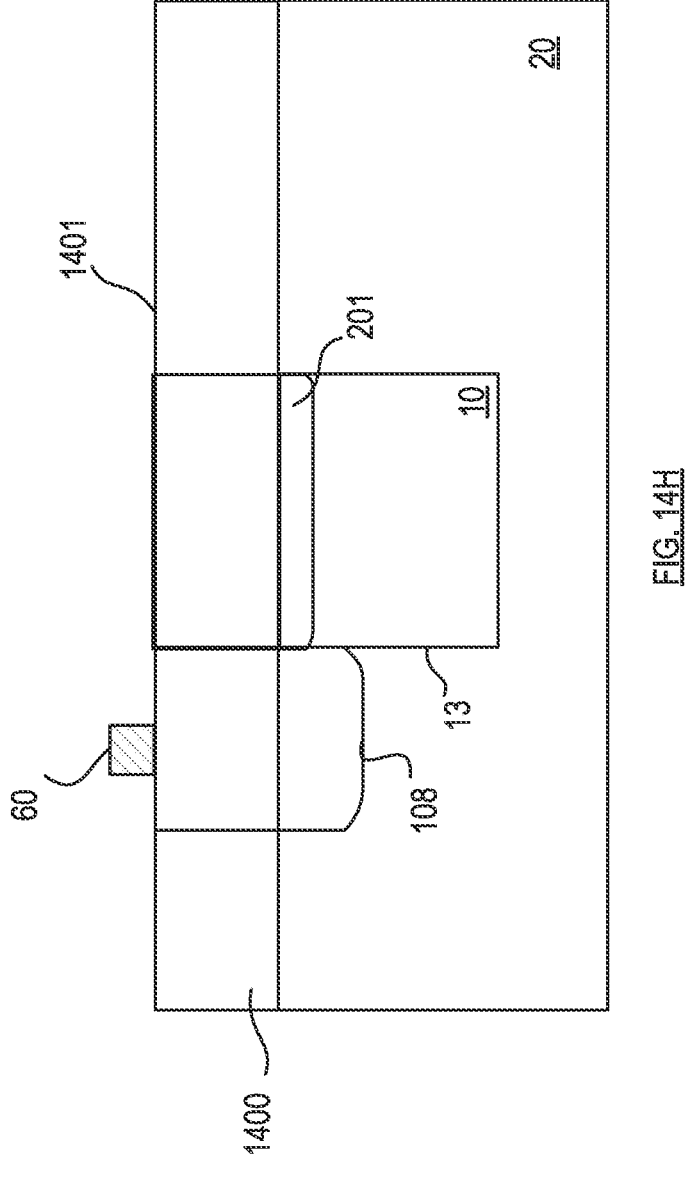
FIG. 14H illustrates a cross-sectional view along an A-A' line in FIG. 14G, according to some embodiments.
Figure 14I:
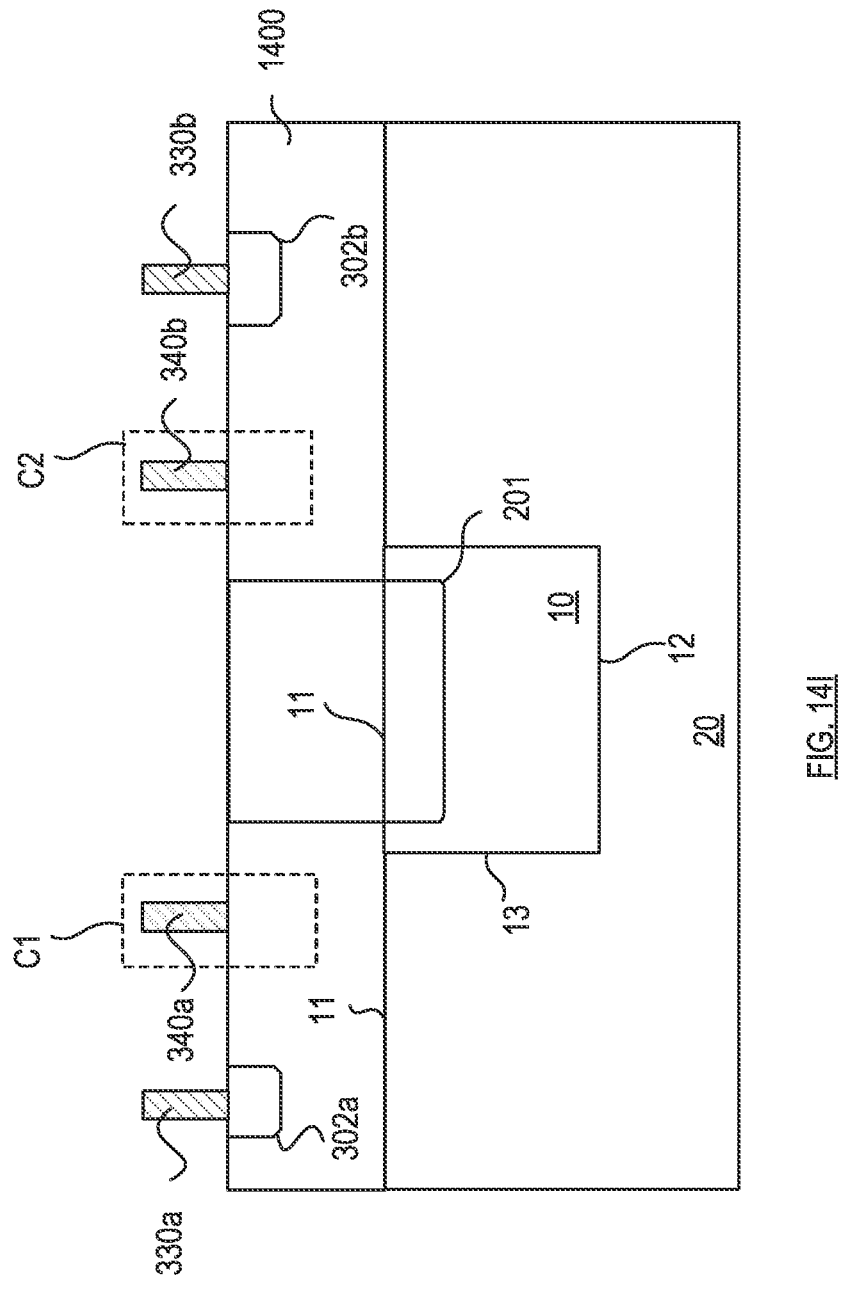
FIG. 14I illustrates a cross-sectional view along a B-B' line in FIG. 14G, according to some embodiments.

FIG. 14G illustrates a top view of a photo-detecting device, according to some embodiments. FIG. 14H illustrates a cross-sectional view along an A-A' line in FIG. 14G, according to some embodiments. FIG. 14I illustrates a cross-sectional view along a B-B' line in FIG. 14G, according to some embodiments. The photo-detecting device 1400g in FIG. 14G is similar to the photo-detecting device 1400c in FIG. 14C. The difference is described below. The second doped region 108 is in the substrate 20. In other words, the fourth peak doping concentration of the second doped region 108 lies in the substrate 20. In some embodiment, the second doped region 108 is below the first surface 1401 of the passivation layer 1400 and is in direct contact with the absorption region 10, for example, the second doped region 108 may be in contact with or overlapped with one of the side surfaces 13 of the absorption region 10. As a result, the carriers generated from the absorption region 10 can move from the absorption region 10 towards the second doped region 108 through the heterointerface between the absorption region 10 and the substrate 20. The second electrode 60 is over the first surface 1401 of the passivation layer 1400.

Figure 14J:
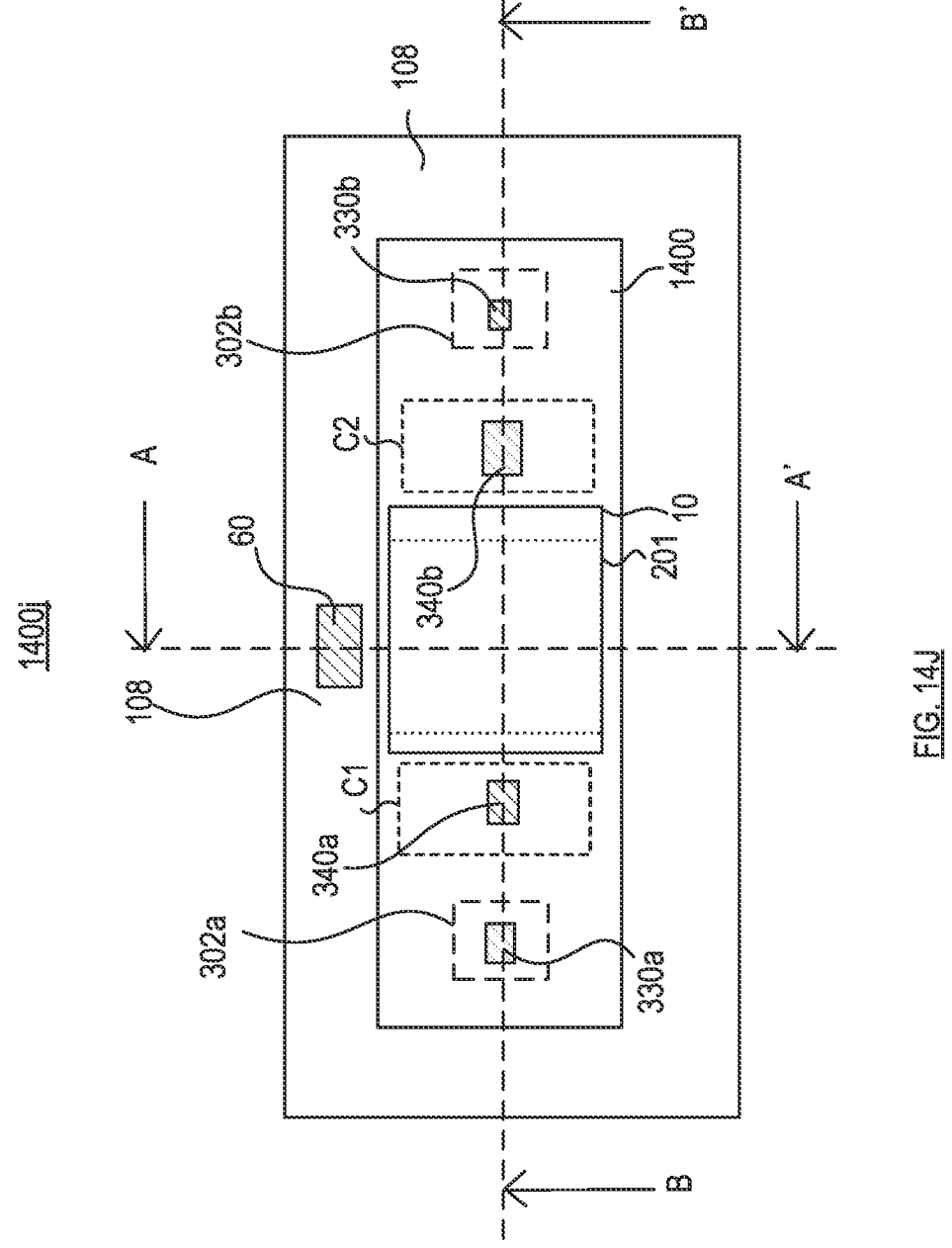
FIG. 14J illustrates a top view of a photo-detecting device, according to some embodiments.
Figure 14K:
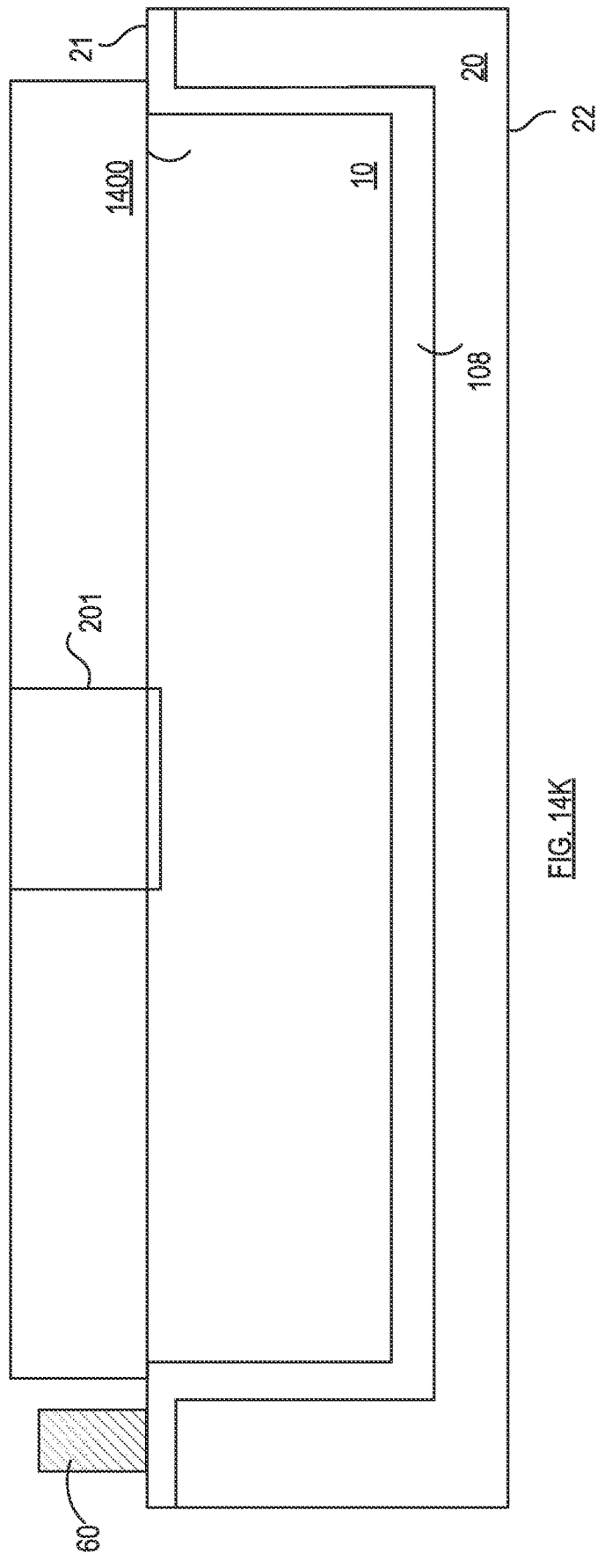
FIG. 14K illustrates a cross-sectional view along an A-A' line in FIG. 14J, according to some embodiments.
Figure 14L:
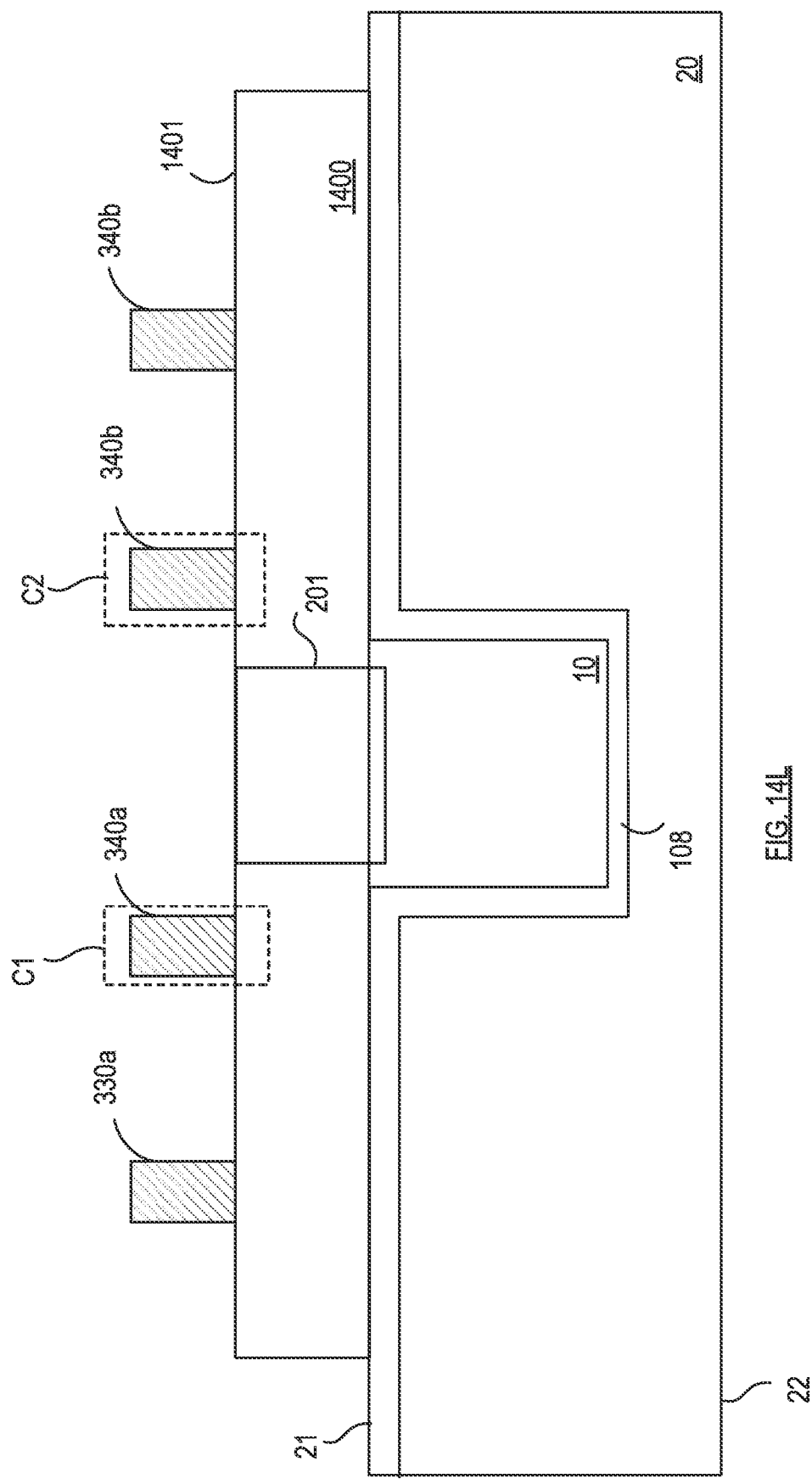
FIG. 14L illustrates a cross-sectional view along a B-B' line in FIG. 14J, according to some embodiments.

FIG. 14J illustrates a top view of a photo-detecting device, according to some embodiments. FIG. 14K illustrates a cross-sectional view along an A-A' line in FIG. 14J, according to some embodiments. FIG. 14K illustrates a cross-sectional view along a B-B' line in FIG. 14J, according to some embodiments. The photo-detecting device 1400j in FIG. 14J is similar to the photo-detecting device 1400g in FIG. 14G. The difference is described below. In some embodiments, a width of the conducting region 201 is less than a distance between the distance between the two control electrodes 340a, 340b. The second doped region 108 may surround at least a portion of the absorption region 10. The second doped region 108 may block photo-generated charges in the absorption region 10 from reaching the substrate 20, which increases the collection efficiency of photo-generated carriers of the photo-detecting device 1400f. The second doped region 108 may also block photo-generated charges in the substrate 20 from reaching the absorption region 10, which increases the speed of photo-generated carriers of the photo-detecting device 1400j. The second doped region 108 may include a material the same as the material of the absorption region 10, the same as the material of the substrate 20, a material as a combination of the material of the absorption region 10 and the material of the substrate 20, or different from the material of the absorption region 10 and the material of the substrate 20. In some embodiments, the shape of the second doped region 108 may be but not limited to a ring. In some embodiments, the second doped region 108 may reduce the cross talk between two adjacent pixels of the photo-detecting apparatus. In some embodiments, the second doped region 108 extends to reach the first surface 21 of the substrate 20.

Figure 15A:
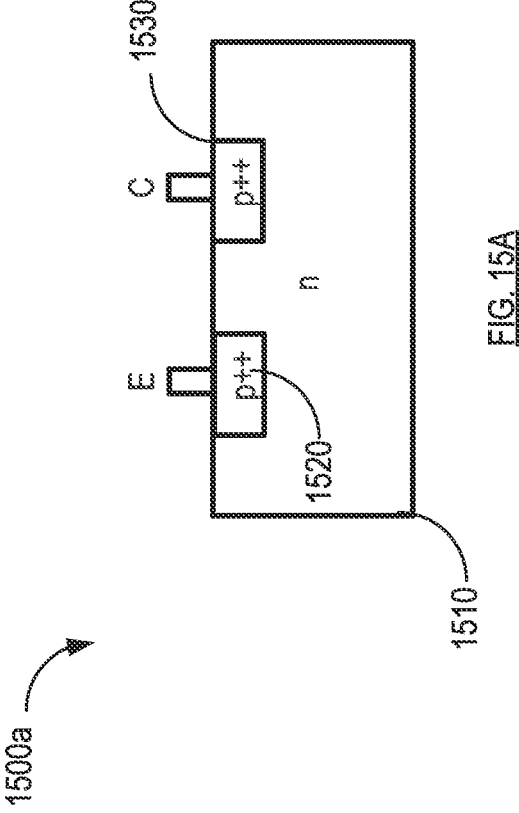
FIGS. 15A-15D show examples of a gain component with two terminals.

FIG. 15A shows a gain component 1500a with two-terminals. The gain component 1500a includes a lightly-doped-region 1510 (e.g., n-region, e.g., 1e14 to 1e17 cm$^{-3}$), an emitter region 1520 and a collector region 1530.

The collector region 1530 is for collecting carriers, and is coupled to a collector electrode (C). The collector region 1530 is of a conductivity type such as heavily p-doped (p++, e.g., 1e18 to 1e21 cm$^{-3}$). The emitter region 1520 is for emitting carriers, and is coupled to an emitter electrode (E). The emitter region 1520 is of a conductivity type such as heavily p-doped (p++).

The material of lightly-doped-region 1510, emitter region 1520, the collector region 1530 can be silicon, germanium, silicon-germanium, or III-V materials.

A method for amplifying photo-carriers received by the gain component 1500a includes the steps of: applying a first voltage (e.g., a positive voltage) to the emitter electrode E; applying a second voltage (e.g., ground) to the collector electrode C; a forward-bias is thus created across the p-n junction between the emitter region 1520 and the lightly-doped region 1510, and a reverse-bias is thus created across the p-n junction between the collector region 1530 and the lightly-doped region 1510 to collect an electrical signal (e.g., hole current) from the emitter; receiving a first type of carriers (e.g., electrons from outside the gain component 1500a) in the lightly-doped region 1510, which increase the forward-bias between the emitter region 1520 and the lightly-doped region 1510; collecting a second type of carriers (e.g., holes) emitted from the emitter region 1520 by the collector region 1530 as an amplified electrical signal (e.g., an amplified hole current).

As a result, the gain component provides an amplified electrical signal in the collector region based on the received carriers in the lightly-doped region, which improves signal to noise ratio.

Figure 15B:
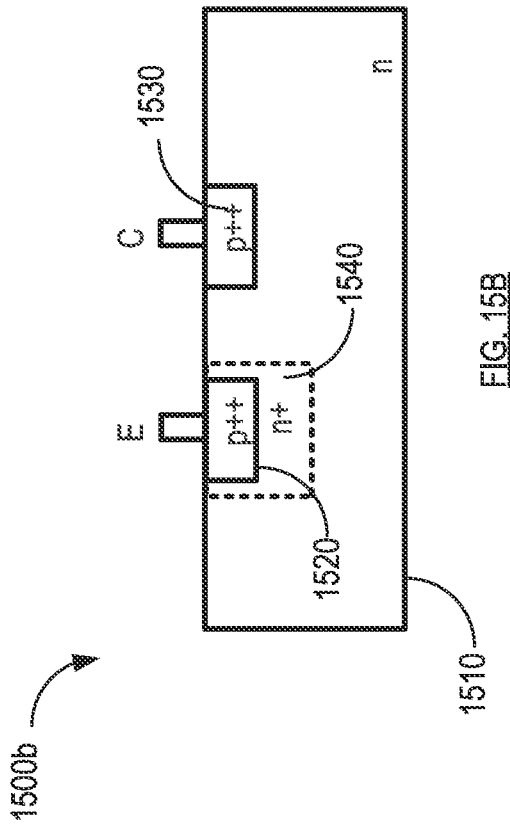

FIG. 15B shows another implementation of the gain component 1500b, where the emitter region 1520 is surrounded by a moderately-doped region 1540 (e.g., n+ region, e.g., 1e16 to 1e19 cm$^{-3}$).

Figure 15C:
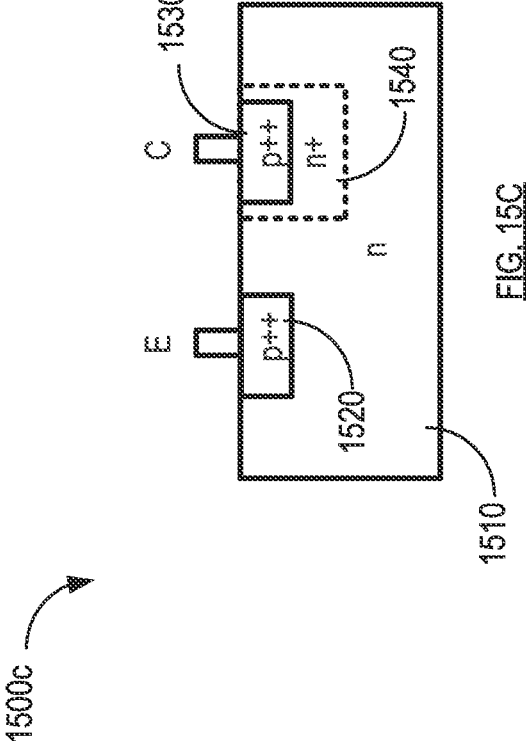

FIG. 15C shows another implementation of the gain component 1500c, where the collector region 1530 is surrounded by a moderately-doped region 1540 (e.g., n+ region, e.g., 1e16 to 1e19 cm$^{-3}$).

Figure 15D:
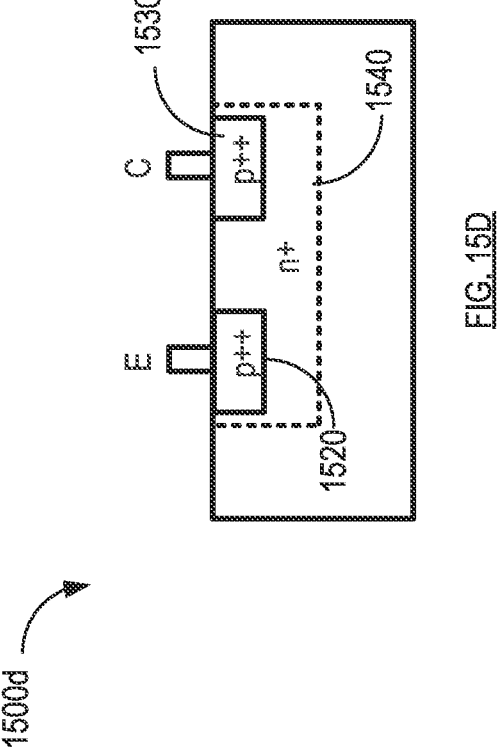

FIG. 15D shows another implementation of the gain component 1500d, where the emitter region 1520 and the collector region 1540 are surrounded by a moderately-doped region (e.g., n+ region, e.g., 1e16 to 1e19 cm$^{-3}$).

Figure 16A:
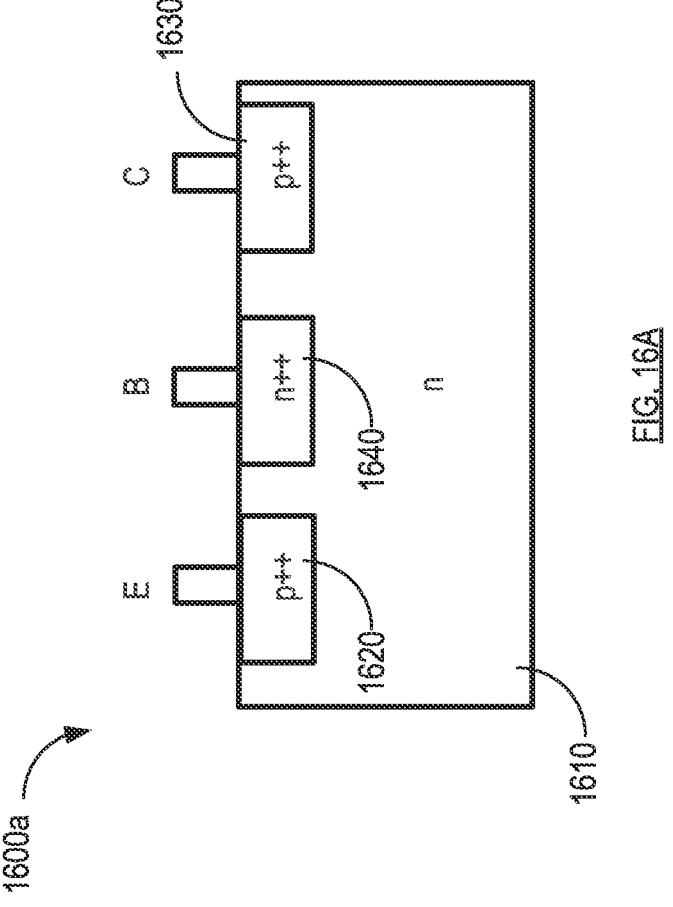
FIGS. 16A-16D show examples of a gain component with three terminals.

FIG. 16A shows a gain component 1600a with three terminals. The gain component 1600a includes a lightly-doped-region 1610 (e.g., n-region), an emitter region 1620, a base region 1640, and a collector region 1630.

The collector region 1630 is for collecting carriers, and is coupled to a collector electrode (C). The collector region 1630 is of a conductivity type such as heavily p-doped (p++). The base region 1640 is coupled to a base electrode (B), and is of a conductivity type such as heavily n-doped (n++). The emitter region 1620 is for emitting carriers, and is coupled to an emitter electrode (E). The emitter region 1620 is of a conductivity type such as heavily p-doped (p++).

The material of lightly-doped-region 1610, emitter region 1620, base region 1640, and collector region 1630 can be silicon, germanium, silicon-germanium, or III-V materials.

A method for amplifying photo-carriers received by the gain component includes the steps of: establishing a first voltage difference between the emitter electrode E and the base electrode B to form a forward-biased p-n junction; establishing a second voltage difference between the collector electrode C and the base electrode B to form a reverse-biased p-n junction; receiving a first type of carriers (e.g., electrons from outside of the gain component 1600a) in the lightly-doped region 1610; increasing the first voltage difference to form another forward-biased p-n junction; collecting a second type of carriers (e.g., holes) emitting from the emitter region 1620 by the collector region 1630 as an amplified electrical signal.

As a result, the gain component 1600a provides an amplified electrical signal in the collector region 1630 based on the received carriers in the lightly-doped region 1610, which improves signal to noise ratio.

Figure 16B:
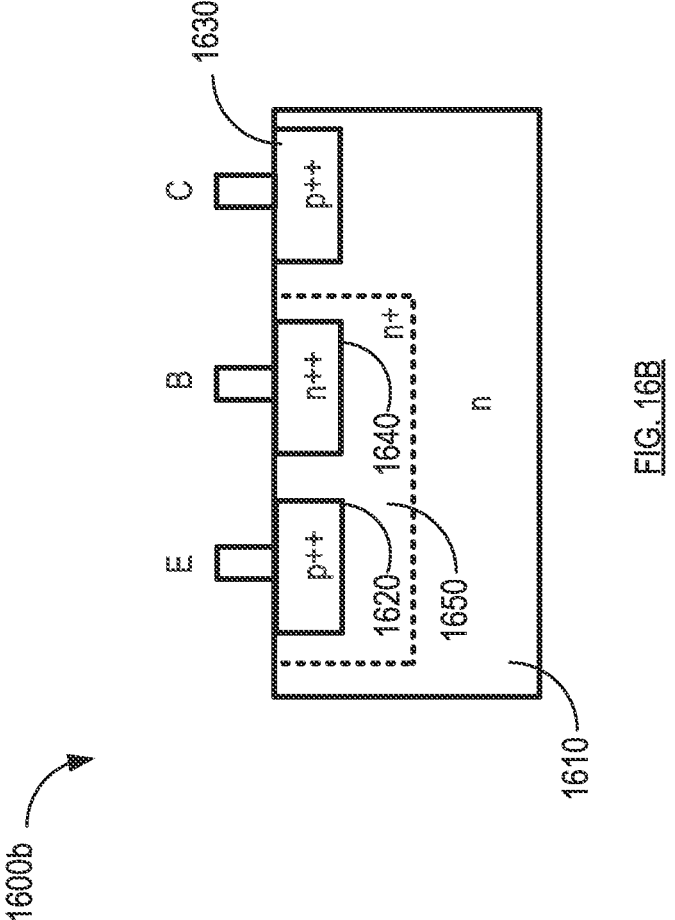

FIG. 16B shows another implementation of the gain component 1600b, where the emitter region 1620 and the base region 1640 are surrounded by a moderately-doped region 1650 (e.g., n+ region).

Figure 16C:
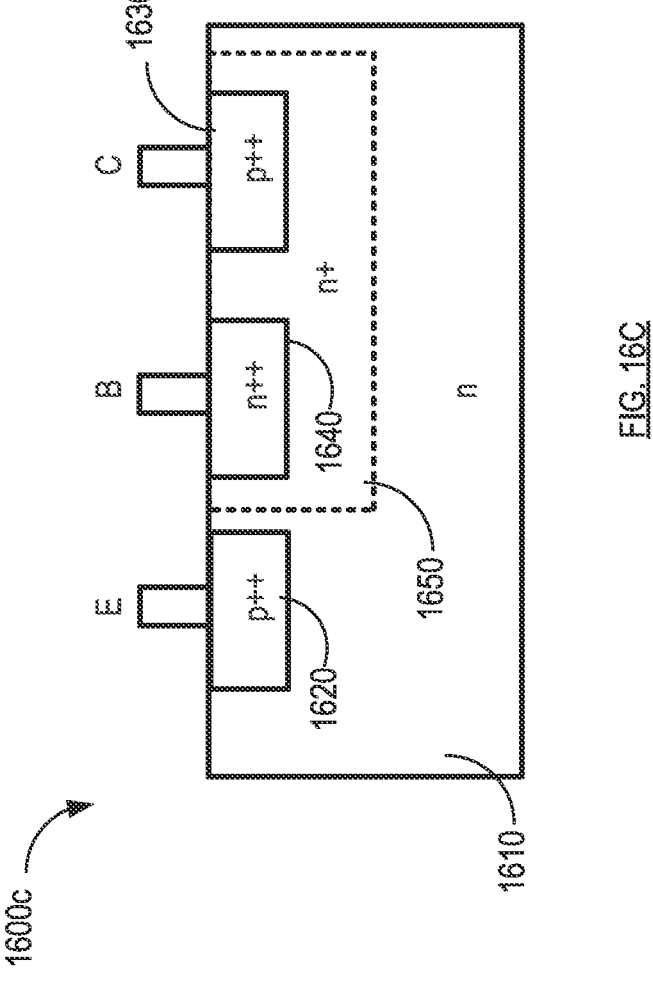

FIG. 16C shows another implementation of the gain component 1600c, where the collector region 1630 and the base region 1640 are surrounded by a moderately-doped region 1650 (e.g., n+ region).

Figure 16D:
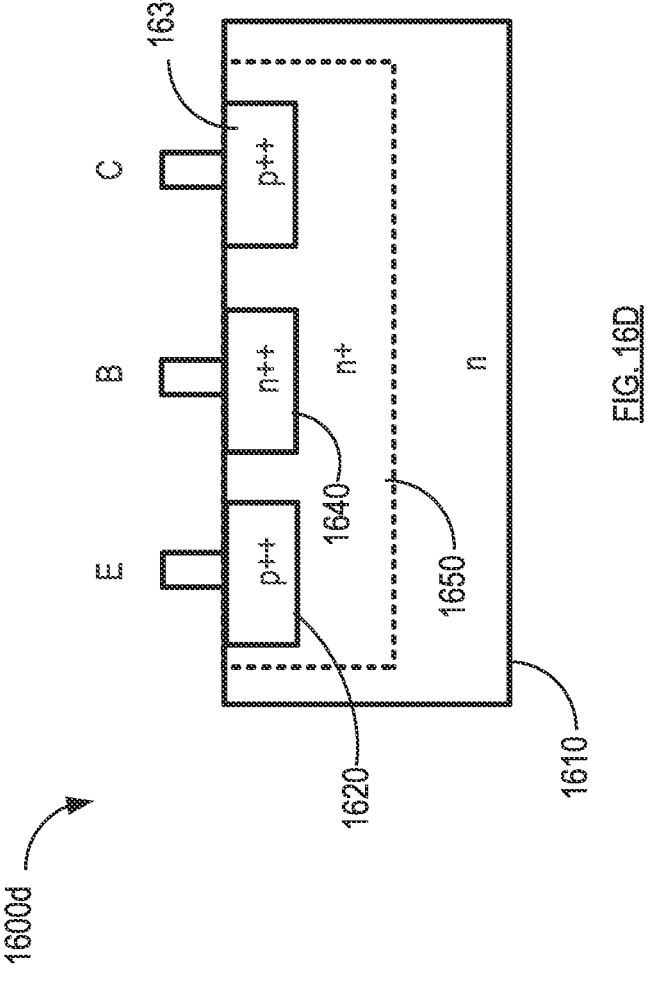

FIG. 16D shows another implementation of the gain component 1600d, where the emitter region 1620, the base region 1640, and the collector region 1630 are surrounded by a moderately-doped region 1610 (e.g., n+ region).

Figure 17A:
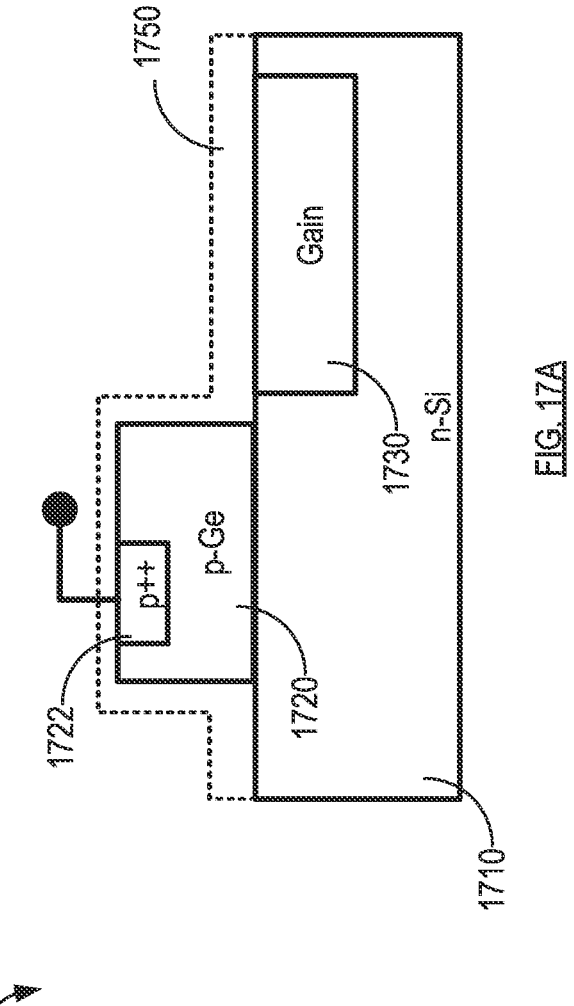
FIGS. 17A-17C show examples of a photo-detecting apparatus that can be used as a CMOS image sensor.

FIG. 17A shows a CMOS image sensor 1700*a* (or a photo-detecting apparatus) that includes a lightly-doped region 1710 (e.g., n-Si), an absorption region 1720 (e.g., p-Ge), and gain component 1730 (e.g., Si). The gain component 1730 can be a two-terminal or a three-terminal gain component as described in FIGS. 15A-15D and 16A-16D.

The absorption region 1720 or the lightly-doped region 1730 can be a Group III-V semiconductor material (e.g., InGaAs, GaAs/AlAs, InP/InGaAs, GaSb/InAs, or InSb), a semiconductor material including a Group IV element (e.g., Ge, Si or Sn), a compound such as $Si_xGe_ySm_{1-x-y}$, ($0 \leq x \leq 1$, $0 \leq y \leq 1$), or $Ge_{1-a}Sn_a$ ($0 \leq a \leq 0.1$), or $Ge_{1-x}Si_x$ ($0 \leq x \leq 0.1$).

In some embodiments, a bandgap of the lightly-doped region 1710 (e.g., n-Si) is greater than a bandgap of the absorption region 1720 (e.g., p-Ge). The gain component 1730 is for collecting photo-carriers to generate an amplified electrical signal. The absorption region 1720 includes a first dopant having a first peak doping concentration. The lightly-doped region 1710 includes a second dopant having a second peak doping concentration lower than the first peak doping concentration to reduce the dark current of the CMOS image sensor 1700*a* (e.g., below 10 pA).

The first peak doping concentration can be between $1 \times 10^{17}$ cm$^{-3}$ and $1 \times 10^{20}$ cm$^{-3}$. In some embodiments, a ratio of the first peak doping concentration to the second peak doping concentration is equal to or more than 10 such that the CMOS image sensor 1701 exhibits low dark current (e.g., less than or equal to 10 pA) and high quantum efficiency. The absorption region 1720 can have a gradient doping profile, where the first peak doping is far from the interface between the absorption region 1720 and the lightly-doped region 1710.

The absorption region 1720 can include a heavily doped region 1722 (e.g., p++) coupled to a voltage (e.g., ground). The lightly-doped region 1710 can receive a first type of photo-carriers (e.g., electrons), and the heavily doped region 1722 can receive a second type of photo-carriers (e.g., holes).

A method for amplifying photo-carriers received by the gain component 1730 includes the steps of: receiving a photo-signal in an absorption region 1720 (e.g., p-Ge) to generate photo-carriers having a first and a second type (e.g., electrons and holes); steering the first type of photo-carriers (e.g., electrons) to a gain region 1730; and generating an amplified electrical signal having the second type (e.g., holes).

As such, the CMOS image sensor 1710 provides an amplified electrical signal based on the optical signal and improves signal to noise ratio.

In some implementations, the light absorption region can be covered (as shown in the dashed line) by a different material 1750 (e.g., poly-Si).

Figure 17B:
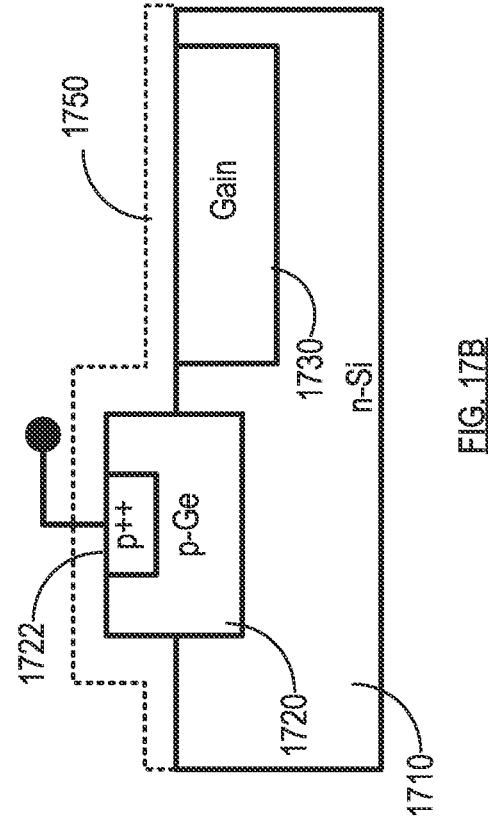
Figure 17B:

FIG. 17B shows an implementation of the CMOS sensor 1700*b*, where the light absorption region 1720 is partially embedded in the lightly-doped region 1710.

Figure 17C:
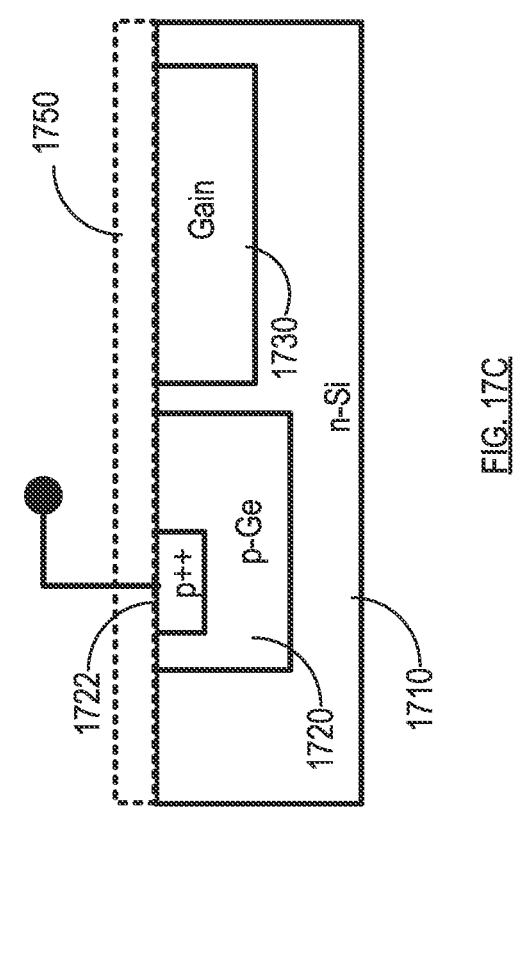

FIG. 17C shows an implementation of the CMOS sensor 1700*c*, where the light absorption region 1720 is fully embedded in the lightly-doped region 1710.

Figure 18A:
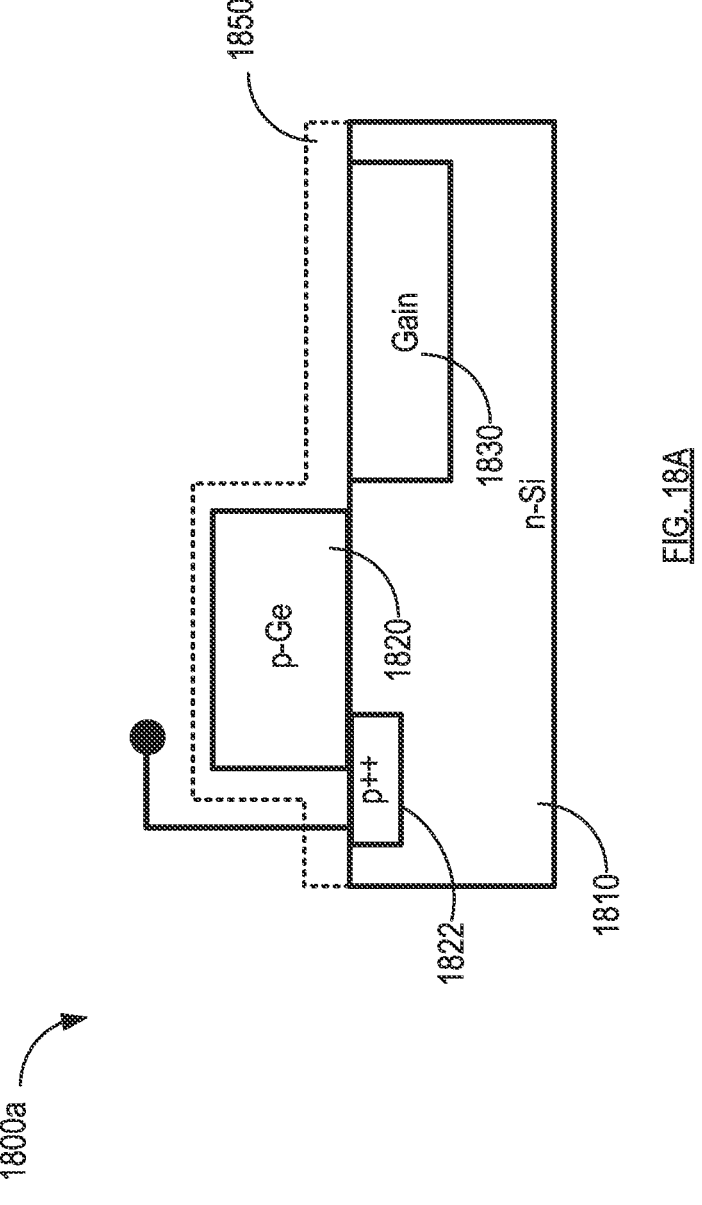
FIGS. 18A-C show examples of a photo-detecting apparatus that can be used as a CMOS image sensor.

Similar to FIG. 17A, FIG. 18A shows a CMOS image sensor 1800*a* that includes a lightly-doped region 1810 (e.g., n-Si), an absorption region 1820 (e.g., p-Ge), and gain component 1830 (e.g., Si). The gain component 1830 can be a two-terminal or a three-terminal gain component as described in FIGS. 15A-15D and 16A-16D.

The lightly-doped region 1810 can include a heavily doped region 1822 (e.g., p++) that is coupled to a voltage (e.g., ground). The lightly-doped region 1810 can receive both a first type of photo-carriers (e.g., electrons) and a second type of photo-carriers (e.g., holes). The first type photo-carriers are directed to the gain component 1830, while the second type of photo-carriers are collected by the heavily doped region 1822.

A method for amplifying photo-carriers received by the gain component 1830 includes the steps of: receiving a photo-signal in an absorption region 1820 (e.g., p-Ge) to generate photo-carriers having a first and a second type (e.g., electrons and holes); steering the first type of photo-carriers (e.g., electrons) to a gain region 1830; and generating an amplified electrical signal having the second type (e.g., holes).

As such, the CMOS image sensor 1800*a* provides an amplified electrical signal based on the optical signal and improves signal to noise ratio.

In some implementations, the light absorption region 1820 can be covered (as shown in the dashed line) by a different material (e.g., poly-Si).

Figure 18B:
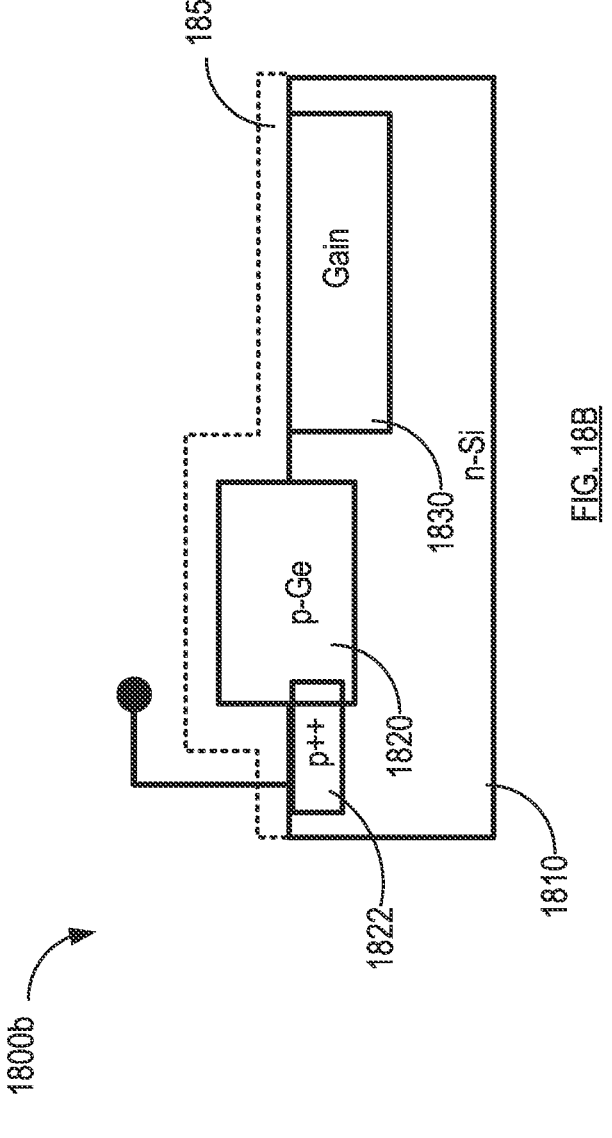

FIG. 18B shows an implementation of the CMOS sensor 1800*b*, where the light absorption region is partially embedded in the lightly-doped region 1810.

Figure 18C:
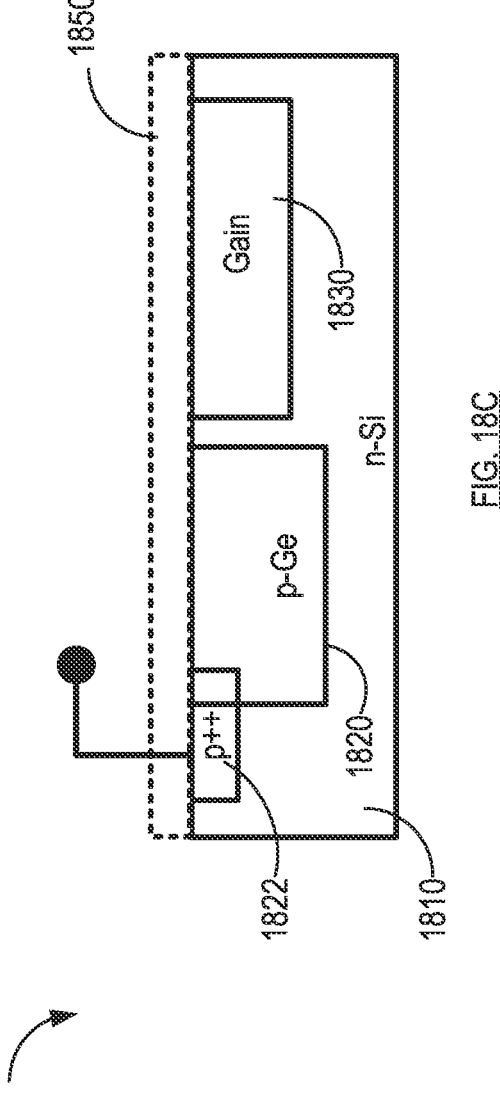

FIG. 18C shows an implementation of the CMOS sensor 1800*c*, where the light absorption region is fully embedded in the lightly-doped region 1810.

Figure 19A:
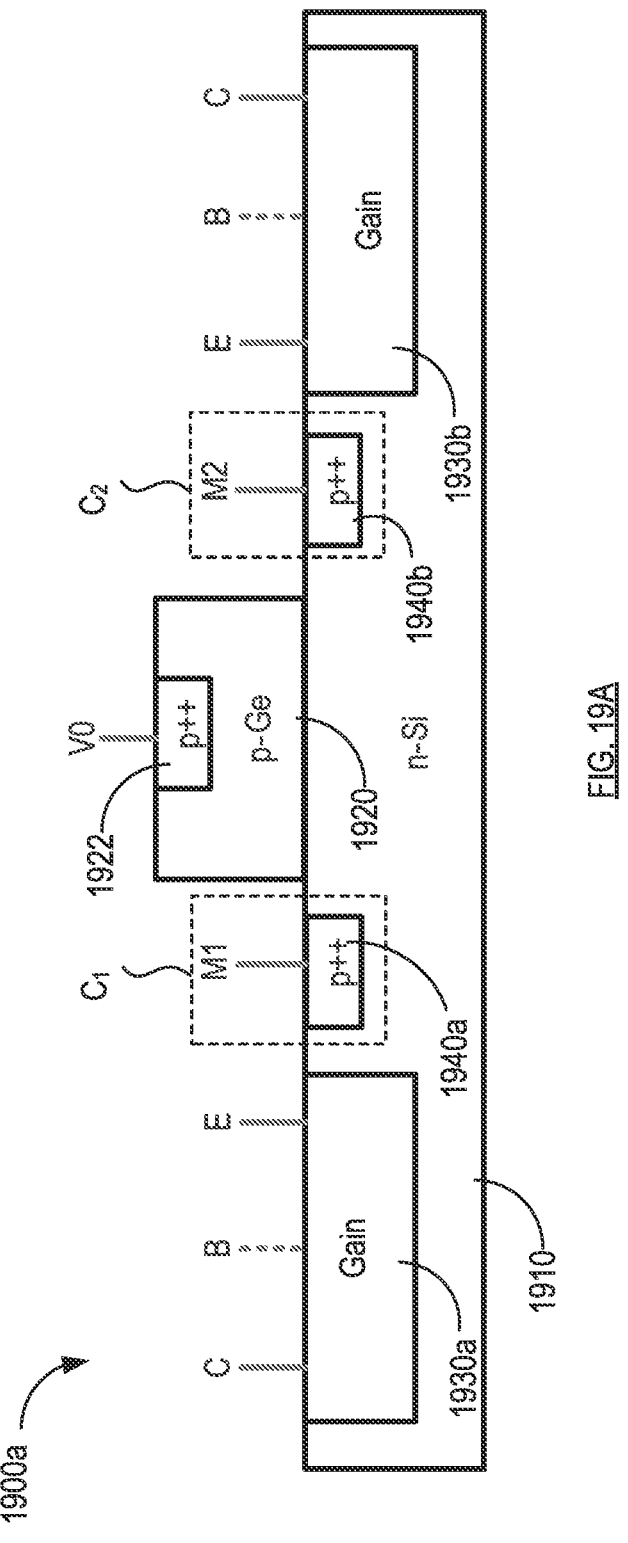
FIG. 19A shows a photo-detecting apparatus with gain.

FIG. 19A shows a photo-detecting apparatus 1900*a* with gain. The photo-detecting apparatus 1900*a* includes a lightly-doped region 1910 (e.g., n-Si), an absorption region 1920 (e.g., p-Ge), two gain components 1930*a* and 1930*b*, and two control regions 1940*a* and 1940*b* (shown as p++, but can be can be undoped or lightly doped) each coupled with a control terminal (M1 and M2). The gain components 1930*a*,1930*b* can be a two-terminal or a three-terminal gain component as described in FIGS. 15A-15D and 16A-16D.

The absorption region 1920 or the lightly-doped region 1910 can be a Group III-V semiconductor material (e.g., InGaAs, GaAs/AlAs, InP/InGaAs, GaSb/InAs, or InSb), a semiconductor material including a Group IV element (e.g., Ge, Si or Sn), a compound such as $Si_xGe_ySn_{1-x-y}$, ($0 \leq x \leq 1$, $0 \leq y \leq 1$), or $Ge_{1-a}Sn_a$ ($0 \leq a \leq 0.1$).

In some embodiments, a bandgap of the lightly-doped region 1910 (e.g., n-Si) is greater than a bandgap of the absorption region 1920 (e.g., p-Ge). The gain components 1930*a*,1930*b* are for collecting photo-carriers to generate an amplified electrical signal. The absorption region 1920 includes a first dopant having a first peak doping concentration. The lightly-doped region 1910 includes a second dopant having a second peak doping concentration lower than the first peak doping concentration to reduce the dark current of the photo-detecting apparatus 1900*a* (e.g., below 10 pA).

The first peak doping concentration and the second peak concentration can be similar to the examples described in FIG. 17A.

The absorption region 1920 can include a heavily doped region 1922 (e.g., p++) coupled to a voltage V0 (e.g., ground). The lightly-doped region 1910 can receive a first type of photo-carriers (e.g., electrons), and the heavily doped region 1922 can receive a second type of photo-carriers (e.g., holes).

The control signals M1 and M2 can steer the first type of photo-carriers towards one of the gain components 1930*a* or 1930*b*.

A method for amplifying photo-carriers received by the gain component includes the steps of: receiving a photo-signal in an absorption region 1920 (e.g., p-Ge) to generate photo-carriers having a first and a second type (e.g., electrons and holes); steering the first type of photo-carriers (e.g., electrons) to a gain region 1930a or 1930b; and generating an amplified electrical signal having the second type (e.g., holes).

As such, the photo-detecting apparatus 1900a provides an amplified electrical signal based on the optical signal and improves signal to noise ratio.

In some implementations, the light absorption region 1920 can be covered (not shown here) by a different material (e.g., poly-Si).

In some implementations, the light absorption region 1920 can be partially (e.g., similar to the absorption region 1720 as shown in FIG. 17B) or fully embedded (e.g., similar to the absorption region 1730 as shown in FIG. 17C) in the lightly-doped region 1910.

Figure 19B:
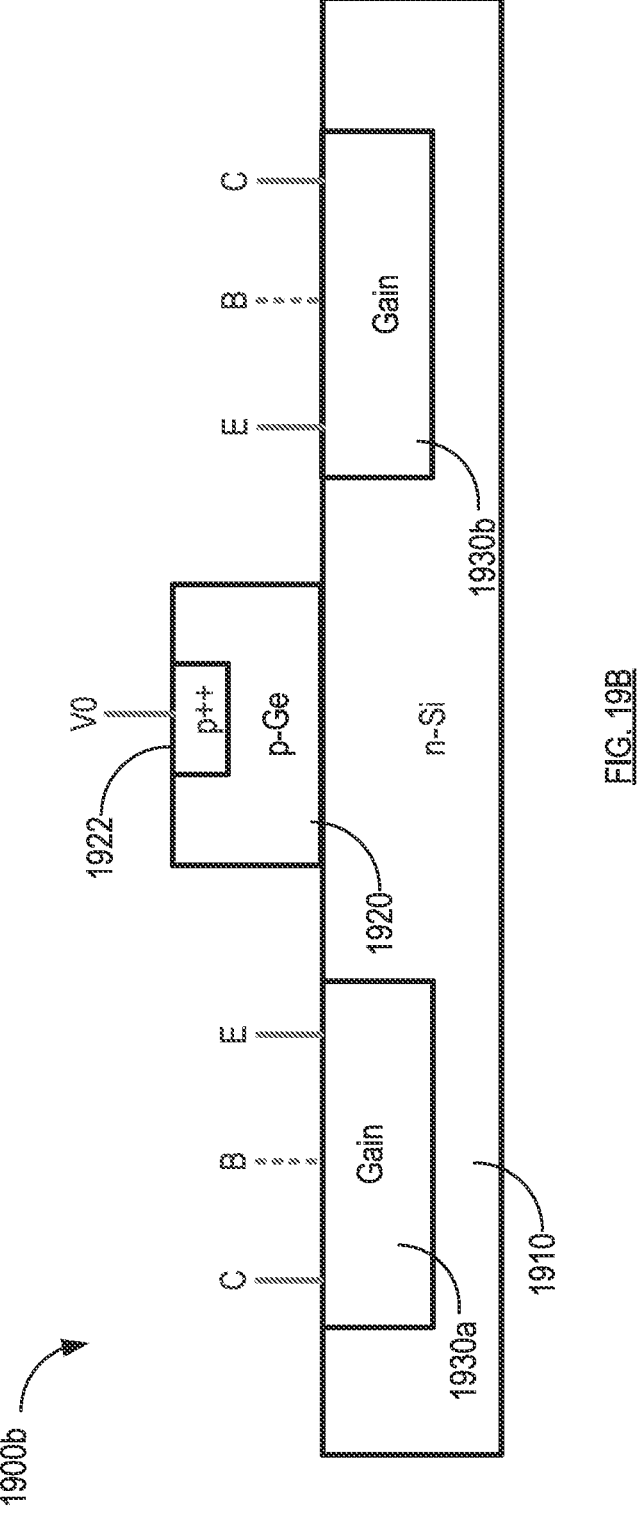
FIG. 19B shows a photo-detecting apparatus with gain.

FIG. 19B shows a photo-detecting apparatus 1900b with gain. The photo-detecting apparatus 1900b is similar to the photo-detecting apparatus 1900a in FIG. 19A, except that the control regions are combined with the emitter regions, such that the emitter signal (E) can be used to steer the carriers and to amplify the carriers.

Figure 20A:
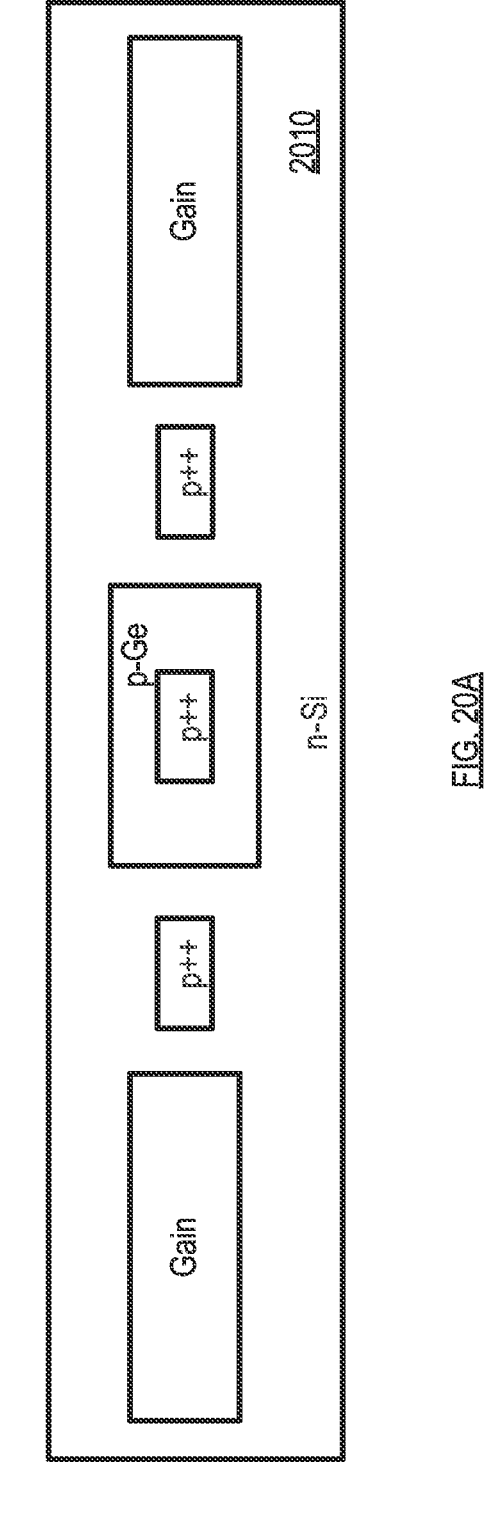
FIG. 20A shows an example top view of the photo-detecting apparatus with gain.

FIG. 20A shows an example top view of the photo-detecting apparatus 2000a with gain, such as described in FIG. 19A or FIG. 19B, where the lightly-doped region is the substrate 2010.

Figure 20B:
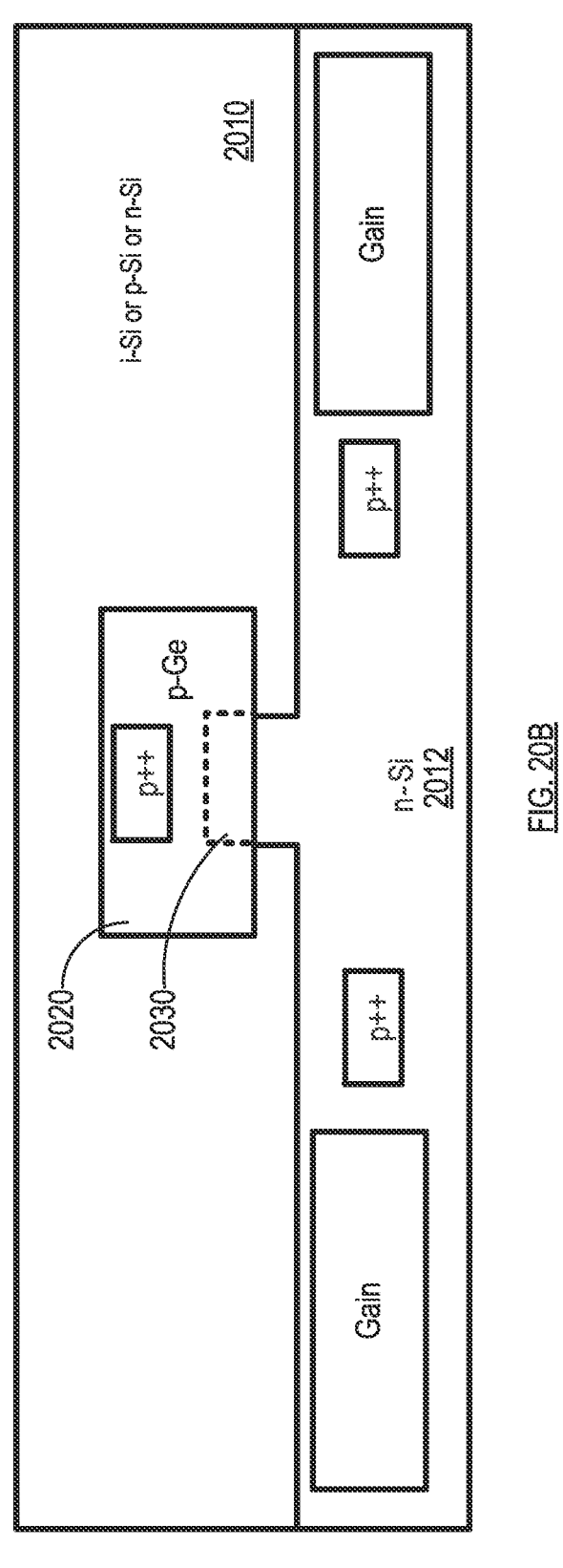
FIG. 20B shows an example top view of the photo-detecting apparatus with gain.

FIG. 20B shows an example top view of the photo-detecting apparatus 2000b with gain, such as described in FIG. 19A or FIG. 19B, where the substrate 2010 can be intrinsic (e.g., i-Si), lightly p-doped (p-Si), or lightly n-doped (n-Si). The lightly-doped region 2012 (e.g., n-Si) can be formed in the substrate 2010 by implant or diffusion or other suitable fabrication method. In some implementations, a portion of the absorption region 2020 (e.g., p-Ge) can be formed on a region of the substrate 2010 that is not the lightly-doped region 2012. The absorption region 2020 can be coupled to the lightly-doped region 2012 through a lightly-doped path 2030 (e.g., n-Si) formed between the absorption region 2020 and the substrate 2010. The photo-carriers (e.g., electrons) generated by the absorption region 2020 can drift from the absorption region 2020 to the lightly-doped region 2012, where one of the gain components can then generate an amplified electrical signal based on the control signals. Accordingly, the photo-detecting apparatus 2000b can be formed in a substrate with intrinsic, lightly p-doping, and lightly n-doping.

Figure 21:
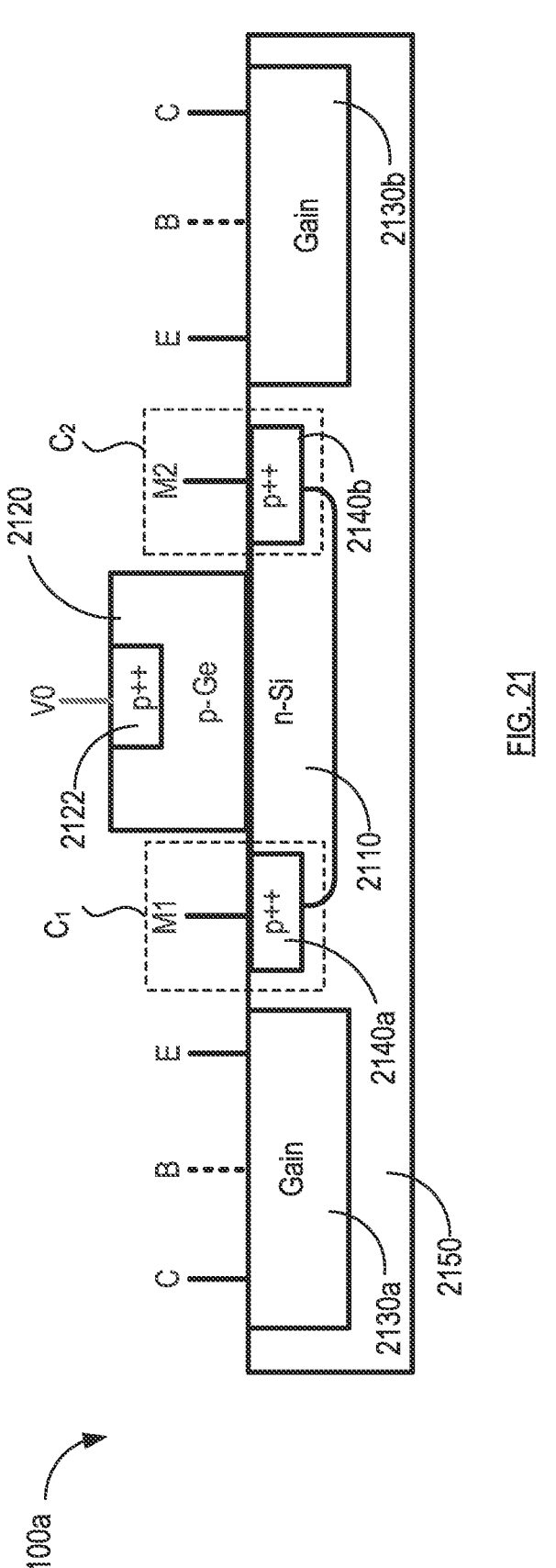
FIG. 21 shows a photo-detecting apparatus with gain.

FIG. 21 shows a photo-detecting apparatus 2100a with gain. The photo-detecting apparatus 2100a includes a lightly-doped region 2110 (e.g., n-Si) formed in a substrate 2150 (e.g., n-Si, p-Si, or intrinsic Si), an absorption region 2120 (e.g., p-Ge), two gain components 2130a and 2130b, and two control regions 2140a and 2140b (shown as p++, but can be undoped or lightly doped) each coupled with a control terminal (M1 and M2). The gain component 2130a, 2030b can be a two-terminal or a three-terminal gain component as described in FIGS. 15A-15D and 16A-16D.

Accordingly, the photo-detecting apparatus 2100a can be formed in a substrate 2150 with intrinsic, lightly p-doping, and lightly n-doping.

The absorption region 2120 or the lightly-doped region 2110 can be formed using materials as described in FIG. 19A.

In some embodiments, the lightly-doped region 2110 may partially or completely overlap the two control regions 2140a and 2140b.

The absorption region can include a heavily doped region 2122 (e.g., p++) coupled to a voltage V0 (e.g., ground). The lightly-doped region 2110 can receive a first type of photo-carriers (e.g., electrons), and the heavily doped region 2122 can receive a second type of photo-carriers (e.g., holes).

The control signals M1 and M2 steers the first type of photo-carriers towards one of the gain components 2130a or 2130b, as described in reference to FIG. 19A.

In some implementations, the light absorption region 2120 can be covered (not shown here) by a different material (e.g., poly-Si).

In some implementations, the light absorption region 2120 can be partially (e.g., similar to the absorption region 1720 as shown in FIG. 17B) or fully embedded (e.g., similar to the absorption region 1720 as shown in FIG. 17C) in the lightly-doped region 2110.

In some implementations, similar to FIG. 19B, the control regions 2140a and 2140b can be combined with the emitter regions, such that the emitter signal (E) can be used to steer the carriers and to amplify the carriers.

Figure 22A:
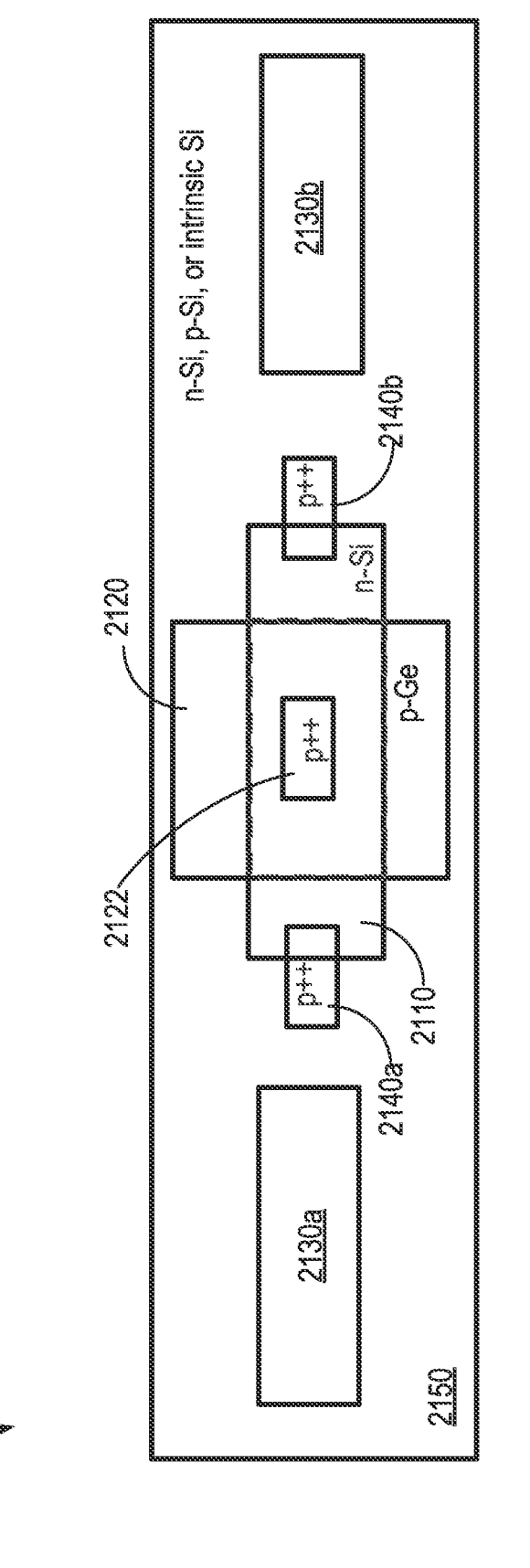
FIG. 22A shows an example top view of the photo-detecting apparatus with gain.
Figure 22B:
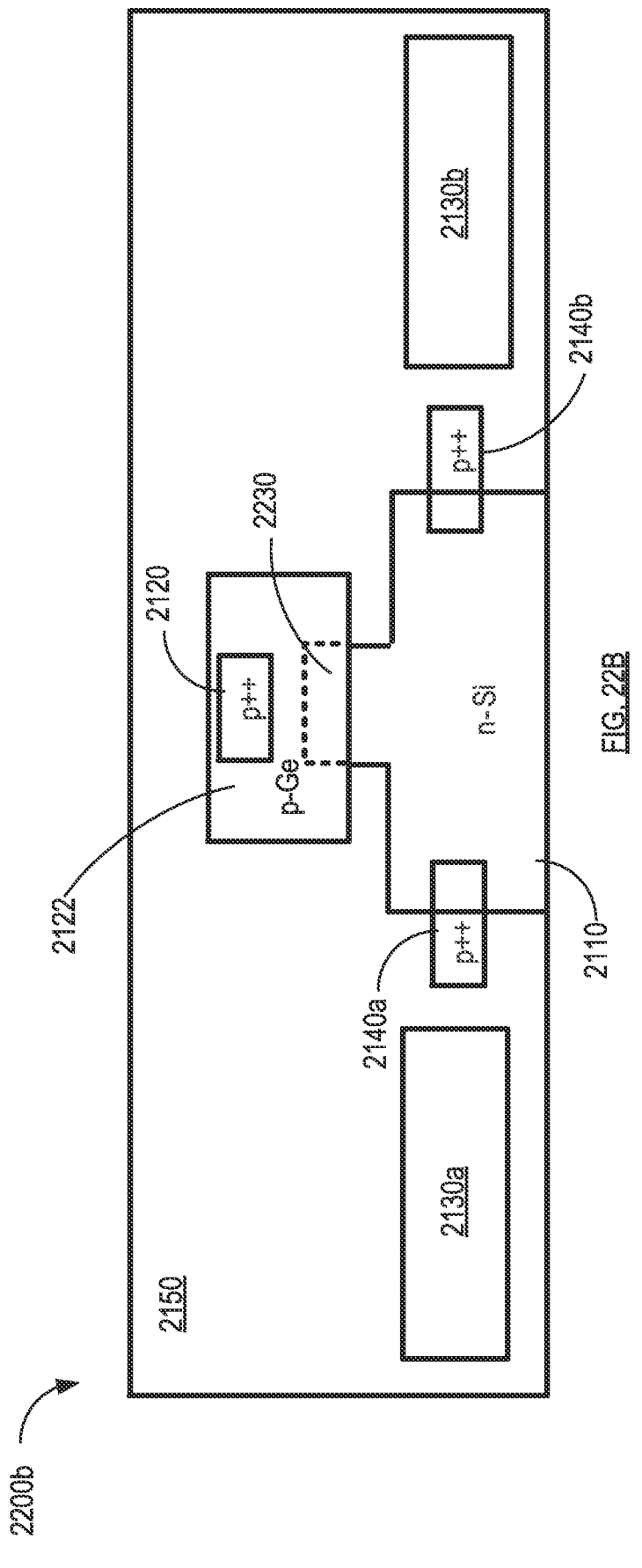
FIG. 22B shows an example top view of the photo-detecting apparatus with gain.

FIG. 22A shows an example top view of the photo-detecting apparatus 2200a with gain, such as the photo-detecting apparatus 2100a described in FIG. 21. and FIG. 22B shows an example top view of the photo-detecting apparatus 2200b with gain, such as the photo-detecting apparatus 2100a described in FIG. 21, where a portion of the absorption region 2120 (e.g., p-Ge) can be formed on a region of the substrate 2150 that is not the lightly-doped region 2110. The lightly doped region 2110 (e.g., n-Si) can be formed in the substrate 2150 by implant or diffusion or other suitable fabrication method. The absorption region 2120 can be coupled to the lightly-doped region 2110 through a lightly-doped path 2230 (e.g., n-Si) formed between the absorption region 2120 and the substrate 2150. The photo-carriers (e.g., electrons) generated by the absorption region 2120 can drift from the absorption region 2120 to the lightly-doped region 2110, where one of the gain components can then generate an amplified electrical signal (e.g., hole current) based on the control signals.

Figure 23A:
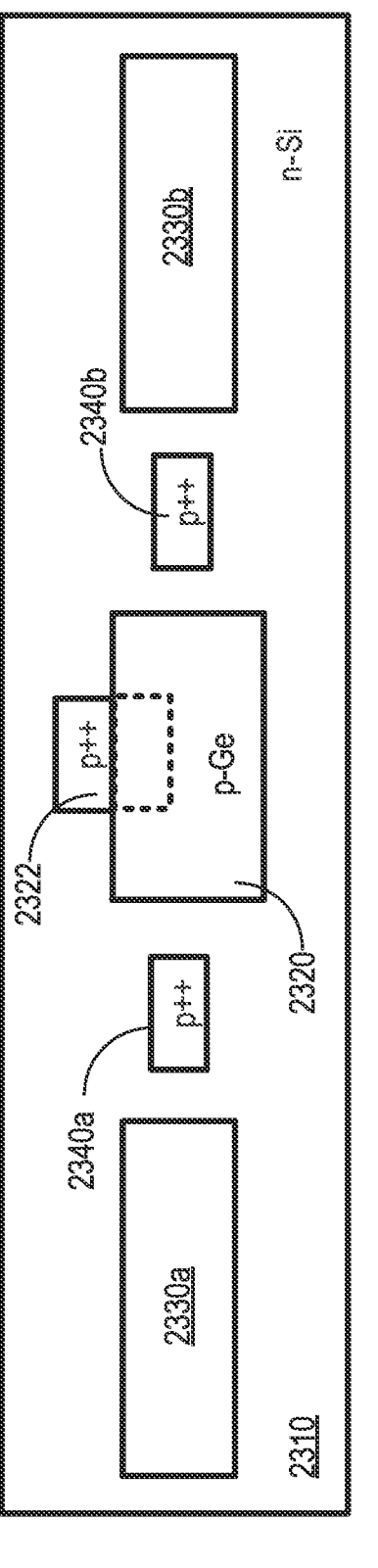
FIG. 23A shows an example top view of the photo-detecting apparatus with gain.

FIG. 23A shows an example top view of the photo-detecting apparatus 2300a with gain, where similar to FIGS. 18A-18C, the heavily doped region 2322 (e.g., p++) is formed in the lightly doped region 2310 (e.g., n-Si) instead of in absorption region 2320 (e.g., p-Ge). The lightly-doped region 2310 can receive both a first type of photo-carriers (e.g., electrons) and a second type of photo-carriers (e.g., holes). The first type photo-carriers are directed to the gain components 2330a or 2330b based on the control signals 2340a or 2340b, while the second type of photo-carriers are collected by the heavily doped region 2322.

Figure 23B:
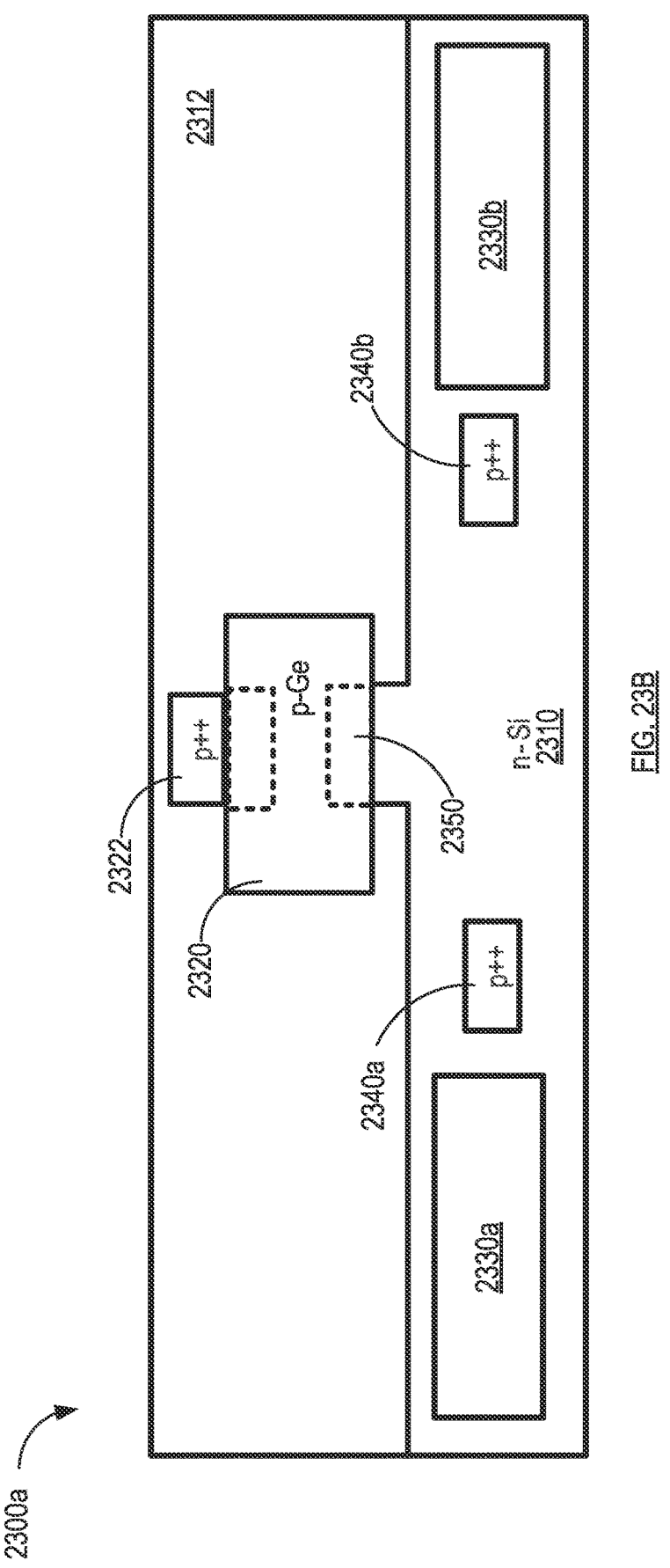
FIG. 23B shows another example top view of the photo-detecting apparatus with gain.

FIG. 23B shows another example top view of the photo-detecting apparatus 2300b with gain that is similar to FIG. 23A, but where a portion of the absorption region 2320 (e.g., p-Ge) can be formed on a region of the substrate 2312 that is not the lightly-doped region 2310. The absorption region 2320 can be coupled to the lightly-doped region 2310 through a lightly-doped path 2350 (e.g., n-Si) formed between the absorption region 2320 and the substrate 2312. The photo-carriers (e.g., electrons) generated by the absorption region 2320 can drift from the absorption region 2320 to the lightly-doped region 2310, where one of the gain components 2330a or 2330b can then generate an amplified electrical signal (e.g., hole current) based on the control signals 2340a or 2340b.

Figure 24A:
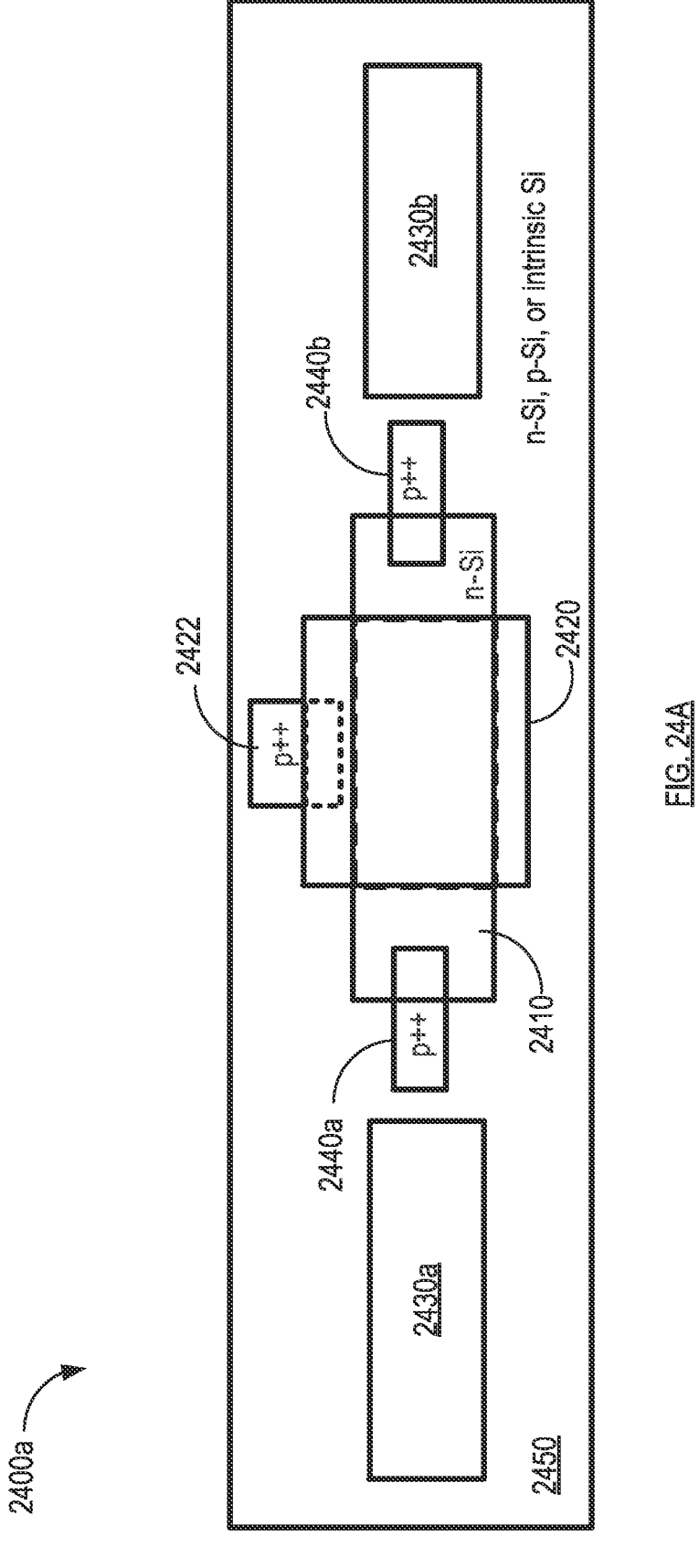
FIG. 24A shows an example top view of the photo-detecting apparatus with gain.

FIG. 24A shows an example top view of the photo-detecting apparatus 2400a with gain, which is similar to FIG. 22A, but the heavily doped region 2422 (e.g., p++) is formed outside (e.g., similar to those shown in FIGS. 18A-18C) of the light absorption region 2420 (e.g., p-Ge). A portion of the absorption region 2420 (e.g., p-Ge) can be formed on a region of the substrate 2450 that is not the lightly-doped region 2410. The lightly doped region 2410 can partially overlap with the two control regions 2440a and 2440b (e.g., p++) adjacent to the gain components 2430a and 2430b. The photo-carriers (e.g., electrons) generated by the absorption region 2420 can drift from the absorption region 2420 to the lightly-doped region 2410, where one of the gain components 2430a or 2430b can then generate an amplified electrical signal (e.g., hole current) based on the control signals.

Figure 24B:
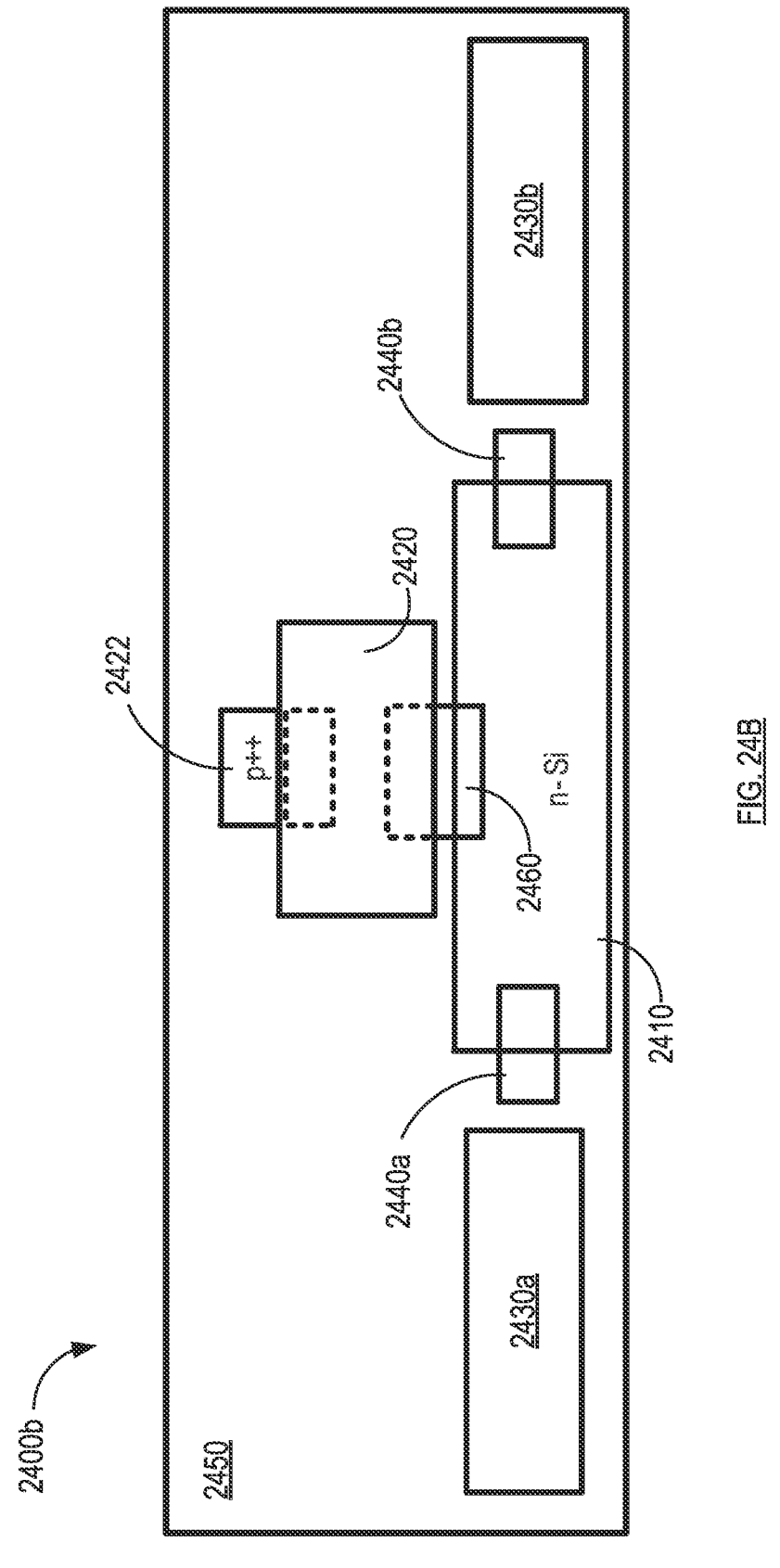
FIG. 24B shows another example top view of the photo-detecting apparatus with gain.

FIG. 24B shows another example top view of the photo-detecting apparatus 2400b with gain that is similar to FIG. 22B, where the heavily doped region 2422 (e.g., p++) is formed outside (e.g., similar to those shown in FIGS. 18A-18C) of the light absorption region 2420 (e.g., p-Ge). The absorption region 2420 can be coupled to the lightly-doped region 2410 through a lightly-doped path 2460 (e.g., n-Si) formed between the absorption region 2420 and the substrate 2450. The photo-carriers (e.g., electrons) generated by the absorption region 2420 can drift from the absorption region 2420 to the lightly-doped region 2410, where one of the gain components 2430a or 2430b can then generate an amplified electrical signal (e.g., hole current) based on the control signals 2440a and 2440b.

Figure 25A:
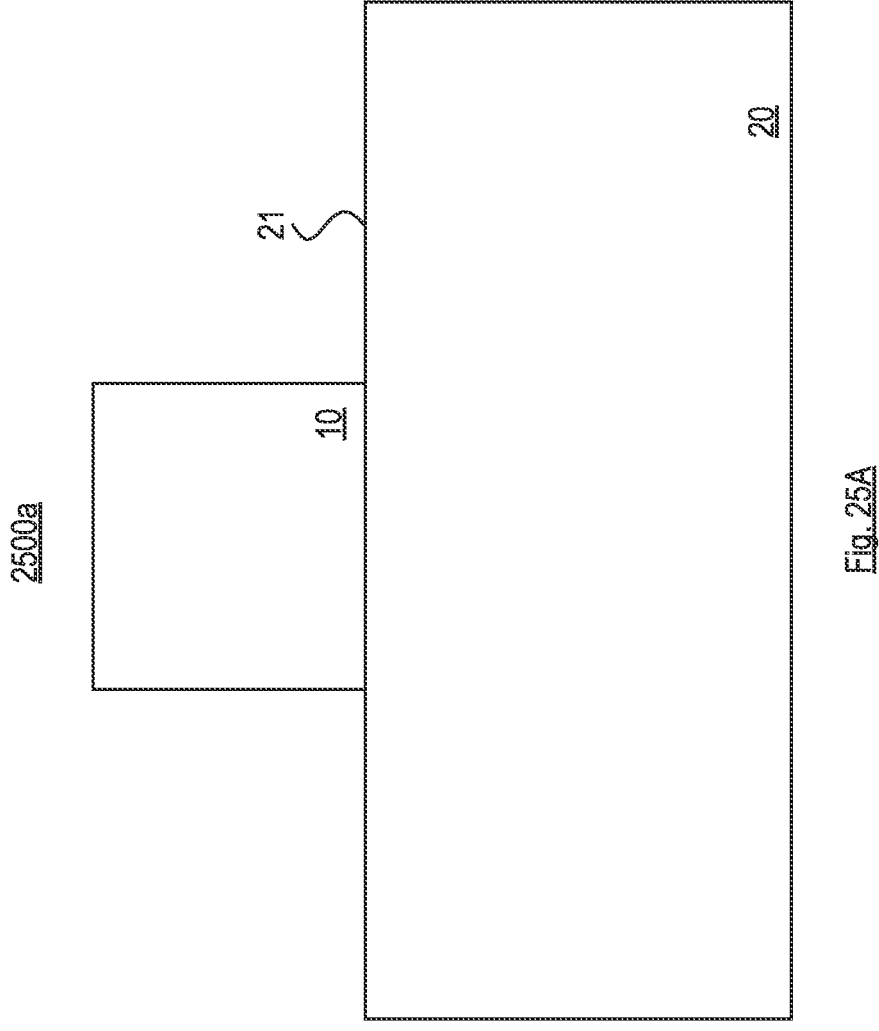
FIGS. 25A-25C illustrate cross-sectional views of a portion of a photo-detecting device.
Figure 25B:
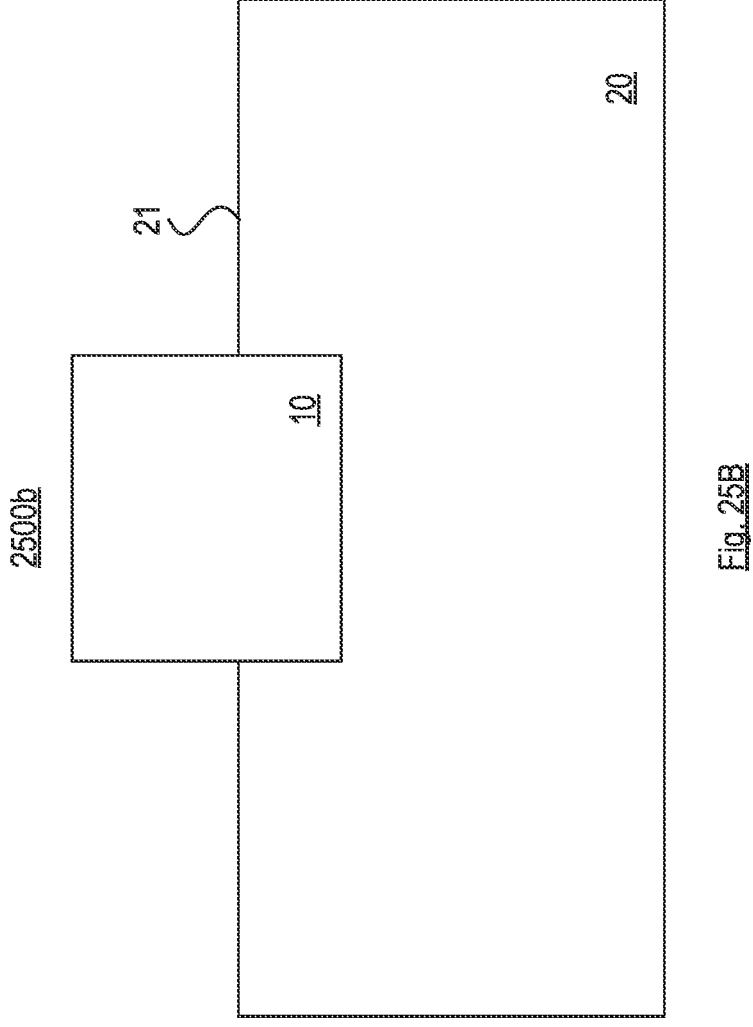
Figure 25C:
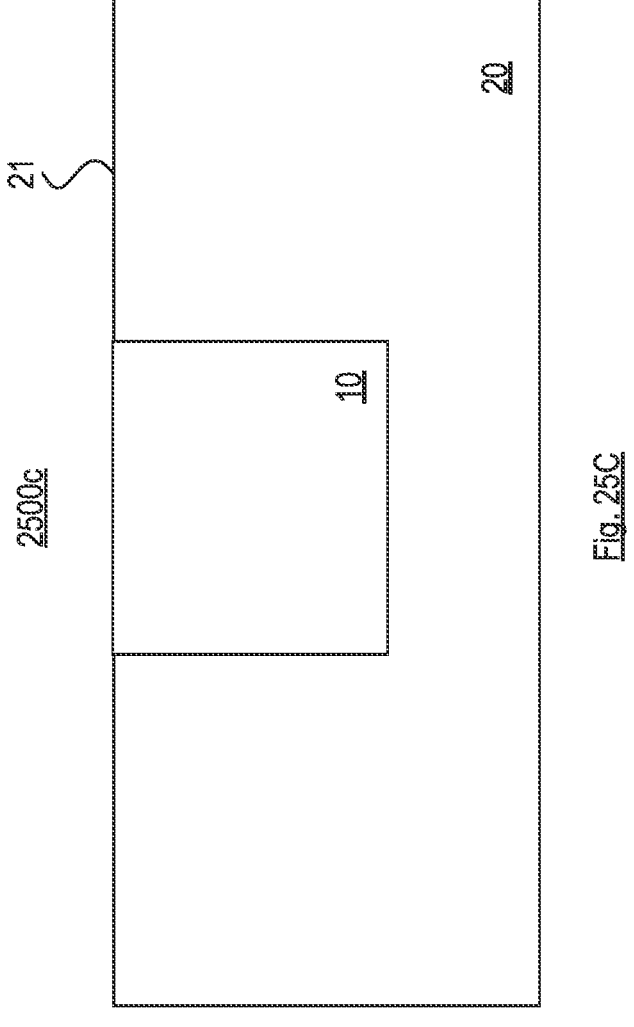

FIGS. 25A-25C illustrate cross-sectional views of a portion of a photo-detecting device, according to some embodiments. The photo-detecting device can include a structure substantially the same as any embodiments described before. In some embodiments, if not specifically mentioned in the previous description, referring to FIG. 25A, the absorption region 10 can be entirely on the first surface 21 of the substrate 20. Referring to FIG. 25B, the absorption region 10 can be partially embedded in the substrate 20. That is, a part of each of the side surfaces are in contact with the substrate 20. Referring to FIG. 25C, the absorption region 10 can be entirely embedded in the substrate 20. That is, the side surfaces are in contact with the substrate 20.

FIGS. 26A-26D show the examples of the control regions C1, C2, C3, C4 of a photo-detecting device according to some embodiments. The photo-detecting device can include a structure substantially the same as any embodiments described before.

Figure 26A:
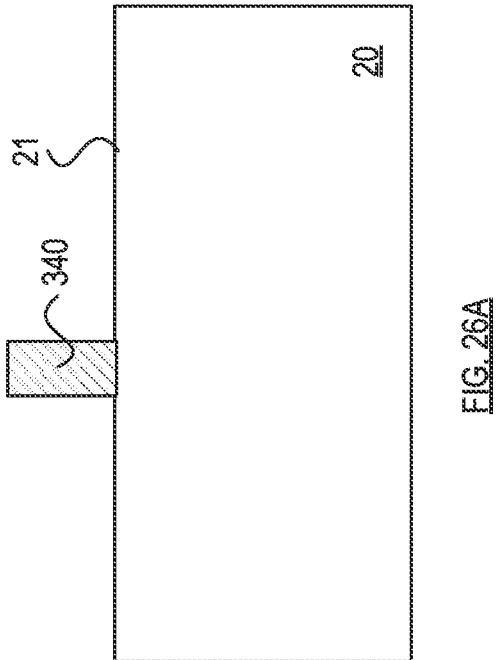
FIGS. 26A-26D show the examples of the control regions of a photo-detecting device according to some embodiments.

Referring to FIG. 26A, in some embodiments, the control electrode 340 can be over the first surface 21 of the substrate 20 with an intrinsic region right under the control electrode 340. The control electrode 340 may lead to formation of a Schottky contact, an Ohmic contact, or a combination thereof having an intermediate characteristic between the two, depending on various factors including the material of the substrate 20 or the material of the passivation layer and/or the material of the control electrode 340 and/or the dopant or defect level of the substrate 20 or the passivation layer 1400. The control electrode 340 may be any one of the control electrodes 340a, 340b, 340c, 340d.

Figure 26B:
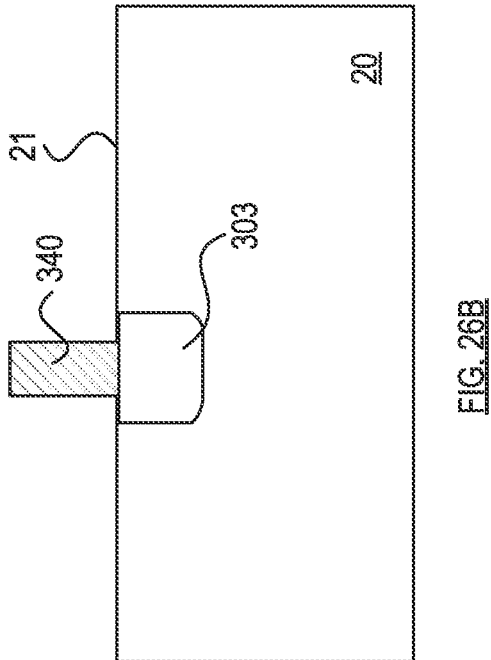

Referring to FIG. 26B, in some embodiments, the control region of the switch further includes a doped region 303 under the control electrodes 340 and in the substrate 20. In some embodiments, the doped region 303 is of a conductivity type different from the conductivity type of the first doped regions 302a,302b. In some embodiments, the doped region 303 include a dopant and a dopant profile. The peak dopant concentrations of the doped region 303 depend on the material of the control electrode 340 and/or the material of the substrate 20 and/or the dopant or defect level of the substrate 20, for example, between $1\times10^{17}$ cm$^{-3}$ to $5\times10^{20}$ cm$^{-3}$. The doped region 303 forms a Schottky or an Ohmic contact or a combination thereof with the control electrode 340. The doped region is for demodulating the carriers generated from the absorption region 10 based on the control of the control signals. The control electrode 340 may be any one of the control electrodes 340a, 340b, 340c, 340d.

Figure 26C:
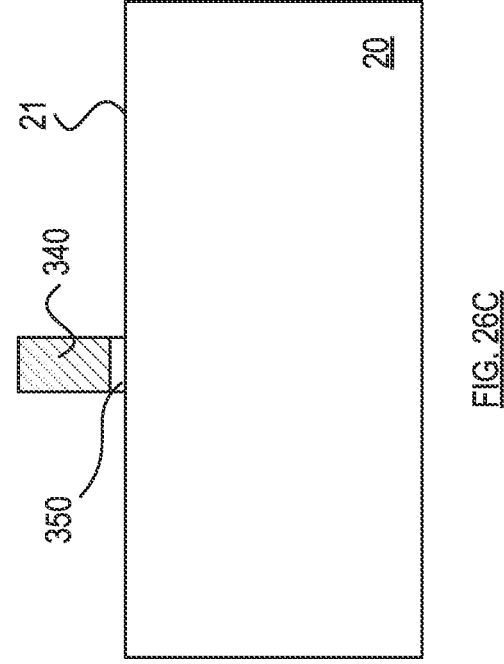

Referring to FIG. 26C, in some embodiments, the control region of the switch further includes a dielectric layer 350 between the substrate 20 and the control electrode 340. The dielectric layer 350 prevents direct current conduction from the control electrode 340 to the substrate 204, but allows an electric field to be established within the substrate 20 in response to an application of a voltage to the control electrode 340. The established electric field between two of the control regions, for example, between the control regions C1, C2, may attract or repel charge carriers within the substrate 20. The control electrode 340 may be any one of the control electrodes 340a, 340b, 340c, 340d.

Figure 26D:
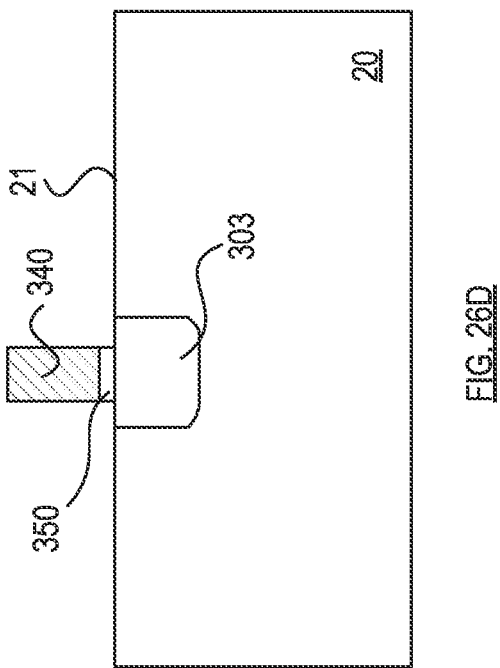

Referring to FIG. 26D, in some embodiments, the control region of the switch further includes a doped region 303 under the control electrodes 340 and in the substrate 20, and also includes a dielectric layer 350 between the substrate 20 and the control electrode 340. The control electrode 340 may be any one of the control electrodes 340a, 340b, 340c, 340d.

In some embodiments, the region of the carrier conducting layer right under the readout electrode may be intrinsic. For example, the region of the substrate right under the readout electrode of each of the switches may be intrinsic. For another example, the region of the passivation layer right under the readout electrode of each of the switches may be intrinsic. The readout electrode may lead to formation of a Schottky contact, an Ohmic contact, or a combination thereof having an intermediate characteristic between the two, depending on various factors including the material of the substrate 20 or the material of the passivation layer 1400 or the material of the passivation layer and/or the material of the readout electrode and/or the dopant or defect level of the substrate 20 or the passivation layer 1400.

In some embodiments, the dielectric layer 350 may include, but is not limited to SiO$_2$. In some embodiments, the dielectric layer 350 may include a high-k material including, but is not limited to, Si$_3$N$_4$, SiON, SiN$_x$, SiO$_x$, GeO$_x$, Al$_2$O$_3$, Y$_2$O$_3$, TiO$_2$, HfO$_2$ or ZrO$_2$. In some embodiments, the dielectric layer 350 may include semiconductor material but is not limited to amorphous Si, polycrystalline Si, crystalline Si, germanium-silicon, or a combination thereof.

In some embodiments, the conducting region 201 of the photo-detecting device can be any suitable design. Taking the conducting region 201 of the photo-detecting device in FIGS. 3A-3B, 4A-4C, 5A-5C, 6A-6G, 7A-7E, 8A-8E, 14C-14L as an example, a width of the conducting region 201 can be less than a distance between the control electrodes 340a, 340b. In some embodiments, the conducting region 201 may not be overlapped with any portion of the two doped regions 303 described in FIGS. 26B and 26D. In some embodiments, the conducting region 201 may be overlapped with a portion of the two doped regions 303 described in FIGS. 26B and 26D. In some embodiments, the conducting region 201 may be overlapped with the entire doped regions 303 described in FIGS. 26B and 26D. In some embodiments, the conducting region 201 may not be overlapped with any portion of each of the first doped regions 302a, 302b. In some embodiments, the conducting region 201 may be overlapped with a portion of each of the first doped regions 302a, 302b. In some embodiments, the conducting region 201 may be overlapped with the entire first doped regions 302a, 302b.

Taking the conducting region 201 of the photo-detecting device in FIGS. 10A, and 11A as another example, the conducting region 201 may not be overlapped with any portion of the third contact region 208. In some embodiments, the conducting region 201 may be overlapped with a portion of the third contact region 208. In some embodiments, the conducting region 201 may be overlapped with the entire third contact region 208. In some embodiments, the conducting region 201 may not be overlapped with any portion of the first contact region 204. In some embodiments, the conducting region 201 may be overlapped with a portion of the first contact region 204. In some embodiments, the conducting region 201 may be overlapped with the entire first contact region 204.

Taking the conducting region 201 of the photo-detecting device in FIGS. 1A-1D, and 2A-2F as another example, the conducting region 201 may not be overlapped with any portion of the first doped region 102. In some embodiments, the conducting region 201 may be overlapped with a portion of the first doped region 102. In some embodiments, the conducting region 201 may be overlapped with the entire the first doped region 102.

Figure 27A:
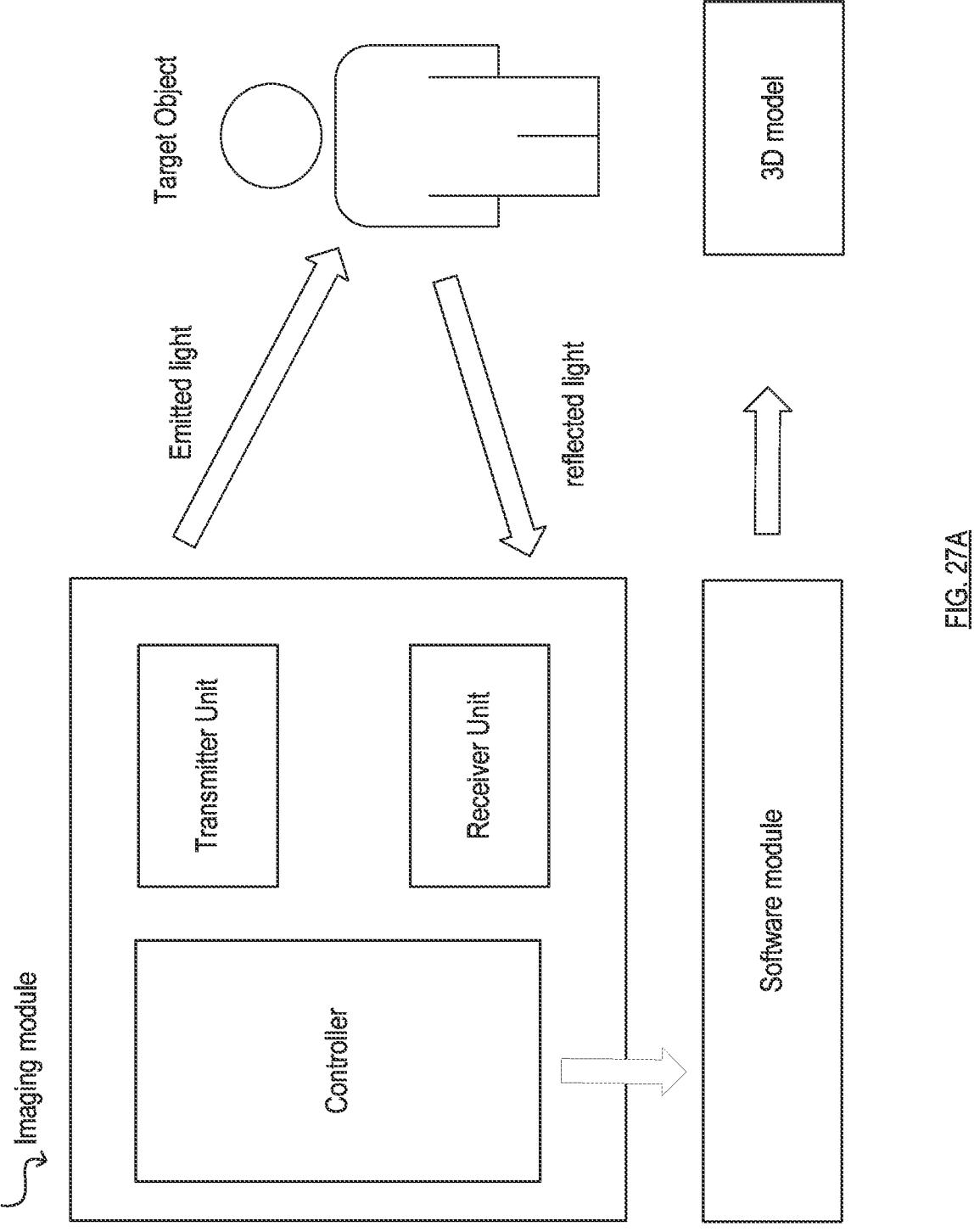
FIG. 27A is a block diagram of an example embodiment of an imaging system.

In some embodiments, any photo-detecting device mentioned above, for example, the photo-detecting device in FIGS. 1A-11E, 13A-26D, may include a waveguide similar to the waveguide 206 described in FIGS. 12A-12C, for guiding and/or confining the incident optical signal passing through a defined region of the substrate 20. FIG. 27A is a block diagram of an example embodiment of an imaging system. The imaging system may include an imaging module and a software module configured to reconstruct a three-dimensional model of a detected object. The imaging system or the imaging module may be implemented on a mobile device (e.g., a smartphone, a tablet, vehicle, drone, etc.), an ancillary device (e.g., a wearable device) for a mobile device, a computing system on a vehicle or in a fixed facility (e.g., a factory), a robotics system, a surveillance system, or any other suitable device and/or system.

The imaging module includes a transmitter unit, a receiver unit, and a controller. During operation, the transmitter unit may emit an emitted light toward a target object. The receiver unit may receive reflected light reflected from the target object. The controller may drive at least the transmitter unit and the receiver unit. In some implementations, the receiver unit and the controller are implemented on one semiconductor chip, such as a system-on-a-chip (SoC). In some cases, the transmitter unit is implemented by two different semiconductor chips, such a laser emitter chip on III-V substrate and a Si laser driver chip on Si substrate.

The transmitter unit may include one or more light sources, control circuitry controlling the one or more light sources, and/or optical structures for manipulating the light emitted from the one or more light sources. In some embodiments, the light source may include one or more LEDs or VCSELs emitting light that can be absorbed by the absorption region in the photo-detecting apparatus. For example, the one or more LEDs or VCSEL may emit light with a peak wavelength within a visible wavelength range (e.g., a wavelength that is visible to the human eye), such as 570 nm, 670 nm, or any other applicable wavelengths. For another example, the one or more LEDs or VCSEL may emit light with a peak wavelength above the visible wavelength range, such as 850 nm, 940 nm, 1050 nm, 1064 nm, 1310 nm, 1350 nm, 1550 nm, or any other applicable wavelengths.

In some embodiments, the emitted light from the light sources may be collimated by the one or more optical structure. For example, the optical structure may include one or more collimating lens.

The receiver unit may include one or more photo-detecting apparatus according to any embodiments as mentioned above. The receiver unit may further include a control circuitry for controlling the control circuitry and/or optical structures for manipulating the light reflected from the target object toward the one or more photo-detecting apparatus. In some implementations, the optical structure includes one or more lens that receives a collimated light and focuses the collimated light towards the one or more photo-detecting apparatus.

In some embodiments, the controller includes a timing generator and a processing unit. The timing generator receives a reference clock signal and provides timing signals to the transmitter unit for modulating the emitted light. The timing signals are also provided to the receiver unit for controlling the collection of the photo-carriers. The processing unit processes the photo-carriers generated and collected by the receiver unit and determines raw data of the target object. The processing unit may include control circuitry, one or more signal processors for processing the information output from the photo-detecting apparatus, and/or computer storage medium that may store instructions for determining the raw data of the target object or store the raw data of the target object. As an example, the controller in an i-ToF sensor determines a distance between two points by using the phase difference between light emitted by the transmitter unit and light received by the receiver unit.

The software module may be implemented to perform in applications such as facial recognition, eye-tracking, gesture recognition, 3-dimensional model scanning/video recording, motion tracking, autonomous vehicles, and/or augmented/virtual reality.

Figure 27B:
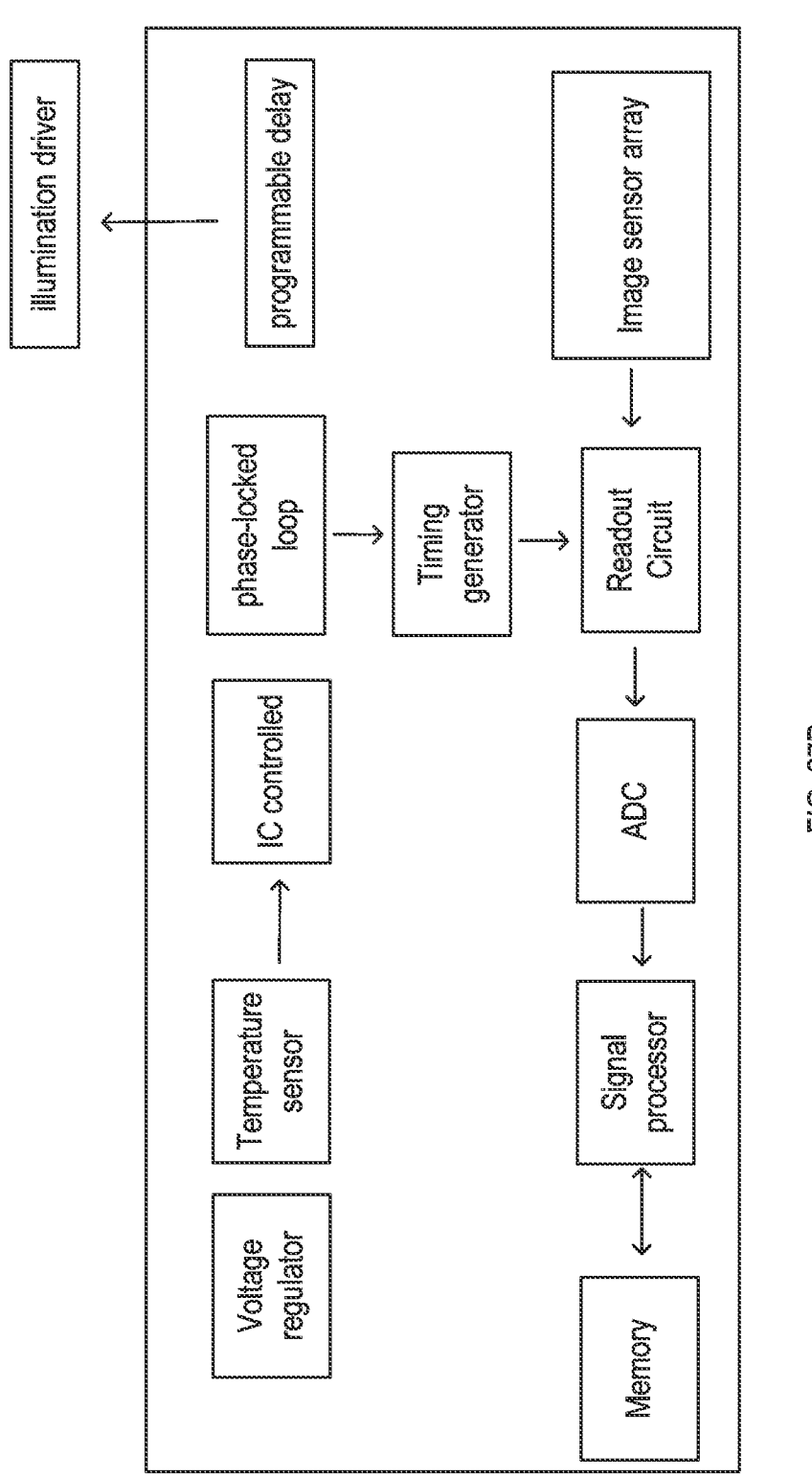
FIG. 27B shows a block diagram of an example receiver unit or the controller.

FIG. 27B shows a block diagram of an example receiver unit or controller. Here, an image sensor array (e.g., 240× 180) may be implemented using any implementations of the photo-detecting device described in reference to FIGS. 3A through 8E, FIGS. 14C through 14L. A phase-locked loop (PLL) circuit (e.g., an integer-N PLL) may generate a clock signal (e.g., four-phase system clocks) for modulation and demodulation. Before sending to the pixel array and external illumination driver, these clock signals may be gated and/or conditioned by a timing generator for a preset integration time and different operation modes. A programmable delay line may be added in the illumination driver path to delay the clock signals.

A voltage regulator may be used to control an operating voltage of the image sensor. For example, multiple voltage domains may be used for an image sensor. A temperature sensor may be implemented for the possible use of depth calibration and power control.

The readout circuit of the photo-detecting apparatus bridges each of the photo-detecting devices of the image sensor array to a column analog-to-digital converter (ADC), where the ADC outputs may be further processed and integrated in the digital domain by a signal processor before reaching the output interface. A memory may be used to store the outputs by the signal processor. In some implementations, the output interface may be implemented using a 2-lane, 1.2 Gb/s D-PHY MIPI transmitter, or using CMOS outputs for low-speed/low-cost systems.

An inter-integrated circuit (I2C) interface may be used to access all of the functional blocks described here.

In some embodiments, the photo-detecting apparatus in the present disclosure further includes an optical element (not shown) over the pixel. In some embodiments, the photo-detecting apparatus in the present disclosure further includes multiple optical elements (not shown) over the multiple pixels. The optical element converges an incoming optical signal to enter the absorbed region. In some embodiments, the optical elements include lenses.

In some embodiments, p-type dopant includes a group-III element. In some embodiments, p-type dopant is boron. In some embodiments, n-type dopant includes a group-V element. In some embodiments, n-type dopant is phosphorous In the present disclosure, if not specifically mention, the absorption region is configured to absorb photons having a peak wavelength in an invisible wavelength range equal to or greater than 800 nm, such as 850 nm, 940 nm, 1050 nm, 1064 nm, 1310 nm, 1350 nm, or 1550 nm or any suitable wavelength range. In some embodiments, the absorption region receives an optical signal and converts the optical signal into electrical signals. The absorption region can be in anu suitable shape, such as, but not limited to, cylinder, rectangular prism.

In the present disclosure, if not specifically mention, the absorption region has a thickness depending on the wavelength of photons to be detected and the material of the absorption region. In some embodiments, when the absorption region includes germanium and is designed to absorb photons having a wavelength equal to or greater than 800 nm, the absorption region has a thickness equal to or greater than 0.1 μm. In some embodiments, the absorption region includes germanium and is designed to absorb photons having a wavelength between 800 nm and 2000 nm, the absorption region has a thickness between 0.1 μm and 2.5 μm. In some embodiments, the absorption region has a thickness between 1 μm and 2.5 μm for higher quantum efficiency. In some embodiments, the absorption region may be grown using a blanket epitaxy, a selective epitaxy, or other applicable techniques.

In the present disclosure, if not specifically mention, the light shield has the optical window for defining the position of the absorbed region in the absorption region. In other words, the optical window is for allowing the incident optical signal enter into the absorption region and defining the absorbed region. In some embodiments, the light shield is on a second surface of the substrate distant from the absorption region when an incident light enters the absorption region from the second surface of the substrate. In some embodiments, a shape of the optical window can be ellipse, circle, rectangular, square, rhombus, octagon or any other suitable shape from a top view of the optical window.

In the present disclosure, if not specifically mention, in a same pixel, the type of the carriers collected by the first doped region of one of the switches and the type of the carriers collected by the first doped region of the other switch are the same. For example, when the photo-detecting apparatus is configured to collects electrons, when the first switch is switched on and the second switch is switched off, the first doped region in the first switch collects electrons of the photo-carriers generated from the absorption region, and when the second switch is switched on and the first switch is switched off, the first doped region in the second switch also collects electrons of the photo-carriers generated from the absorption region.

In the present disclosure, if not specifically mention, the first electrode, second electrode, readout electrode, and the control electrode include metals or alloys. For example, the first electrode, second electrode, readout electrode, and the control electrode include Al, Cu, W, Ti, Ta—TaN—Cu stack or Ti—TiN—W stack.

In some embodiments, if not specifically mention, the cross-sectional views shown in the present disclosure may be a cross-sectional view along any possible cross-sectional line of a photo-detecting apparatus or a photo-detecting device.

As used herein and not otherwise defined, the terms "substantially" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to $\pm10\%$ of that numerical value, such as less than or equal to $\pm5\%$, less than or equal to $\pm4\%$, less than or equal to $\pm3\%$, less than or equal to $\pm2\%$, less than or equal to $\pm1\%$, less than or equal to $\pm0.5\%$, less than or equal to $\pm0.1\%$, or less than or equal to $\pm0.05\%$.

While the disclosure has been described by way of example and in terms of a preferred embodiment, it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An optical sensor, comprising:
a first photo-detecting element comprising:
an absorption region comprising p-doped germanium, the absorption region configured to receive an optical signal and to generate photo-carriers in response to the optical signal; and
a silicon substrate in contact with the absorption region via a heterointerface, the silicon substrate comprising:
a plurality of p-doped regions;
a plurality of n-doped regions, wherein the plurality of p-doped regions are formed closer to the heterointerface than the plurality of n-doped regions are;
one or more multiplication regions formed between the plurality of p-doped regions and the plurality of n-doped regions, wherein the one or more multiplication regions are configured to amplify a portion of the photo-carriers drifting from the absorption region to the plurality of p-doped regions; and
an n-doped carrier conducting region in contact with the absorption region to form the heterointerface and in contact with the plurality of p-doped regions,
wherein a maximum distance between two outermost p-doped regions of the plurality of p-doped regions is greater than a width of the n-doped carrier conducting region.

2. The optical sensor of claim 1, wherein the plurality of p-doped regions are at least partially overlapped with the n-doped carrier conducting region.

3. The optical sensor of claim 1, wherein a ratio between a first doping concentration of the absorption region and a second doping concentration of the n-doped carrier conducting region at the heterointerface is equal to or greater than 10.

4. The optical sensor of claim 3, wherein the absorption region further comprises a first p-doped contact region coupled to a first electrode, wherein the plurality of n-doped regions are coupled to a second electrode, and wherein the first p-doped contact region has a third doping concentration higher than the first doping concentration.

5. The optical sensor of claim 4, wherein the plurality of p-doped regions have a fourth doping concentration that is higher than the second doping concentration of the n-doped carrier conducting region.

6. The optical sensor of claim 4, wherein the first photo-detecting element is configured to operate in a Geiger mode under a reverse bias between the first electrode and the second electrode.

7. The optical sensor of claim 4, wherein the plurality of p-doped regions are coupled to a third electrode.

8. The optical sensor of claim 1, wherein the plurality of p-doped regions and the plurality of n-doped regions are arranged in a staggered arrangement.

9. The optical sensor of claim 1, wherein the absorption region is doped with a graded doping profile.

10. The optical sensor of claim 1, wherein the absorption region is at least partially embedded in the silicon substrate.

11. The optical sensor of claim 1, wherein the silicon substrate comprises a first surface and a second surface that is opposite to the first surface, wherein the plurality of p-doped regions are formed closer to the first surface than the plurality of n-doped regions, and wherein the first photo-detecting element further comprises one or more optical structures formed on the second surface configured to receive the optical signal.

12. The optical sensor of claim 11, wherein the one or more optical structures comprise one or more lenses.

13. The optical sensor of claim 1, comprising a sensor array comprising one-dimensional (1D) or two-dimensional (2D) array of photo-detecting elements formed on the silicon substrate, the 1D or 2D array of photo-detecting elements including the first photo-detecting element.

14. The optical sensor of claim 1, wherein a thickness of the one or more multiplication regions is in a range from 100 nm to 500 nm.

15. The optical sensor of claim 1, wherein at least 50% of the absorption region is doped with a doping concentration that is equal to or greater than $1 \times 10^{16}$ cm$^{-3}$.

16. A system comprising:

an optical transmitter configured to emit an optical signal having a peak wavelength greater than 900 nm; and an optical sensor, comprising:

a first photo-detecting element comprising:

an absorption region comprising p-doped germanium, the absorption region configured to receive the optical signal and to generate photo-carriers in response to the optical signal; and a silicon substrate in contact with the absorption region via a heterointerface, the silicon substrate comprising:

a plurality of p-doped regions;

a plurality of n-doped regions, wherein the plurality of p-doped regions are formed closer to the heterointerface than the plurality of n-doped regions;

one or more multiplication regions formed between the plurality of p-doped regions and the plurality of n-doped regions, wherein the one or more multiplication regions are configured to amplify a portion of the photo-carriers drifting from the absorption region to the plurality of p-doped regions; and an n-doped carrier conducting region in contact with the absorption region to form the heterointerface and in contact with the plurality of p-doped regions, wherein a maximum distance between two outermost p-doped regions of the plurality of p-doped regions is greater than a width of the n-doped carrier conducting region.

17. The system of claim 16, wherein the system is a mobile device, a wearable device, or a robotic device.

18. The system of claim 16, wherein the optical transmitter comprises one or more light emitting diodes or one or more vertical-cavity surface-emitting lasers.

* * * * *